(12) United States Patent
Liu et al.

(10) Patent No.: US 11,928,325 B1
(45) Date of Patent: Mar. 12, 2024

(54) SYSTEMS, METHODS, AND GRAPHICAL USER INTERFACES FOR CONFIGURING DESIGN OF EXPERIMENTS

(71) Applicant: JMP Statistical Discovery LLC, Cary, NC (US)

(72) Inventors: Peng Liu, Naperville, IL (US); Mark Wallace Bailey, Haddonfield, NJ (US); Bradley Allen Jones, Cary, NC (US); Caleb Bridges King, Morrisville, NC (US); Ryan Adam Lekivetz, Cary, NC (US); Joseph Albert Morgan, Raleigh, NC (US); Jacob Davis Rhyne, Dallas, NC (US)

(73) Assignee: SAS INSTITUTE INC., Cary, NC (US)

( * ) Notice: Subject to any disclaimer, the term of this patent is extended or adjusted under 35 U.S.C. 154(b) by 0 days.

(21) Appl. No.: 18/229,050

(22) Filed: Aug. 1, 2023

Related U.S. Application Data

(60) Provisional application No. 63/451,793, filed on Mar. 13, 2023, provisional application No. 63/446,681, filed on Feb. 17, 2023, provisional application No. 63/441,078, filed on Jan. 25, 2023.

(51) Int. Cl.
    *G06F 3/0482* (2013.01)
    *G06F 3/04847* (2022.01)
    *G06F 30/20* (2020.01)

(52) U.S. Cl.
    CPC ........ *G06F 3/04847* (2013.01); *G06F 3/0482* (2013.01); *G06F 30/20* (2020.01)

(58) Field of Classification Search
    CPC .................................................. G06F 3/048–05
    See application file for complete search history.

(56) References Cited

U.S. PATENT DOCUMENTS

| | | | | |
|---|---|---|---|---|
| 6,583,795 | B1* | 6/2003 | Ohyama | G06Q 10/107 715/744 |
| 8,812,625 | B1* | 8/2014 | Chitilian | G06F 16/2322 709/224 |
| 9,836,184 | B2* | 12/2017 | Mamadgi | G06F 3/0482 |
| 10,803,214 | B1* | 10/2020 | Jones | G06F 30/20 |
| 2007/0112581 | A1* | 5/2007 | Smith | G06Q 30/06 705/26.1 |
| 2012/0075322 | A1* | 3/2012 | Hathaway | G06T 11/206 703/2 |
| 2012/0079379 | A1* | 3/2012 | Hathaway | G06Q 10/06 715/709 |

(Continued)

*Primary Examiner* — Daniel Rodriguez
(74) *Attorney, Agent, or Firm* — Padowithz Alce; Chandler Scheitlin; Alce PLLC

(57) ABSTRACT

A system, method, and computer-program product includes displaying a plurality of factor-setting user interface (UI) control elements configured to receive an input of characters for specifying a set of design of experiment factors for creating a design of experiment (DOE), displaying a plurality of factor type UI control elements configured to receive input for specifying a factor type of a plurality of factor types, displaying a plurality of dynamic rows of editable UI control elements configured to receive inputs of experimental values for the set of DOE factors, and displaying a composite factor UI control component configured to receive inputs for generating one or more control signals that add or remove one or more DOE factors of the set of DOE factors.

29 Claims, 55 Drawing Sheets

(56) References Cited

U.S. PATENT DOCUMENTS

| | | | |
|---|---|---|---|
| 2015/0081596 A1* | 3/2015 | Maaseidvaag | G06N 5/04 |
| | | | 706/11 |
| 2018/0060466 A1* | 3/2018 | Morgan | G06F 30/20 |
| 2018/0060469 A1* | 3/2018 | Morgan | G06F 30/20 |
| 2019/0346297 A1* | 11/2019 | Lekivetz | G06F 11/079 |
| 2020/0250165 A1* | 8/2020 | Gardner | G06F 3/0482 |
| 2021/0124858 A1* | 4/2021 | Morgan | G06F 30/23 |
| 2021/0165771 A1* | 6/2021 | Papazian | G06F 16/248 |
| 2023/0041773 A1* | 2/2023 | Lekivetz | G06F 3/0482 |

* cited by examiner

| | | | | | | |
|---|---|---|---|---|---|---|
| 802q | X12 | CONTINUOUS | 810q | HARD ∨ | 812q | LOWER: 0 | UPPER: 1 | 814q |
| 802r | X13 | CONTINUOUS | 810r | HARD ∨ | 812r | LOWER: -1 | UPPER: 1 | 814r |
| 802s | X14 | CONTINUOUS | 810s | HARD ∨ | 812s | LOWER: -1 | UPPER: 1 | 814s |
| 802t | X15 | DISCRETE NUMERIC ∨ | 810t | VERY HARD ∨ | 812t | − + LEVELS: 1 2 3 4 5 | 814t |
| 802u | X16 | DISCRETE NUMERIC ∨ | 810u | VERY HARD ∨ | 812u | − + LEVELS: 1 2 3 4 5 | 814u |
| 802v | X17 | DISCRETE NUMERIC ∨ | 810v | VERY HARD ∨ | 812v | − + LEVELS: 1 2 3 4 5 | 814v |
| 802w | X18 | DISCRETE NUMERIC ∨ | 810w | VERY HARD ∨ | 812w | − + LEVELS: 1 2 3 4 5 | 814w |
| 802x | X19 | DISCRETE NUMERIC ∨ | 810x | VERY HARD ∨ | 812x | − + LEVELS: 1 2 3 4 5 | 814x |
| 802y | X20 | DISCRETE NUMERIC ∨ | 810y | VERY HARD ∨ | 812y | − + LEVELS: 1 2 3 4 5 | 814y |
| 802z | X21 | DISCRETE NUMERIC ∨ | 810z | VERY HARD ∨ | 812z | − + LEVELS: 1 2 3 4 5 | 814z |
| 802aa | X22 | DISCRETE NUMERIC ∨ | 810aa | EASY ∨ | 812aa | − + LEVELS: 1 2 3 4 5 6 7 8 | 814aa |
| 802bb | X23 | DISCRETE NUMERIC ∨ | 810bb | EASY ∨ | 812bb | − + LEVELS: 1 2 3 4 5 6 7 8 | 814bb |
| 802cc | X24 | CATEGORICAL ∨ | 810cc | HARD ∨ | 812cc | − + LEVELS: L1 L2 L3 | 814cc |
| 802dd | X25 | CATEGORICAL ∨ | 810dd | HARD ∨ | 812dd | − + LEVELS: L1 L2 L3 | 814dd |
| 802ee | X26 | CATEGORICAL ∨ | 810ee | VERY HARD ∨ | 812ee | − + LEVELS: L1 L2 L3 L4 | 814ee |
| 802ff | X27 | CATEGORICAL ∨ | 810ff | VERY HARD ∨ | 812ff | − + LEVELS: L1 L2 L3 L4 | 814ff |
| 802gg | X28 | CATEGORICAL ∨ | 810gg | VERY HARD ∨ | 812gg | − + LEVELS: L1 L2 L3 L4 | 814gg |

3910
RECEIVING FACTOR SPECIFICATION DATA THAT SPECIFIES A PLURALITY OF FACTORS AND ONE OR MORE FACTOR PARAMETERS OF THE PLURALITY OF FACTORS FOR CONFIGURING A DESIGN OF EXPERIMENTS

3920
EXECUTING A FACTOR TYPE CONVERSION FOR A TARGET FACTOR OF THE PLURALITY OF FACTORS BASED ON THE FACTOR SPECIFICATION DATA INDICATING A SELECTION OF A SUCCESSOR FACTOR TYPE SELECTED FROM A PLURALITY OF FACTOR TYPES, WHEREIN EXECUTING THE FACTOR TYPE CONVERSION INCLUDES:

3924
REPLACING, AT A GRAPHICAL USER INTERFACE, A SET OF FACTOR SPECIFICATION USER INTERFACE ELEMENTS THAT CORRESPOND TO AN INCUMBENT FACTOR TYPE PREVIOUSLY SELECTED FOR THE TARGET FACTOR WITH A SECOND SET OF FACTOR SPECIFICATION USER INTERFACE ELEMENTS THAT CORRESPOND TO THE SUCCESSOR FACTOR TYPE

3928
UPDATING THE DESIGN OF EXPERIMENTS WITH AN EXPERIMENT DESIGN POLICY FOR THE SUCCESSOR FACTOR TYPE, WHEREIN THE EXPERIMENT DESIGN POLICY FOR THE SUCCESSOR FACTOR TYPE CONTROLS A TRANSFORMATION OF AN UNDERLYING MODEL OF THE DESIGN OF EXPERIMENTS

3930
EXECUTING A MODEL TRANSFORMATION OF THE UNDERLYING MODEL OF THE DESIGN OF EXPERIMENTS BASED ON THE EXPERIMENT DESIGN POLICY FOR THE SUCCESSOR FACTOR TYPE, WHEREIN EXECUTING THE MODEL TRANSFORMATION INCLUDES MODIFYING ONE OR MORE OPERATIONAL PARAMETERS OF THE UNDERLYING MODEL TO SATISFY THE EXPERIMENTAL DESIGN POLICY FOR THE SUCCESSOR FACTOR TYPE

3940
EXECUTING THE DESIGN OF EXPERIMENTS BASED AT LEAST ON THE FACTOR SPECIFICATION DATA, THE EXECUTING OF THE FACTOR TYPE CONVERSION, AND THE EXECUTING OF THE MODEL TRANSFORMATION

FIG. 39

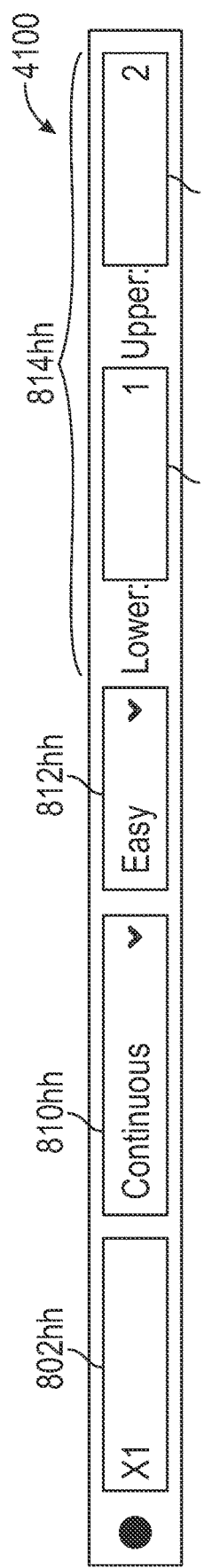
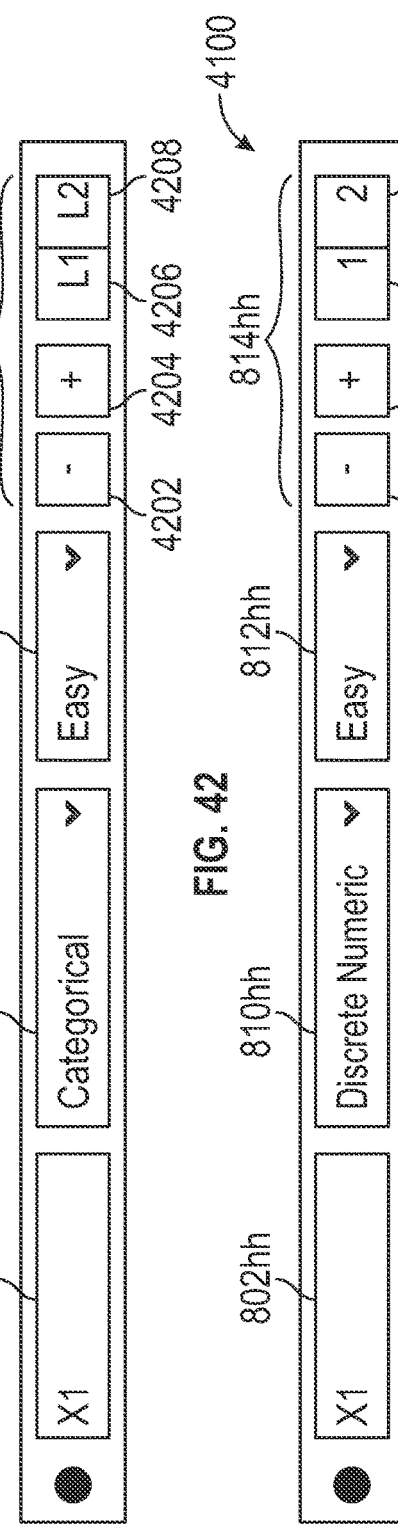
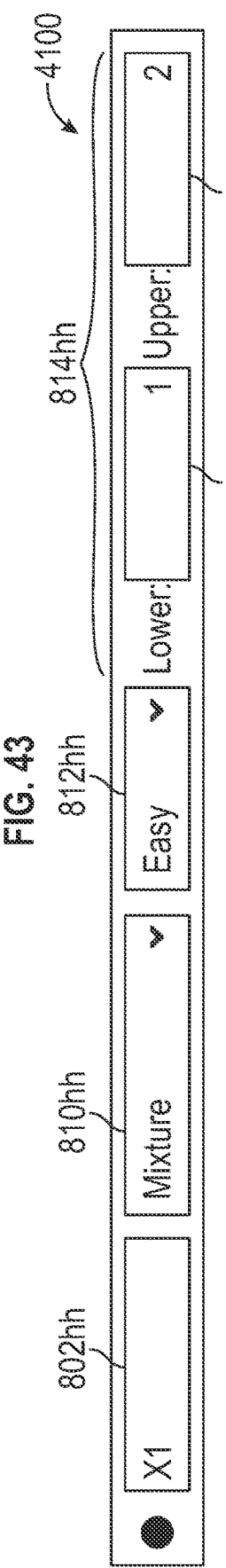
FIG. 41
FIG. 42
FIG. 43
FIG. 44

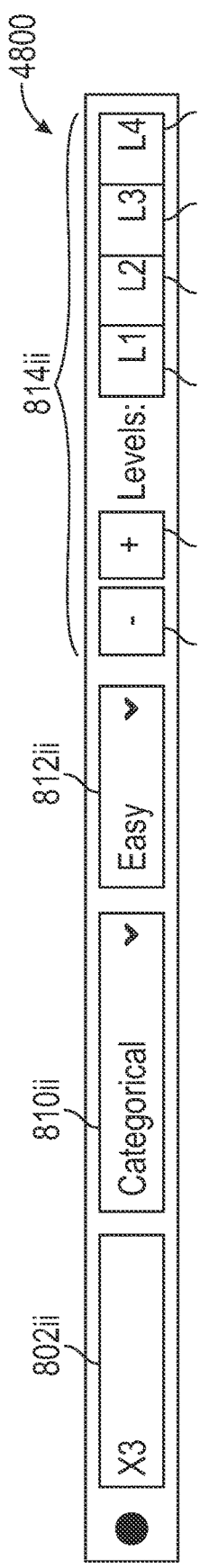
FIG. 48
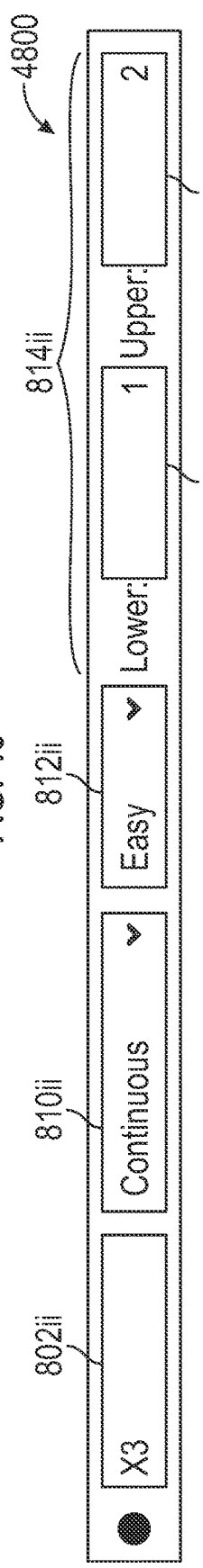
FIG. 49
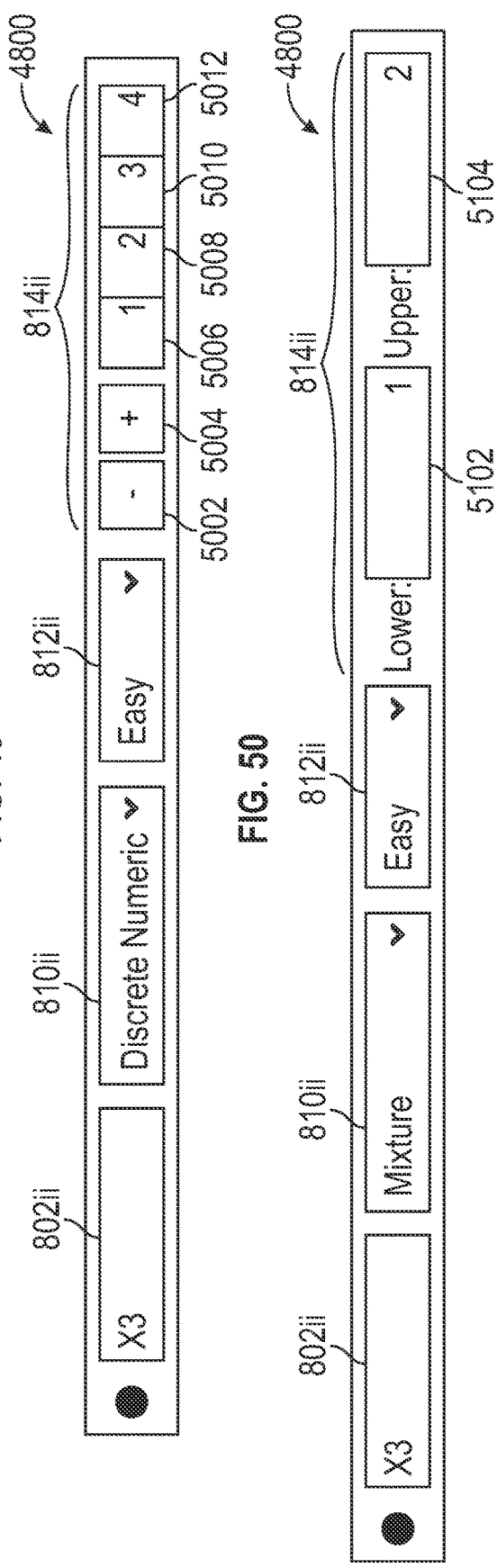
FIG. 50
FIG. 51

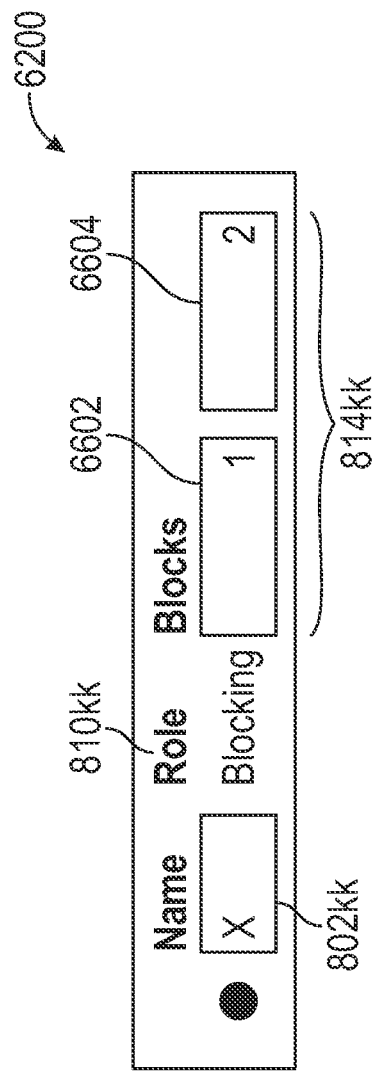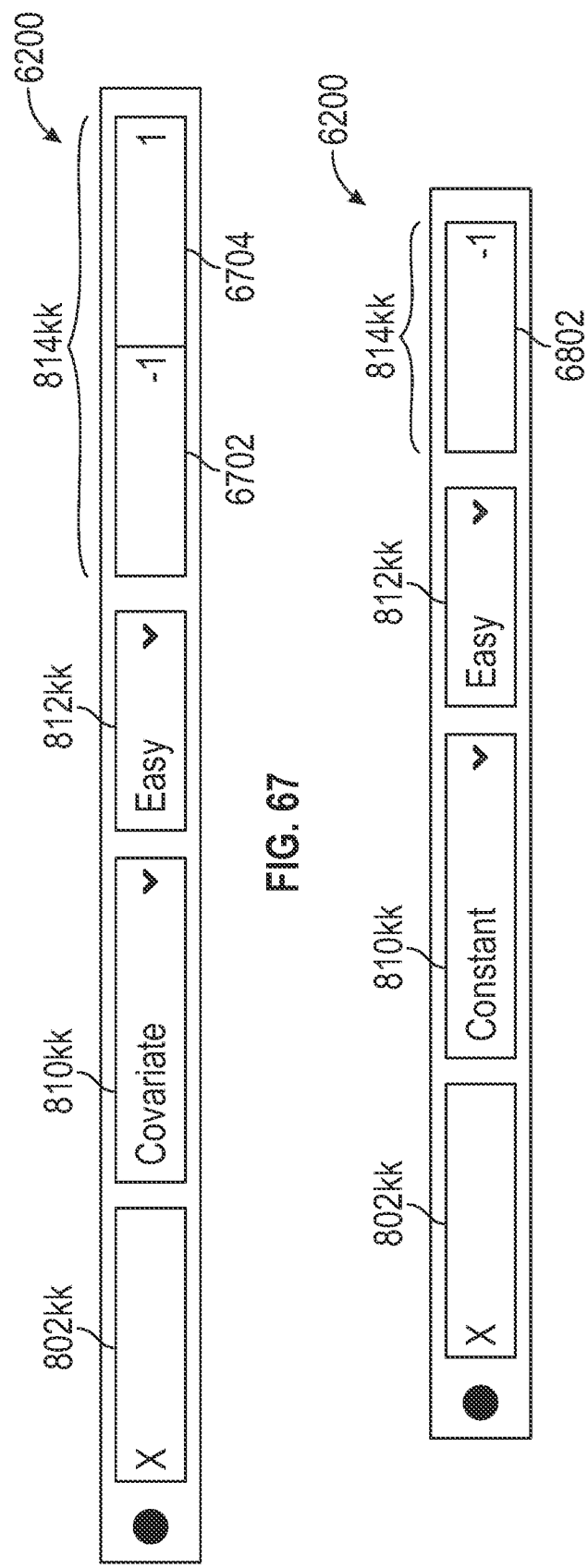
FIG. 66
FIG. 67
FIG. 68

Space Filling Design Methods

Number of Runs: 50

- 7902 — Sphere Packing — Optimal Packing of Spheres Inside of a Cube
- 7904 — Latin Hypercube — Latin HyperCube with Optimal Spacing
- 7906 — Uniform — Uniform Design
- 7908 — Minimum Potential — Minimum Energy Designs in a Spherical Region
- 7910 — Maximum Entropy — Maximum Entropy Designs for a Gaussian Process
- 7912 — Gaussian Process IMSE Optimal — Integrated Mean Square Error Optimal Designs for a Gaussian Process
- 7914 — Fast Flexible Filling — Space Filling Design Through Clustering

FIG. 79

SYSTEMS, METHODS, AND GRAPHICAL USER INTERFACES FOR CONFIGURING DESIGN OF EXPERIMENTS

CROSS-REFERENCE TO RELATED APPLICATIONS

This application claims the benefit of U.S. Provisional Application No. 63/451,793, filed on 13 Mar. 2023, U.S. Provisional Application No. 63/446,681, filed on 17 Feb. 2023, and U.S. Provisional Application No. 63/441,078, filed on 25 Jan. 2023, which are incorporated in their entireties by this reference.

TECHNICAL FIELD

This invention relates generally to the field of experimental design and, more specifically, to new and useful systems and methods for configuring design of experiments.

BACKGROUND

Design of Experiments (DoE) are typically configured using computer tools. Users may interact with such computer tools to define inputs of the design of experiments (commonly referred to as "factors") and outputs of the design of experiments (commonly referred to as "responses"). However, these computer tools may not allow a user to modify factors of the design of experiments without discarding previous user work. Furthermore, these computer tools do not intelligently adapt a model underlying the design of experiments as factors are added, removed, or as attributes of the factors change. Such limitations and inefficiencies are not only frustrating to the user, but can also cause inaccuracies in the design of experiments model if not corrected.

The embodiments of the present application provide technical solutions that address, at least, the needs described above, as well as the deficiencies of the start of the art.

BRIEF SUMMARY OF THE INVENTION(S)

In some embodiments, a computer-program product embodied in a non-transitory machine-readable storage medium stores computer instructions that, when executed by one or more processors, perform operations that provide a graphical user interface comprising a plurality of factor-setting user interface (UI) control elements configured to receive an input of characters for specifying a set of design of experiment factors for creating a design of experiment (DOE), a plurality of factor type UI control elements, each respective factor type UI control element of the plurality of factor type UI control elements being configured to receive input for specifying a factor type of a plurality of factor types displayed by the respective factor type UI control element for a corresponding DOE factor of the set of DOE factors, a plurality of dynamic rows of editable UI control elements configured to receive inputs of experimental values for the set of DOE factors, wherein one or more dynamic rows of editable UI control elements of the plurality of dynamic rows of editable UI control elements are dynamically reconfigured from a current format of control elements to a new format of control elements based on one or more input operations to one or more of the plurality of factor type UI control elements, and a composite factor UI control component configured to receive inputs for generating one or more control signals that add or remove one or more DOE factors of the set of DOE factors.

In some embodiments, the graphical user interface further comprises a factor-setting grid container control, wherein the factor-setting grid container control includes: one or more columns of the plurality of factor-setting UI control elements, a column of the plurality of factor type UI control elements, and one or more columns of the plurality of dynamic rows of editable UI control elements.

In some embodiments, the factor-setting grid container control includes a plurality of rows of factor-setting composition components, and each row of factor-setting composition components of the plurality of factor-setting composition components includes: a factor-setting UI control element of the plurality of factor-setting UI control elements, a factor type UI control element of the plurality of factor type UI control elements, and a dynamic row of editable UI control elements of the plurality of dynamic rows of editable UI control elements.

In some embodiments, the graphical user interface further comprises a plurality of DOE platform configuration UI control elements being configured to receive input for configuring the plurality of factor type UI control elements to a DOE platform of a plurality of DOE platforms, wherein each DOE platform of the plurality DOE platforms defines a distinct number of factor types that is selectably available for a respective factor type UI control element of the plurality of factor type UI control elements.

In some embodiments, a respective DOE platform configuration UI control element of the plurality of DOE platform configuration UI control elements, when operated, changes a current DOE platform of a target factor type UI control element of the plurality of factor type UI control elements to a selected DOE platform, and the selected DOE platform increases or decreases a number of factor type UI control elements available for selection when operating the target factor type UI control element.

In some embodiments, the composite factor UI control component comprises a plurality of UI control buttons native to an operating system implementing the GUI including: a factor addition control button that, when operated, adds one or more DOE factors to an end of the set of DOE factors, a factor subtraction control button that, when operated, removes one or more DOE factors from the end of the set of DOE factors, a factor deletion control button that, when operated, removes one or more selected DOE factors from an arbitrary position within the set of DOE factors; a factor control operation undo button that, when operated, reverts the DOE or the GUI to a previous state that includes erasing a last set of one or more changes to the DOE or the GUI; and a factor control operation redo button that, when operated, reverses one or more most recent in time operations of the factor control operation undo button.

In some embodiments, the composite factor UI control component further includes a sub-composite factor UI control component comprising a number edit control element that, when operated, receives an input of a number identifying a number of DOE factors to append to the end of the set of DOE factors and a drop-down menu control element that, when operated, displays the plurality of factor type UI control elements that are available for selection, wherein in response to an input of a target number into the number edit control element and a selection of a target factor type from the plurality of factor type UI control elements that are selectably available via the drop-down menu control element, a control signal is generated that causes an automatically appending of the number of DOE factors to the end of the set of DOE of factors.

In some embodiments, the plurality of UI control buttons of the composite factor UI control component further includes a factor set reset control button that, when operated, deletes the set of DOE factors.

In some embodiments, the plurality of UI control buttons of the composite factor UI control component further includes a factor dialog control button that, when operated, displays a dialog menu element that includes: a first grid container control comprising a plurality of rows of factor-setting composition components, each row of factor-setting composition components of the plurality of rows of factor-setting composition components includes: a plurality of UI control elements for creating a distinct DOE factor of the set of DOE factors, and a DOE factor instantiation control button arranged in-line with the plurality of UI control elements, wherein the DOE factor instantiation control button, when operated, automatically appends one or more target DOE factors to the set of DOE factors, and a second grid container control comprising a further plurality of rows of factor-setting composition components, each row of factor-setting composition components of the further plurality of rows of factor-setting composition components includes a further plurality of UI control elements for creating a plurality of DOE factors of the set of DOE factors; a further composite factor UI control component arranged with the second grid container for controlling an addition to and a subtraction from of one or more DOE factors from a further set of DOE factors of the second grid container; and a further DOE factor instantiation control button arranged with the second grid container control that, when operated, automatically appends the plurality of DOE factors to the set of DOE factors.

In some embodiments, the current format of control elements corresponds to an incumbent factor type UI control element of the plurality of factor type UI control elements and the new format of control elements corresponds to a succeeding factor type UI control element of the plurality of factor type UI control elements that is selected in place of the incumbent factor type UI control element.

In some embodiments, the plurality of factor-setting UI control elements comprise a plurality of character edit boxes arranged in a column, and each of the plurality of character edit boxes is configured to receive input of one or more characters that define a target DOE factor of the set of DOE factors.

In some embodiments, the plurality of factor type UI control elements comprise a plurality of drop-down menu elements arranged in a column, an input operation to a respective drop-down menu element of the plurality of drop-down menu elements causes the respective drop-down menu element to expand and display a set of factor type UI control elements.

In some embodiments, an order of the plurality of factor-setting UI control elements is rearranged within the GUI based on: executing a selection of a target factor-setting UI control element of the plurality of factor-setting UI control elements, moving the target factor-setting UI control element from a current position within the order, and placing the target factor-setting UI control element within a new position within the order of the plurality of factor-setting UI control elements.

In some embodiments, the set of DOE factors is configured with a plurality of sequential groups of DOE factors, each of the plurality of sequential groups of DOE factors having a maximum group size not exceeding a specified number of DOE factors, an operation to rearrange a target DOE factor from a first group to a second group of the plurality of sequential groups of DOE factors automatically updates a group identification value associated with the target DOE factor and one or more group identification values of other DOE factors moved into one or more other groups of DOE factors of the plurality of sequential groups of DOE factors based on the rearrangement of the target DOE factor.

In some embodiments, when one or more DOE factors are appended to an end of the set of DOE factors causing a size of the set of DOE factors to exceed a display area of the graphical UI, the graphical UI is automatically scrolled to a section of the set of DOE factors displaying at least the one or more DOE factors.

In some embodiments, a computed-implemented method comprises displaying a plurality of factor-setting user interface (UI) control elements configured to receive an input of characters for specifying a set of design of experiment factors for creating a design of experiment (DOE); displaying a plurality of factor type UI control elements, each respective factor type UI control element of the plurality of factor type UI control elements being configured to receive input for specifying a factor type of a plurality of factor types displayed by the respective factor type UI control element for a corresponding DOE factor of the set of DOE factors; displaying a plurality of dynamic rows of editable UI control elements configured to receive inputs of experimental values for the set of DOE factors, wherein one or more dynamic rows of editable UI control elements of the plurality of dynamic rows of editable UI control elements are dynamically reconfigured from a current format of control elements to a new format of control elements based on one or more input operations to one or more of the plurality of factor type UI control elements; and displaying a composite factor UI control component configured to receive inputs for generating one or more control signals that add or remove one or more DOE factors of the set of DOE factors.

In some embodiments, the computer-implemented method further comprises displaying a factor-setting grid container control, wherein the factor-setting grid container control includes: one or more columns of the plurality of factor-setting UI control elements, a column of the plurality of factor type UI control elements, and one or more columns of the plurality of dynamic rows of editable UI control elements.

In some embodiments, the factor-setting grid container control includes a plurality of rows of factor-setting composition components, and each row of factor-setting composition components of the plurality of factor-setting composition components includes: a factor-setting UI control element of the plurality of factor-setting UI control elements, a factor type UI control element of the plurality of factor type UI control elements, and a dynamic row of editable UI control elements of the plurality of dynamic rows of editable UI control elements.

In some embodiments, the computer-implemented method further comprises displaying a plurality of DOE platform configuration UI control elements being configured to receive input for configuring the plurality of factor type UI control elements to a DOE platform of a plurality of DOE platforms, wherein each DOE platform of the plurality DOE platforms defines a distinct number of factor types that is selectably available for a respective factor type UI control element of the plurality of factor type UI control elements.

In some embodiments, a respective DOE platform configuration UI control element of the plurality of DOE platform configuration UI control elements, when operated, changes a current DOE platform of a target factor type UI control element of the plurality of factor type UI control elements to a selected DOE platform, and the selected DOE platform increases or decreases a number of factor type UI control elements available for selection when operating the target factor type UI control element.

In some embodiments, the composite factor UI control component comprises a plurality of UI control buttons native to an operating system implementing the GUI including: a factor addition control button that, when operated, adds one or more DOE factors to an end of the set of DOE factors, a factor subtraction control button that, when operated, removes one or more DOE factors from the end of the set of DOE factors, a factor deletion control button that, when operated, removes one or more selected DOE factors from an arbitrary position within the set of DOE factors; a factor control operation undo button that, when operated, reverts the DOE or the GUI to a previous state that includes erasing a last set of one or more changes to the DOE or the GUI; and a factor control operation redo button that, when operated, reverses one or more most recent in time operations of the factor control operation undo button.

In some embodiments, the composite factor UI control component further includes a sub-composite factor UI control component comprising a number edit control element that, when operated, receives an input of a number identifying a number of DOE factors to append to the end of the set of DOE factors and a drop-down menu control element that, when operated, displays the plurality of factor type UI control elements that are available for selection, wherein in response to an input of a target number into the number edit control element and a selection of a target factor type from the plurality of factor type UI control elements that are selectably available via the drop-down menu control element, a control signal is generated that causes an automatically appending of the number of DOE factors to the end of the set of DOE of factors.

In some embodiments, a computer-implemented system comprises: one or more processors; a memory; a computer-readable medium operably coupled to the one or more processors, the computer-readable medium having computer-readable instructions stored thereon that, when executed by the one or more processors, cause a computing device to perform operations comprising: displaying a plurality of factor-setting user interface (UI) control elements configured to receive an input of characters for specifying a set of design of experiment factors for creating a design of experiment (DOE); displaying a plurality of factor type UI control elements, each respective factor type UI control element of the plurality of factor type UI control elements being configured to receive input for specifying a factor type of a plurality of factor types displayed by the respective factor type UI control element for a corresponding DOE factor of the set of DOE factors; displaying a plurality of dynamic rows of editable UI control elements configured to receive inputs of experimental values for the set of DOE factors, wherein one or more dynamic rows of editable UI control elements of the plurality of dynamic rows of editable UI control elements are dynamically reconfigured from a current format of control elements to a new format of control elements based on one or more input operations to one or more of the plurality of factor type UI control elements; and displaying a composite factor UI control component configured to receive inputs for generating one or more control signals that add or remove one or more DOE factors of the set of DOE factors.

In some embodiments, the computer-implemented system further comprises computer-readable instructions that, when executed, cause the computing device to perform operations comprising: displaying a factor-setting grid container control, wherein the factor-setting grid container control includes: one or more columns of the plurality of factor-setting UI control elements, a column of the plurality of factor type UI control elements, and one or more columns of the plurality of dynamic rows of editable UI control elements.

In some embodiments, the factor-setting grid container control includes a plurality of rows of factor-setting composition components, and each row of factor-setting composition components of the plurality of factor-setting composition components includes: a factor-setting UI control element of the plurality of factor-setting UI control elements, a factor type UI control element of the plurality of factor type UI control elements, and a dynamic row of editable UI control elements of the plurality of dynamic rows of editable UI control elements.

In some embodiments, the computer-implemented system further comprises computer-readable instructions that, when executed, cause the computing device to perform operations comprising: displaying a plurality of DOE platform configuration UI control elements being configured to receive input for configuring the plurality of factor type UI control elements to a DOE platform of a plurality of DOE platforms, wherein each DOE platform of the plurality DOE platforms defines a distinct number of factor types that is selectably available for a respective factor type UI control element of the plurality of factor type UI control elements.

In some embodiments, a respective DOE platform configuration UI control element of the plurality of DOE platform configuration UI control elements, when operated, changes a current DOE platform of a target factor type UI control element of the plurality of factor type UI control elements to a selected DOE platform, and the selected DOE platform increases or decreases a number of factor type UI control elements available for selection when operating the target factor type UI control element.

In some embodiments, the composite factor UI control component comprises a plurality of UI control buttons native to an operating system implementing the GUI including: a factor addition control button that, when operated, adds one or more DOE factors to an end of the set of DOE factors, a factor subtraction control button that, when operated, removes one or more DOE factors from the end of the set of DOE factors, a factor deletion control button that, when operated, removes one or more selected DOE factors from an arbitrary position within the set of DOE factors; a factor control operation undo button that, when operated, reverts the DOE or the GUI to a previous state that includes erasing a last set of one or more changes to the DOE or the GUI; and a factor control operation redo button that, when operated, reverses one or more most recent in time operations of the factor control operation undo button.

In some embodiments, the current format of control elements corresponds to an incumbent factor type UI control element of the plurality of factor type UI control elements and the new format of control elements corresponds to a succeeding factor type UI control element of the plurality of factor type UI control elements that is selected in place of the incumbent factor type UI control element.

In some embodiments, the plurality of factor-setting UI control elements comprise a plurality of character edit boxes arranged in a column, and each of the plurality of character edit boxes is configured to receive input of one or more characters that define a target DOE factor of the set of DOE factors.

In some embodiments, a computer-program product embodied in a non-transitory machine-readable storage medium stores computer instructions that, when executed by one or more processors, perform operations comprising: receiving factor specification data that specifies a plurality of factors and one or more factor parameters of the plurality of factors for configuring a design of experiments; executing a factor type conversion for a target factor of the plurality of factors based on the factor specification data indicating a selection of a successor factor type selected from a plurality of factor types, wherein executing the factor type conversion includes: replacing, at a graphical user interface, a set of factor specification user interface elements that correspond to an incumbent factor type previously selected for the target factor with a second set of factor specification user interface elements that correspond to the successor factor type; and updating the design of experiments with an experiment design policy for the successor factor type, wherein the experiment design policy for the successor factor type controls a transformation of an underlying model of the design of experiments; executing a model transformation of the underlying model of the design of experiments based on the experiment design policy for the successor factor type, wherein executing the model transformation includes modifying one or more operational parameters of the underlying model to satisfy the experimental design policy for the successor factor type; and executing the design of experiments based at least on the factor specification data, the execution of the factor type conversion, and the execution of the model transformation.

In some embodiments, the set of factor specification user interface elements indicates a continuous range associated with the target factor, executing the factor type conversion for the target factor further includes: converting a minimum value and a maximum value of the continuous range to a character representation, defining a first categorical level based on the character representation of the minimum value, and defining a second categorical level based on the character representation of the maximum value, and the second set of factor specification user interface elements indicates a plurality of categorical levels associated with the target factor, including the first categorical level and the second categorical level.

In some embodiments, the set of factor specification user interface elements indicates a continuous range associated with the target factor, executing the factor type conversion for the target factor further includes: defining a first discrete numeric level based on a minimum value of the continuous range, and defining a second discrete numeric level based on a maximum value of the continuous range, and the second set of factor specification user interface elements indicates a plurality of discrete numeric levels associated with the target factor, including the first discrete numeric level and the second discrete numeric level.

In some embodiments, the set of factor specification user interface elements indicates a plurality of categorical levels associated with the target factor, executing the factor type conversion for the target factor further includes: identifying, from the plurality of categorical levels, a first categorical level and a second categorical level that satisfies one or more factor type conversion criteria, converting the first categorical level and the second categorical level to a numerical value, defining a minimum continuous value based on the numerical value of the first categorical level, and defining a maximum continuous value based on the numerical value of the second categorical level, and the second set of factor specification user interface elements indicates a continuous range associated with the target factor, including the minimum continuous value and the maximum continuous value of the target factor.

In some embodiments, the first categorical level and the second categorical level satisfy the one or more factor type conversion criteria when a value of the first categorical level and a value of the second categorical level correspond to a numerical string, and the first categorical level and the second categorical level do not satisfy the one or more factor type conversion criteria when the value of the first categorical level and the value of the second categorical level does not include the numerical string.

In some embodiments, the first categorical level and the second categorical level are not identified when the plurality of categorical levels do not include at least two categorical levels that satisfy the one or more factor type conversion criteria, when the first categorical level and the second categorical level are identified, executing the factor type conversion for the target factor includes: the converting of the first categorical level and the second categorical level to the numerical value, the defining of the minimum continuous value based on the numerical value of the first categorical level, and the defining of the maximum continuous value based on the numerical value of the second categorical level, and when the first categorical level and the second categorical level are not identified, executing the factor type conversion for the target factor includes: defining the minimum continuous value based on a pre-determined minimum value, and defining the maximum continuous value based on a pre-determined maximum value.

In some embodiments, the set of factor specification user interface elements indicates a plurality of categorical levels associated with the target factor, executing the factor type conversion for the target factor further includes: converting each of the plurality of categorical levels to a discrete numeric level, wherein the converting includes: in accordance with a determination that one or more factor type conversion criteria are satisfied: converting each of the plurality of categorical levels to a numerical value, and defining a first plurality of discrete numeric levels that each correspond to the numerical value of a respective one of the plurality of categorical levels, and the second set of factor specification user interface elements indicates a plurality of discrete numeric levels associated with the target factor, including the discrete numeric level corresponding to each of the plurality of categorical levels.

In some embodiments, the one or more factor type conversion criteria are satisfied when the plurality of categorical levels comprise a plurality of numerical strings, and the one or more factor type conversion criteria are not satisfied when the plurality of categorical levels do not comprise a plurality of numerical strings.

In some embodiments, converting each of the plurality of categorical levels to the discrete numeric level further includes: in accordance with a determination that the one or more factor type conversion criteria are not satisfied: mapping each of the plurality of categorical levels to a pre-determined discrete numeric value, and defining a second plurality of discrete numeric levels that each correspond to the pre-determined discrete numeric value mapped to a respective one of the plurality of categorical levels.

In some embodiments, the set of factor specification user interface elements indicates a plurality of discrete numeric levels associated with the target factor, including a minimum discrete numeric level and a maximum discrete numeric level of the target factor, executing the factor type conversion for the target factor further includes: defining a minimum continuous value based on the minimum discrete numeric level, and defining a maximum continuous value based on the maximum discrete numeric level, and the second set of factor specification user interface elements indicates a continuous range of the target factor, including the minimum continuous value and the maximum continuous value of the target factor.

In some embodiments, the set of factor specification user interface elements indicates a plurality of discrete numeric levels associated with the target factor, executing the factor type conversion for the target factor further includes: converting the plurality of discrete numeric levels to a character representation, and transforming each of the plurality of discrete numeric levels to a categorical level based on the converting, wherein each categorical level corresponds to the character representation of a respective one of the plurality of discrete numeric levels, and the second set of factor specification user interface elements indicates a plurality of categorical levels associated with the target factor, including the categorical level corresponding to each of the plurality of discrete numeric levels.

In some embodiments, executing the model transformation includes: adding, to the underlying model, a main effect model term that comprises the target factor when one or more first model transformation criteria are satisfied, adjusting, in the underlying model, one or more continuous model terms to have a single degree of freedom, preserving one or more model interaction terms present in the underlying model, preserving a power of one or more model terms in the underlying model, and adding, to underlying model, an intercept model term when one or more second model transformation criteria are satisfied.

In some embodiments, the one or more first model transformation criteria are satisfied when the main effect model term is not already included in the underlying model, and the one or more second model transformation criteria are satisfied when: the incumbent factor type corresponds to a mixture factor type, and a remainder of the plurality of factors in the factor specification data have a factor type that is different from the mixture factor type.

In some embodiments, executing the model transformation includes: adding, to the underlying model, a main effect model term that comprises the target factor when one or more first model transformation criteria are satisfied, removing, from the underlying model, one or more model terms that comprise the target factor with a power greater than one, setting, in the underlying model, the main effect model term to have a value of k−1 degrees of freedom, wherein k corresponds to a total number of categorical levels associated with the target factor, and adding, to the underlying model, an intercept model term when one or more second model transformation criteria are satisfied.

In some embodiments, executing the model transformation includes: adjusting, in the underlying model, one or more model terms that have a power to have a second power that is equivalent to a total number of discrete numeric levels associated with the target factor, adjusting, in the underlying model, one or more second model terms that do not have a power, wherein adjusting a target model term of the one or more second model terms includes: setting the target model term to have a first level of estimability when the target model term corresponds to a main effects model term, and setting the target model term to have a second level of estimability when the target model term corresponds to a model interaction term, preserving one or more model interaction terms present in the underlying model, and adding, to the underlying model, an intercept model term when one or more model transformation criteria are satisfied.

In some embodiments, a computed-implemented method comprises: receiving factor specification data that specifies a plurality of factors and one or more factor parameters of the plurality of factors for configuring a design of experiments; executing a factor type conversion for a target factor of the plurality of factors based on the factor specification data indicating a selection of a successor factor type selected from a plurality of factor types, wherein executing the factor type conversion includes: replacing, at a graphical user interface, a set of factor specification user interface elements that correspond to an incumbent factor type previously selected for the target factor with a second set of factor specification user interface elements that correspond to the successor factor type; and updating the design of experiments with an experiment design policy for the successor factor type, wherein the experiment design policy for the successor factor type controls a transformation of an underlying model of the design of experiments; executing a model transformation of the underlying model of the design of experiments based on the experiment design policy for the successor factor type, wherein executing the model transformation includes modifying one or more operational parameters of the underlying model to satisfy the experimental design policy for the successor factor type; and executing the design of experiments based at least on the factor specification data, the execution of the factor type conversion, and the execution of the model transformation.

In some embodiments, the set of factor specification user interface elements indicates a continuous range associated with the target factor, executing the factor type conversion for the target factor further includes: converting a minimum value and a maximum value of the continuous range to a character representation, defining a first categorical level based on the character representation of the minimum value, and defining a second categorical level based on the character representation of the maximum value, and the second set of factor specification user interface elements indicates a plurality of categorical levels associated with the target factor, including the first categorical level and the second categorical level.

In some embodiments, the set of factor specification user interface elements indicates a continuous range associated with the target factor, executing the factor type conversion for the target factor further includes: defining a first discrete numeric level based on a minimum value of the continuous range, and defining a second discrete numeric level based on a maximum value of the continuous range, and the second set of factor specification user interface elements indicates a plurality of discrete numeric levels associated with the target factor, including the first discrete numeric level and the second discrete numeric level.

In some embodiments, the set of factor specification user interface elements indicates a plurality of categorical levels associated with the target factor, executing the factor type conversion for the target factor further includes: identifying, from the plurality of categorical levels, a first categorical level and a second categorical level that satisfies one or more factor type conversion criteria, converting the first categorical level and the second categorical level to a numerical value, defining a minimum continuous value based on the numerical value of the first categorical level, and defining a maximum continuous value based on the numerical value of the second categorical level, and the second set of factor specification user interface elements indicates a continuous range associated with the target factor, including the minimum continuous value and the maximum continuous value of the target factor.

In some embodiments, the first categorical level and the second categorical level satisfy the one or more factor type conversion criteria when a value of the first categorical level and a value of the second categorical level correspond to a numerical string, and the first categorical level and the second categorical level do not satisfy the one or more factor type conversion criteria when the value of the first categorical level and the value of the second categorical level does not include the numerical string.

In some embodiments, the first categorical level and the second categorical level are not identified when the plurality of categorical levels do not include at least two categorical levels that satisfy the one or more factor type conversion criteria, when the first categorical level and the second categorical level are identified, executing the factor type conversion for the target factor includes: the converting of the first categorical level and the second categorical level to the numerical value, the defining of the minimum continuous value based on the numerical value of the first categorical level, and the defining of the maximum continuous value based on the numerical value of the second categorical level, and when the first categorical level and the second categorical level are not identified, executing the factor type conversion for the target factor includes: defining the minimum continuous value based on a pre-determined minimum value, and defining the maximum continuous value based on a pre-determined maximum value.

In some embodiments, the set of factor specification user interface elements indicates a plurality of categorical levels associated with the target factor, executing the factor type conversion for the target factor further includes: converting each of the plurality of categorical levels to a discrete numeric level, wherein the converting includes: in accordance with a determination that one or more factor type conversion criteria are satisfied: converting each of the plurality of categorical levels to a numerical value, and defining a first plurality of discrete numeric levels that each correspond to the numerical value of a respective one of the plurality of categorical levels, and the second set of factor specification user interface elements indicates a plurality of discrete numeric levels associated with the target factor, including the discrete numeric level corresponding to each of the plurality of categorical levels.

In some embodiments, executing the model transformation includes: adjusting, in the underlying model, one or more model terms that have a power to have a second power that is equivalent to a total number of discrete numeric levels associated with the target factor, adjusting, in the underlying model, one or more second model terms that do not have a power, wherein adjusting a target model term of the one or more second model terms includes: setting the target model term to have a first level of estimability when the target model term corresponds to a main effects model term, and setting the target model term to have a second level of estimability when the target model term corresponds to a model interaction term, preserving one or more model interaction terms present in the underlying model, and adding, to the underlying model, an intercept model term when one or more model transformation criteria are satisfied.

In some embodiments, a computer-implemented system comprises: one or more processors; a memory; a computer-readable medium operably coupled to the one or more processors, the computer-readable medium having computer-readable instructions stored thereon that, when executed by the one or more processors, cause a computing device to perform operations comprising: receiving factor specification data that specifies a plurality of factors and one or more factor parameters of the plurality of factors for configuring a design of experiments; executing a factor type conversion for a target factor of the plurality of factors based on the factor specification data indicating a selection of a successor factor type selected from a plurality of factor types, wherein executing the factor type conversion includes: replacing, at a graphical user interface, a set of factor specification user interface elements that correspond to an incumbent factor type previously selected for the target factor with a second set of factor specification user interface elements that correspond to the successor factor type; and updating the design of experiments with an experiment design policy for the successor factor type, wherein the experiment design policy for the successor factor type controls a transformation of an underlying model of the design of experiments; executing a model transformation of the underlying model of the design of experiments based on the experiment design policy for the successor factor type, wherein executing the model transformation includes modifying one or more operational parameters of the underlying model to satisfy the experimental design policy for the successor factor type; and executing the design of experiments based at least on the factor specification data, the execution of the factor type conversion, and the execution of the model transformation.

In some embodiments, the set of factor specification user interface elements indicates a plurality of discrete numeric levels associated with the target factor, including a minimum discrete numeric level and a maximum discrete numeric level of the target factor, executing the factor type conversion for the target factor further includes: defining a minimum continuous value based on the minimum discrete numeric level, and defining a maximum continuous value based on the maximum discrete numeric level, and the second set of factor specification user interface elements indicates a continuous range of the target factor, including the minimum continuous value and the maximum continuous value of the target factor.

In some embodiments, the set of factor specification user interface elements indicates a plurality of discrete numeric levels associated with the target factor, executing the factor type conversion for the target factor further includes: converting the plurality of discrete numeric levels to a character representation, and transforming each of the plurality of discrete numeric levels to a categorical level based on the converting, wherein each categorical level corresponds to the character representation of a respective one of the plurality of discrete numeric levels, and the second set of factor specification user interface elements indicates a plurality of categorical levels associated with the target factor, including the categorical level corresponding to each of the plurality of discrete numeric levels.

In some embodiments, executing the model transformation includes adding, to the underlying model, a main effect model term that comprises the target factor when one or more first model transformation criteria are satisfied, adjusting, in the underlying model, one or more continuous model terms to have a single degree of freedom, preserving one or more model interaction terms present in the underlying model, preserving a power of one or more model terms in the underlying model, and adding, to underlying model, an intercept model term when one or more second model transformation criteria are satisfied.

In some embodiments, the one or more first model transformation criteria are satisfied when the main effect model term is not already included in the underlying model, and the one or more second model transformation criteria are satisfied when: the incumbent factor type corresponds to a mixture factor type, and a remainder of the plurality of factors in the factor specification data have a factor type that is different from the mixture factor type.

In some embodiments, executing the model transformation includes: adding, to the underlying model, a main effect model term that comprises the target factor when one or more first model transformation criteria are satisfied, removing, from the underlying model, one or more model terms that comprise the target factor with a power greater than one, setting, in the underlying model, the main effect model term to have a value of k−1 degrees of freedom, wherein k corresponds to a total number of categorical levels associated with the target factor, and adding, to the underlying model, an intercept model term when one or more second model transformation criteria are satisfied.

In some embodiments, executing the model transformation includes: adjusting, in the underlying model, one or more model terms that have a power to have a second power that is equivalent to a total number of discrete numeric levels associated with the target factor, adjusting, in the underlying model, one or more second model terms that do not have a power, wherein adjusting a target model term of the one or more second model terms includes: setting the target model term to have a first level of estimability when the target model term corresponds to a main effects model term, and setting the target model term to have a second level of estimability when the target model term corresponds to a model interaction term, preserving one or more model interaction terms present in the underlying model, and adding, to the underlying model, an intercept model term when one or more model transformation criteria are satisfied.

BRIEF DESCRIPTION OF THE FIGURES

FIGS. 8-38 illustrate example design of experiments (DoE) factor specification user interfaces according to at least one embodiment of the present technology.

FIG. 39 illustrates an example flow chart for performing factor type conversions and model transformations in a design of experiments according to at least one embodiment of the present technology.

FIGS. 41-80 illustrate example factor type conversions and model transformations executed by methods 700 and/or 3900 according to at least one embodiment of the present technology.

DESCRIPTION OF THE PREFERRED EMBODIMENTS

The following description of the preferred embodiments of the inventions are not intended to limit the inventions to these preferred embodiments, but rather to enable any person skilled in the art to make and use these inventions.

DETAILED DESCRIPTION

In the following description, for the purposes of explanation, specific details are set forth in order to provide a thorough understanding of embodiments of the technology. However, it will be apparent that various embodiments may be practiced without these specific details. The figures and description are not intended to be restrictive.

The ensuing description provides example embodiments only, and is not intended to limit the scope, applicability, or configuration of the disclosure. Rather, the ensuing description of the example embodiments will provide those skilled in the art with an enabling description for implementing an example embodiment. It should be understood that various changes may be made in the function and arrangement of elements without departing from the spirit and scope of the technology as set forth in the appended claims.

Specific details are given in the following description to provide a thorough understanding of the embodiments. However, it will be understood by one of ordinary skill in the art that the embodiments may be practiced without these specific details. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional operations not included in a figure. A process may correspond to a method, a function, a procedure, a subroutine, a subprogram, etc. When a process corresponds to a function, its termination can correspond to a return of the function to the calling function or the main function.

Example Systems

Systems depicted in some of the figures may be provided in various configurations. In some embodiments, the systems may be configured as a distributed system where one or more components of the system are distributed across one or more networks in a cloud computing system.

Figure 1:
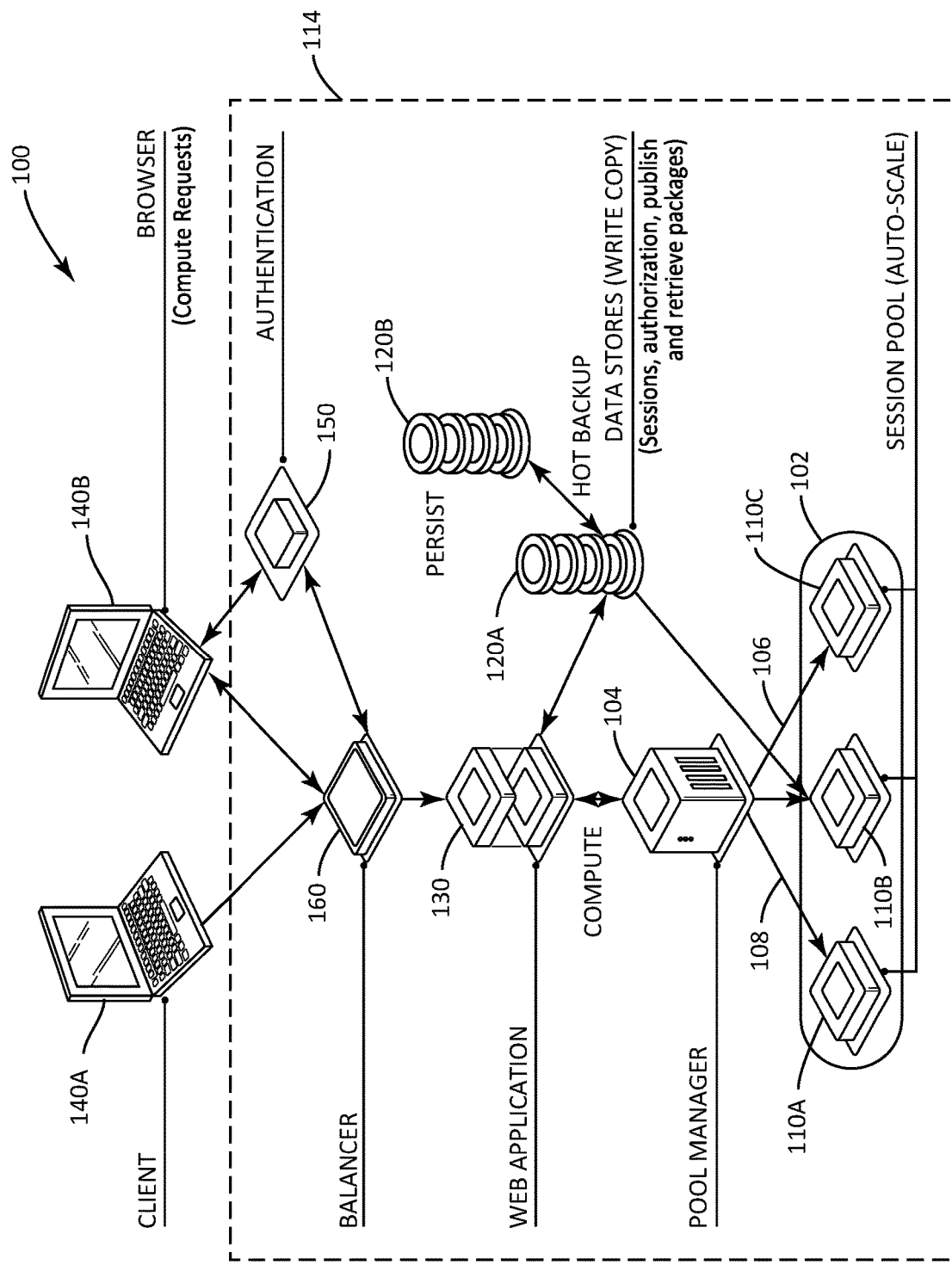
FIG. 1 illustrates an example network, including an example set of devices communicating with each other, according to at least one embodiment of the present technology.

FIG. 1 illustrates an example network 100 including an example set of devices communicating with each other (e.g., over one or more of an exchange system or a network), according to embodiments of the present technology. Network 100 includes network devices configured to communicate with a variety of types of client devices, for example, client devices 140, over a variety of types of communication channels. A client device 140 may be configured to communicate over a public or private network (e.g., client device 140B is configured to support a browser for computing requests or providing authentication).

Network devices and client devices can transmit a communication over a network 100. Network 100 may include one or more of different types of networks, including a wireless network, a wired network, or a combination of a wired and wireless network. Examples of suitable networks include the Internet, a personal area network, a local area network (LAN), a wide area network (WAN), a wireless local area network (WLAN), cloud network, or a cellular network. A wireless network may include a wireless interface or combination of wireless interfaces. As an example, a network in the one or more networks may include a short-range communication channel, such as a Bluetooth or a Bluetooth Low Energy channel. A wired network may include a wired interface. The wired and/or wireless networks may be implemented using routers, access points, base stations, bridges, gateways, or the like, to connect devices in the network. The one or more networks can be incorporated entirely within or can include an intranet, an extranet, or a combination thereof. In one embodiment, communications between two or more systems and/or devices can be achieved by a secure communications protocol, such as secure sockets layer (SSL) or transport layer security (TLS), or other available protocols such as according to an Open Systems Interaction model. In addition, data and/or transactional details may be encrypted. Networks may include other devices for infrastructure for the network. For example, a cloud network may include cloud infrastructure system on demand. As another example, one or more client devices may utilize an Internet of Things (IoT) infrastructure where things (e.g., machines, devices, phones, sensors) can be connected to networks and the data from these things can be collected and processed within the things and/or external to the things. IoT may be implemented with various infrastructure such as for accessibility (technologies that get data and move it), embed-ability (devices with embedded sensors), and IoT services. Industries in the IoT space may include automotive (connected car), manufacturing (connected factory), smart cities, energy and retail.

Network devices and client devices can be different types of devices or components of devices. For example, client device 140 is shown as a laptop and balancer 160 is shown as a processor. Client devices and network devices could be other types of devices or components of other types of devices such as a mobile phone, laptop computer, tablet computer, temperature sensor, motion sensor, and audio sensor. Additionally, or alternatively, the network devices may be or include sensors that are sensitive to detecting aspects of their environment. For example, the network devices may include sensors such as water sensors, power sensors, electrical current sensors, chemical sensors, optical sensors, pressure sensors, geographic or position sensors (e.g., GPS), velocity sensors, acceleration sensors, and flow rate sensors. Examples of characteristics that may be sensed include force, torque, load, strain, position, temperature, air pressure, fluid flow, chemical properties, resistance, electromagnetic fields, radiation, irradiance, proximity, acoustics, moisture, distance, speed, vibrations, acceleration, electrical potential, and electrical current. The sensors may be mounted to various components used as part of a variety of different types of systems (e.g., an oil drilling operation). The network devices may detect and record data related to the environment that it monitors, and transmit that data to network 100.

As noted, one type of system that may include various sensors that collect data to be processed and/or transmitted to a computing environment (not shown) according to certain embodiments includes an oil drilling system. For example, the one or more drilling operation sensors may include, for example, surface sensors that measure a stand-pipe pressure, a surface torque, and a rotation speed of a drill pipe, and downhole sensors that measure a rotation speed of a bit and fluid densities. Besides the raw data collected directly by the sensors, other data may include parameters either developed by the sensors or assigned to the system by a client or other controlling device. For example, one or more drilling operation control parameters may control settings such as a mud motor speed to flow ratio, a bit diameter, a predicted formation top, seismic data, weather data, etc. Other data may be generated using physical models such as an earth model, a weather model, a seismic model, a bottom hole assembly model, a well plan model, an annular friction model, etc. In addition to sensor and control settings, predicted outputs, of for example, the rate of penetration and pump pressure may also be stored and used for modeling, prediction, or classification.

In another example, another type of system that may include various sensors that collect data to be processed and/or transmitted to a computing environment according to certain embodiments includes a home automation or similar automated network in a different environment, such as an office space, school, public space, sports venue, or a variety of other locations. Network devices in such an automated network may include network devices that allow a user to access, control, and/or configure various home appliances located within the user's home (e.g., a television, radio, light, fan, humidifier, sensor, microwave, iron, and/or the like), or outside of the user's home (e.g., exterior motion sensors, exterior lighting, garage door openers, sprinkler systems, or the like). For example, network device or client device may include a home automation switch that may be coupled with a home appliance. In another embodiment, a network or client device can allow a user to access, control, and/or configure devices, such as office-related devices (e.g., copy machine, printer, or fax machine), audio and/or video related devices (e.g., a receiver, a speaker, a projector, a DVD player, or a television), media-playback devices (e.g., a compact disc player, a CD player, or the like), computing devices (e.g., a home computer, a laptop computer, a tablet, a personal digital assistant (PDA), a computing device, or a wearable device), lighting devices (e.g., a lamp or recessed lighting), devices associated with a security system, devices associated with an alarm system, devices that can be operated in an automobile (e.g., radio devices, navigation devices), and/or the like. Data may be collected from such various sensors in raw form, or data may be processed by the sensors to create parameters or other data either developed by the sensors based on the raw data or assigned to the system by a client or other controlling device.

In another example, another type of system that may include various sensors that collect data to be processed and/or transmitted to a computing environment (e.g., computing environment or another computing environment not shown) according to certain embodiments includes a manufacturing environment (e.g., manufacturing products or energy). A variety of different network devices may be included in an energy pool, such as various devices within one or more power plants, energy farms (e.g., wind farm, and solar farm) energy storage facilities, factories, homes and businesses of consumers. One or more of such devices may include one or more sensors that detect energy gain or loss, electrical input or output or loss, and a variety of other efficiencies. These sensors may collect data to inform users of how the energy pool, and individual devices within the pool, may be functioning and how they may be made more efficient. In a manufacturing environment, image data can be taken of the manufacturing process or other readings of manufacturing equipment. For example, in a semiconductor manufacturing environment, images can be used to track, for example, process points (e.g., movement from a bonding site to a packaging site), and process parameters (e.g., bonding force, electrical properties across a bond of an integrated circuit).

Network device sensors may also perform processing on data it collects before transmitting the data to a computing environment, or before deciding whether to transmit data to a computing environment. For example, network devices may determine whether data collected meets certain rules, for example by comparing data or values calculated from the data and comparing that data to one or more thresholds. The network device may use this data and/or comparisons to determine if the data should be transmitted to a computing environment for further use or processing.

Devices in computing environment 114 may include specialized computers, servers, or other machines that are configured to individually and/or collectively process large amounts of data (e.g., using a session pool 102). The computing environment 114 may also include storage devices (e.g., data stores 120) that include one or more databases of structured data, such as data organized in one or more hierarchies, or unstructured data. The databases may communicate with the processing devices within computing environment 114 to distribute data to them and store data used in the computing environment 114. Computing environment 114 may collect, analyze and/or store data from or pertaining to communications, client device operations, client rules, and/or user-associated actions stored at one or more devices in computing environment 114. Such data may influence communication routing to the devices within computing environment 114, and how data is stored or processed within computing environment 114, among other actions.

Network 100 may also include one or more network-attached data stores 120. Network-attached data stores 120 are used to store data to be processed by the computing environment 114 as well as any intermediate or final data generated by the computing system in non-volatile memory. For instance, data stores 120 can perform functions such as writing and copying data and can provide data storage for network functions such as sessions, authorization, publishing and retrieving packages. In certain embodiments, the configuration of the computing environment 114 allows its operations to be performed such that intermediate and final data results can be stored solely in volatile memory (e.g., RAM), without a requirement that intermediate or final data results be stored to non-volatile types of memory (e.g., disk). This can be useful in certain situations, such as when the computing environment 114 receives ad hoc queries from a user and when responses, which are generated by processing large amounts of data, need to be generated on-the-fly. In this non-limiting situation, the computing environment 114 may be configured to retain the processed information within memory so that responses can be generated for the user at different levels of detail as well as allow a user to interactively query against this information.

Network-attached data stores 120 may store a variety of different types of data organized in a variety of different ways and from a variety of different sources. For example, network-attached data stores 120 may include storage other than primary storage located within computing environment 114 that is directly accessible by processors located therein. Network-attached data stores 120 may include secondary, tertiary, auxiliary, or back-up storage (e.g., data storage 120B), such as large hard drives, servers, and virtual memory, among other types. Storage devices may include portable or non-portable storage devices, optical storage devices, and various other mediums capable of storing and containing data (e.g., computer a machine-readable storage medium or computer-readable storage medium such as computer readable medium 210 in FIG. 2).

Furthermore, the data stores may hold a variety of different types of data. For example, network-attached data stores 120 may hold unstructured (e.g., raw) data, such as manufacturing data (e.g., a database containing records identifying products being manufactured with parameter data for each product, such as performance metrics or criteria) or product sales databases (e.g., a database containing individual data records identifying details of individual product performance).

The unstructured data may be presented to the computing environment 114 in different forms such as a flat file or a conglomerate of data records and may have data values and accompanying time stamps. The computing environment 114 may be used to analyze the unstructured data in a variety of ways to determine the best way to structure (e.g., hierarchically) that data, such that the structured data is tailored to a type of further analysis on the data. For example, after being processed, the unstructured time stamped data may be aggregated by time (e.g., into daily time period units) to generate time series data and/or structured hierarchically according to one or more dimensions (e.g., parameters, attributes, and/or variables). For example, data may be stored in a hierarchical data structure, such as a ROLAP OR MOLAP database, or may be stored in another tabular form, such as in a flat-hierarchy form.

Other devices can further be used to influence communication routing and/or processing between devices within computing environment 114 and with devices outside of computing environment 114. For example, as shown in FIG. 1, computing environment 114 may include a device 130 supporting a web application. Thus, computing environment 114 can retrieve data of interest, such as client information (e.g., product information, client rules, etc.), technical product details, news, current or predicted weather, and so on. Balancer 160 can be used to balance and direct load within the computing environment 114. Authentication device 150 can be used to provide authentication or other security protocols for a client device, user or group accessing computing environment 114.

In addition to computing environment 114 collecting data (e.g., as received from network devices, such as sensors, and client devices or other sources) to be processed as part of a big data analytics project, it may also receive data in real time as part of a streaming analytics environment. As noted, data may be collected using a variety of sources as communicated via different kinds of networks or locally. Such data may be received on a real-time streaming basis. For example, network devices may receive data periodically from sensors as the sensors continuously sense, monitor and track changes in their environments. Devices within computing environment 114 may also perform pre-analysis on data it receives to determine if the data received should be processed as part of an ongoing project. The data received and collected by computing environment 114, no matter what the source or method or timing of receipt, may be processed over a period of time for a client to determine results data based on the client's needs and rules.

FIG. 1 includes a pool of devices with a pool manager 104 and session pool 102. Network 100 includes a variety of pool managers (e.g., pool manager 104) and worker nodes 110 (e.g., devices, servers, or server farms of session pool 102), according to embodiments of the present technology. Devices of session pool 102 are communicatively connected (e.g., via communication path 108 and communication path 106). Therefore, the pool manager may transmit information (e.g., related to the session pool 102 or notifications), to and receive information from each other. Although only one pool manager 104 is shown in FIG. 1, the network 100 may include more pool managers or a different kind of device manager (e.g., a dedicated resource manager).

Session pool 102 includes one or more worker nodes (e.g., worker node 110A). Shown in FIG. 1 are three worker nodes 110A-C merely for illustration, more or less worker nodes could be present. For instance, the pool manager 104 may itself be a worker node and may not need further worker nodes to complete a task. A given worker node could include dedicated computing resources or allocated computing resources as needed to perform operations as directed by the pool manager 104. The number of worker nodes included in a session pool 102 may be dependent, for example, upon how large the project or data set is being processed by the session pool 102, the capacity of each worker node, and the time designated for the session pool 102 to complete the project. Each worker node within the session pool 102 may be connected (wired or wirelessly, and directly or indirectly) to pool manager 104. Therefore, each worker node may receive information from the pool manager 104 (e.g., an instruction to perform work on a project) and may transmit information to the pool manager 104 (e.g., a result from work performed on a project). Furthermore, worker nodes 110 may communicate with each other (either directly or indirectly). For example, worker nodes 110 may transmit data between each other related to a job being performed or an individual task within a job being performed by that worker node. However, in certain embodiments, worker nodes 110 may not, for example, be connected (communicatively or otherwise) to certain other worker nodes. In an embodiment, worker nodes may only be able to communicate with the pool manager 104 that controls it, and may not be able to communicate with other worker nodes in the session pool 102.

The pool manager 104 may connect with other devices of network 100 or an external device (e.g., a pool user, such as a server or computer). For example, a server or computer may connect to pool manager 104 and may transmit a project or job to the node. The project may include a data set. The data set may be of any size. Once the pool manager 104 receives such a project including a large data set, the pool manager 104 may distribute the data set or projects related to the data set to be performed by worker nodes 110. Alternatively, for a project including a large data set, the data set may be received or stored by a machine other than a pool manager 104 or worker node 110 (e.g., a Hadoop data node).

Pool manager may maintain knowledge of the status of the worker nodes 110 in the session pool 102 (i.e., status information), accept work requests from clients, subdivide the work across worker nodes 110, and coordinate the worker nodes 110, among other responsibilities. Worker nodes 110 may accept work requests from a pool manager 104 and provide the pool manager 104 with results of the work performed by the worker nodes 110. A session pool 102 may be started from a single node (e.g., a machine, computer, server, etc.). This first node may be assigned or may start as the primary pool manager 104 that will control any additional nodes that enter the session pool 102.

When a project is submitted for execution (e.g., by a client or a pool manger 104), it may be assigned to a set of nodes. After the nodes are assigned to a project, a data structure (i.e., a communicator) may be created. The communicator may be used by the project for information to be shared between the project code running on each node. A communication handle may be created on each node. A handle, for example, is a reference to the communicator that is valid within a single process on a single node, and the handle may be used when requesting communications between nodes.

A pool manager may be designated as the primary pool manager among multiple pool managers. A server, computer or other external device may connect to the primary pool manager. Once the pool manager receives a project, the primary pool manager may distribute portions of the project to its worker nodes for execution. For example, when a project is initiated on session pool 102, primary pool manager 104 controls the work to be performed for the project to complete the project as requested or instructed. The primary pool manager may distribute work to the worker nodes 110 based on various factors, such as which subsets or portions of projects may be completed most efficiently and in the correct amount of time. For example, a worker node may perform analysis on a portion of data that is already local (e.g., stored on) the worker node. The primary pool manager also coordinates and processes the results of the work performed by each worker node after each worker node executes and completes its job. For example, the primary pool manager may receive a result from one or more worker nodes, and the pool manager may organize (e.g., collect and assemble) the results received and compile them to produce a complete result for the project received from the end user.

Any remaining pool manager (not shown) may be assigned as backup pool manager for the project. In an embodiment, backup pool manager may not control any portion of the project. Instead, backup pool manager may serve as a backup for the primary pool manager and take over as primary pool manager if the primary pool manager were to fail.

To add another node or machine to the session pool 102, the primary pool manager may open a pair of listening sockets, for example. A socket may be used to accept work requests from clients, and the second socket may be used to accept connections from other pool nodes. The primary pool manager may be provided with a list of other nodes (e.g., other machines, computers, servers) that will participate in the pool, and the role that each node will fill in the pool. Upon startup of the primary pool manager (e.g., the first node on the pool), the primary pool manager may use a network protocol to start the server process on every other node in the session pool 102. Command line parameters, for example, may inform each node of one or more pieces of information, such as: the role that the node will have in the pool, the host name of the primary pool manager, and the port number on which the primary pool manager is accepting connections from peer nodes. The information may also be provided in a configuration file, transmitted over a secure shell tunnel, and recovered from a configuration server. While the other machines in the pool may not initially know about the configuration of the pool, that information may also be sent to each other node by the primary pool manager. Updates of the pool information may also be subsequently sent to those nodes.

For any pool manager other than the primary pool manager added to the pool, the pool manager may open multiple sockets. For example, the first socket may accept work requests from clients, the second socket may accept connections from other pool members, and the third socket may connect (e.g., permanently) to the primary pool manager. When a pool manager (e.g., primary pool manager) receives a connection from another pool manager, it first checks to see if the peer node is in the list of configured nodes in the pool. If it is not on the list, the pool manager may clear the connection. If it is on the list, it may then attempt to authenticate the connection. If authentication is successful, the authenticating node may transmit information to its peer, such as the port number on which a node is listening for connections, the host name of the node, and information about how to authenticate the node, among other information. When a node, such as the new pool manager, receives information about another active node, it will check to see if it already has a connection to that other node. If it does not have a connection to that node, it may then establish a connection to that pool manager.

Any worker node added to the pool may establish a connection to the primary pool manager and any other pool manager on the pool. After establishing the connection, it may authenticate itself to the pool (e.g., any pool manager, including both primary and backup, or a server or user controlling the pool). After successful authentication, the worker node may accept configuration information from the pool manager.

When a node joins a session pool 102 (e.g., when the node is powered on or connected to an existing node on the pool or both), the node is assigned (e.g., by an operating system of the pool) an identifier (e.g., a universally unique identifier (UUID)). This identifier may help other nodes and external entities (devices, users, etc.) to identify the node and distinguish it from other nodes. When a node is connected to the pool, the node may share its identifier with the other nodes in the pool. Since each node may share its identifier, each node may know the identifier of every other node on the pool. Identifiers may also designate a hierarchy of each of the nodes (e.g., backup pool manager) within the pool. For example, the identifiers of each of the backup pool manager may be stored in a list of backup pool manager to indicate an order in which the backup pool manager will take over for a failed primary pool manager to become a new primary pool manager. However, a hierarchy of nodes may also be determined using methods other than using the unique identifiers of the nodes. For example, the hierarchy may be predetermined, or may be assigned based on other predetermined factors.

The pool may add new machines at any time (e.g., initiated from any pool manager). Upon adding a new node to the pool, the pool manager may first add the new node to its table of pool nodes. The pool manager may also then notify every other pool manager about the new node. The nodes receiving the notification may acknowledge that they have updated their configuration information.

Primary pool manager 104 may, for example, transmit one or more communications to backup pool manager or other control or worker nodes within the session pool 102). Such communications may be sent using protocols such as periodically, at fixed time intervals, or between known fixed stages of the project's execution. The communications transmitted by primary pool manager 104 may be of varied types and may include a variety of types of information. For example, primary pool manager 104 may transmit snapshots (e.g., status information) of the session pool 102 so that backup pool manager 104 always has a recent snapshot of the session pool 102. The snapshot or pool status may include, for example, the structure of the pool (including, for example, the worker nodes in the pool, unique identifiers of the nodes, or their relationships with the primary pool manager) and the status of a project (including, for example, the status of each worker node's portion of the project). The snapshot may also include analysis or results received from worker nodes in the session pool 102. The backup pool manager may receive and store the backup data received from the primary pool manager. The backup pool manager may transmit a request for such a snapshot (or other information) from the primary pool manager, or the primary pool manager may send such information periodically to the backup pool manager.

As noted, the backup data may allow the backup pool manager to take over as primary pool manager if the primary pool manager fails without requiring the pool to start the project over from scratch. If the primary pool manager fails, the backup pool manager that will take over as primary pool manager may retrieve the most recent version of the snapshot received from the primary pool manager and use the snapshot to continue the project from the stage of the project indicated by the backup data. This may prevent failure of the project as a whole.

A backup pool manager may use various methods to determine that the primary pool manager has failed. In one example of such a method, the primary pool manager may transmit (e.g., periodically) a communication to the backup pool manager that indicates that the primary pool manager is working and has not failed, such as a heartbeat communication. The backup pool manager may determine that the primary pool manager has failed if the backup pool manager has not received a heartbeat communication for a certain predetermined period of time. Alternatively, a backup pool manager may also receive a communication from the primary pool manager itself (before it failed) or from a worker node that the primary pool manager has failed, for example because the primary pool manager has failed to communicate with the worker node.

Different methods may be performed to determine which backup pool manager of a set of backup pool manager will take over for failed primary pool manager 104 and become the new primary pool manager. For example, the new primary pool manager may be chosen based on a ranking or "hierarchy" of backup pool manager based on their unique identifiers. In an alternative embodiment, a backup pool manager may be assigned to be the new primary pool manager by another device in the session pool 102 or from an external device (e.g., a system infrastructure or an end user, such as a server or computer, controlling the session pool 102). In another alternative embodiment, the backup pool manager that takes over as the new primary pool manager may be designated based on bandwidth or other statistics about the session pool 102.

A worker node within the session pool 102 may also fail. If a worker node fails, work being performed by the failed worker node may be redistributed amongst the operational worker nodes. In an alternative embodiment, the primary pool manager may transmit a communication to each of the operable worker nodes still on the session pool 102 that each of the worker nodes should purposefully fail also. After each of the worker nodes fail, they may each retrieve their most recent saved checkpoint of their status and re-start the project from that checkpoint to minimize lost progress on the project being executed.

Figure 2:
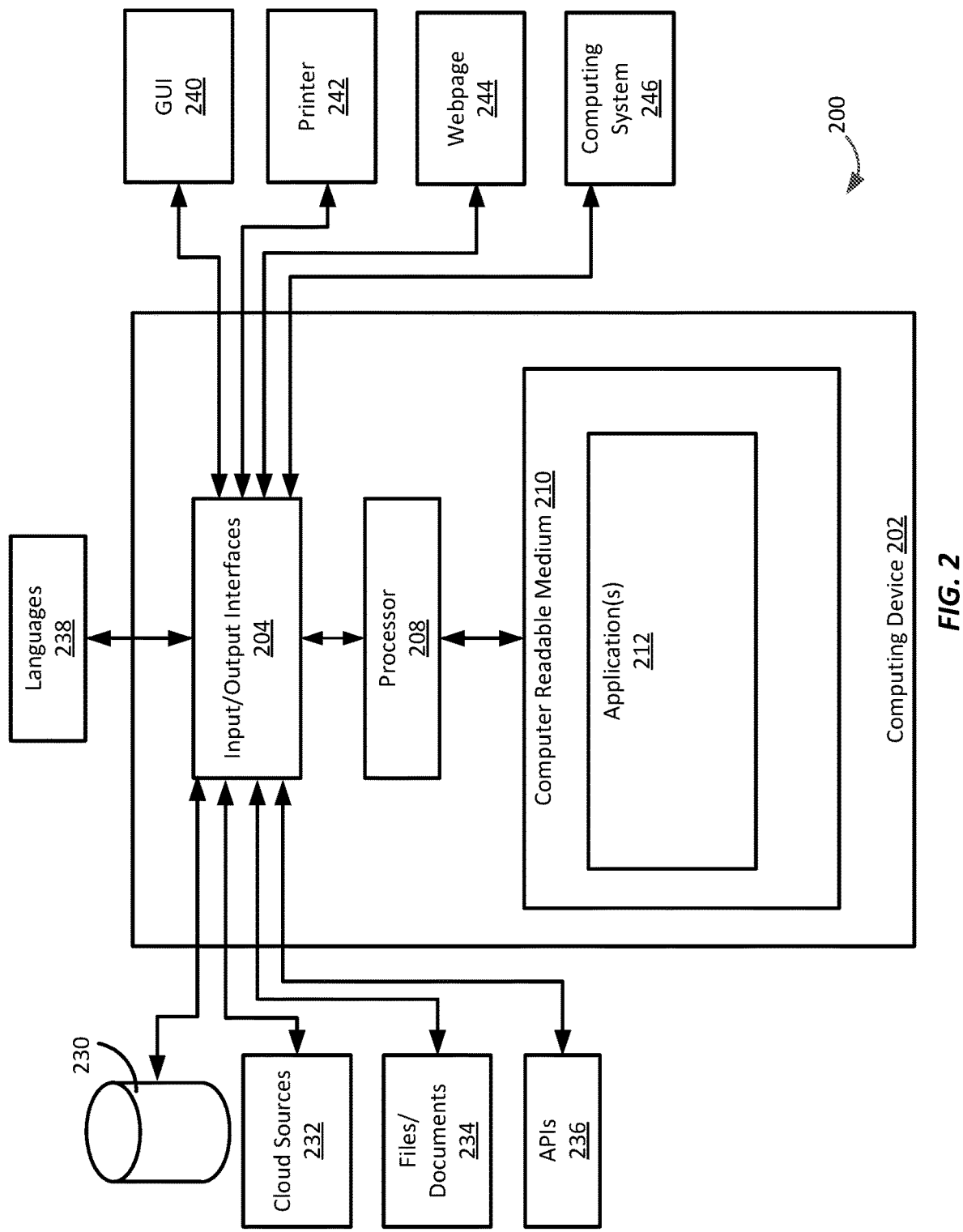
FIG. 2 illustrates a block diagram that provides an illustration of the hardware components of a computing system according to at least one embodiment of the present technology.

While each device in FIG. 1 is shown as a single device, it will be appreciated that multiple devices may instead be used. FIG. 2 shows an example computing structure for a device in FIG. 1. FIG. 2 includes a computing device 202. The computing device 202 has a computer-readable medium 210 and a processor 208. Computer-readable medium 210 is an electronic holding place or storage for information so the information can be accessed by processor 208. The computer readable medium 210 is a non-transitory medium in which data can be stored and that does not include carrier waves and/or transitory electronic signals. Examples of a non-transitory medium may include, for example, a magnetic disk or tape, optical storage media such as compact disk or digital versatile disk, flash memory, memory or memory devices. A computer-program product may include code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including, for example, memory sharing, message passing, token passing, and network transmission. Computer-readable medium 210 can include, but is not limited to, any type of random-access memory (RAM), any type of read only memory (ROM), any type of flash memory, etc. such as magnetic storage devices (e.g., hard disk, floppy disk, magnetic strips), optical disks (e.g., compact disc (CD), digital versatile disc (DVD)), smart cards, flash memory devices, etc.

Processor 208 executes instructions (e.g., stored at the computer-readable medium 210). The instructions can be carried out by a special purpose computer, logic circuits, or hardware circuits. In one or more embodiments, processor 208 is implemented in hardware and/or firmware. Processor 208 executes an instruction, meaning it performs or controls the operations called for by that instruction. The term "execution" is the process of running an application or the carrying out of the operation called for by an instruction. The instructions can be written using one or more programming language, scripting language, assembly language, etc. Processor 208 in one or more embodiments can retrieve a set of instructions from a permanent memory device and copy the instructions in an executable form to a temporary memory device that is generally some form of RAM, for example.

Processor 208 operably couples with components of computing device 202 (e.g., input/output interface 204 and with computer readable medium 210) to receive, to send, and to process information.

For instance, in one or more embodiments, computing device 202 sends and/or receives information from one or more of databases 230, cloud sources 232, application programming interfaces 236 (API's), graphical user interfaces 240 (GUIs), printers 242, webpages 244, and computing systems 246. The input/output interface 204 may be configured to receive languages 238 (e.g., to communicate with other computing systems 246) or specific electronic files or documents 234 (e.g., inputs for building models or designing experiments). The input/output interface 204 may be a single interface (e.g., an output interface only to output reports to a printer 242), multiple interface (e.g., a graphical user interface 240 may be interactive and send and receive data over input/output interface 204), or a set of interfaces (e.g., to connect with multiple devices).

In one or more embodiments, computer-readable medium 210 stores instructions for execution by processor 208. In one or more embodiments, one or more applications stored on computer-readable medium 210 are implemented in software (e.g., computer-readable and/or computer-executable instructions) stored in computer-readable medium 210 and accessible by processor 208 for execution of the instructions.

Figure 3:
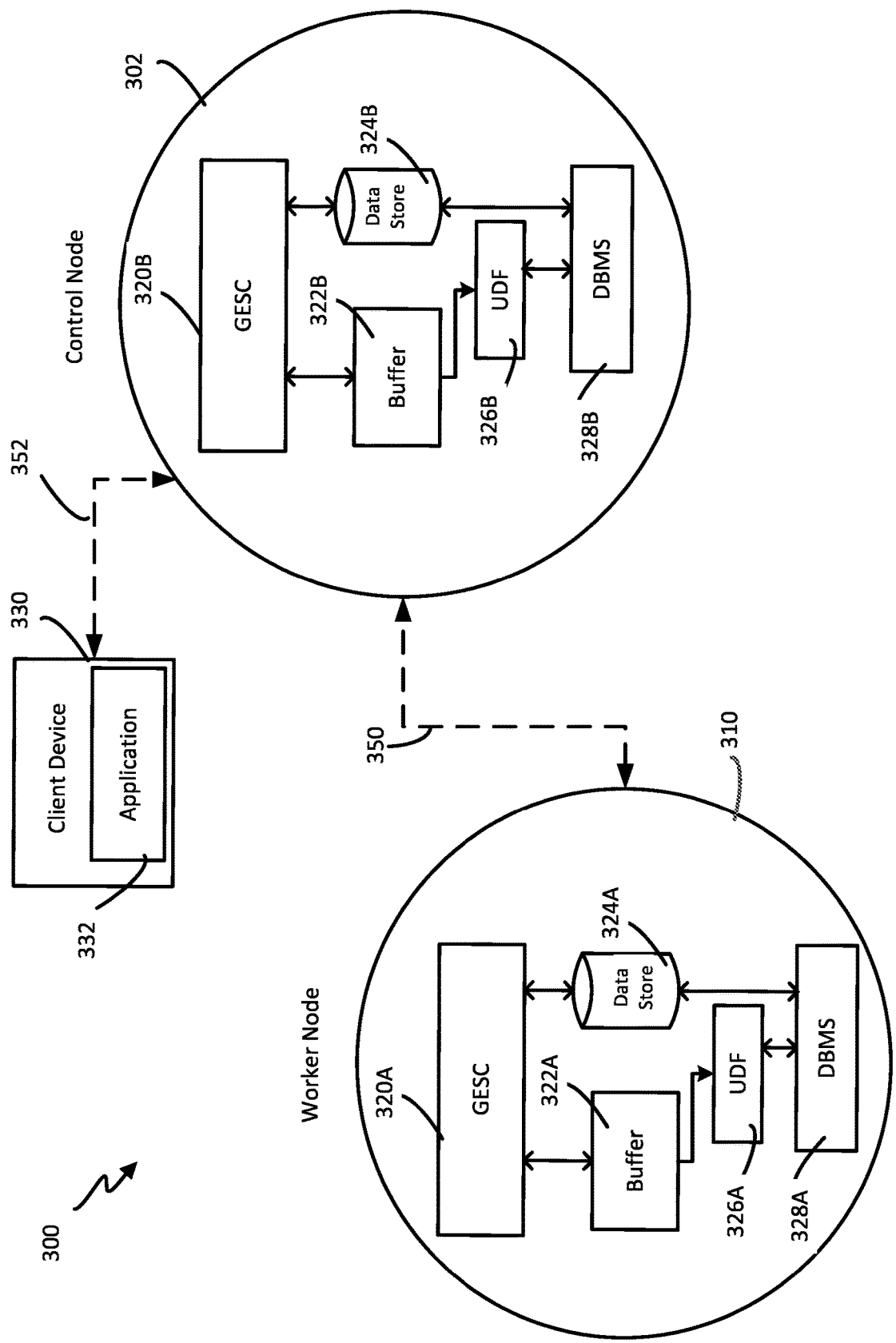
FIG. 3 illustrates a portion of a communications grid computing system, including a control node and a worker node, according to at least one embodiment of the present technology.

FIG. 3 illustrates a system 300 including a control node (e.g., pool manager 104 of FIG. 1) and a worker node (e.g., worker nodes 110 of FIG. 1), according to embodiments of the present technology. System 300 includes one control node (control node 302) and one worker node (worker node 310) for purposes of illustration but may include more worker and/or control node. The control node 302 is communicatively connected to worker node 310 via communication path 350. Therefore, control node 302 may transmit information (e.g., related to the session pool 102 or notifications), to and receive information from worker node 310 via path 350.

System 300 includes data processing nodes (e.g., control node 302 and worker node 310). Control node 302 and worker node 310 can include multi-core data processors. Each control node 302 and worker node 310 in this example includes a grid-enabled software component (GESC) 320 that executes on the data processor associated with that node and interfaces with buffer memory 322 also associated with that node. Each control node 302 and worker node 310 in this example includes a database management software (DBMS) 328 that executes on a database server (not shown) at control node 302 and on a database server (not shown) at worker node 310.

Each control node 302 and worker node 310 in this example also includes a data storage 324. Data storage 324, similar to network-attached data stores 120 in FIG. 1, are used to store data to be processed by the nodes in the computing environment. Data storage 324 may also store any intermediate or final data generated by the computing system after being processed, for example in non-volatile memory. However, in certain embodiments, the configuration of the system 300 allows its operations to be performed such that intermediate and final data results can be stored solely in volatile memory (e.g., RAM), without a requirement that intermediate or final data results be stored to non-volatile types of memory. Storing such data in volatile memory may be useful in certain situations, such as when the pool receives queries (e.g., ad hoc) from a client device 330 and when responses, which are generated by processing large amounts of data, need to be generated quickly or on-the-fly. In such a situation, the pool may be configured to retain the data within memory so that responses can be generated at different levels of detail and so that a client may interactively query against this information.

Each control node 302 and worker node 310 in this example also includes a user-defined function (UDF) 326. The UDF 326 provides a mechanism for the DBMS 328 to transfer data to or receive data from the database stored in the data storage 324 that are managed by the DBMS. For example, UDF 326 can be invoked by the DBMS 328 to provide data to the GESC 320 for processing. The UDF 326 may establish a socket connection (not shown) with the GESC 320 to transfer the data. Alternatively, the UDF 326 can transfer data to the GESC 320 by writing data to shared memory accessible by both the UDF 326 and the GESC 320.

The GESC 320 at the control node 302 and worker node 310 may be connected via a network. Therefore, control node 302 and worker node 310 can communicate with each other via the network using a predetermined communication protocol such as, for example, the Message Passing Interface (MPI). Each GESC 320 can engage in point-to-point communication with the GESC at another node or in collective communication with multiple GESCs via the network. The GESC 320 at each node may contain identical (or nearly identical) software instructions. Each control node 302 and worker node 310 may be configured to operate as either a pool manager or a worker node. The GESC 320B at the control node 302 can communicate, over a communication path 352, with a client device 330. More specifically, control node 302 may communicate with client application 332 hosted by the client device 330 to receive queries and to respond to those queries after processing large amounts of data.

DBMS 328 may control the creation, maintenance, and use of database or data structure (not shown) within control node 302 and worker node 310. The database may organize data stored in data storage 324. The DBMS 328 at control node 302 may accept requests for data and transfer the appropriate data for the request. With such a process, collections of data may be distributed across multiple physical locations. In this example, each control node 302 and worker node 310 stores a portion of the total data managed by the management system in its associated data storage 324.

Furthermore, the DBMS 328 may be responsible for protecting against data loss using replication techniques. Replication includes providing a backup copy of data stored on one node on one or more other nodes. Therefore, if one node fails, the data from the failed node can be recovered from a replicated copy residing at another node. Data or status information for each node in the session pool 102 may also be shared with each node on the pool.

Figure 4:
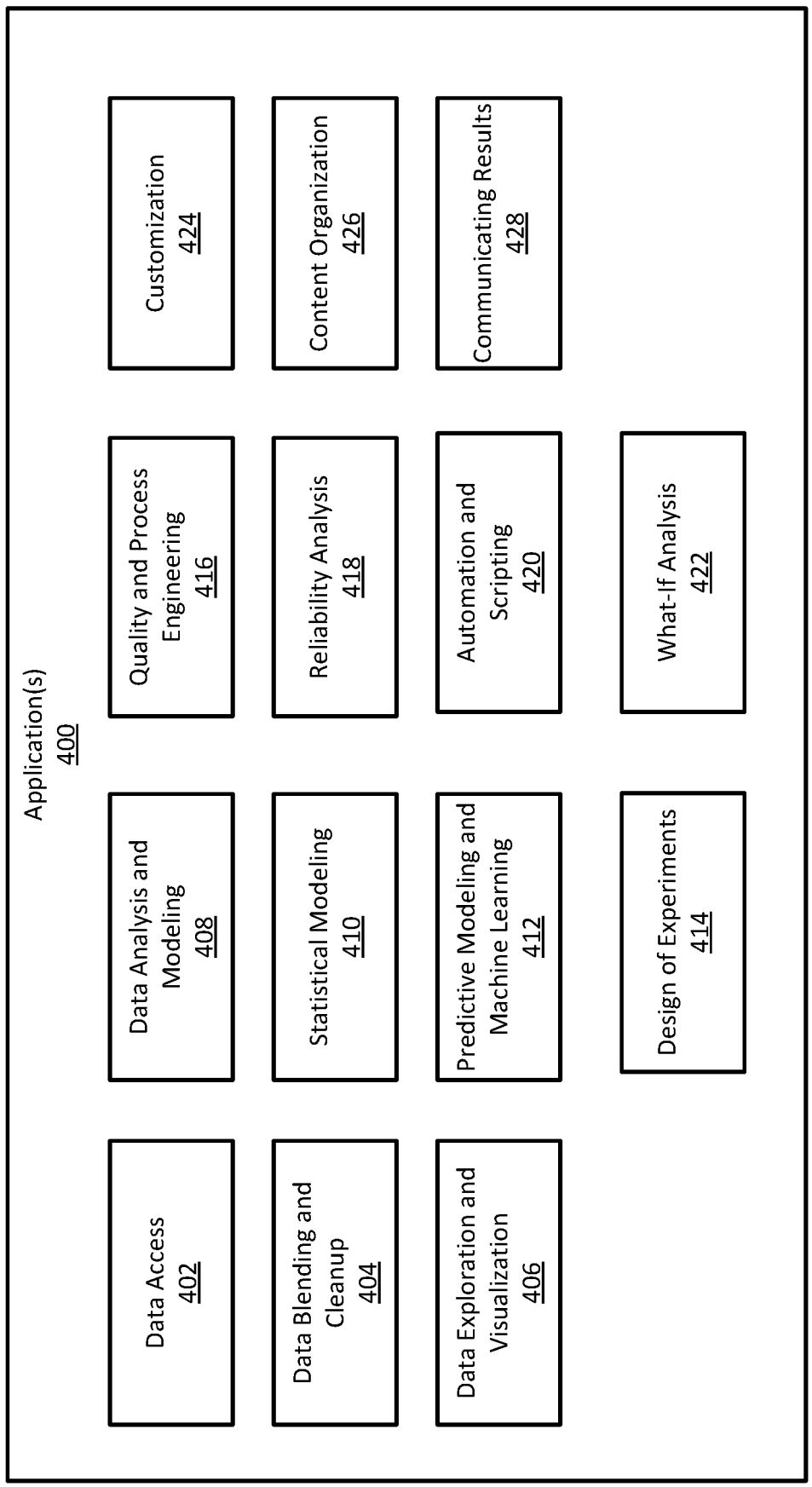
FIG. 4 illustrates a block diagram of example applications according to at least one embodiment of the present technology.

FIG. 4 provides example applications 400 (e.g., applications executed by a computing device 202, worker node 310, or control node 302) for performing one or more tasks or operations.

For example, data access operations 402 can be used for accessing data from different sources (e.g., importing and/or reading Excel files, flat files, relational databases, APIs, R, Python, and SAS® files and databases). For instance, data can be imported for data visualization, exploration and analysis. Data can be formatted or optimized. For instance, data blending and cleanup operations 404 can be used to remove complexity (e.g., in text, images and functions data) and for screening data (e.g., screening data for outliers, entry errors, missing values and other inconsistencies that can compromise data analysis). This can be useful for visual and interactive tools. Data can also be transformed, blended, grouped, filtered, merged into a single table or into subsets, or otherwise arranged for a particular scenario.

In one or more embodiments, one or more applications 400 include data exploration and visualization operations 406 that can be used to support plot and profiler tools. For instance, plot tools can be used to create data plots (e.g., to plot data to spot patterns and patterns that do not fit a trend). Some example plots include bubble plots, scatter plots (matrix and 3D), parallel plots, cell plots, contour plots, ternary plots, and surface plots. Profilers are tools that can be used to create a specialized set of plots in which changing one plot changes the other plots. For instance, profiling is an approach to generate visualizations of response surfaces by seeing what would happen if a user changed just one or two factors at a time. Profiler tools can be used to create interactive profiles of data (e.g., to explore and graph data dynamically and uncover hidden relationships between graphed data or interface with linked data, to interpret and understand the fit of equations to data, and to find factor values to optimize responses). Some example profiler tools include prediction profiler, contour profiler, surface profiler, mixture profiler, custom profiler, and excel profiler. A prediction profiler can be used to show vertical slices across each factor, holding other factors at a current value. A contour profiler allows horizontal slices showing contour lines for two factors at a time. A surface profiler generates three-dimensional plots for two factors at a time, or contour surface plot for 3 factors at a time. A mixture profiler is a contour profiler for mixture of factors. A custom profiler is a numerical optimizer. An excel profiler allows for visualization of models or formulas stored in electronic worksheets. Accordingly, profiler tools can allow for one or more of simulation, surface visualization, optimization, and desirability studies. Graphs (e.g., from plot or profiler tools) can be exported to electronic or print reports for presenting findings. Further, data exploration and visualization operations 406 can include text exploration such as computer extraction of symbols, characters, words and phrases; or computer visualization such as to organize symbols, characters, words and phrases to uncover information regarding a text or classify the text.

In one or more embodiments, one or more applications 400 include data analysis and modeling operations 408 can be used to analyze one or many variables or factors in linked analysis. Analysis results may be linked with specific graphs designed for different types of data or metrics (e.g., graphs related to histograms, regression modeling and distribution fitting). Data analysis and modeling can be performed real-time (or just-in-time). For instance, applications 400 can included statistical modeling operations 410. For instance, statistical modeling operations 410 can be used for a diversity of modeling tasks such as univariate, multivariate and multifactor. Data can be transformed from its collected form (e.g., text or functional form) and data can be used for building models for better insights (e.g., discovery trends or patterns in data). As another example, one or more applications 400 can include predictive modeling and machine learning operations 412 to build models using predictive modeling techniques, such as regression, neural networks and decision trees. The operations 412 can be used to fit multiple predictive models and determine the best performing model with model screening. Validation (e.g., cross-validation and k-fold cross-validation) can be used (e.g., to prevent over-fitting or to select a best model). Machine learning methods can be used by the user without having to write code and tune algorithms. Examples of machine learning techniques are described in more detail with respect to FIGS. 5 and 6).

In one or more embodiments, one or more applications 400 include design of experiments (DOE) operations 414 used to create designs for experiments that provide test conditions for one or more factors tested in the experiment. For example, the design of experiments operations 414 can be used to create optimally designed experiments, efficient experiments to meet constraints, process limitations and budget, and/or screening designs to untangle important effects between multiple factors. DOE operations 414 can also be used for evaluating designs (e.g., design diagnostic measures such as efficiency metrics).

In one or more embodiments, one or more applications 400 include quality and process engineering operations 416 to track and visualize quality and processes. For instance, the quality and process engineering operations 416 can generate charts to explore root causes of quality or process problems (e.g., causes of variation in manufacturing processes and drill down into problem processes). Additionally, or alternatively, they can be used to generate notifications for metrics that exceed a threshold such as an out-of-control signal or a control chart warning. Additionally, or alternatively, they can be used to study the capability and performance of one or more variables to identify processes that are not meeting user-defined goals. Objective data from processes or consumer data can be used to release better products and react to market trends.

In one or more embodiments, one or more applications 400 include reliability analysis operations 418. For example, in manufacturing, reliability analysis tools can be used to prevent failure, improve warranty or product performance, find and address important design vulnerabilities, and pinpoint defects in materials or processes. Reliability analysis tools can also be used to determine how to reduce or improve these issues (e.g., by identifying trends and outliers in data and model predictions). What-if Analysis operations 422 can be used to demonstrate patterns of predicted responses and the effect of each factor on the response with scenario analysis. For example, a graphical user interface can be used for a user to put in different inputs, assumptions or constraints for a system and observe responses or effects. For instance, in a measurement system analysis analyzing whether parts would be in-specification, different estimated variances between parts and operators testing the parts could be varied to determine the effect on modeled output for the measurement system analysis.

In one or more embodiments, one or more applications 400 include automation and scripting operations 420. For example, automation can allow code-free access for a user to automation routines all the way up to completely customized applications (e.g., code free access to SAS®, MATLAB®, Python® and R routines). For example, a design created for experiments can be automated such that automatic testing is performed for the design.

In one or more embodiments, one or more applications 400 include operations for greater user control and interaction. For instance, customization operations 424 can be used for user customization (e.g., mass customizations, and customizations of graphics, statistics, and default views). As another example, content organization operations 426 can be used to organize data (e.g., translate statistical results to a simplified view to communicate findings and organize, summarize, and document content to better aid the accountability and reproducibility of projects). As another example, the communicating results operations 428 can be used for presentation of results, models, or other output from one or more applications 400 (e.g., presented in print, graphical user interface, or web-based versions).

In one or more embodiments, fewer, different, and additional components can be incorporated into computing device 202. In one or more embodiments, the input/output interface has more than one interface that uses the same or different interface technology.

In one or more embodiments, the one or more applications 400 can be integrated with other analytic or computing tools not specifically shown here. For instance, one or more applications are implemented using or integrated with one or more software tools such as JMP®, Base SAS, SAS® Enterprise Miner™, SAS/STAT®, SAS® High Performance Analytics Server, SAS® Visual Data Mining and Machine Learning, SAS® LASR™ SAS® In-Database Products, SAS® Scalable Performance Data Engine, SAS® Cloud Analytic Services, SAS/OR®, SAS/ETS®, SAS® Inventory Optimization, SAS® Inventory Optimization Workbench, SAS® Visual Analytics, SAS® Viya™, SAS In-Memory Statistics for Hadoop®, SAS® Forecast Server, and SAS/IML®.

Figure 5:
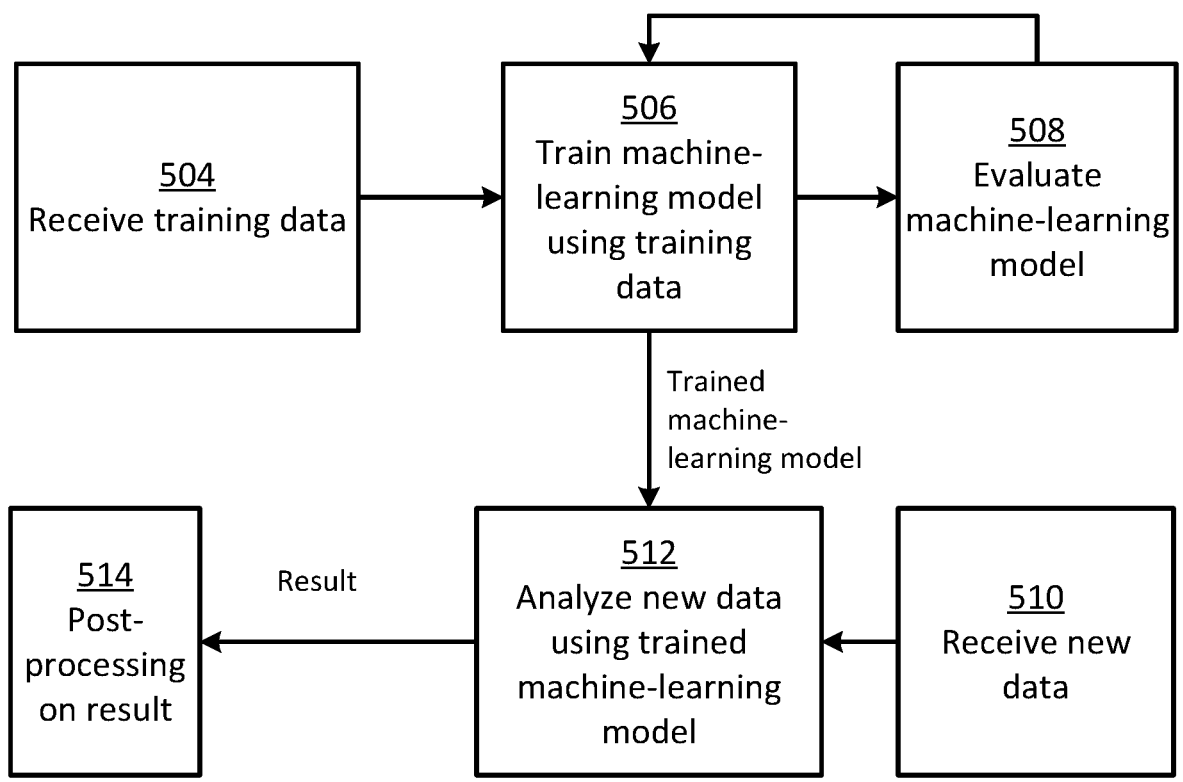
FIG. 5 illustrates a flow chart of an example of a process for generating and using a machine-learning model according to at least one embodiment of the present technology.

One or more embodiments are useful for generating and using machine-learning models. FIG. 5 is a flow chart of an example of a process for generating and using a machine-learning model according to some aspects. Machine learning is a branch of artificial intelligence that relates to mathematical models that can learn from, categorize, and make predictions about data. Such mathematical models, which can be referred to as machine-learning models, can classify input data among two or more classes; cluster input data among two or more groups; predict a result based on input data; identify patterns or trends in input data; identify a distribution of input data in a space; or any combination of these. Examples of machine-learning models can include (i) neural networks; (ii) decision trees, such as classification trees and regression trees; (iii) classifiers, such as Naïve bias classifiers, logistic regression classifiers, ridge regression classifiers, random forest classifiers, least absolute shrinkage and selector operator (LASSO) classifiers, and support vector machines; (iv) clusterers, such as k-means clustering, mean-shift clusterers, and spectral clusterers; (v) factorizers, such as factorization machines, principal component analyzers and kernel principal component analyzers; and (vi) ensembles or other combinations of machine-learning models. In some examples, neural networks can include deep neural networks, feed-forward neural networks, recurrent neural networks, convolutional neural networks, radial basis function (RBF) neural networks, echo state neural networks, long short-term memory neural networks, bi-directional recurrent neural networks, gated neural networks, hierarchical recurrent neural networks, stochastic neural networks, modular neural networks, spiking neural networks, dynamic neural networks, cascading neural networks, neuro-fuzzy neural networks, or any combination of these.

Different machine-learning models may be used interchangeably to perform a task. Examples of tasks that can be performed at least partially using machine-learning models include various types of scoring; bioinformatics; cheminformatics; software engineering; fraud detection; customer segmentation; generating online recommendations; adaptive websites; determining customer lifetime value; search engines; placing advertisements in real time or near real time; classifying DNA sequences; affective computing; performing natural language processing and understanding; object recognition and computer vision; robotic locomotion; playing games; optimization and metaheuristics; detecting network intrusions; medical diagnosis and monitoring; or predicting when an asset, such as a machine, will need maintenance.

Any number and combination of tools can be used to create machine-learning models. Examples of tools for creating and managing machine-learning models can include SAS® Enterprise Miner, SAS® Rapid Predictive Modeler, and SAS® Model Manager, SAS Cloud Analytic Services (CAS)®, SAS Viya® of all which are by SAS Institute Inc. of Cary, North Carolina.

Machine-learning models construction can be at least partially automated (e.g., with little or no human involvement) in a training process. During training, input data can be iteratively supplied to a machine-learning model to enable the machine-learning model to identify patterns related to the input data or to identify relationships between the input data and output data. With training, the machine-learning model can be transformed from an untrained state to a trained state. Input data can be split into one or more training sets and one or more validation sets, and the training process may be repeated multiple times. The splitting may follow a k-fold cross-validation rule, a leave-one-out-rule, a leave-p-out rule, or a holdout rule. An overview of training and using a machine-learning model is described below with respect to the flow chart of FIG. 5.

In block 504, training data is received. In some examples, the training data is received from a remote database or a local database, constructed from various subsets of data, or input by a user. The training data can be used in its raw form for training a machine-learning model or pre-processed into another form, which can then be used for training the machine-learning model. For example, the raw form of the training data can be smoothed, truncated, aggregated, clustered, or otherwise manipulated into another form, which can then be used for training the machine-learning model.

In block 506, a machine-learning model is trained using the training data. The machine-learning model can be trained in a supervised, unsupervised, or semi-supervised manner. In supervised training, each input in the training data is correlated to a desired output. This desired output may be a scalar, a vector, or a different type of data structure such as text or an image. This may enable the machine-learning model to learn a mapping between the inputs and desired outputs. In unsupervised training, the training data includes inputs, but not desired outputs, so that the machine-learning model has to find structure in the inputs on its own. In semi-supervised training, only some of the inputs in the training data are correlated to desired outputs.

In block 508, the machine-learning model is evaluated. For example, an evaluation dataset can be obtained, for example, via user input or from a database. The evaluation dataset can include inputs correlated to desired outputs. The inputs can be provided to the machine-learning model and the outputs from the machine-learning model can be compared to the desired outputs. If the outputs from the machine-learning model closely correspond with the desired outputs, the machine-learning model may have a high degree of accuracy. For example, if 90% or more of the outputs from the machine-learning model are the same as the desired outputs in the evaluation dataset, the machine-learning model may have a high degree of accuracy. Otherwise, the machine-learning model may have a low degree of accuracy. The 90% number is an example only. A realistic and desirable accuracy percentage is dependent on the problem and the data.

In some examples, if the machine-learning model has an inadequate degree of accuracy for a particular task, the process can return to block 506, where the machine-learning model can be further trained using additional training data or otherwise modified to improve accuracy. If the machine-learning model has an adequate degree of accuracy for the particular task, the process can continue to block 510.

In block 510, new data is received. In some examples, the new data is received from a remote database or a local database, constructed from various subsets of data, or input by a user. The new data may be unknown to the machine-learning model. For example, the machine-learning model may not have previously processed or analyzed the new data.

In block 512, the trained machine-learning model is used to analyze the new data and provide a result. For example, the new data can be provided as input to the trained machine-learning model. The trained machine-learning model can analyze the new data and provide a result that includes a classification of the new data into a particular class, a clustering of the new data into a particular group, a prediction based on the new data, or any combination of these.

In block 514, the result is post-processed. For example, the result can be added to, multiplied with, or otherwise combined with other data as part of a job. As another example, the result can be transformed from a first format, such as a time series format, into another format, such as a count series format. Any number and combination of operations can be performed on the result during post-processing.

Figure 6:
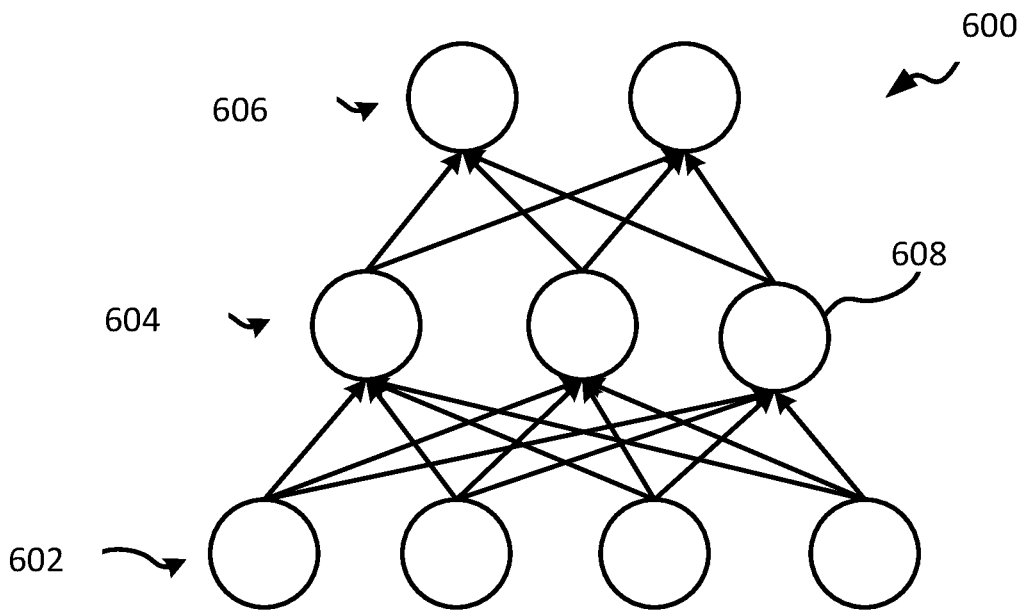
FIG. 6 illustrates an example of a machine-learning model as a neural network according to at least one embodiment of the present technology.

A more specific example of a machine-learning model is the neural network 600 shown in FIG. 6. The neural network 600 is represented as multiple layers of interconnected neurons, such as neuron 608, that can exchange data between one another. The layers include an input layer 602 for receiving input data, a hidden layer 604, and an output layer 606 for providing a result. The hidden layer 604 is referred to as hidden because it may not be directly observable or have its input directly accessible during the normal functioning of the neural network 600. Although the neural network 600 is shown as having a specific number of layers and neurons for exemplary purposes, the neural network 600 can have any number and combination of layers, and each layer can have any number and combination of neurons.

The neurons and connections between the neurons can have numeric weights, which can be tuned during training. For example, training data can be provided to the input layer 602 of the neural network 600, and the neural network 600 can use the training data to tune one or more numeric weights of the neural network 600. In some examples, the neural network 600 can be trained using backpropagation.

Backpropagation can include determining a gradient of a particular numeric weight based on a difference between an actual output of the neural network 600 and a desired output of the neural network 600. Based on the gradient, one or more numeric weights of the neural network 600 can be updated to reduce the difference, thereby increasing the accuracy of the neural network 600. This process can be repeated multiple times to train the neural network 600. For example, this process can be repeated hundreds or thousands of times to train the neural network 600.

In some examples, the neural network 600 is a feed-forward neural network. In a feed-forward neural network, every neuron only propagates an output value to a subsequent layer of the neural network 600. For example, data may only move one direction (forward) from one neuron to the next neuron in a feed-forward neural network.

In other examples, the neural network 600 is a recurrent neural network. A recurrent neural network can include one or more feedback loops, allowing data to propagate in both forward and backward through the neural network 600. This can allow for information to persist within the recurrent neural network. For example, a recurrent neural network can determine an output based at least partially on information that the recurrent neural network has seen before, giving the recurrent neural network the ability to use previous input to inform the output.

In some examples, the neural network 600 operates by receiving a vector of numbers from one layer; transforming the vector of numbers into a new vector of numbers using a matrix of numeric weights, a nonlinearity, or both; and providing the new vector of numbers to a subsequent layer of the neural network 600. Each subsequent layer of the neural network 600 can repeat this process until the neural network 600 outputs a final result at the output layer 606. For example, the neural network 600 can receive a vector of numbers as an input at the input layer 602. The neural network 600 can multiply the vector of numbers by a matrix of numeric weights to determine a weighted vector. The matrix of numeric weights can be tuned during the training of the neural network 600. The neural network 600 can transform the weighted vector using a nonlinearity, such as a sigmoid tangent or the hyperbolic tangent. In some examples, the nonlinearity can include a rectified linear unit, which can be expressed using the following equation: $y = \max(x, 0)$, where y is the output and x is an input value from the weighted vector. The transformed output can be supplied to a subsequent layer, such as the hidden layer 604, of the neural network 600. The subsequent layer of the neural network 600 can receive the transformed output, multiply the transformed output by a matrix of numeric weights and a nonlinearity, and provide the result to yet another layer of the neural network 600. This process continues until the neural network 600 outputs a final result at the output layer 606.

Other examples of the present disclosure may include any number and combination of machine-learning models having any number and combination of characteristics. The machine-learning model(s) can be trained in a supervised, semi-supervised, or unsupervised manner, or any combination of these. The machine-learning model(s) can be implemented using a single computing device or multiple computing devices, such as the session pool 102 discussed above.

Implementing some examples of the present disclosure at least in part by using machine-learning models can reduce the total number of processing iterations, time, memory, electrical power, or any combination of these consumed by a computing device when analyzing data. For example, a neural network may more readily identify patterns in data than other approaches. This may enable the neural network to analyze the data using fewer processing cycles and less memory than other approaches, while obtaining a similar or greater level of accuracy.

Some machine-learning approaches may be more efficiently and speedily executed and processed with machine-learning specific processors (e.g., not a generic CPU). Such processors may also provide an energy savings when compared to generic CPUs. For example, some of these processors can include a graphical processing unit (GPU), an application-specific integrated circuit (ASIC), a field-programmable gate array (FPGA), an artificial intelligence (AI) accelerator, a neural computing core, a neural computing engine, a neural processing unit, a purpose-built chip architecture for deep learning, and/or some other machine-learning specific processor that implements a machine learning approach or one or more neural networks using semiconductor (e.g., silicon (Si), gallium arsenide (GaAs)) devices. Furthermore, these processors may also be employed in heterogeneous computing architectures with a number of and a variety of different types of cores, engines, nodes, and/or layers to achieve various energy efficiencies, chip-level thermal processing considerations, processing speed improvements, data communication speed improvements, and/or data efficiency targets and improvements throughout various parts of the system when compared to a homogeneous computing architecture that employs CPUs for general purpose computing.

Associated Processes

Figure 7:
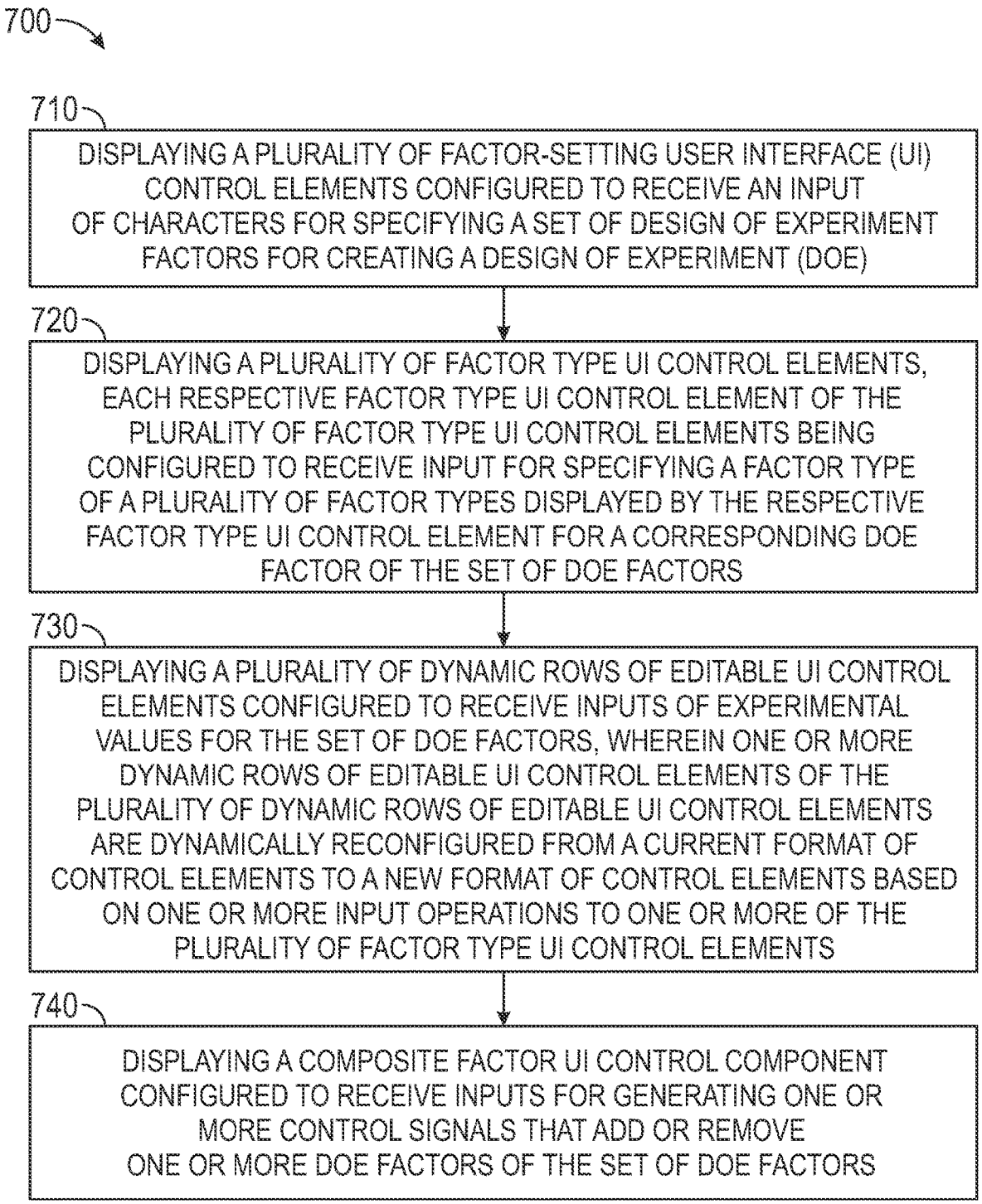
FIG. 7 illustrates an example flow chart for displaying a design of experiments (DoE) factor specification user interface according to at least one embodiment of the present technology.

FIG. 7 illustrates one embodiment of a method 700 for displaying a design of experiments (DoE) factor specification user interface. It should be appreciated that other examples contemplated within the scope of the present disclosure may involve more operations, fewer operations, different operations, or a different order of operations than as shown in FIG. 7.

As will be described in more detail herein, the embodiments of the method 700 may result in numerous technical advantages and technical improvements-a subset of which will now be described. Firstly, the user interface elements described with reference to processes 710-740 may reduce a total number of inputs required for specifying and/or manipulating factors involved in a design of experiments. Secondly, the dynamic reconfiguration of rows described with reference to processes 720 and 730 may provide a user with an efficient way to adjust experimental values (e.g., levels) of one or more design of experiment factors when such design of experiment factors change to a new factor type. Thirdly, the composite factor user interface control component described with reference to process 740 may enable a user to efficiently add or remove factors in the design of experiment, thus providing a high level of control and customization when configuring the design of experiments.

Overall, these technical advantages and improvements provide a more intuitive, flexible, and user-friendly interface for designing experiments, thereby reducing a cognitive burden on the user when configuring one or more design of experiments. Furthermore, providing efficient ways for managing factors in a design of experiments may improve a user's experience and decrease user interaction time, which is particularly important in instances where the design of experiments factor specification user interface is displayed on battery-operated devices. Additionally, in some embodiments, the method 700 described herein may accelerate a technical configuration of one or more design of experiments and the underlying computer systems that execute the design of experiments created via the design of experiments factor specification user interface.

Figure 8:
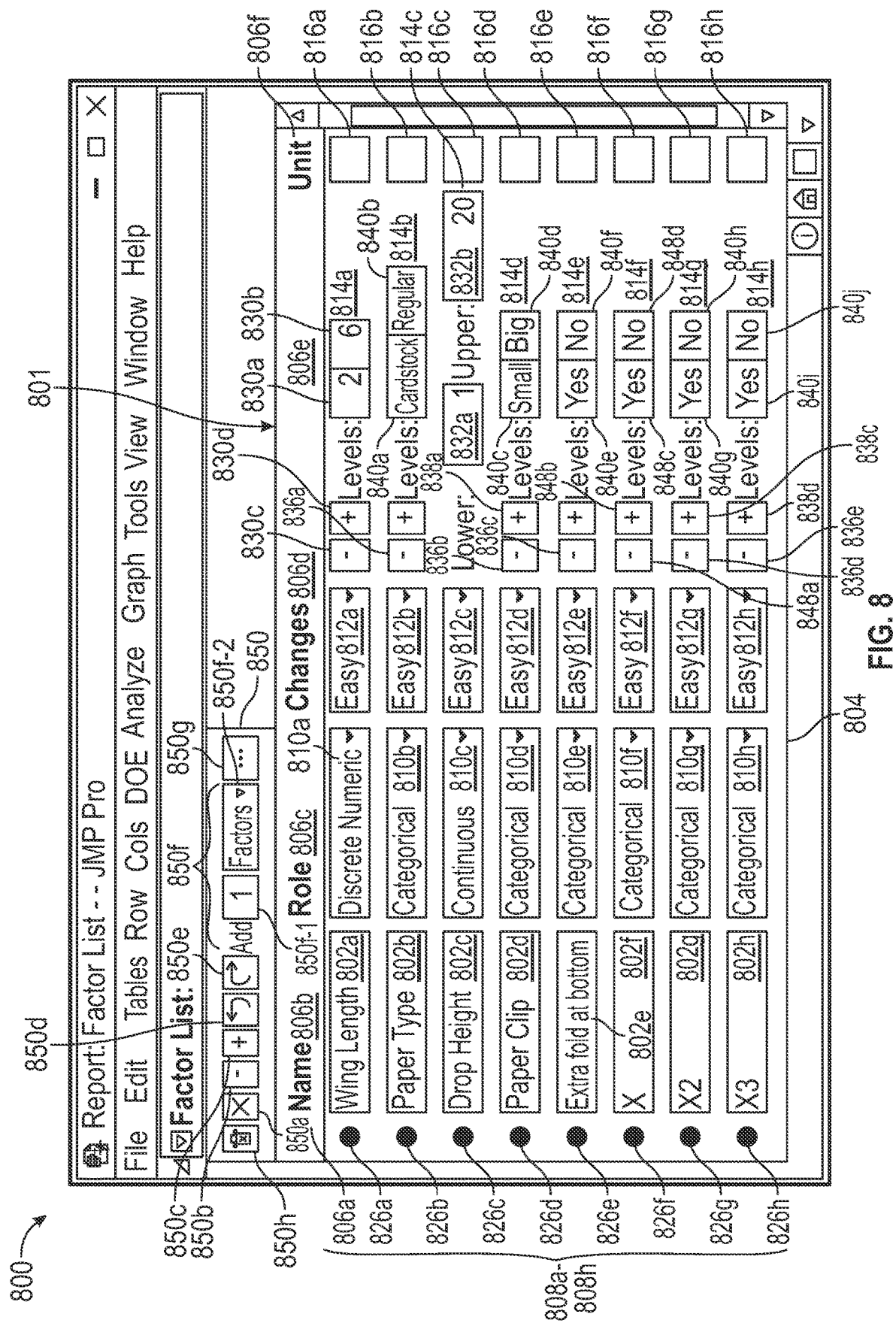

In some embodiments, the method 700 may include a process 710 that functions to display a plurality of factor-setting user interface (UI) control elements configured to receive an input of characters for specifying a set of design of experiment factors for creating a design of experiments (DoE). An example of the process 710 displaying a plurality of factor-setting user interface control elements is illustrated in FIG. 8. Specifically, in FIG. 8, the process 710 is causing a plurality of factor-setting user interface control elements 802a-802h to be displayed in a design of experiments factor specification user interface 800. It shall be noted that, in some embodiments, the set of design of experiment factors specified by the plurality of factor-setting user interface control elements 802a-802h may relate to variables in the design of experiments that may be manipulated during one or more runs of the design of experiments—as will described in more detail in the method 3900.

In some embodiments, the plurality of factor-setting user interface control elements displayed by the process 710 may each specify (e.g., indicate) a name of a target factor in the design of experiments. For instance, in the example illustrated in FIG. 8, the plurality of factor-setting user interface control elements 802a-802h are specifying a name of eight (8) factors in the design of experiments. Specifically, in this example, the factor-setting user interface control elements 802a-802h specify a plurality of design of experiment factors named "Wing Length," "Paper Type," "Drop Height," "Paper Clip," "Extra fold at bottom," "X," "X2," and "X3," respectively. It shall be noted that the above example is not intended to be limiting and that the design of experiments factor specification user interface 800 may specify additional, fewer, or different design of experiment factors without departing from the scope of the disclosure.

Figure 9:
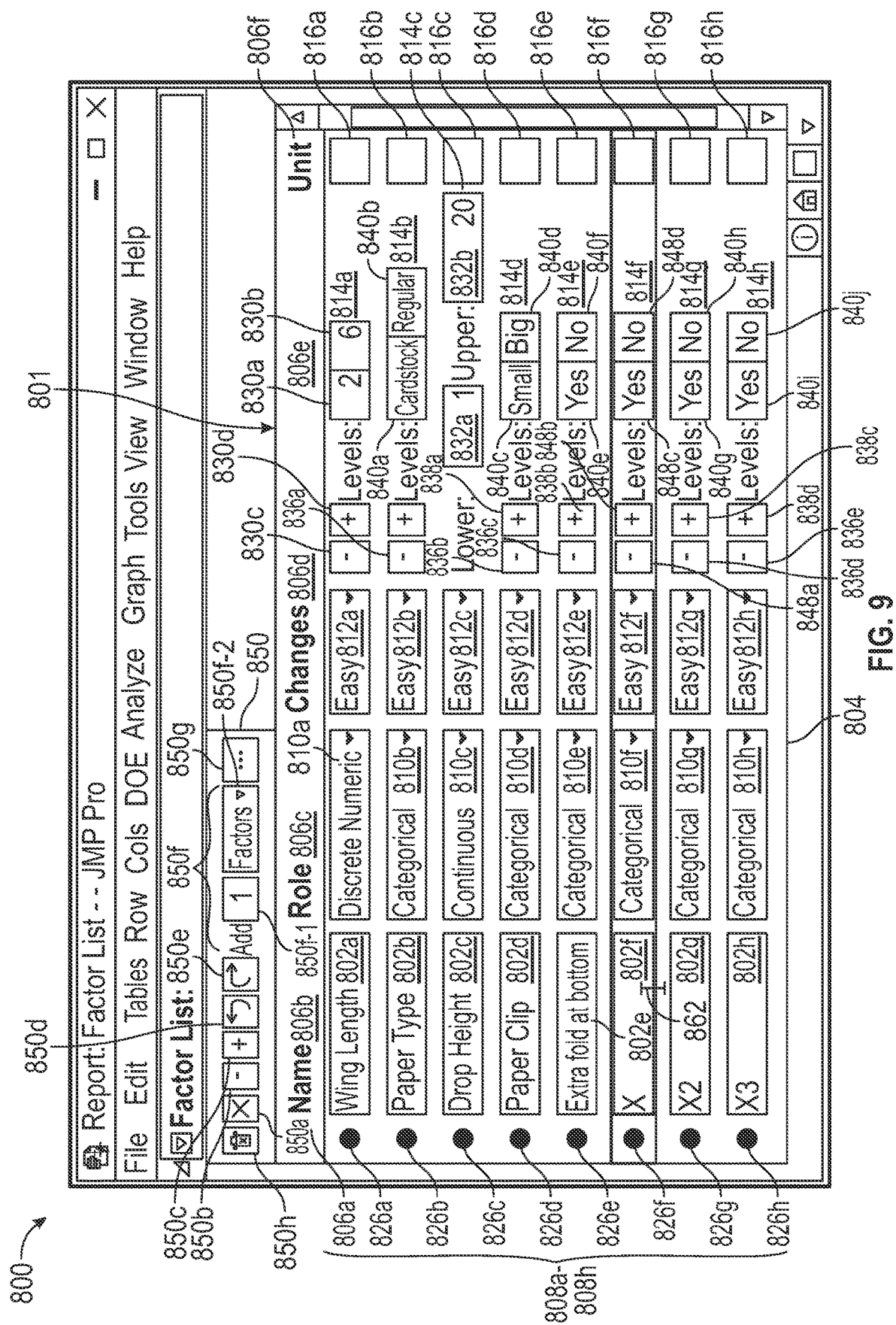
Figure 10:
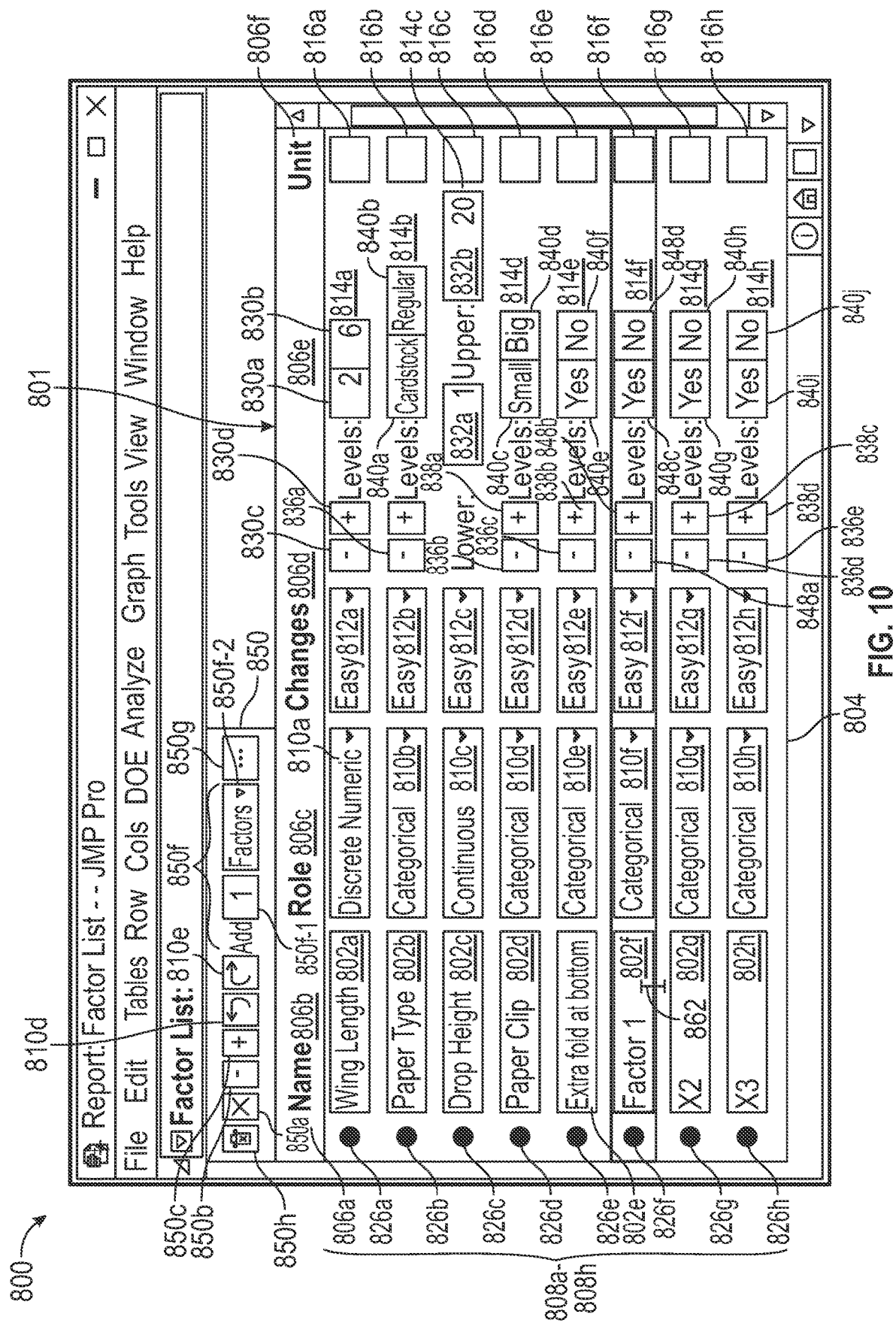

Additionally, in the example of FIG. 8, each of the plurality of factor-setting user interface control elements 802a-802h comprise a character edit box that is configured to update a name of a target factor based on receiving an input of one or more characters (e.g., alphabetic characters, numeric characters, alphanumeric characters, etc.). For instance, as illustrated in FIGS. 9 and 10, an input 862 is received for replacing the selected character 'X' (illustrated in FIG. 9) with the characters for "Factor 1" (illustrated in FIG. 10) and, as a result, causes the name of the design of experiment factor corresponding to the factor-setting user interface control element 802f to be changed from "X" to "Factor 1."

It shall be noted the above example is not intended to be limiting and that the plurality of factor-setting user interface control elements displayed by the process 710 may comprise different types of user interface elements without departing from the scope of the disclosure, such as text edit boxes or the like.

In some embodiments, the names specified by the plurality of factor-setting user interface control elements 802a-802h may be automatically generated. In one or more examples of such embodiments, the names specified by the plurality of factor-setting user interface control elements 802a-802h may be automatically generated based on an order of the plurality factor-setting user interface control elements 802a-802h in the design of experiments factor specification user interface 800 (e.g., the names specified by the factor-setting user interface control elements 802a-802h in FIG. 8 may instead be "X1," "X2," "X3," "X4," "X5," "X6," "X7," "X8," respectively).

In some embodiments, the process 710 may display the plurality of factor-setting user interface control elements within a factor-setting grid container control that includes (e.g., arranges content along) one or more rows and one or more columns. An example of the process 710 displaying the plurality of factor-setting user interface control elements within a factor-setting grid container control is also illustrated in FIG. 8. Specifically, in FIG. 8, the process 710 is displaying the plurality of factor-setting user interface control elements 802a-802h within a factor-setting grid container control 804 that includes a column 806a, a column 806b labeled "Name" (also referred to herein as a "factor-setting UI control elements column"), a column 806c labeled "Role" (also referred to herein as a "factor type UI control elements column"), a column 806d labeled "Changes", a dynamic column 806e (also referred to herein as a "dynamic column of editable UI control elements), and a column 806f labeled "Unit." Example user interface elements that may be included in the plurality of columns 806a-806f will now be described.

Additionally, as also shown in FIG. 8, the column 806a includes a plurality of factor re-ordering user interface elements 826a-826h. The column 806b labeled "Name" includes the plurality of factor-setting user interface control elements 802a-802h. The column 806c labeled "Role" includes a plurality of factor type user interface control elements 810a-810h. The column 806d labeled "Changes" includes a plurality of design of experiments platform configuration user interface control elements 812a-812h. The dynamic column 806e includes a plurality of dynamic rows of editable user interface control elements 814a-814h. Lastly, the column 806f labeled "Unit" includes a plurality of factor unit user interface control elements 816a-816h.

Furthermore, in the example illustrated in FIG. 8, the factor-setting grid container control 804 also includes a plurality of factor-setting composition component rows 808a-808h. Specifically, in FIG. 8, the plurality of factor-setting composition component rows 808a-808h include the plurality of factor re-ordering user interface elements 826a-826h, the plurality of factor-setting user interface control elements 802a-802h, the plurality of factor type user interface control elements 810a-810h, the plurality of design of experiments platform configuration user interface control elements 812a-812h, the plurality of dynamic rows of editable user interface control elements 814a-814h, and the plurality of factor unit user interface control elements 816a-816h, respectively. It shall be noted that the characteristics and operations of the user interface control elements 810a-810h, 812a-812h, 814a-814h, and 816a-816h will be described in more detail in processes 720-740.

In some embodiments, a respective factor-setting composition component row in the factor-setting grid container control 804 may be re-ordered based on input(s) directed to the column 806a. For instance, in the example of FIG. 23, an input 828 selecting the factor re-ordering user interface element 826a is detected. Further, in FIG. 24, the input 828 moves from a position corresponding to the factor re-ordering user interface element 826a to a position corresponding to the factor re-ordering user interface element 826h. Thus, as a result of detecting the input 828, as illustrated in FIG. 25, the positions of the factors named "Wing Length" and "X3" are swapped in the design of experiments factor specification user interface 800.

Referring to FIG. 7, in some embodiments, the method 700 may include a process 720 that functions to display a plurality of factor type UI control elements, each respective factor type UI control element of the plurality of factor type UI control elements being configured to receive input for specifying a factor type of a plurality of factor types displayed by the respective factor type UI control element for a corresponding DOE factor of the set of DOE factors. As will be described in more detail herein, in some embodiments, displaying the plurality of factor type user interface control elements may enable a user interacting with the design of experiments factor specification user interface to specify whether a target design of experiment factor relates to a continuous factor type, a discrete numeric factor type, a categorical factor type, a blocking factor type, a mixture factor type, a constant factor, an uncontrolled factor type, or the like. An example of the process 720 displaying a plurality of factor type user interface control elements will now be described with reference to FIG. 11.

Figure 11:
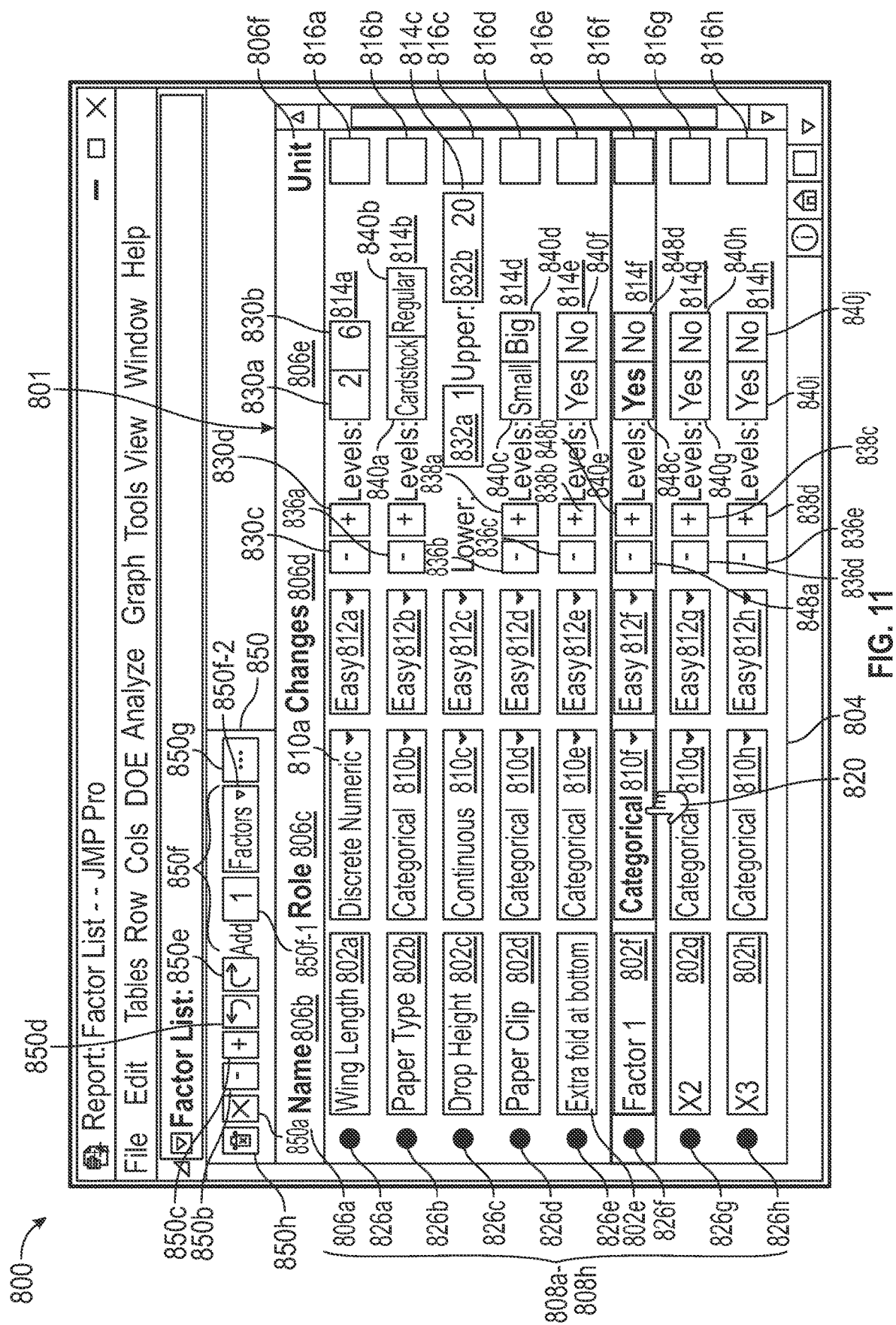

In FIG. 11, the process 720 is displaying a plurality of factor type user interface control elements 810a-810h that each include a selectable combo box user interface element (also referred to herein as a "dropdown menu element"). Specifically, in FIG. 11, the selectable combo box user interface elements associated with the plurality of factor type user interface control elements 810a-810h are specifying (e.g., indicating) that that the design of experiment factors named "Wing Length," "Paper Type," "Drop Height," "Paper Clip," "Extra fold at bottom," "Factor 1," "X2," and "X3" are currently of a discrete numeric factor type, a categorical factor type, a continuous factor type, a categorical factor type, a categorical factor type, a categorical factor type, a categorical factor type, and a categorical factor type, respectively.

Figure 12:
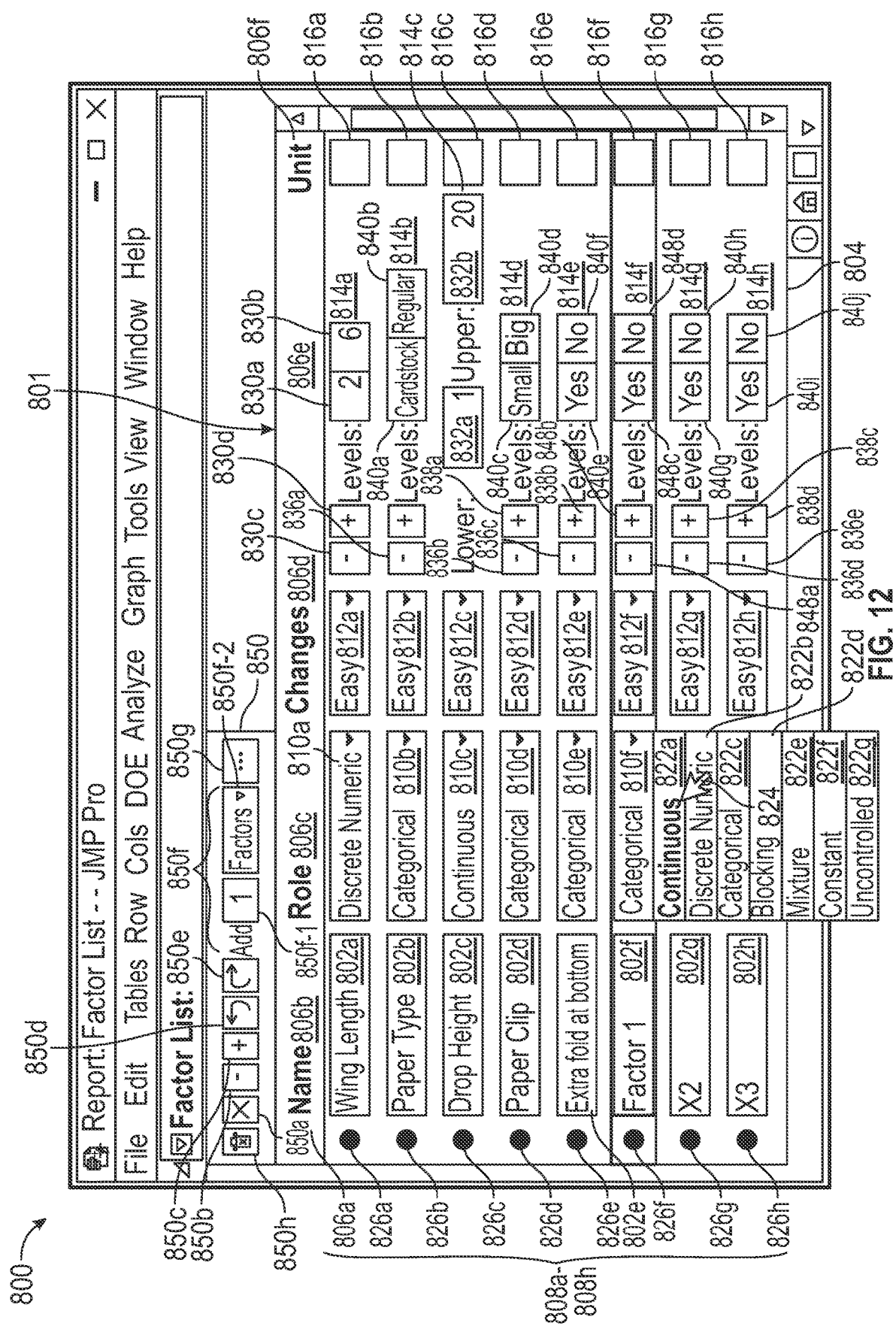

In some embodiments, an input operation to a respective combo box user interface element may cause the respective combo box user interface element to expand and display a set of factor type user interface control elements. For instance, as additionally illustrated in FIG. 11, the process 720 is detecting an input 820 selecting the factor type user interface control element 810f, and in response, as illustrated in FIG. 12, a plurality of factor type user interface control elements 822a-822g are displayed in the design of experiments factor specification user interface 800.

Figure 13:
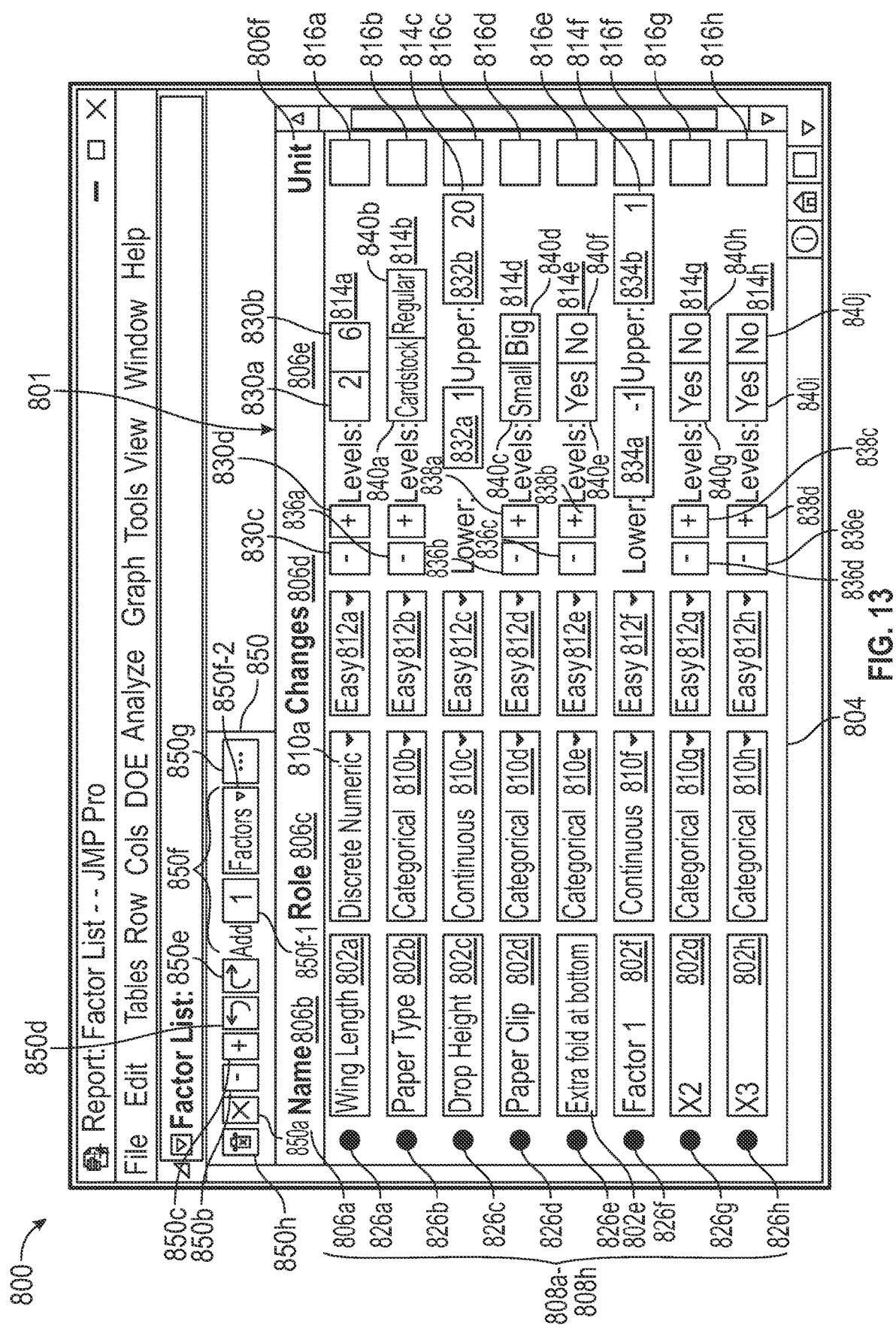

In some embodiments, the plurality of factor type user interface control elements 822a-822g are selectable and, when selected, updates a factor type associated with a corresponding factor. For instance, as also shown in FIG. 12, the process 720 is detecting an input 824 selecting the factor type user interface control element 822a, and in response, as shown in FIG. 13, the design of experiment factor named "Factor 1" is updated from being a categorical factor type to a continuous factor type.

It shall be noted that when the factor type user interface control elements 822b-822g are selected, the design of experiment factor named "Factor 1" may be analogously updated to a discrete numeric factor type, a categorical factor type, a blocking factor type, a mixture factor type, a constant factor type, or an uncontrolled factor type, respectively.

Referring to FIG. 7, in some embodiments, the method 700 may include a process 730 that functions to display a plurality of dynamic rows of editable UI control elements configured to receive inputs of experimental values for the set of DOE factors, wherein one or more dynamic rows of editable UI control elements of the plurality of dynamic rows of editable UI control elements are dynamically reconfigured from a current format of control elements to a new format of control elements based on one or more input operations to one or more of the plurality of factor type UI control elements. Examples of the process 730 displaying a plurality of dynamic rows will now be described with reference to FIG. 13.

In some embodiments, a dynamic row of editable user interface control elements displayed for a discrete numeric factor may enable a user to define one or more discrete numeric levels (e.g., experimental values) for the discrete numeric factor. For instance, in the example of FIG. 13, the dynamic row of editable user interface control elements 814a displayed for the discrete numeric factor "Wing Length" includes a plurality of number edit boxes 830a and 830b. Specifically, in FIG. 13, the plurality of number edit boxes 830a and 830b specify (e.g., indicate) that the factor "Wing Length" is currently associated with two (2) discrete numeric levels having the values two (2) and six (6), respectively. It shall be noted that if the factor "Wing Length" was associated with more, fewer, or different discrete numeric levels, the dynamic row of editable user interface control elements 814a may correspondingly include more, fewer, or different number edit boxes.

Additionally, as shown in FIG. 13, the dynamic row of editable user interface control elements 814a includes button control user interface elements 830c and 830d. The button control user interface element 830c may be selectable and, when selected, may function to remove one or more of the plurality of number edit boxes 830a and 830b from the design of experiments factor specification user interface 800 and dissociate the discrete numeric levels associated with such number edit boxes from the factor "Wing Length."

Conversely, in some embodiments, the button control user interface element 830d may be selectable and, when selected, may function to display one or more additional number edit boxes in the dynamic row of editable user interface control elements 814a for adding one or more discrete numeric levels to the factor "Wing Length." That is, in some embodiments, numeric input received by the plurality of number edit boxes 830a, 830b, and the number edit boxes added via button control user interface element 830c-830d may be used to specify or update one or more discrete numeric levels associated with the factor "Wing Length."

In some embodiments, a dynamic row of editable user interface control elements displayed for a continuous factor may include a plurality of user interface control elements that enable a user to define a continuous range for the continuous factor (e.g., experimental values). For instance, in the example of FIG. 13, the dynamic rows of editable user interface control elements 814c and 814f displayed for the continuous factors "Drop Height" and "Factor 1" include a plurality of number edit boxes 832a-832b and 834a-834b, respectively.

In some embodiments, numeric input received by the plurality of number edit boxes 832a and 834a may be used to define a minimum value of the continuous range associated with the factors "Drop Height" and "Factor 1," respectively. For instance, in the example illustrated in FIG. 13, the number edit boxes 832a and 834a specify (e.g., indicate) that the minimum value of the continuous range associated with factor "Drop Height" and "Factor 1" is the value one (1) and negative one (−1), respectively.

Conversely, in some embodiments, numeric input received by the plurality of number edit boxes 832b and 834b may be used to define a maximum value of the continuous range associated with the factors "Drop Height" and "Factor 1," respectively. For instance, in the example illustrated in FIG. 13, the number edit boxes 832b and 834b specify (e.g., indicate) that the maximum value of the continuous range associated with factor "Drop Height" and "Factor 1" is the value twenty (20) and one (1), respectively.

In some embodiments, a dynamic row of editable user interface control elements displayed for a categorical factor may include a plurality of user interface control elements that are configured to receive input for defining one or more categorical levels (e.g., experimental values) of the categorical factor. For instance, in the example of FIG. 13, the dynamic rows of editable user interface control elements 814b, 814d, 814e, 814g, and 814h include a plurality of text edit boxes 840a-840b, 840c-840d, 840e-840f, 840g-840h, and 840i-840j, respectively.

Specifically, in FIG. 13, the plurality of text edit boxes 840a and 840b are specifying (e.g., indicating) that the factor "Paper Type" is current associated with two (2) categorical levels having the values "Cardstock" and "Regular," respectively. The plurality of text boxes 840c and 840d are specifying that the factor "Paper Clip" is currently associated with two (2) categorical levels having the values "Small" and "Big," respectively. The plurality of text boxes 840e and 840f are specifying that the factor "Extra fold at bottom" is currently associated with two (2) categorical levels having the values "Yes" and "No," respectively. The plurality of text boxes 840g and 840h are specifying that the factor "X2" is currently associated with two (2) categorical levels having the values "Yes" and "No," respectively. Lastly, the plurality of text boxes 840i and 840j are specifying that the factor "X3" is currently associated with two (2) categorical levels having the values "Yes" and "No," respectively.

In some embodiments, a dynamic row of editable user interface control elements displayed for a mixture factor may include a plurality of user interface control elements that are configured to receive input for defining experimental values of the mixture factor. For instance, in the example of FIG. 14A, the dynamic row of editable user interface control elements 814i displayed for the mixture factor "X1" includes a plurality of number edit boxes 842a and 842b. Example operations of the plurality of number edit boxes 842a and 842b will now be described. However, it shall be noted that these examples are not intended to be limiting and that the dynamic row of editable user interface control elements 814i may include fewer, additional, or different items without departing from the scope of the disclosure. It shall also be noted that the control elements 842c-842g may have similar characteristics to the control elements 802a-802h, 810a-810h, 812a-812h, and 816a-816h described above.

Figure 14A:
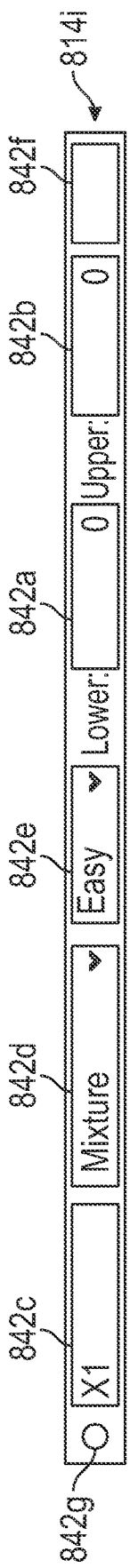

In some embodiments, numerical input provided to the number edit box 842a may be used to define a lower mixture value for the factor "X1." For instance, in the example illustrated in FIG. 14A, the number edit box 842a is specifying (e.g., indicating) that the lower mixture value of the factor "X1" is zero (0). Conversely, in some embodiments, numerical input provided to the number edit box 842b may be used to define an upper mixture value for the factor "X1." For instance, as also illustrated in FIG. 14A, the number edit box 842b is specifying (e.g., indicating) that the upper mixture value of the factor "X1" is one (1).

Figure 14B:
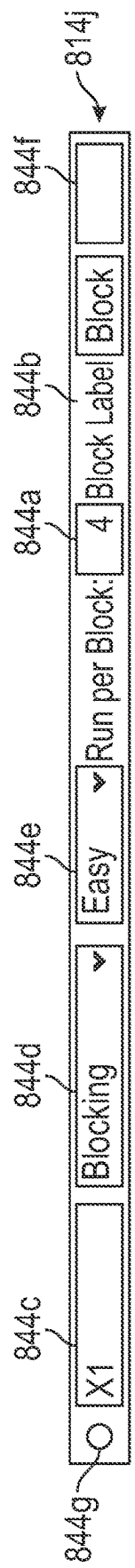

In some embodiments, a dynamic row of editable user interface control elements displayed for a blocking factor may include a plurality of user interface control elements that are configured to receive input for defining experimental values of the blocking factor. For instance, in the example of FIG. 14B, the dynamic row of editable user interface control elements 814j displayed for the blocking factor "X1" includes a number edit box 844a and a text edit box 844b. Example operations of the number edit box 844a and text edit box 844b will now be described. However, it shall be noted that these examples are not intended to be limiting and that the dynamic row of editable user interface control elements 814j may include fewer, additional, or different items without departing from the scope of the disclosure. It shall also be noted that the control elements 844c-844g may have similar characteristics to the control elements 802a-802h, 810a-810h, 812a-812h, and 816a-816h described above.

In some embodiments, numerical input provided to the number edit box 844a may be used to define a number of runs per block. For instance, in the example illustrated in FIG. 14B, the number edit box 844a is specifying (e.g., indicating) that the factor "X1" is associated with four (4) runs per block. Analogously, in some embodiments, text input provided to the text edit box 844b may be used to define a block label for the factor "X1." For instance, in the example illustrated in FIG. 14B, the text edit box 844b is specifying (e.g., indicating) that the block label associated with the factor "X1" is "Block."

In some embodiments, a dynamic row of editable user interface control elements displayed for a covariate factor may include a plurality of user interface control elements that are configured to receive input for defining experimental values of the covariate factor. For instance, in the example of FIG. 14C, the dynamic row of editable user interface control elements 814k displayed for the covariate factor "X1" includes a plurality of number edit boxes 846a and 846b. Example operations of the number edit boxes 846a and 846b will now be described. However, it shall be noted that these examples are not intended to be limiting and that the dynamic row of editable user interface control elements 814k may include fewer, additional, or different items without departing from the scope of the disclosure. It shall also be noted that the control elements 846c-846g may have similar characteristics to the control elements 802a-802h, 810a-810h, 812a-812h, and 816a-816h described above.

Figure 14C:
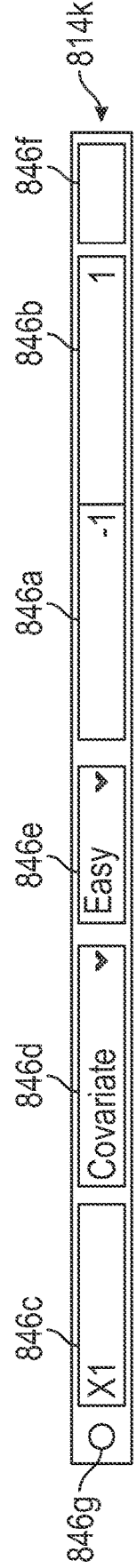

In some embodiments, numerical input provided to the number edit box 846a may be used to define a minimum value for the factor "X1." For instance, in the example illustrated in FIG. 14C, the number edit box 846a is specifying (e.g., indicating) that the minimum value of the factor "X1" is negative 1 (-1). Conversely, in some embodiments, numerical input provided to the number edit box 846b may be used to define a maximum value for the factor "X1." For instance, as also illustrated in FIG. 14C, the number edit box 846b is specifying (e.g., indicating) that the maximum value of the factor "X1" is one (1).

In some embodiments, a dynamic row of editable user interface control elements displayed for a constant factor may include one or more user interface control elements that are configured to receive input for defining an experimental value of the constant factor. For instance, in the example of FIG. 14D, the dynamic row of editable user interface control elements 814l displayed for the constant factor "X1" includes a number edit box 848a. Example operations of the number edit box 848a will now be described. However, it shall be noted that these examples are not intended to be limiting and that the dynamic row of editable user interface control elements 814l may include fewer, additional, or different items without departing from the scope of the disclosure. It shall also be noted that the control elements 848c-848g may have similar characteristics to the control elements 802a-802h, 810a-810h, 812a-812h, and 816a-816h described above.

Figure 14D:
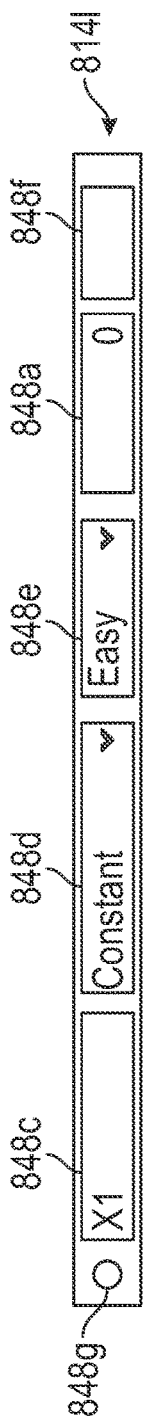

In some embodiments, numerical input provided to the number edit box 848a may be used to define a constant value for the factor "X1." For instance, in the example illustrated in FIG. 14D, the number edit box 848a is specifying (e.g., indicating) that the constant value of the factor "X1" is zero (0).

In some embodiments, one or more of the dynamic rows of editable user interface control elements displayed via the process 730 may be dynamically reconfigured when a factor type of a corresponding factor changes. Specifically, in some embodiments, when a factor changes to a new factor type (e.g., succeeding factor type), the dynamic row of editable user interface control elements may be reconfigured to cease displaying user interface control elements associated with a previous factor type (e.g., the incumbent factor type) and start displaying user interface control elements associated with the new factor type (e.g., the succeeding factor type). For instance, as shown in FIG. 13, when the design of experiment factor named "Factor 1" changed—for reasons previously described in process 720—from being a categorical factor (as illustrated in FIG. 11) to being a continuous factor (as shown in FIG. 13), the dynamic row of editable user interface control elements 814*f* was reconfigured from displaying the user interface control elements 848*a*-848*d* associated with defining experimental values for the categorical factor type (as illustrated in FIG. 11) to displaying the user interface control elements 834*a* and 834*b* associated with defining experimental values for the continuous factor type (as shown in FIG. 13).

It shall be noted that, in some embodiments, if the design of experiment factor named "Factor 1" was instead changed from being of a categorical factor type to a discrete numeric factor type, blocking factor type, mixture factor type, constant factor type, or uncontrolled factor type, the dynamic row 814*f* would have instead been dynamically reconfigured to display user interface control elements associated with defining experimental values for the discrete numeric factor (e.g., elements similar to 830*a*-830*d* in FIG. 13), the blocking factor type (e.g., elements similar to 844*a*-844*b* in FIG. 14B), the mixture factor type (e.g., elements similar to 846*a*-846*b* in FIG. 14A), the constant factor type (e.g., element similar to 848*a* in FIG. 14D), or the uncontrolled factor type, respectively. It shall also be noted that, in some embodiments, "dynamically reconfiguring a row" as referred to herein may additionally, or alternatively, include performing one or more of the operations described with reference to process 3924 in the method 3900.

Stated another way, the dynamic reconfiguration of a row, as referred to herein, may be initiated in response to detecting a user input selecting a new factor type for a target factor. Accordingly, in response to detecting the user input, the method 700 may function to dynamically (e.g., automatically) reconfigure a row of user interface control elements corresponding to the target factor by ceasing a display of user interface control elements associated with a previous factor type of the target factor and initiating a display of user interface control elements associated with the new factor type of the target factor.

Figure 15:
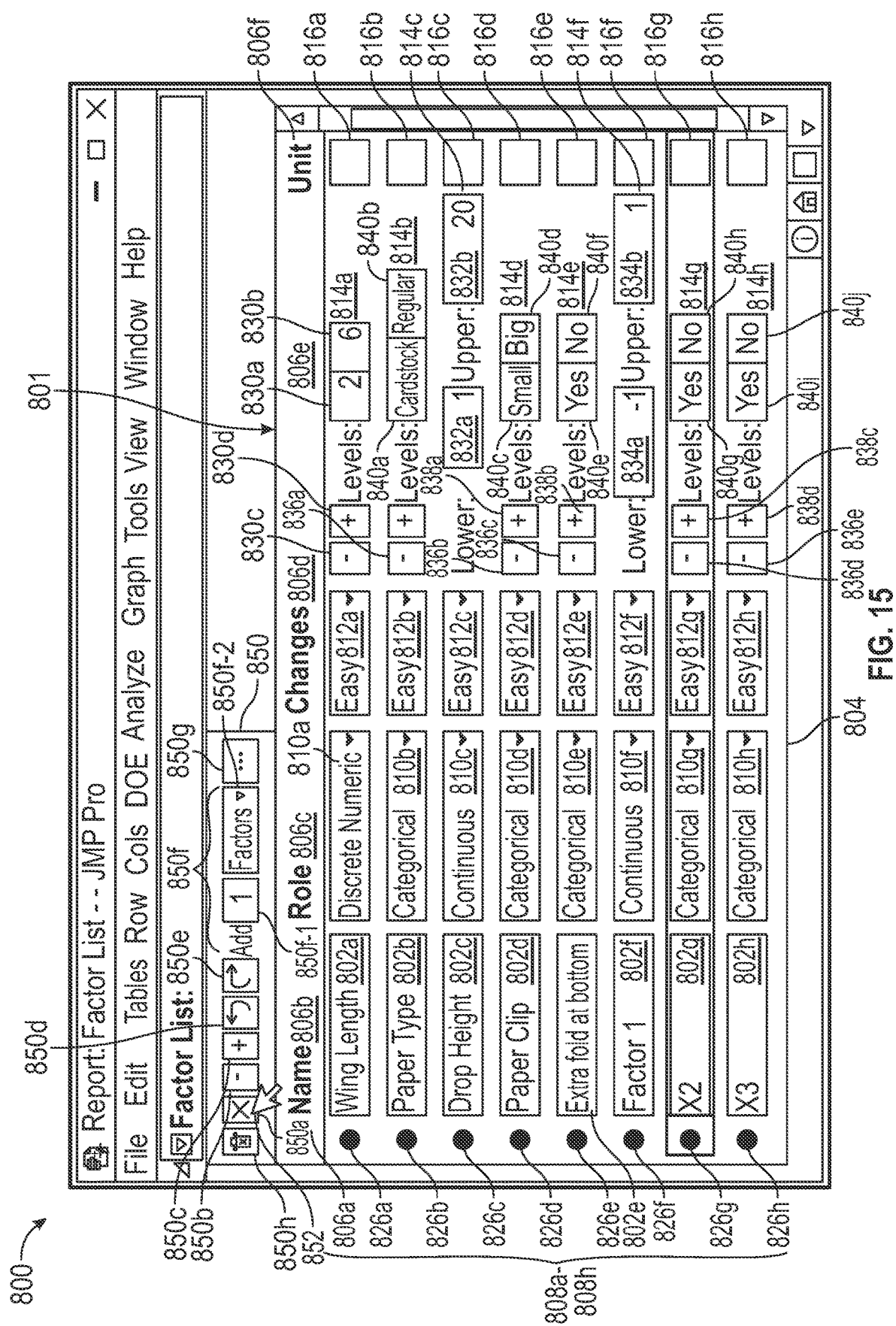

Referring to FIG. 7, in some embodiments, the method 700 may include a process 740 that functions to display a composite factor UI control component configured to receive inputs for generating one or more control signals that add or remove one or more DOE factors of the set of DOE factors. An example of the process 740 displaying a composite factor user interface control component is illustrated in FIG. 15. Specifically, in FIG. 15, the process 740 is causing the composite factor user interface control component 850 to be displayed in the design of experiments factor specification user interface 800. Example control elements that may be included in the composite factor user interface control component 850 will now be described.

Figure 16:
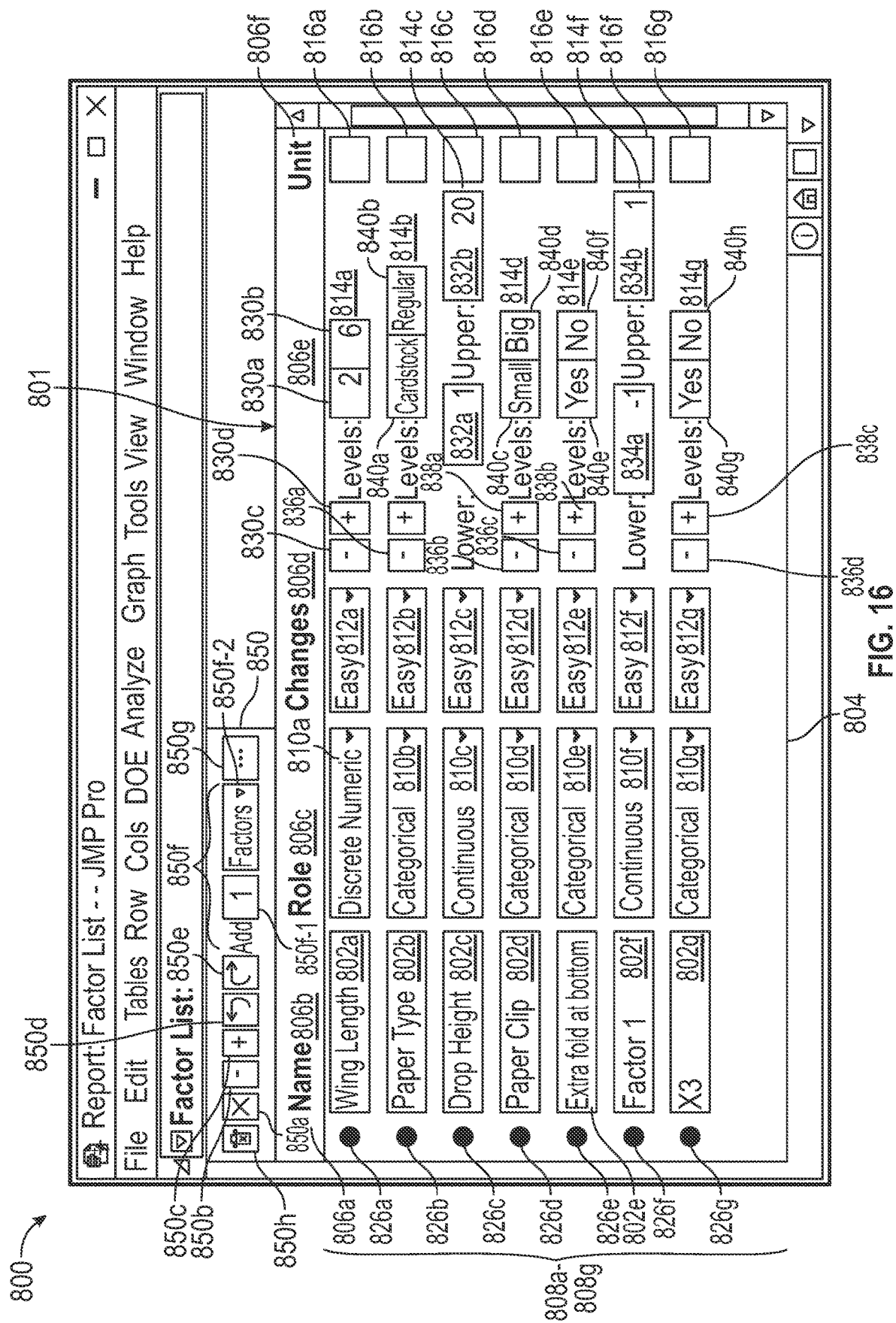

In some embodiments, the composite factor user interface control component 850 may include a button control element 850*a*. The button control element 850*a*, in some embodiments, may be configured to remove one or more previously selected factors from the design of experiments. For instance, as also illustrated in FIG. 15, an input 852 directed towards the button control element 850*a* is detected while the factor-setting composition component row 808*g* is selected. In response, as illustrated in FIG. 16, the factor-setting composition component row 808*g* is removed from the factor-setting grid container control 804. It shall be noted that the above example is not intended to be limiting and that if additional or different factor-setting composition component rows were selected than illustrated, the additional or different factor-setting composition components rows would be deleted in analogous ways.

Figure 17:
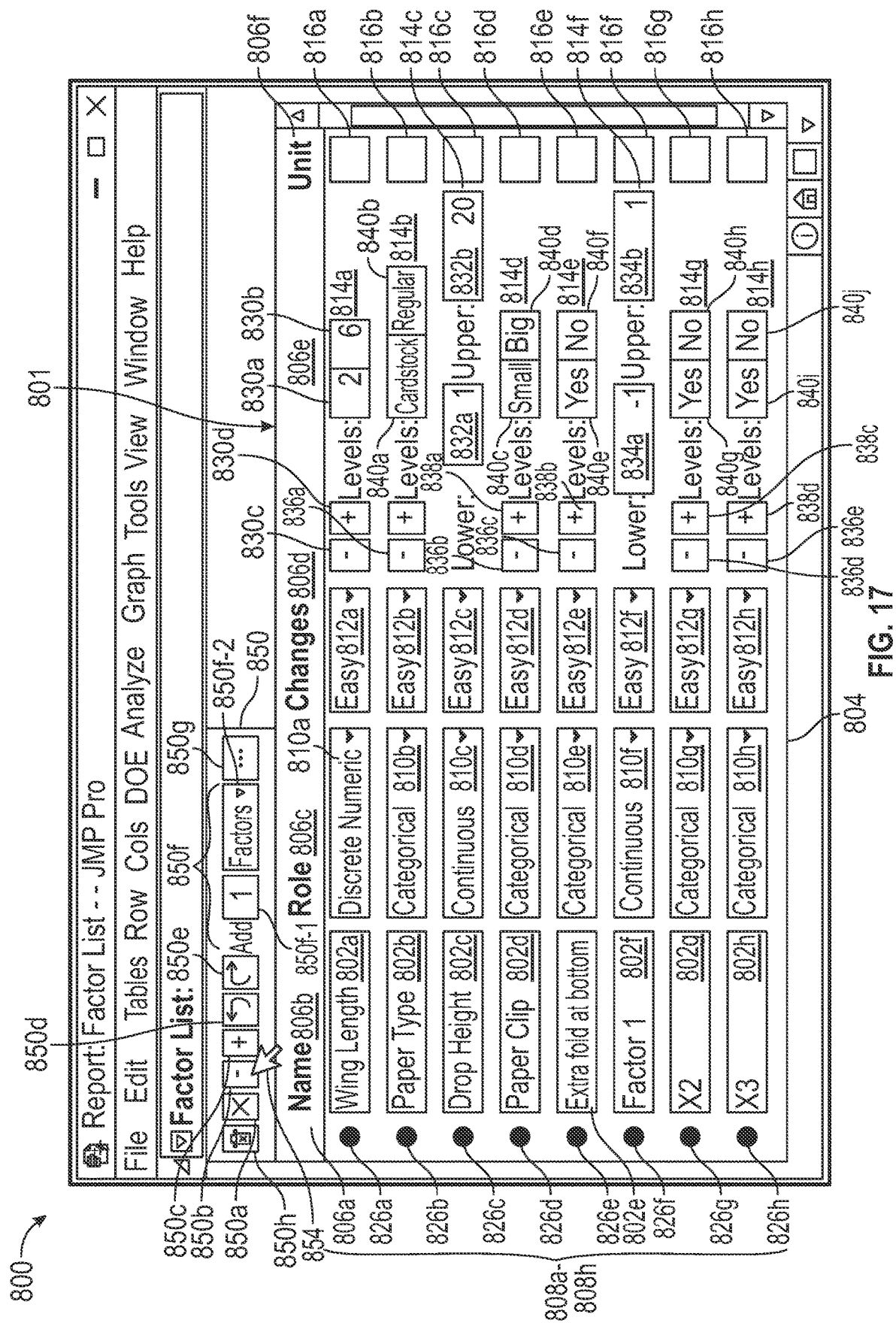
Figure 18:
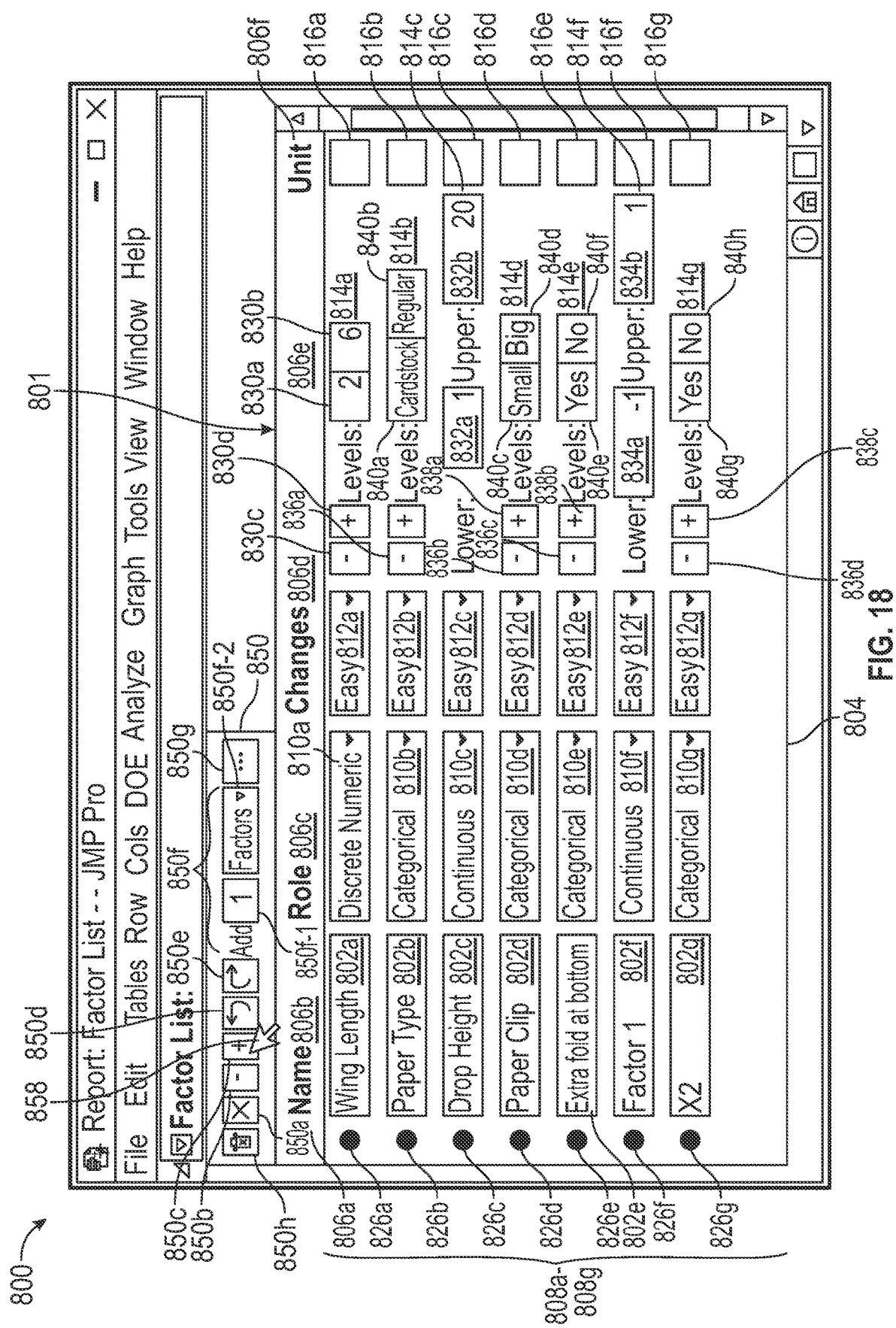

Additionally, or alternatively, in some embodiments, the composite factor user interface control component 850 may include a button control element 850*b*. The button control element 850*b*, in some embodiments, may be configured to remove one or more design of experiment factors displayed at an end of the factor-setting grid container control 804. For instance, as illustrated in FIG. 17, an input 854 selecting the button control element 850*b* is detected and, in response, as illustrated in FIG. 18, the factor-setting composition component row 826*h* is removed from the end of the factor-setting grid container control 804.

Figure 19:
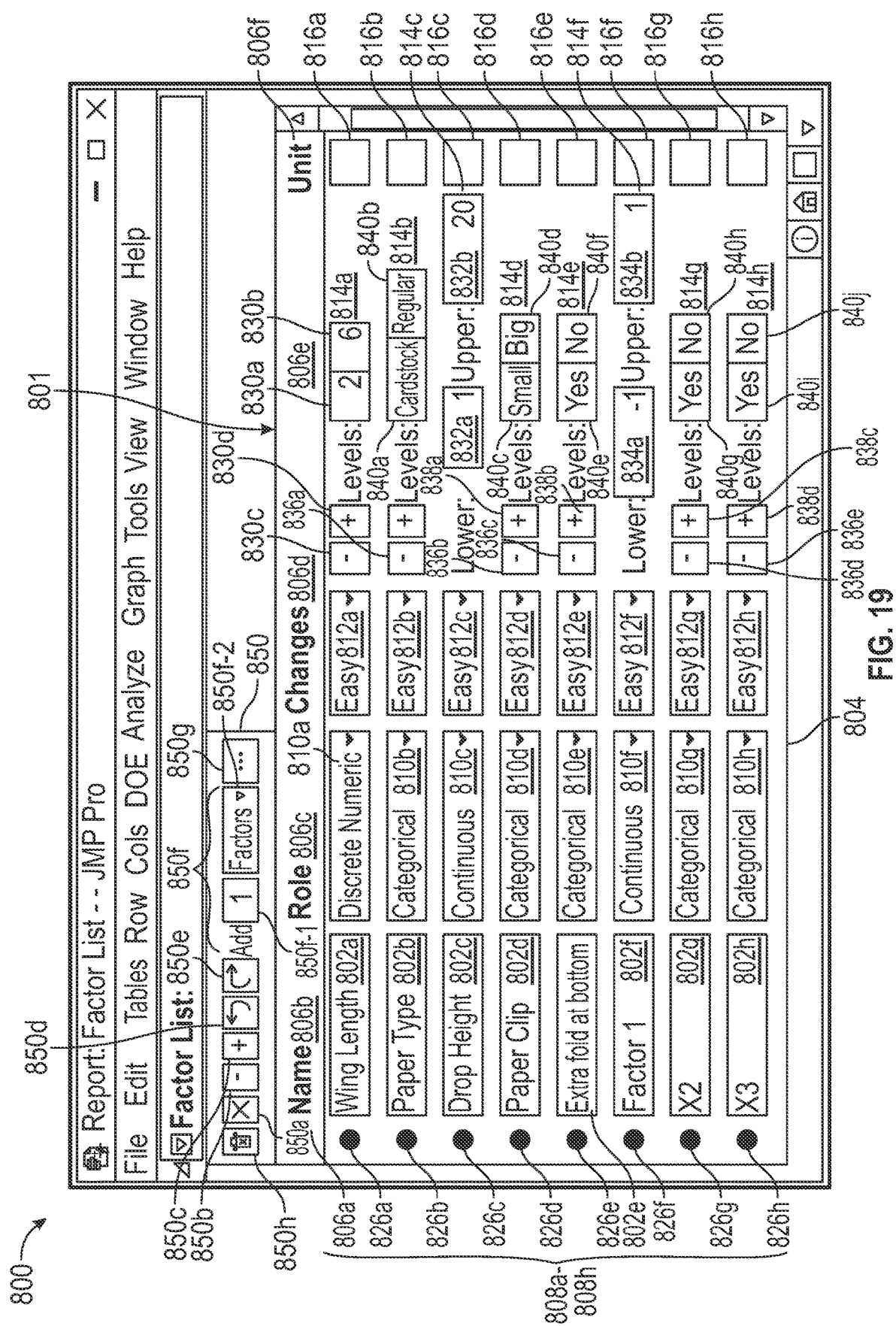

Additionally, or alternatively, in some embodiments, the composite factor user interface control component 850 may include a button control element 850*c*. The button control element 850*c*, in some embodiments, may be configured to add one or more design of experiment factors to the design of experiments. For instance, as also illustrated in FIG. 18, an input 858 selecting the button control element 850*c* is detected and, in response, as illustrated in FIG. 19, the factor-setting composition component row 826*h* is added (e.g., appended) to the end of the factor-setting grid container control 804.

It shall be noted that, in some instances, a factor-setting composition component row being added to the design of experiments factor specification user interface may exceed a current display area of the design of experiments factor specification user interface. Accordingly, in some examples of such embodiments, the design of experiments factor specification user interface may be automatically scrolled to a section of the design of experiments factor specification user interface that at least includes the recently added factor-setting composition component row.

Figure 20:
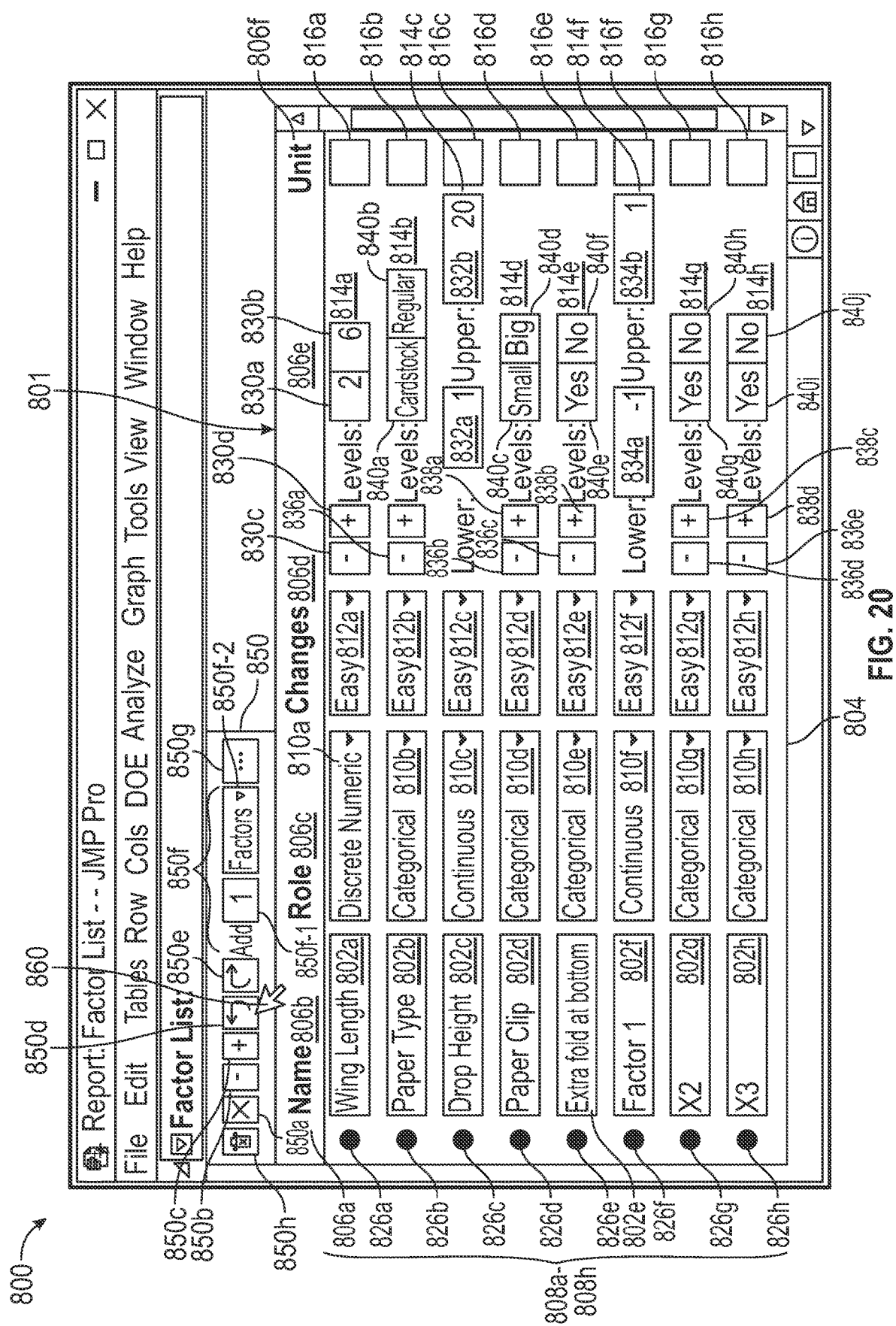
Figure 21:
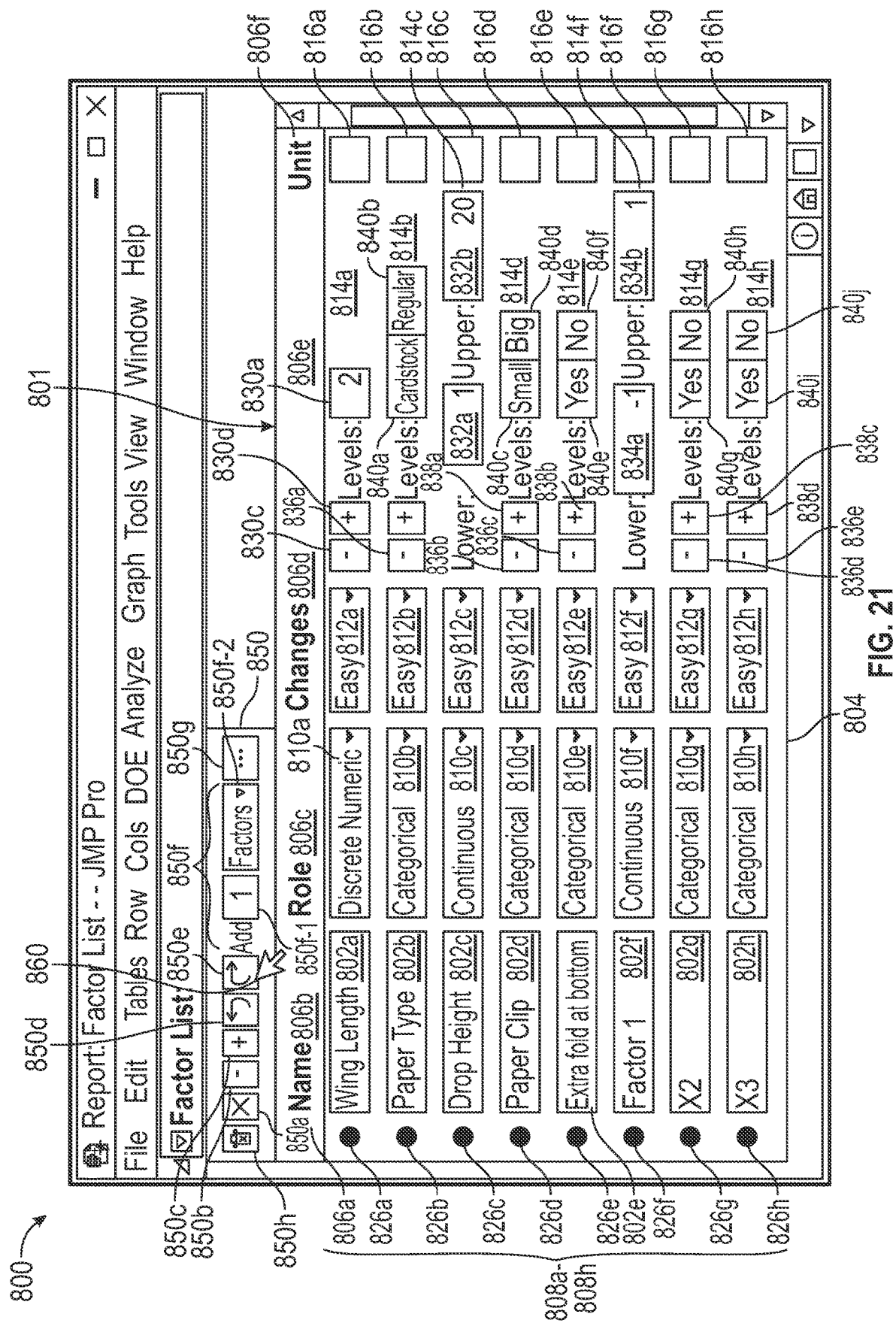

Additionally, or alternatively, in some embodiments, the composite factor user interface control component 850 may include a button control element 850*d*. The button control element 850*d*, in some embodiments, may be configured to undo one or more operations performed by a user interacting with the design of experiments graphical user interface 800. Specifically, in some embodiments, the button control element 850*d* may undo user input(s) directed to the control elements 802*a*-802*h*, 810*a*-810*h*, 812*a*-812*h*, 814*a*-814*h*, 816*a*-816*h*, and 850*a*-850*h*, and/or may undo operations performed by the control elements 802*a*-802*h*, 810*a*-810*h*, 812*a*-812*h*, 814*a*-814*h*, 816*a*-816*h*, and/or 850*a*-850*h*. For instance, in the example of FIG. 20, an input 860 selecting the button control element 850*d* is detected and, in response, as illustrated in FIG. 21, the number edit box 830*b* illustrated in FIG. 20 is no longer being displayed in the design of experiments factor specification user interface 800 (e.g., the discrete numeric level '6' is no longer associated with the factor named "Wing Length").

Figure 22:
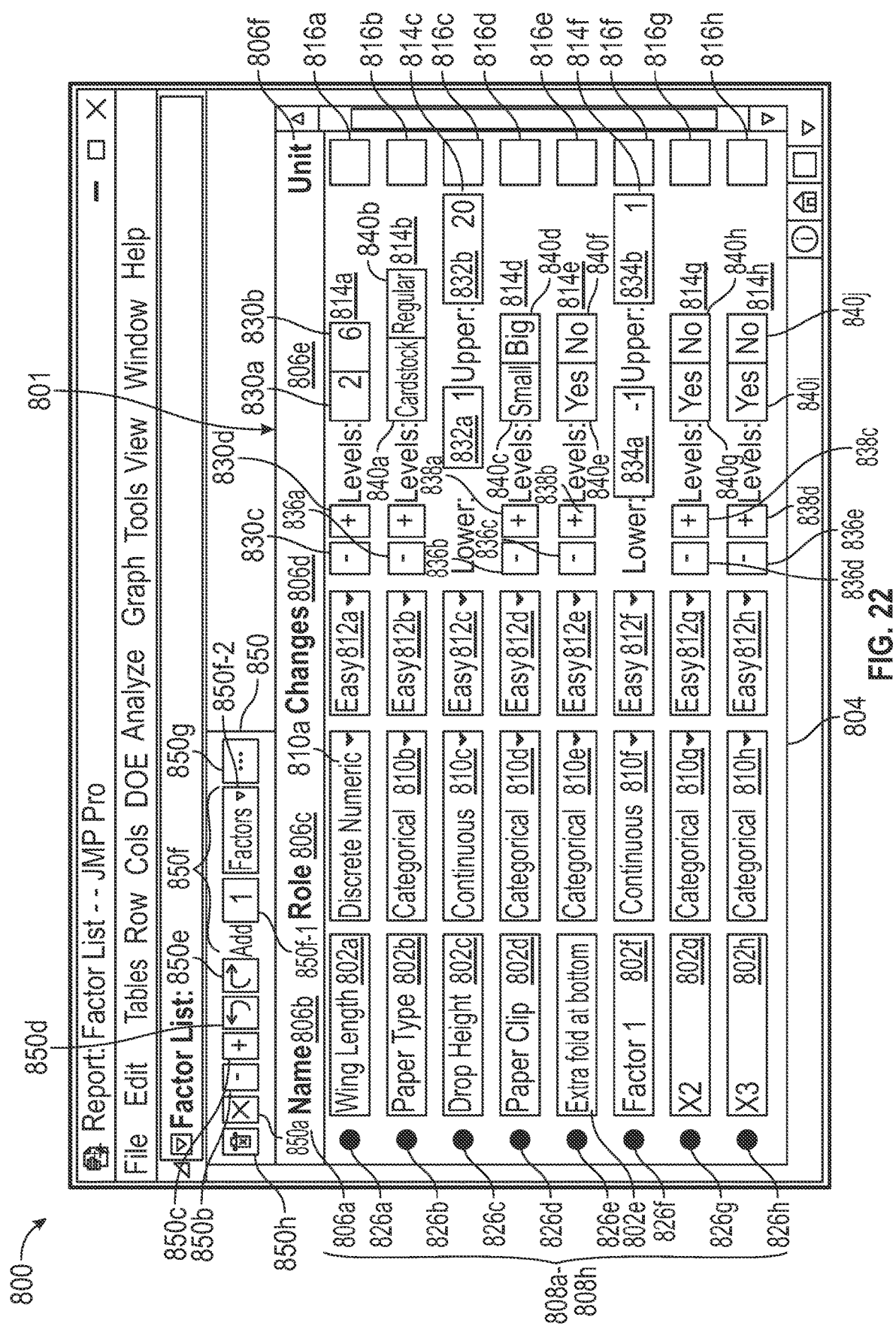

Additionally, or alternatively, in some embodiments, the composite factor user interface control component 850 may include a button control element 850*e*. The button control element 850*e*, in some embodiments, may be configured to reverse one or more most recent in time operations of the button control element 850*d*. For instance, as also illustrated in FIG. 21, an input 862 selecting the button control element 850*e* is detected and, in response, as illustrated in FIG. 22, the number edit box 830*b* is re-displayed in the design of experiments factor specification user interface 800 (e.g., the discrete numeric level '6' is re-associated with the factor named "Wing Length").

Figure 26:
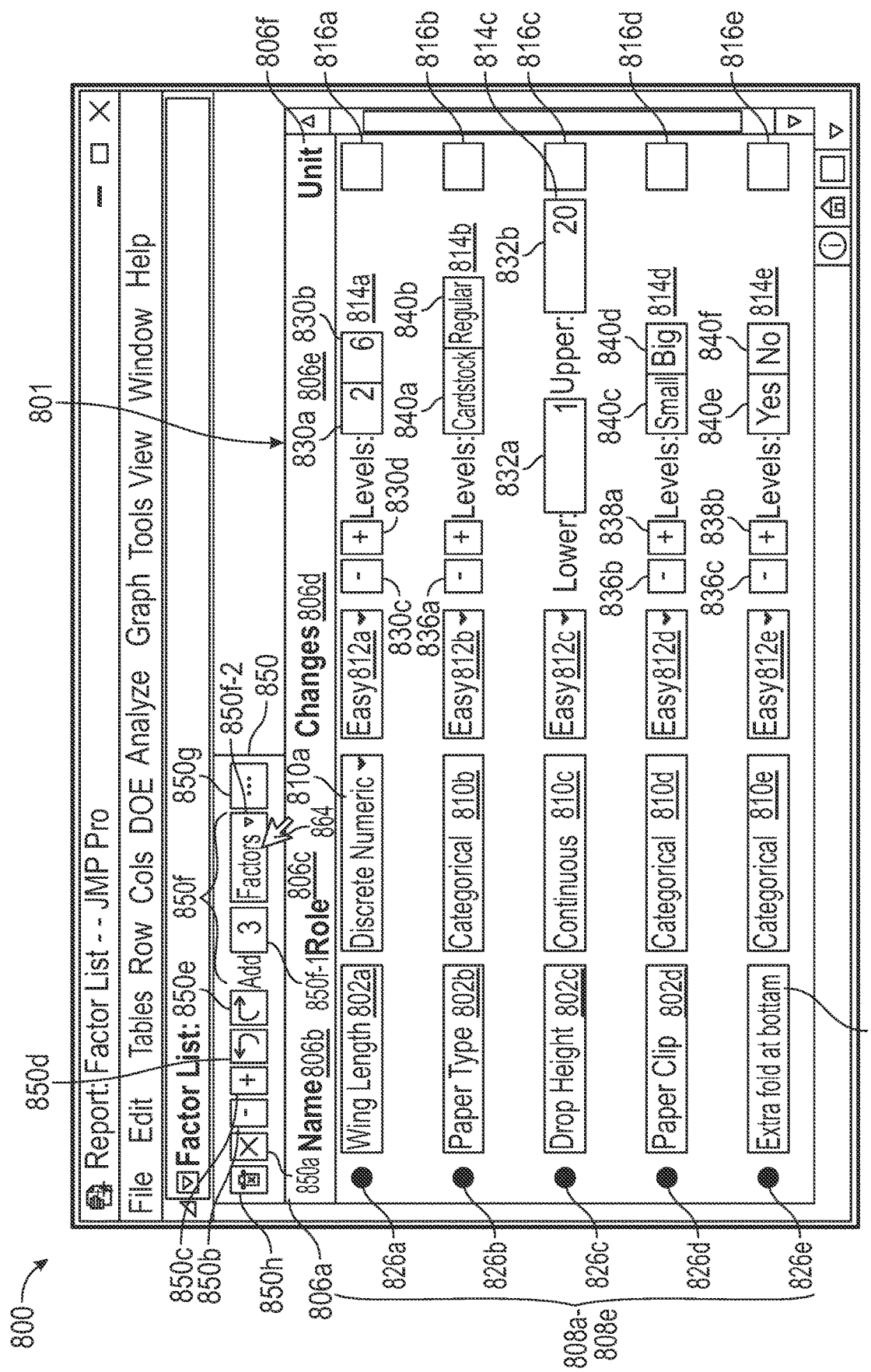

Additionally, or alternatively, in some embodiments, the composite factor user interface control component 850 may include a sub-composite factor user interface control component 850*f* for adding design of experiment factors of a respective factor type in bulk. As shown in FIG. 26, in some embodiments, the sub-composite factor user interface 850*f* may include a number edit control element 850*f*-1 and a drop-down menu element 850*f*-2. Example operations and characteristics of the number edit control element 850*f*-1 and the drop-down menu element 850*f*-2 will now be described.

In some embodiments, numeric input received by the number edit control element 850*f*-1 may control a total number of design of experiment factors to add to the design of experiments factor specification user interface 800. For instance, in the example of FIG. 26, the numeric input being displayed within the number edit control element 850*f*-1 is indicating that, when the drop-down menu element 850*f*-2 is operated, three (3) design of experiment factors will be added (e.g., appended) to the design of experiments factor specification user interface 800. It shall be noted that the above example is not intended to be limiting and that the number edit control component 850*f*-1 may specify fewer or additional design of experiments to the to the design of experiments factor specification user interface 800 without departing from the scope of the disclosure.

Figure 27:
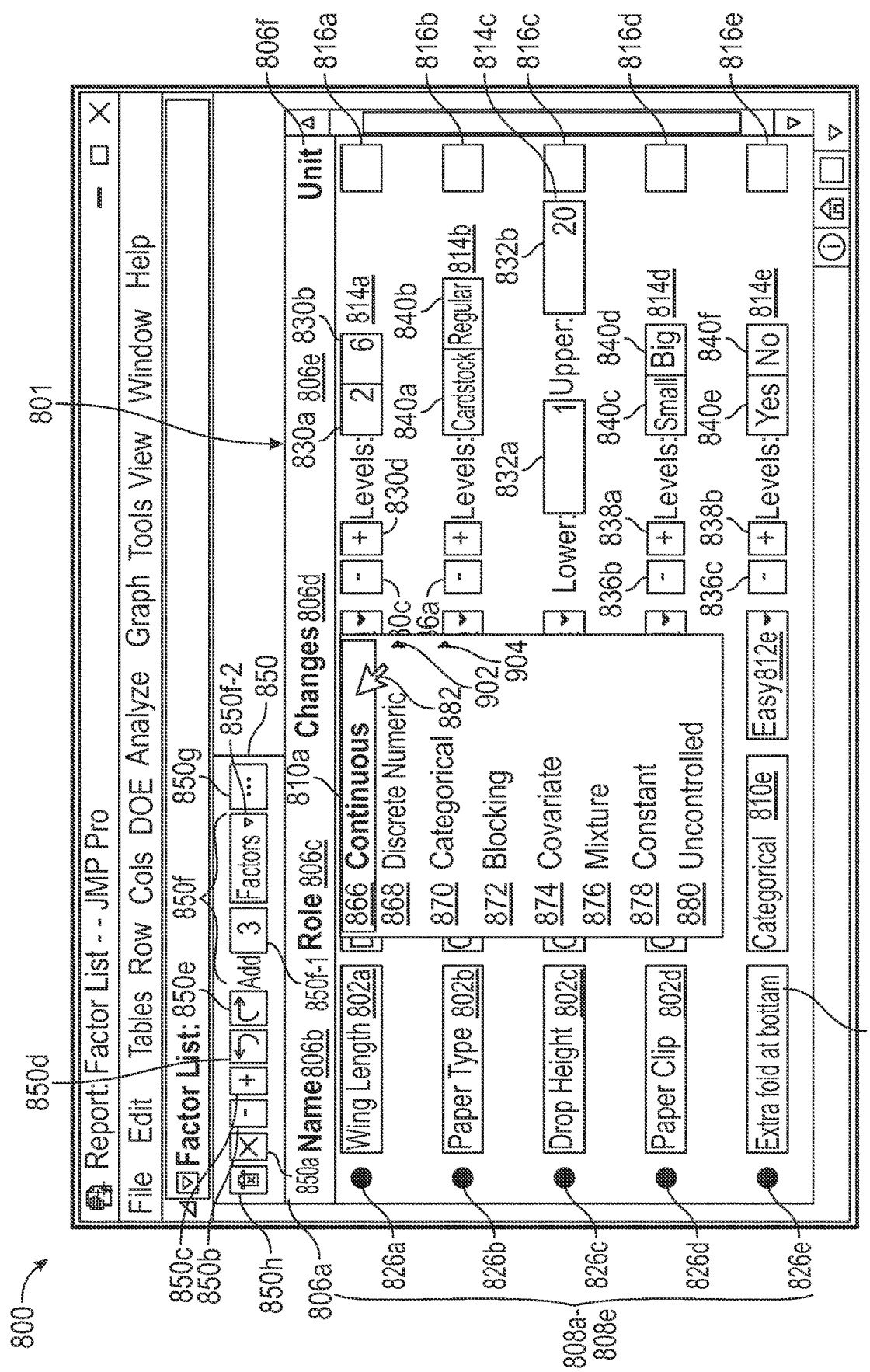

In some embodiments, a selection of the drop-down menu element 850*f*-2 may cause a plurality of factor type user interface control elements to be displayed in the design of experiments factor specification user interface 800. For instance, as also shown in FIG. 26, an input 864 selecting the drop-down menu element 850*f*-2 is detected and, in response, as illustrated in FIG. 27, the drop-down menu element expands to display a plurality of factor type user interface control elements 866-880. Specifically, in FIG. 27, the plurality of factor type user interface control elements correspond to a continuous factor type, a discrete numeric factor, a categorical factor type, a blocking factor type, a covariate factor type, a mixture factor type, a constant factor type, and an uncontrolled factor type, respectively.

Figure 28:
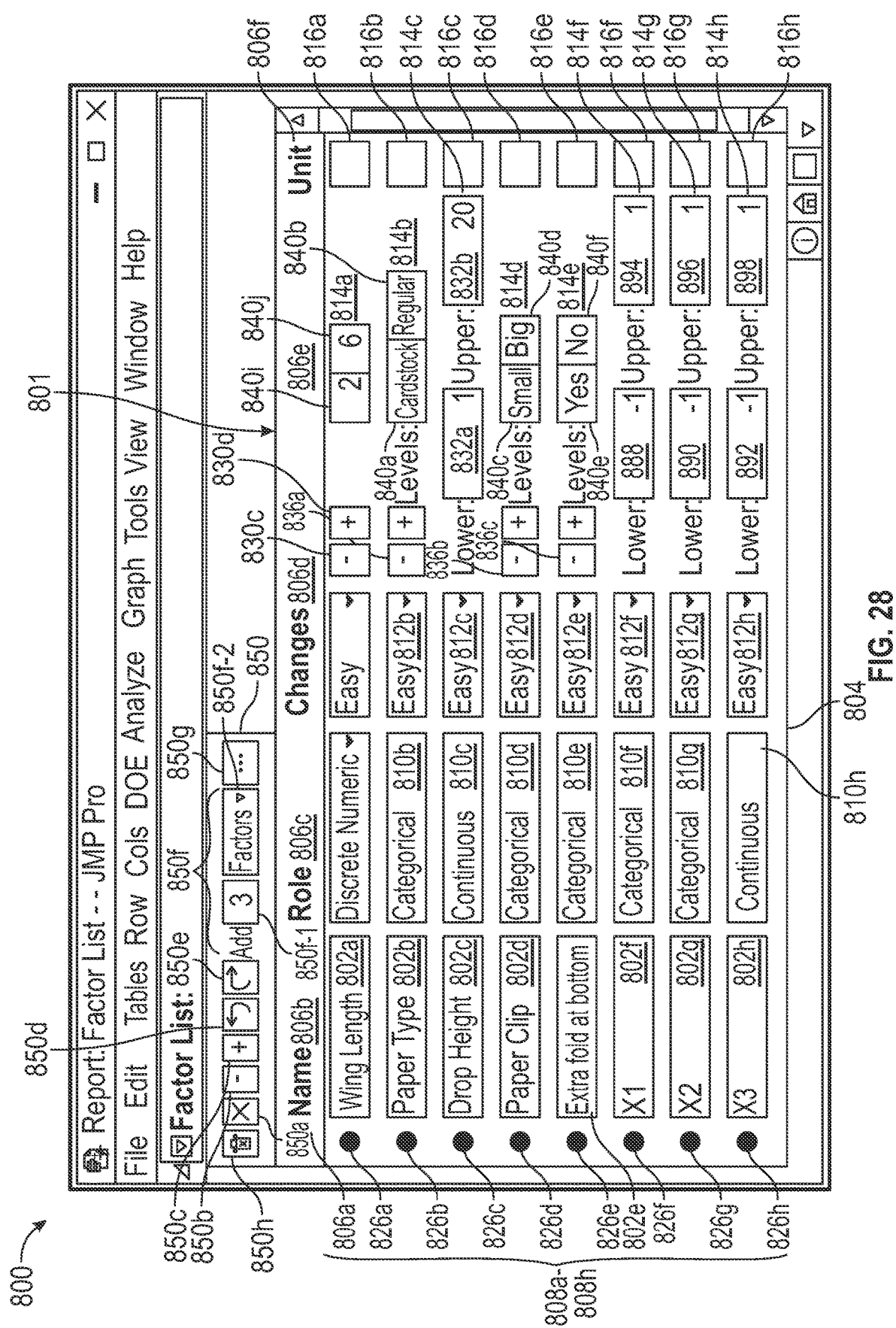

In some embodiments, the plurality of factor type user interface control elements 866-880 may be selectable and, when selected, control the type of design of experiment factors added to the design of experiments factor specification user interface 800. For instance, as also shown in the example of FIG. 27, an input 882 selecting the factor type user interface control element 866 is detected and, in response, as illustrated in FIG. 28, three (3) factor-setting composition component rows 808*f*-808*h* corresponding to the continuous factor type are added to the design of experiments factor specification user interface 800. Specifically, in FIG. 28, the control elements 802*f*-802*h*, 810*f*-810*h*, 812*f*-812*h*, 814*f*-814*h*, and 888-898 are indicating that the design of experiment factors corresponding to the newly added factor-setting are named X, X2, X3, are of the continuous factor type, have changes set to 'easy', have a lower limit of negative one (−1), and have an upper limit of one (1), respectively.

It shall be noted that, in some embodiments, if the number edit box control element 850*f*-1 specified a different number of design of experiment factors to add than as illustrated (e.g., a number other than three (3)), a different number of factor-setting composition component rows would have instead been added to the design of experiments factor specification user interface 800.

Additionally, as illustrated in FIG. 27, the factor type user interface control elements 868 and 870 are being displayed in associated with visual indications 902, 904, respectively. Specifically, in FIG. 27, the visual indications 902 and 904 are indicating that input may cause the drop-down menu element 850*f*-2 to be further expanded for defining a total number of discrete numeric levels and categorical levels associated with the design of experiment factors being added to the design of experiments factor specification user interface 800. For instance, as illustrated in FIG. 29, an input 882 directed to the factor type user interface control element 868 is detected and, in response, as also illustrated in FIG. 29, a plurality of factor level user interface control elements 906-920 are displayed for specifying a total number of discrete numeric factor levels to define for the design of experiment factors being added to the design of experiments factor specification user interface 800.

Figure 29:
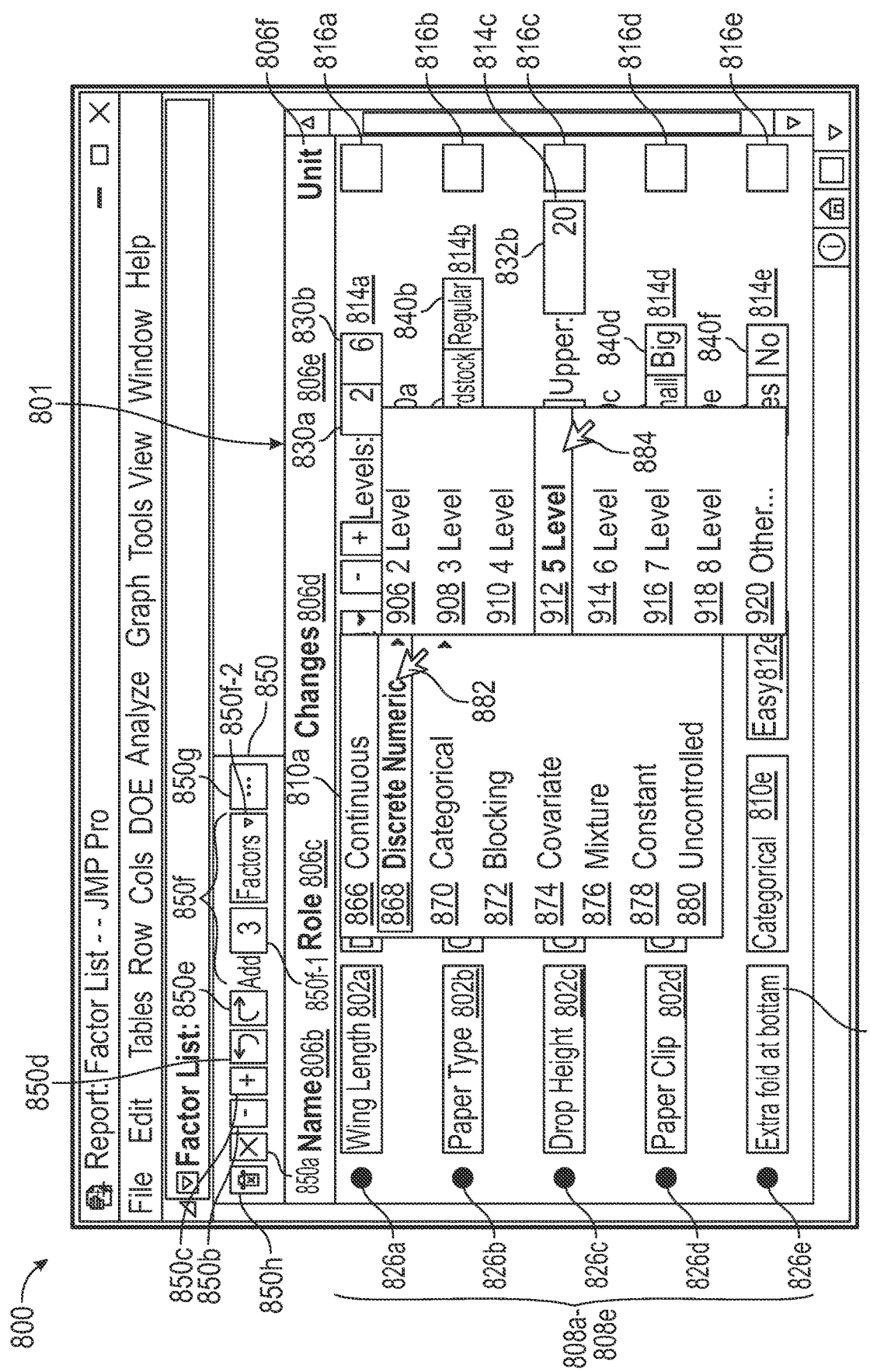
Figure 30:
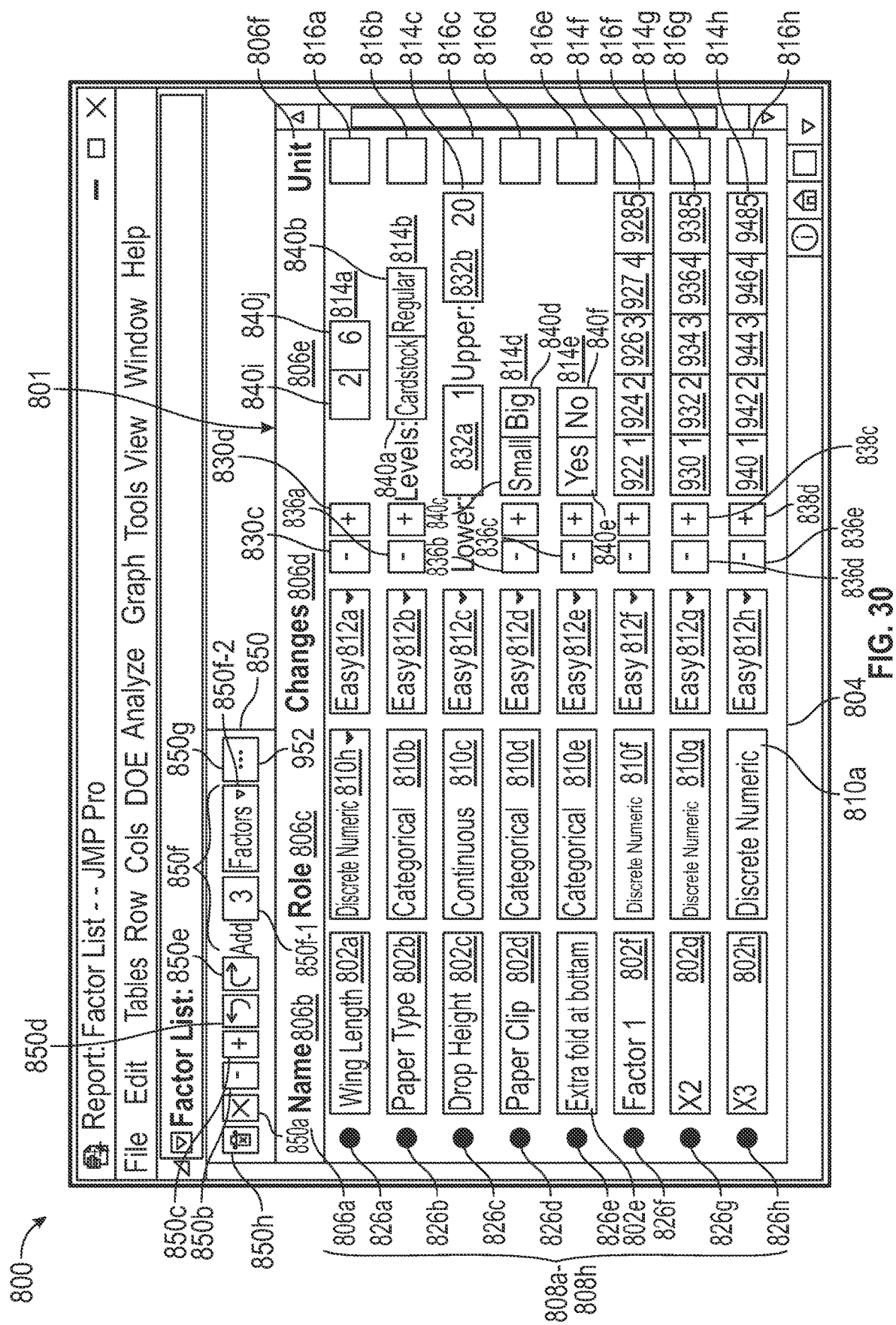

Furthermore, as also illustrated in FIG. 29, an input 884 selecting the factor level user interface control element 912 is detected. In response, as illustrated in FIG. 30, three design of experiment factors are added to the design of experiments factor specification user interface 800 (indicated by the factor-setting composition component rows 808*f*-808*h*). Specifically, in FIG. 28, the control elements 802*f*-802*h*, 810*f*-810*h*, 812*f*-812*h*, 814*f*-814*h*, and 922-948 are indicating that the design of experiment factors corresponding to the newly added factor-setting are named X, X2, X3, are of the discrete numeric factor type, have changes set to 'easy,' and are associated with five discrete numeric levels having values one (1), two (2), three (3), four (4), and five (5), respectively.

Figure 31:
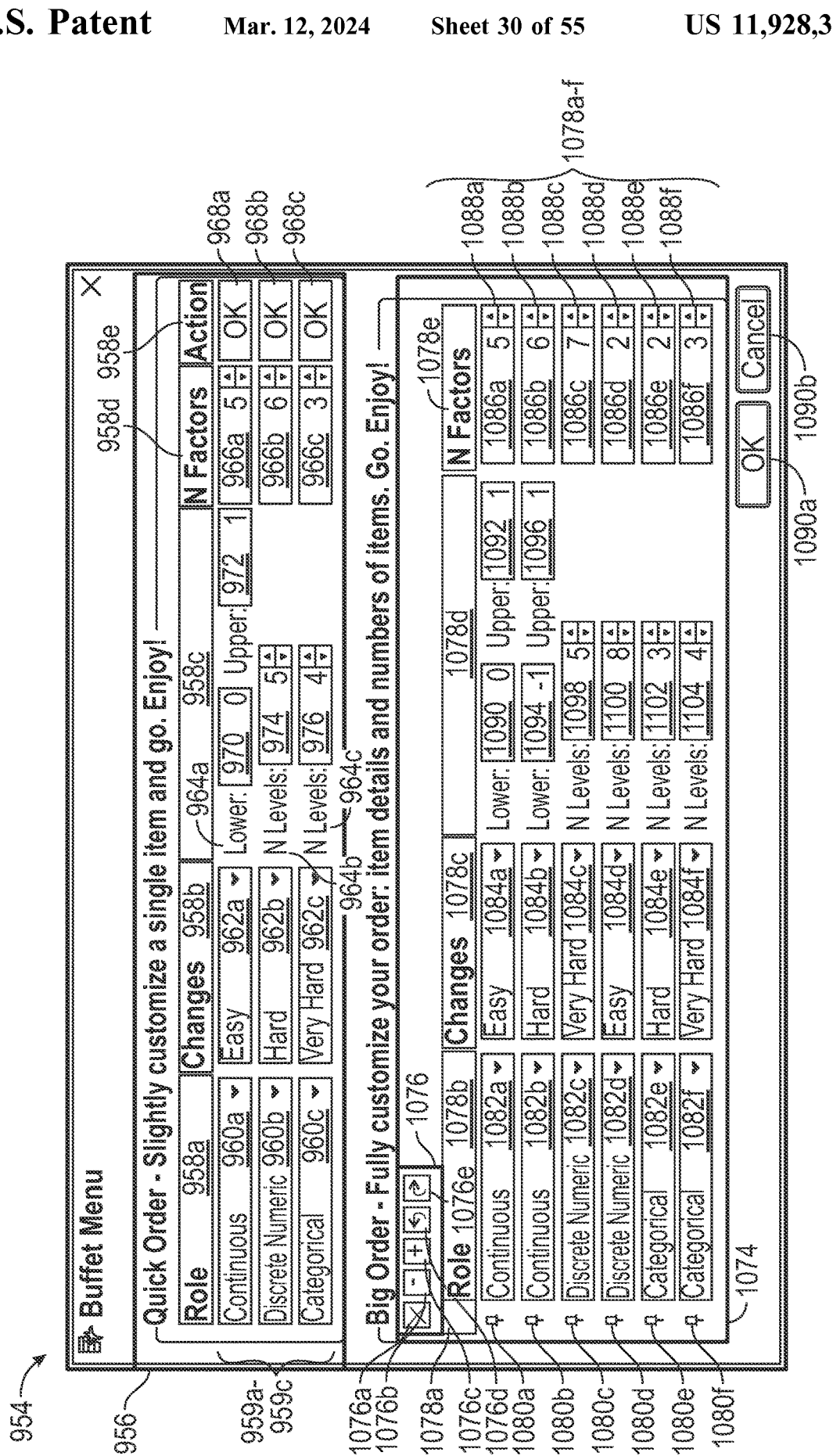

Additionally, or alternatively, in some embodiments, the composite factor user interface control component 850 may include a factor dialog control button 850*g* that, when selected, causes a dialog menu element to be displayed. For instance, as also shown in FIG. 30, an input 952 selecting the factor dialog control button 850*g* is detected and, in response, as shown in FIG. 31, a dialog menu element 954 is displayed. It shall be noted that, while not explicitly illustrated in FIG. 31, the dialog menu element 954 may be displayed in a variety of ways including, but not limited to, overlaid on the design of experiments factor specification user interface 800, in a new user interface (e.g., distinct from the design of experiments factor specification user interface 800), or the like.

In some embodiments, the dialog menu element 954 may include a first grid container control 956 comprising one or more rows and one or more columns. For instance, in the example of FIG. 31, the first grid container control 956 includes a column 958*a* named "Role," a column 958*b* named "Changes," a dynamic column 958*c*, a column 958*d* named "N Factors," and a column 958*e* named "Action." Specifically, in FIG. 31, the columns 958*a*-958*e* include a plurality of factor text labels 960*a*-960*c*, a plurality of combo box user interface control elements 962*a*-962*c* (similar to elements 812*a*-812*h* illustrated in FIG. 8), a plurality of dynamic rows of editable user interface control components 964*a*-964*c*, a plurality of number input fields 966*a*-966*c*, and a plurality of button control elements 968*a*-968*c*, respectively.

Furthermore, as also illustrated in FIG. 31, the first grid container control 956 includes a plurality of factor-setting composition component rows 959*a*-959*c*. Specifically, in FIG. 31, the factor-setting composition component rows 959*a*-959*c* include the user interface elements 960*a*-968*a*, 960*b*-968*b*, and 960*c*-968*c*, respectively. Example characteristics and operations of the above-mentioned user interface elements will now be described.

In some embodiments, the plurality of factor text labels 960*a*-960*c* may indicate the type of factors that will be added to the design of experiments factor specification user interface 800 when a selection of the button control elements 968a-968c are detected. For instance, in the example of FIG. 31, the plurality of factor text labels 960a-960c are indicating that the button control elements 968a-968c, when selected, will add one or more continuous factors, one or more discrete numeric factors, and one or more categorical factors to the design of experiments factor specification user interface 800, respectively.

In some embodiments, the plurality of combo box user interface control elements 962a-962c may indicate a change difficultly level of the continuous factors, discrete numeric factors, and categorical factors that will be added to the design of experiments factor specification user interface 800 when a selection of the button control elements 968a-968c is detected, respectively. For instance, in the example of FIG. 31, the plurality of combo box user interface control elements 962a-962c are indicating that continuous, discrete numeric, and categorical factors added via button controls 968a-968c will have a change difficulty level set "Easy," "Hard," and "Very Hard," respectively. It shall be noted that, in some embodiments, input directed to the plurality of combo box user interface control elements 962a-962c may cause the plurality of combo box user interface control elements 962a-962c to expand for enabling a user interacting with the design of experiments graphical user interface 800 to select a factor change difficulty level for the continuous factor role, discrete numeric factor role, and categorical factor role, respectively.

In some embodiments, the rows 964a-964c of editable user interface control elements may include user interface control elements for specifying attributes of factors that will be added to the design of experiments factor specification user interface 800 when a selection of the button control elements 968a-968c is detected. Examples of items/content that may be displayed within the rows 964a-964c of editable user interface control element will now be described below.

In some embodiments, the row 964a of editable user interface control elements may include one or more user interface control elements that are configured to receive input for defining a continuous range of the continuous factor(s) added via the button control element 968a. For instance, in the example of FIG. 31, the row 964a of editable user interface control elements includes number edit boxes 970 and 972 that are specifying that the continuous factors added via button control element 968a will have a minimum value zero (0) and a maximum value of one (1), respectively.

In some embodiments, the row 964b of editable user interface control elements may include one or more user interface control elements that are configured to receive input for defining a number of levels for the discrete numeric factors added via the button control element 968b. For instance, as also illustrated in the example of FIG. 31, the row 964b of editable user interface control elements includes a number input field 974 that is specifying that the discrete numeric factors added via button control element 968b will have five (5) discrete levels.

In some embodiments, the row 964c of editable user interface control elements may include one or more user interface control elements that are configured to receive input for defining a number of levels for the categorical factors added via the button control element 968c. For instance, as also illustrated in the example of FIG. 31, the row 964c of editable user interface control elements includes a number input field 976 that is specifying that the categorical factors added via button control element 968c will have four (4) categorical levels.

In some embodiments, the plurality of number input fields 966a-966c may be configured to receive input for specifying a total number of factors to add to the design of experiments factor specification user interface 800 when a selection of the button control elements 968a-968c is detected, respectively. For instance, in the example of FIG. 31, the plurality of number input fields 966a-966c are specifying that five (5) continuous factors, six (6) discrete numeric factors, and three (3) categorical factors will be added to the design of experiments factor specification user interface 800 when the button control elements 968a-968c are selected, respectively.

Figure 32:
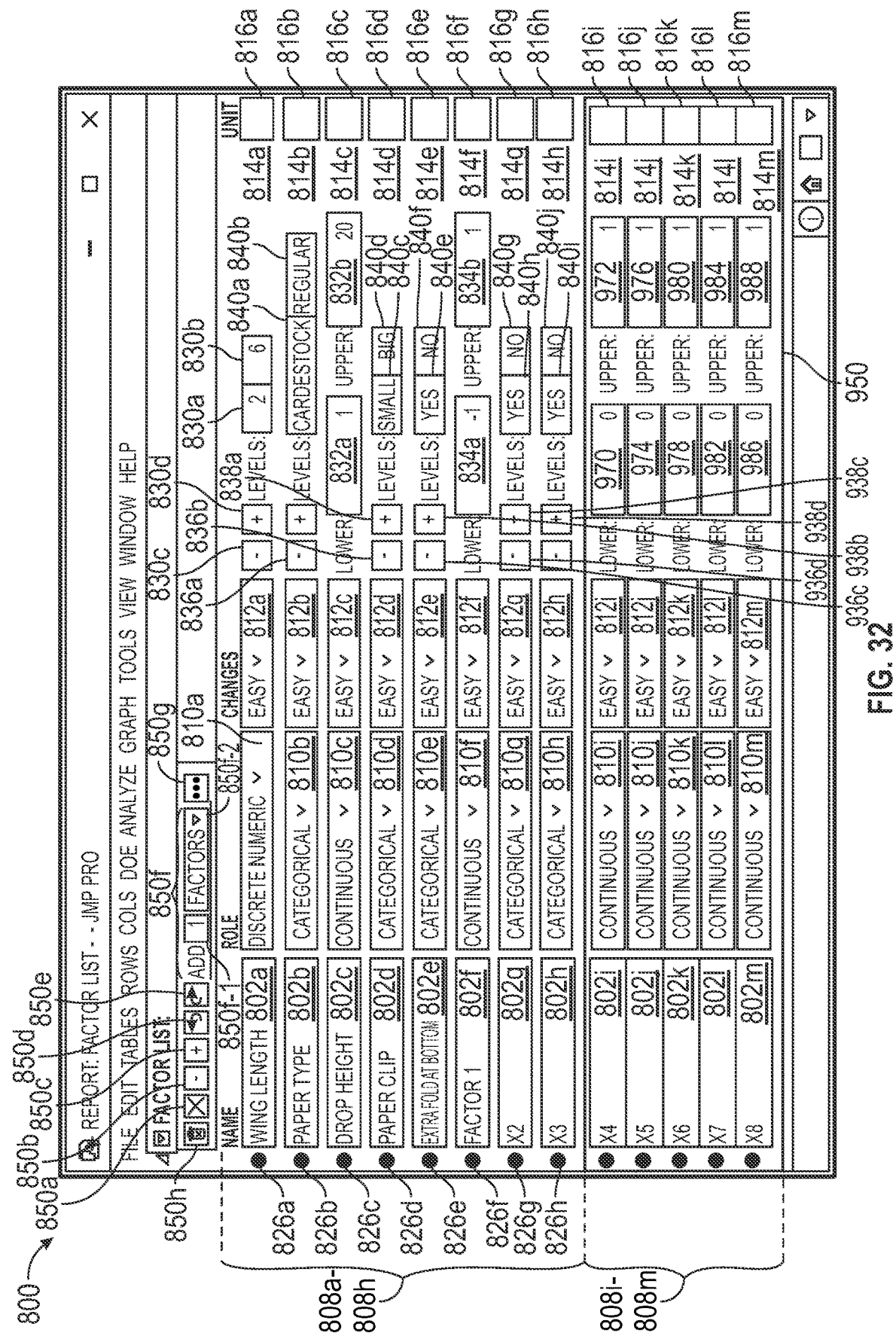

In some embodiments, the button control element 968a, when selected, may add one or more factors to the design of experiments factor specification user interface 800 in a manner defined by the elements 960a-966a. An example result of selecting the button control element 968a is illustrated in FIG. 32. Specifically, in FIG. 32 and because the number input field 966a illustrated in FIG. 31 includes the numerical value five (5), a corresponding number of factor-setting composition component rows 808i-808m are added to the design of experiments factor specification user interface 800.

Additionally, as shown in FIG. 32, the plurality of factor-setting user interface control elements 802i-802m, the plurality of factor-type user interface control elements 810i-810m, the plurality of design of experiments platform configuration user interface control elements 812i-812m, and the plurality of number input fields 970-988 included in the plurality of dynamic rows of editable user interface control elements 814i-814m are indicating that the design of experiment factors corresponding to the factor-setting composition component rows 808i-808m are named "X4"-"X8", respectively, have a factor type based on the text label 960a illustrated in FIG. 31 (e.g., continuous factor type), have a change difficulty level based on the combo box user interface control element 962a illustrated in FIG. 31 (e.g., Easy), and have a continuous range based on the number input fields 970-972 illustrated in FIG. 31 (e.g., a continuous range between zero (0) and one (1)).

Figure 33:
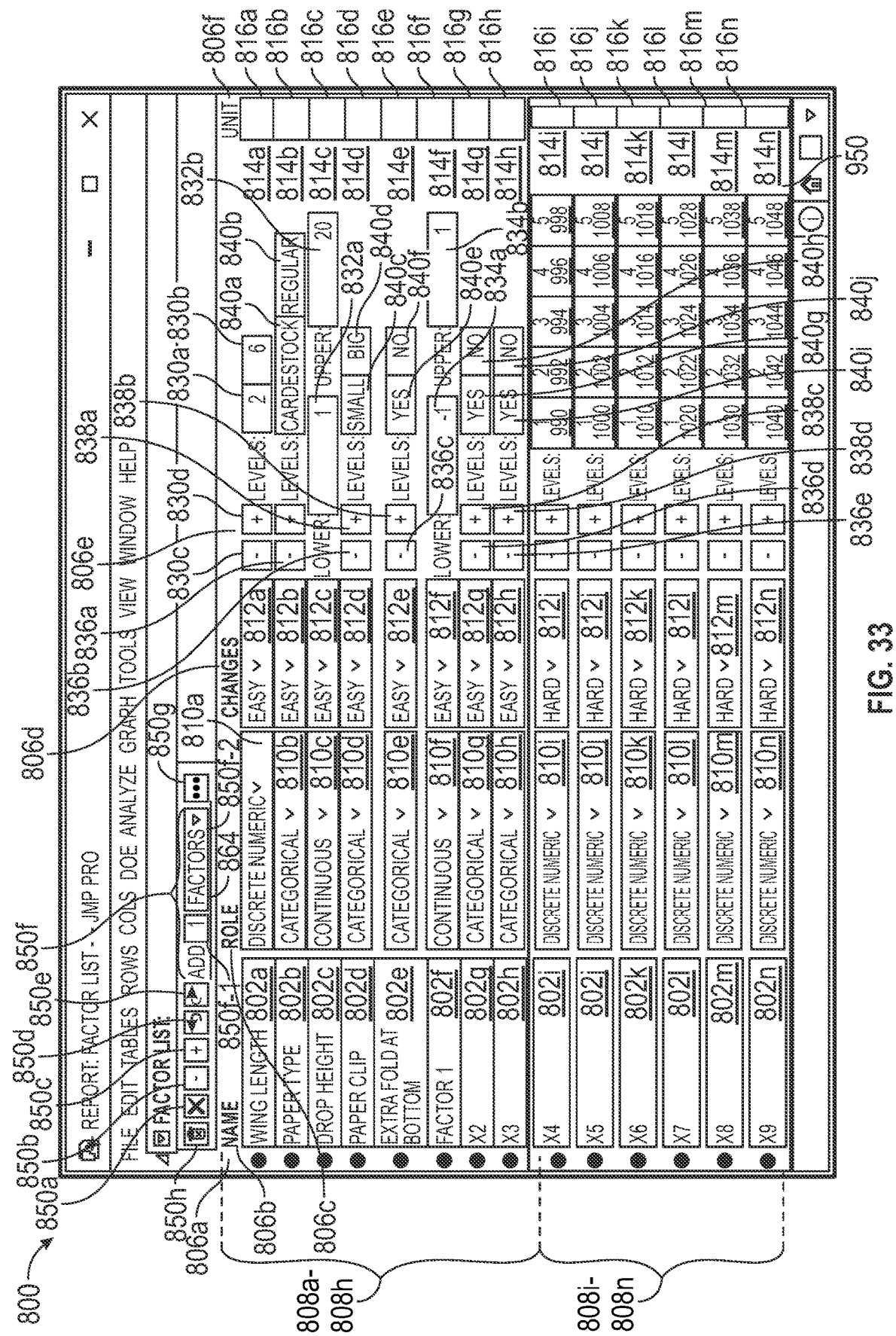

Analogously, in some embodiments, the button control element 968b, when selected, may add one or more factors to the design of experiments factor specification user interface 800 in a manner defined by the elements 960b-966b. An example result of selecting the button control element 968b is illustrated in FIG. 33. Specifically, in FIG. 33 and because the number input field 966b illustrated in FIG. 31 includes the numerical value six (6), a corresponding number of factor-setting composition component rows 808i-808n are added to the design of experiments factor specification user interface 800.

Additionally, as shown in FIG. 33, the plurality of factor-setting user interface control elements 802i-802n, the plurality of factor-type user interface control elements 810i-810n, the plurality of design of experiments platform configuration user interface control elements 812i-812n, and the plurality of text input fields 990-1048 included in the plurality of dynamic rows of editable user interface control elements 814i-814m are indicating that the design of experiment factors corresponding to the factor-setting composition component rows 808i-808m are named "X4"-"X9", respectively, have a factor type based on the text label 960a illustrated in FIG. 31 (e.g., discrete numeric factor type), have a change difficulty level based on the combo box user interface control element 962a illustrated in FIG. 31 (e.g., Hard), and have a number of discrete levels based on the number input fields 974 illustrated in FIG. 31 (e.g., five (5) discrete levels).

Figure 34:
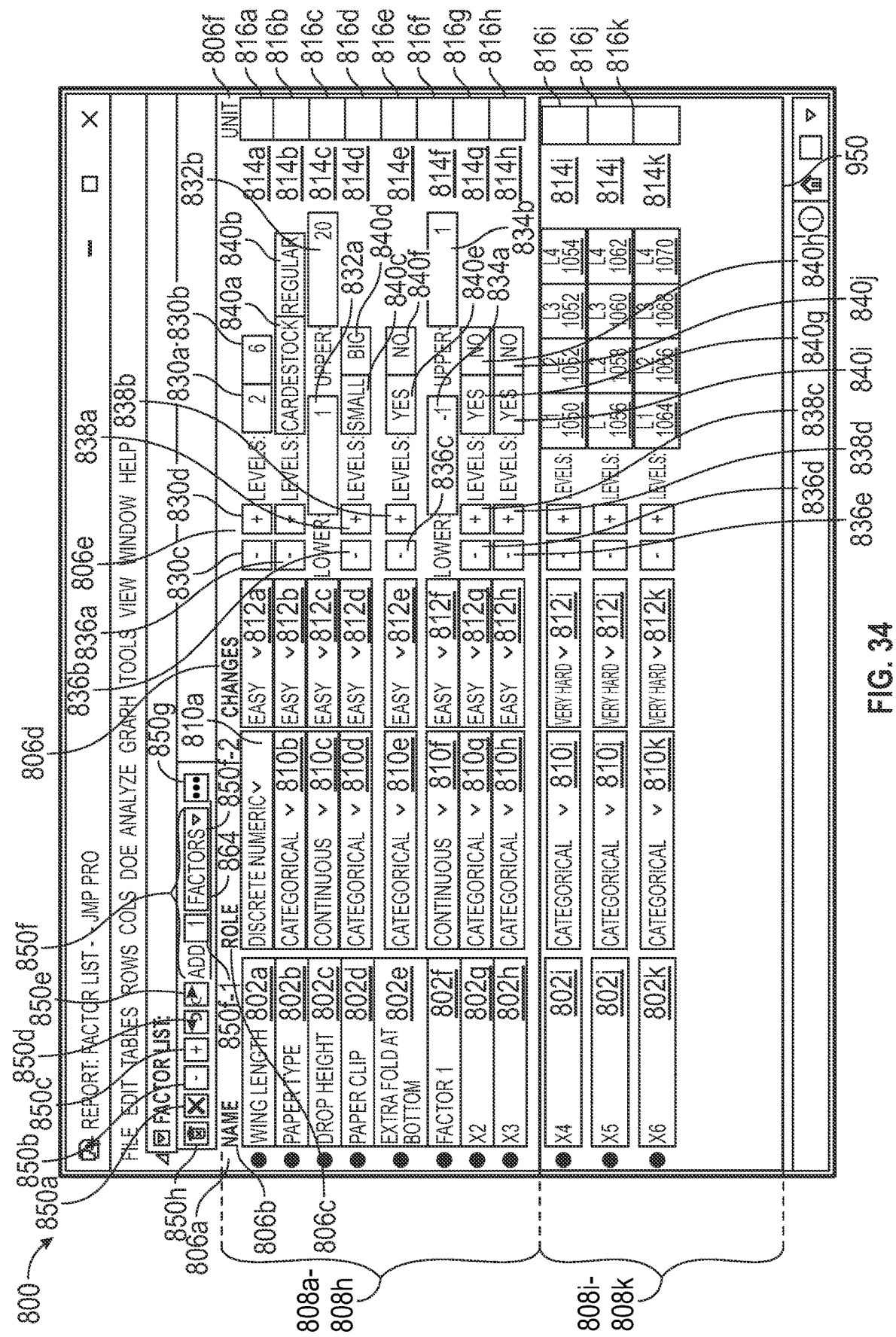

Similarly, in some embodiments, the button control element 968c, when selected, may add one or more factors to the design of experiments factor specification user interface 800 in a manner defined by the elements 960c-966c. An example result of selecting the button control element 968c is illustrated in FIG. 34. Specifically, in FIG. 34 and because the number input field 966c illustrated in FIG. 31 includes the numerical value three (3), a corresponding number of factor-setting composition component rows 808i-808k are added to the design of experiments factor specification user interface 800.

Additionally, as shown in FIG. 34, the plurality of factor-setting user interface control elements 802i-802k, the plurality of factor-type user interface control elements 810i-810k, the plurality of design of experiments platform configuration user interface control elements 812i-812k, and the plurality of text input fields 1050-1070 included in the plurality of dynamic rows of editable user interface control elements 814i-814k are indicating that the design of experiment factors corresponding to the factor-setting composition component rows 808i-808m are named "X4"-"X6", respectively, have a factor type based on the text label 960c illustrated in FIG. 31 (e.g., categorical factor type), have a change difficulty level based on the combo box user interface control element 962c illustrated in FIG. 31 (e.g., Very Hard), and have a number of categorical levels based on the number input fields 976 illustrated in FIG. 31 (e.g., four (4) discrete levels).

Furthermore, in some embodiments, the dialog menu element displayed by the process 740 may include a second grid container control element. For instance, in the example of FIG. 31, the process 740 is causing a second grid container control element 1074 to be displayed in the dialog menu element 954. Example control elements that may be displayed within the second grid container control element 1074 will now be described.

In some embodiments, as illustrated in FIG. 31, the second grid container control element 1074 may include a composite factor user interface control component 1076. The composite factor user interface control component 1076, in some embodiments, may include one or more button control elements for modifying design of experiment factors displayed within the second grid container control 1074. For instance, in the example illustrated in FIG. 31, the composite factor user interface control component 1076 includes a plurality of button control elements 1076a-1076e. It shall be noted that the above example is not intended to be limiting and that the composite factor user interface control component 1076 may include additional, different, or fewer button control elements than illustrated in FIG. 31 without departing from the scope of the disclosure. Example operations of the button control elements 1076a-1076e will now be described.

The button control element 1076a-1076e, in some embodiments, may perform operations similar to button control element 850a-850e illustrated in FIG. 22. That is, in some embodiments, the button control element 1076a may be configured to remove one or more previously selected factor-setting composition component rows 1078a-1078f from the second grid container control 1074. The button control element 1076b may be configured to remove a factor-setting composition component row displayed at an end of the factor-setting grid container control 1074 (e.g., row 1078f). The button control element 1076c may be configured to add one or more factor-setting composition component rows to the second grid container control 1074. The button control element 1076d may be configured to undo one or more operations performed within the second grid container control 1074. The button control element 1076e may be configured to reverse one or more most recent in time operations of the button control element 850d.

Additionally, in some embodiments, the second grid container control element 1074 may include one or more rows and one or more columns. For instance, as also illustrated in the example of FIG. 31, the second grid container control element 1074 includes a plurality of factor-setting composition component rows 1078a-1078f and a plurality of columns 1078a-1078e. Specifically, in FIG. 31, the plurality of factor-setting composition component rows 1078a-1078f include the control elements 1080a-1088a, 1080b-1088b, 1080c-1088c, 1080d-1088d, 1080e-1088e, and 1080f-1088f, respectively.

Figure 23:
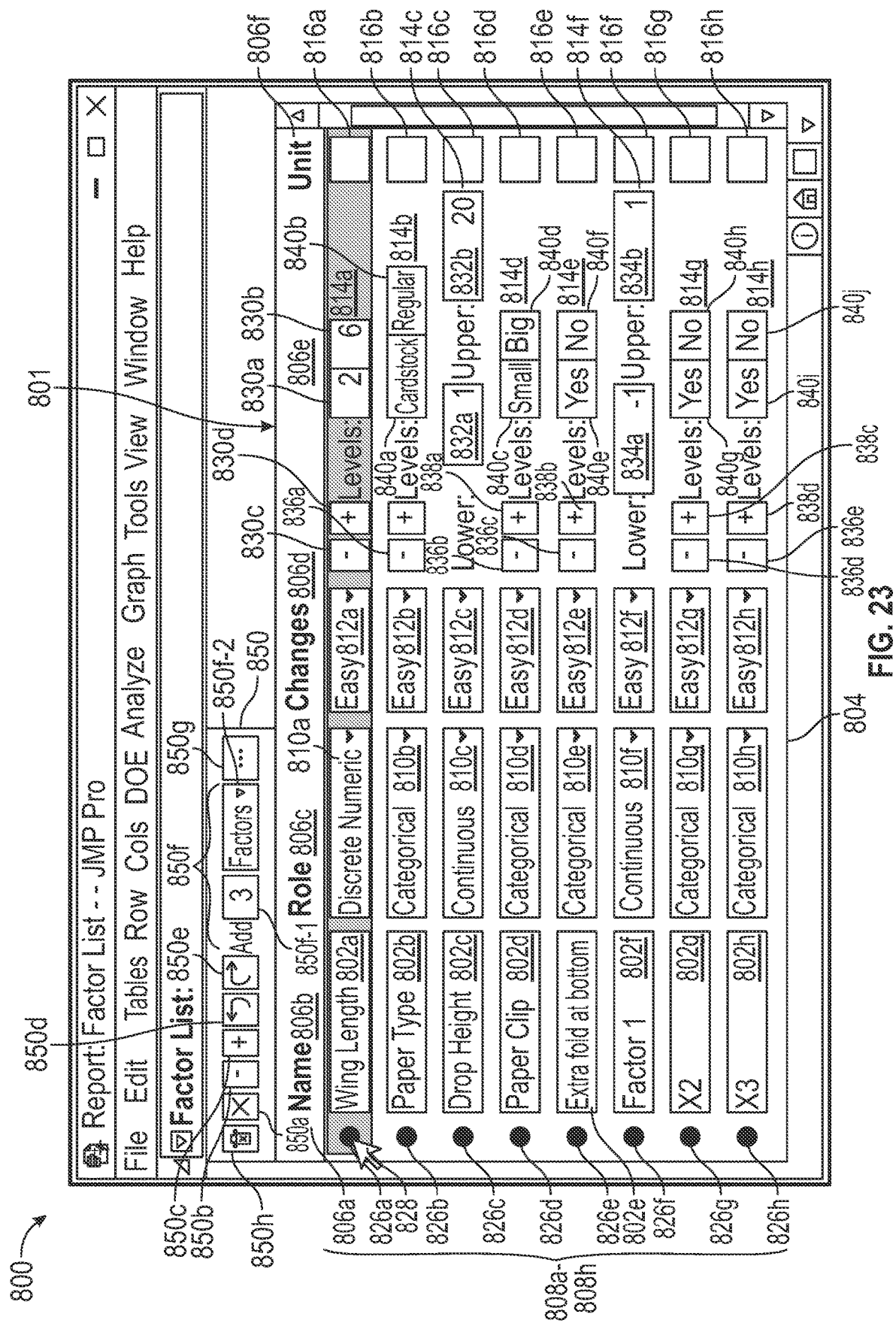
Figure 24:
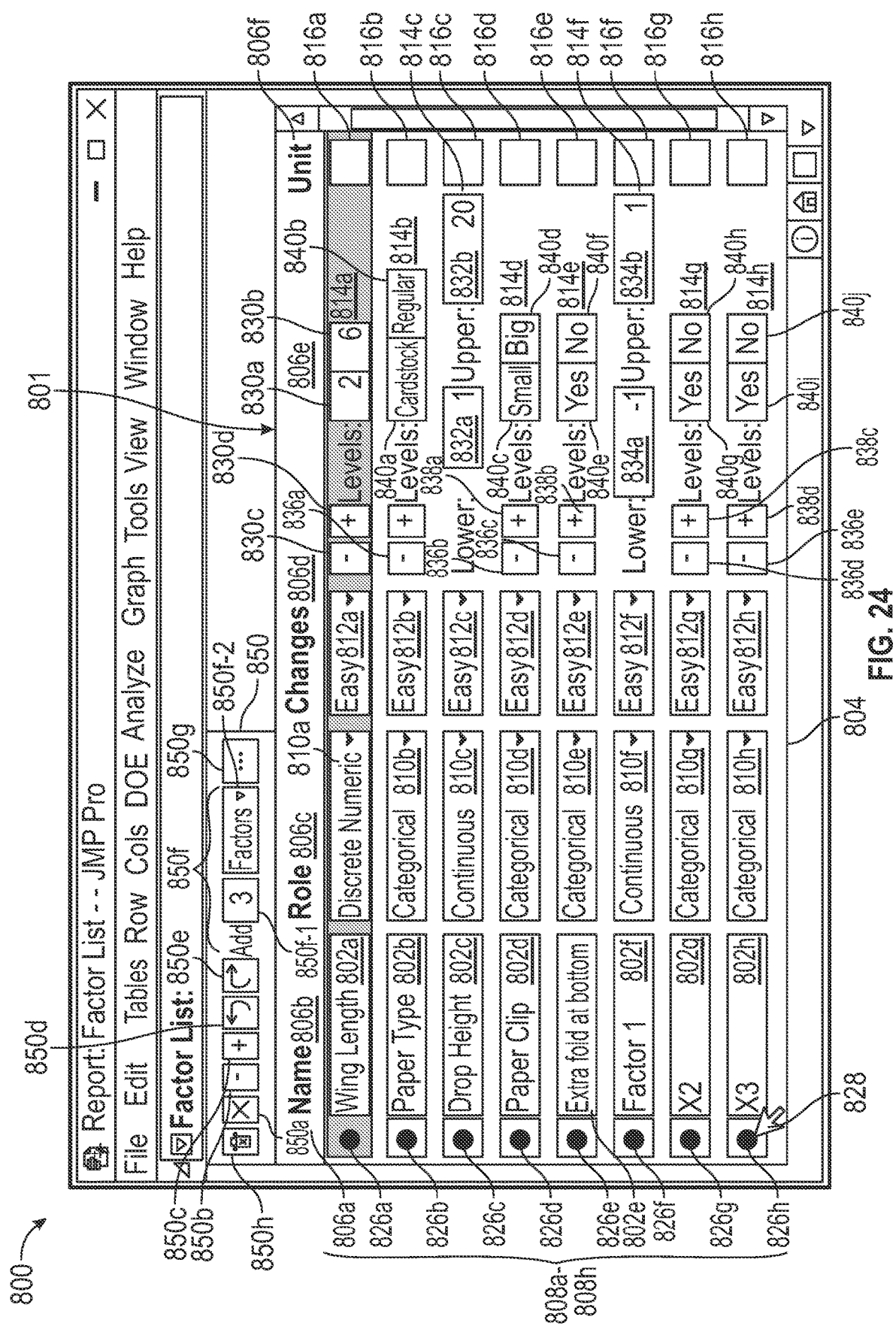
Figure 25:
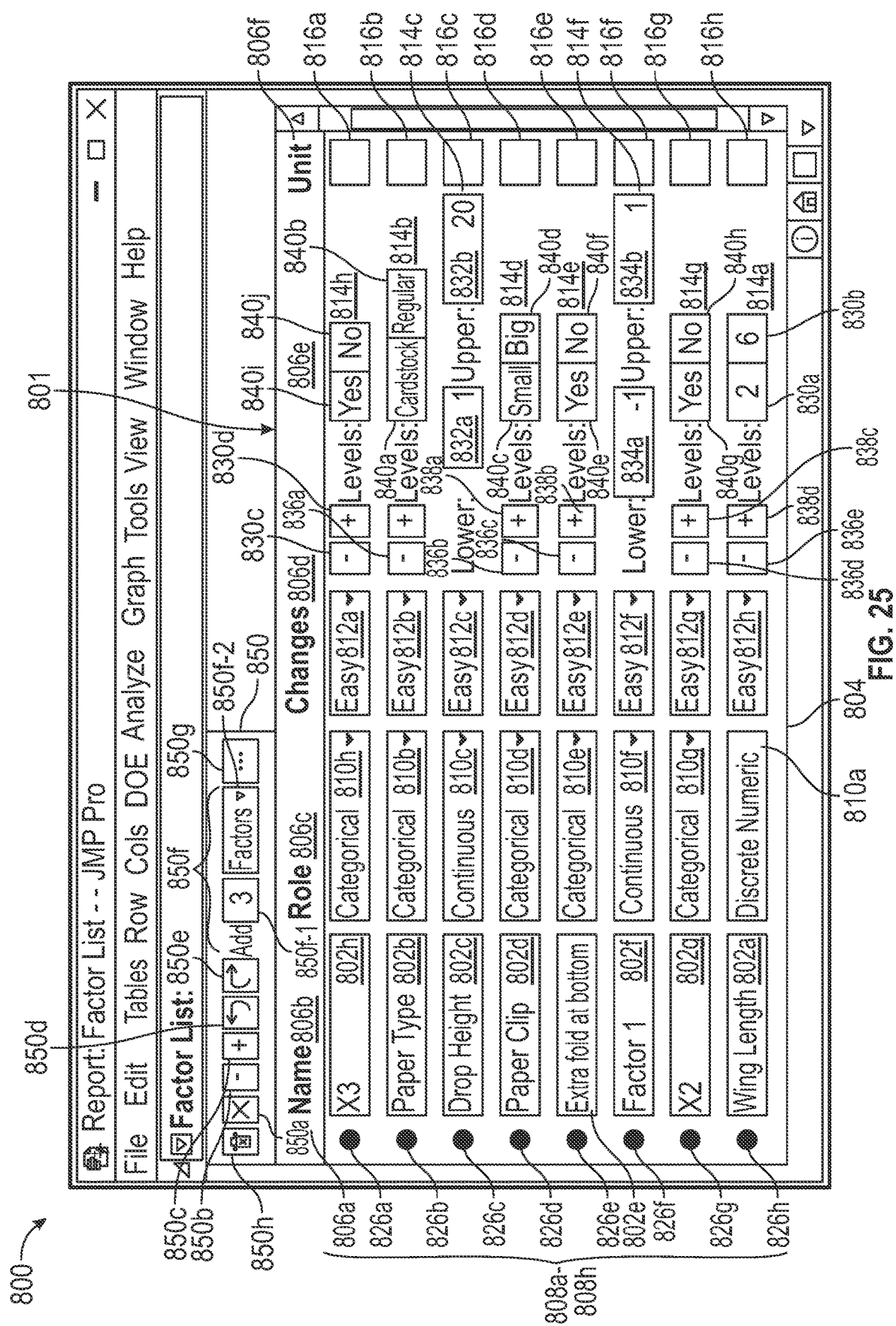

It shall be noted that the control elements 1080a-1080f, in some embodiments, may be configured to operate in a same or similar manner as the plurality of factor re-ordering user interface elements 826a-826h illustrated in FIGS. 23-25. The control elements 1082a-1082f, in some embodiments, may be configured to operate in a same or similar manner as the plurality of factor-setting user interface control elements 802a-802h illustrated in FIG. 8. The control elements 1082a-1082f, in some embodiments, may be configured to operate in a same or similar manner as the plurality of factor type user interface control elements 810a-810h illustrated in FIG. 8. The control elements 1084a-1084f, in some embodiments, may be configured to operate in a same or similar manner as the plurality of combo box user interface control elements 962a-962c also illustrated in FIG. 31. The rows of control elements 1086a-1086f may have similar operating characteristics as the plurality of rows of control elements 964a-964c also illustrated in FIG. 31. The control elements 1088a-1088f, in some embodiments, may be configured to operate in a same or similar manner as the plurality of number input fields 966a-966c also illustrated in FIG. 31.

Furthermore, in some embodiments, the dialog menu element displayed by the process 740 may include one or more button control elements. For instance, in the example of FIG. 31, the dialog menu element 954 includes button control elements 1090a and 1090b. The button control element 1090a, when selected, in some embodiments, may cause an addition of one or more factor-setting composition component rows to the design experiments factor specification user interface 800. Conversely, in some embodiments, the button control element 1090b, when selected, in some embodiments, may forgo an addition of one or more factor-setting composition component rows to the design experiments factor specification user interface 800.

Figure 35:
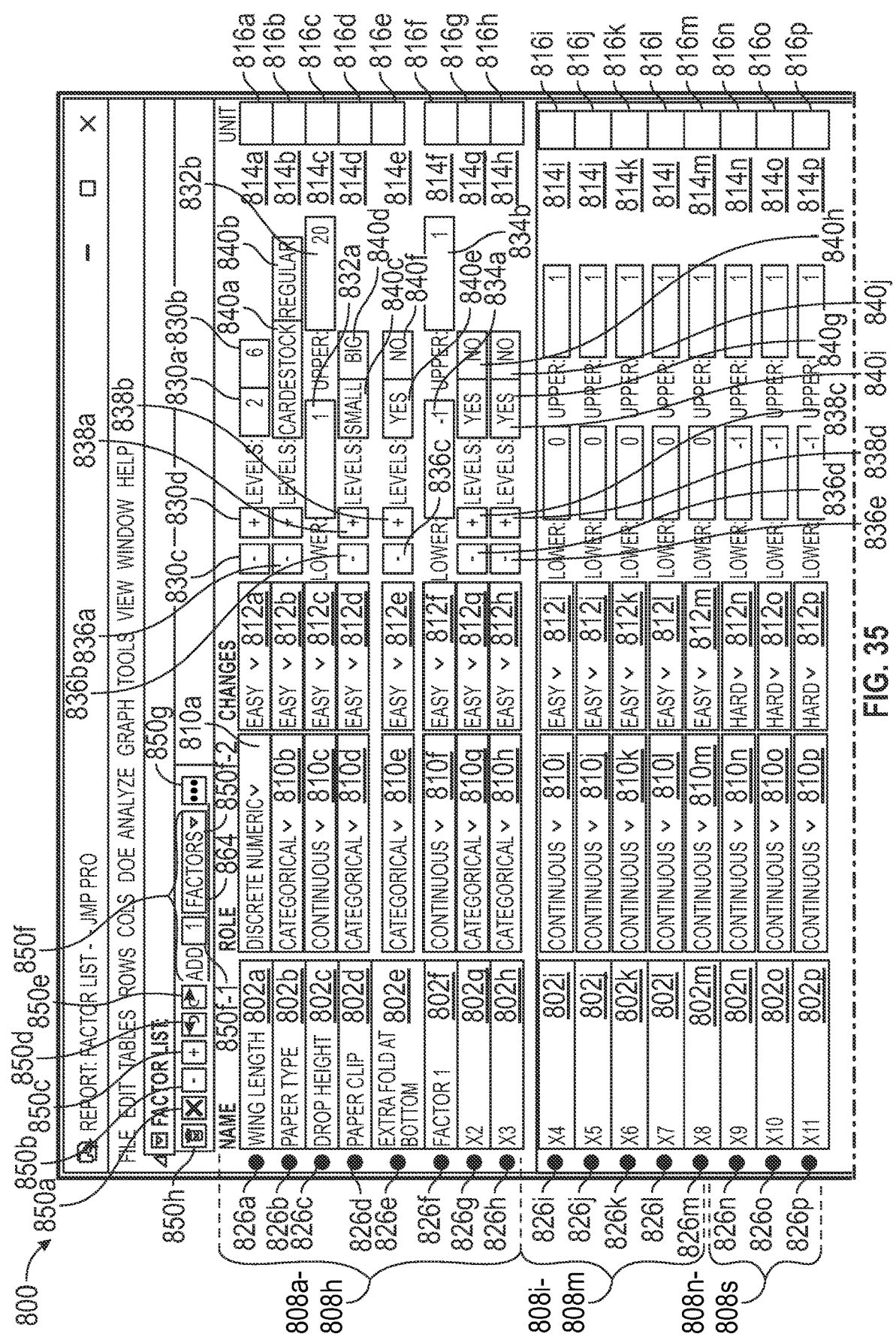

An example result of selecting the button control element 1090a is illustrated in FIG. 35. Particularly, in FIG. 35, a plurality of factor-setting composition component rows 808i-808m, 808n-808s, 808t-808z, 808aa-808bb, 808cc-808dd, and 808ee-808gg are added to the design of experiments factor specification user interface 800 based on the factor-setting composition component rows 1078a, 1078b, 1078c, 1078d, 1078e, and 1078f, respectively.

The user interface control elements displayed with rows 808i-808m will now be described. Additionally, as shown in FIG. 35, the plurality of factor-setting user interface control elements 802i-802m are indicating the design of experiment factors corresponding to the rows 808i-808m are named "X4"-"X8," respectively. The plurality of factor type user interface control elements 810i-810m are indicating that the design of experiment factors corresponding to the rows 808i-808m have a factor type based on the combo box user interface control element 1082a (e.g., continuous factor type). The plurality of design of experiments platform configuration user interface control elements 812*i*-812*m* are indicating that the design of experiment factors corresponding to the rows 808*i*-808*m* have a change difficulty level based on the combo box user interface control element 1084*a* (e.g., "Easy"). The plurality of rows of editable user interface control elements 814*i*-814*m* are indicating that the design of experiment factors corresponding to the rows 808*i*-808*m* have a minimum continuous value corresponding to number input field 1090 (e.g., 0) and a maximum continuous value corresponding to number input field 1092 (e.g., 1).

The user interface control elements displayed with rows 808*n*-808*s* will now be described. Additionally, as shown in FIG. 35, the plurality of factor-setting user interface control elements 802*n*-802*s* are indicating the design of experiment factors corresponding to the rows 808*n*-808*s* are named "X9"-"X14," respectively. The plurality of factor type user interface control elements 810*n*-810*s* are indicating that the design of experiment factors corresponding to the rows 808*n*-808*s* have a factor type based on the combo box user interface control element 1082*b* (e.g., continuous factor type). The plurality of design of experiments platform configuration user interface control elements 812*n*-812*s* are indicating that the design of experiment factors corresponding to the rows 808*n*-808*s* have a change difficulty level based on the combo box user interface control element 1084*b* (e.g., "Hard"). The plurality of rows of editable user interface control elements 814*n*-814*s* are indicating that the design of experiment factors corresponding to the rows 808*n*-808*s* have a minimum continuous value corresponding to number input field 1094 (e.g., −1) and a maximum continuous value corresponding to number input field 1096 (e.g., 1).

The user interface control elements displayed with rows 808*t*-808*z* will now be described. Additionally, as shown in FIG. 35, the plurality of factor-setting user interface control elements 802*t*-802*z* are indicating the design of experiment factors corresponding to the rows 808*t*-808*z* are named "X15"-"X21," respectively. The plurality of factor type user interface control elements 810*t*-810*z* are indicating that the design of experiment factors corresponding to the rows 808*t*-808*z* have a factor type based on the combo box user interface control element 1082*c* (e.g., discrete numeric factor type). The plurality of design of experiments platform configuration user interface control elements 812*t*-812*z* are indicating that the design of experiment factors corresponding to the rows 808*t*-808*z* have a change difficulty level based on the combo box user interface control element 1084*c* (e.g., "Very Hard"). The plurality of rows of editable user interface control elements 814*t*-814*z* are indicating that the design of experiment factors corresponding to the rows 808*n*-808*s* have a total number of discrete levels based on the number input control element 1098 (e.g., five (5) discrete levels).

The user interface control elements displayed with rows 808*aa*-808*bb* will now be described. Additionally, as shown in FIG. 35, the plurality of factor-setting user interface control elements 802*aa*-80*bb* are indicating the design of experiment factors corresponding to the rows 808*aa*-808*bb* are named "X22"-"X23," respectively. The plurality of factor type user interface control elements 810*aa*-810*bb* are indicating that the design of experiment factors corresponding to the rows 808*aa*-808*bb* have a factor type based on the combo box user interface control element 1082*d* (e.g., discrete numeric factor type). The plurality of design of experiments platform configuration user interface control elements 812*aa*-812*bb* are indicating that the design of experiment factors corresponding to the rows 808*aa*-808*bb* have a change difficulty level based on the combo box user interface control element 1084*d* (e.g., "Easy"). The plurality of rows of editable user interface control elements 814*aa*-814*bb* are indicating that the design of experiment factors corresponding to the rows 808*aa*-808*bb* have a total number of discrete levels based on the number input control element 1100 (e.g., eight (8) discrete levels).

The user interface control elements displayed with rows 808*cc*-808*dd* will now be described. Additionally, as shown in FIG. 35, the plurality of factor-setting user interface control elements 802*cc*-802*dd* are indicating the design of experiment factors corresponding to the rows 808*cc*-808*dd* are named "X24"-"X25," respectively. The plurality of factor type user interface control elements 810*cc*-810*dd* are indicating that the design of experiment factors corresponding to the rows 808*cc*-808*dd* have a factor type based on the combo box user interface control element 1082*e* (e.g., categorical factor type). The plurality of design of experiments platform configuration user interface control elements 812*cc*-812*dd* are indicating that the design of experiment factors corresponding to the rows 808*cc*-808*dd* have a change difficulty level based on the combo box user interface control element 1084*e* (e.g., "Hard"). The plurality of rows of editable user interface control elements 814*cc*-814*dd* are indicating that the design of experiment factors corresponding to the rows 808*cc*-808*dd* have a total number of categorical levels based on the number input control element 1102 (e.g., three (3) categorical levels).

The user interface control elements displayed with rows 808*ee*-808*gg* will now be described. Additionally, as shown in FIG. 35, the plurality of factor-setting user interface control elements 802*ee*-802*gg* are indicating the design of experiment factors corresponding to the rows 808*ee*-808*gg* are named "X26"-"X28," respectively. The plurality of factor type user interface control elements 810*ee*-810*gg* are indicating that the design of experiment factors corresponding to the rows 808*ee*-808*gg* have a factor type based on the combo box user interface control element 1082*f* (e.g., categorical factor type). The plurality of design of experiments platform configuration user interface control elements 812*ee*-812*gg* are indicating that the design of experiment factors corresponding to the rows 808*ee*-808*gg* have a change difficulty level based on the combo box user interface control element 1084*f* (e.g., "Very Hard"). The plurality of rows of editable user interface control elements 814*ee*-814*gg* are indicating that the design of experiment factors corresponding to the rows 808*ee*-808*gg* have a total number of categorical levels based on the number input control element 1104 (e.g., four (4) categorical levels).

In some embodiments, the above-described factor-setting component composition rows may be extensible to include additional, fewer, or different user interface control elements based on a DoE platform associated with the design of experiments factor specification user interface 800. For instance, in the example illustrated in FIG. 36, the design of experiments factor specification user interface 800 is being displayed for configuring a GO-SSD design of experiments. Specifically, in FIG. 36, the design of experiments factor specification user interface 800 includes a plurality of factor-setting composition component rows 808*hh*-808*kk* that belong to design of experiment group 1 (e.g., as indicated by the design of experiments group user interface elements 1106*hh*-1106*kk*), a plurality of factor-setting composition component rows 808*ll*-808*oo* that belong to design of experiment group 2 (e.g., as indicated by the design of experiments group user interface elements 1106ll-1106oo), and a plurality of factor-setting composition component rows 808pp-808ss that belong to design of experiment group 3 (e.g., as indicated by the design of experiments group user interface elements 1106pp-1106ss). It shall be noted that a design of experiment group, as generally referred to herein, may have a maximum group size (e.g., four (4) factors) that is controlled by a user or by a system implementing the method 700.

Figure 36:
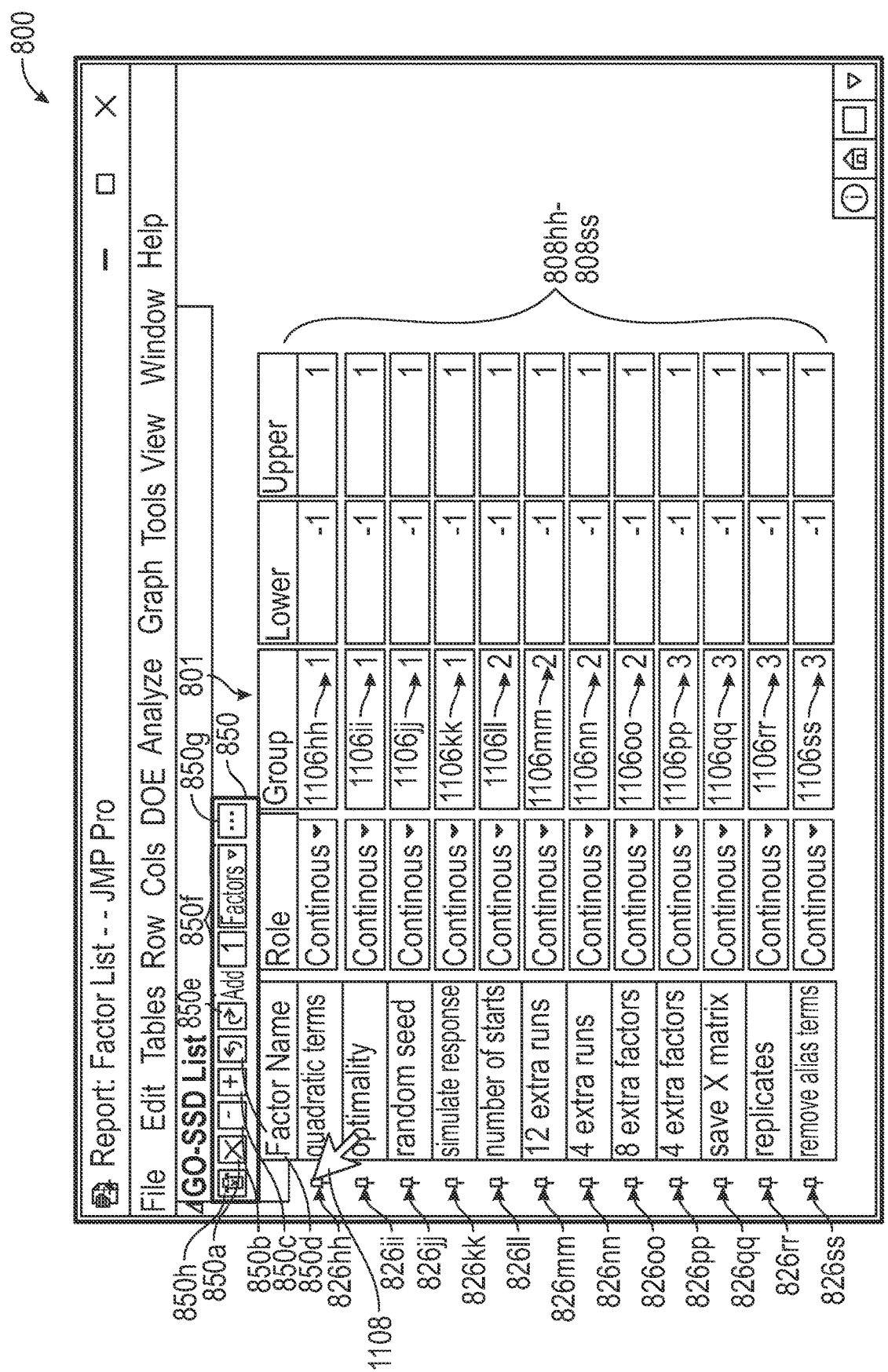
Figure 37:
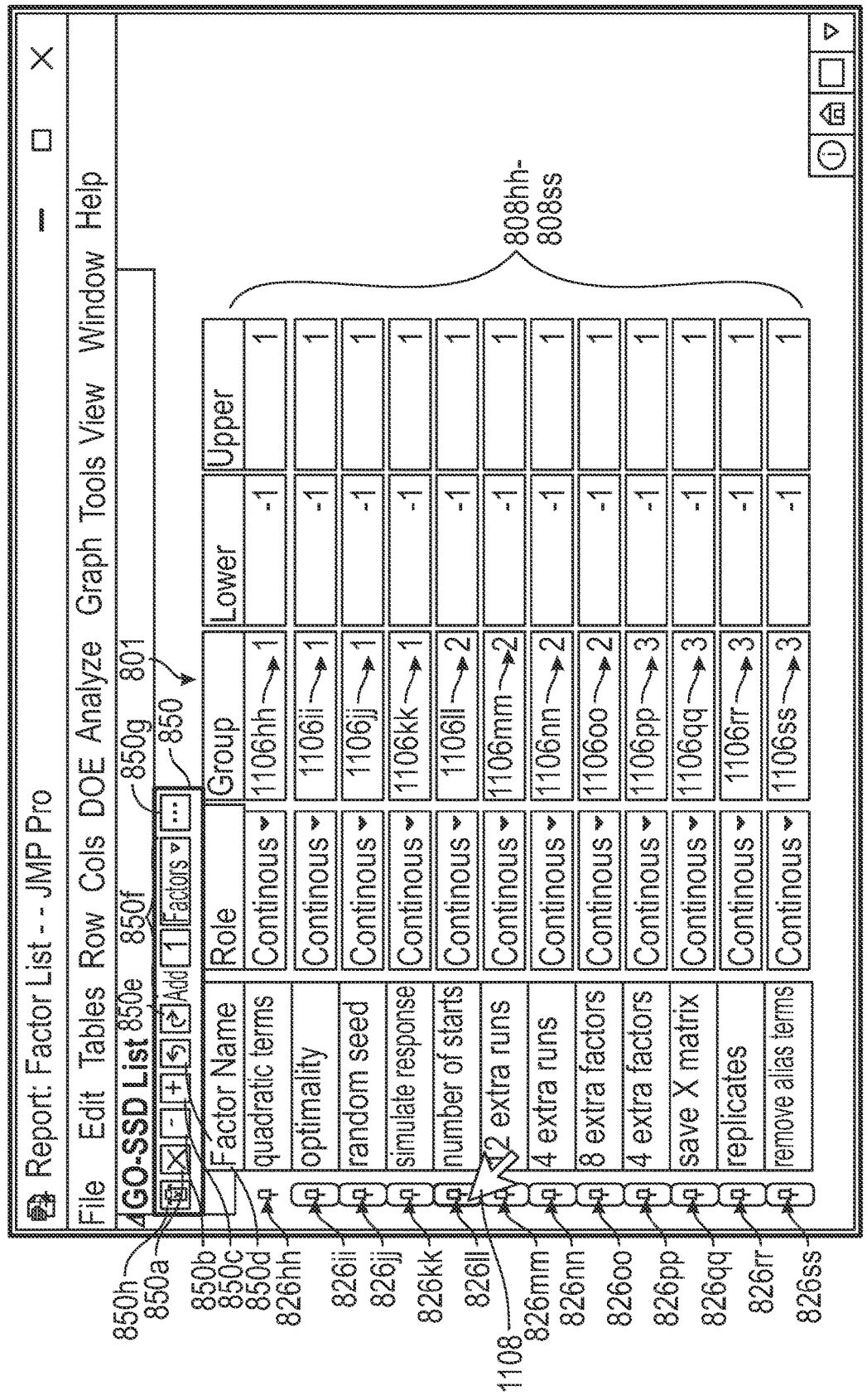
Figure 38:
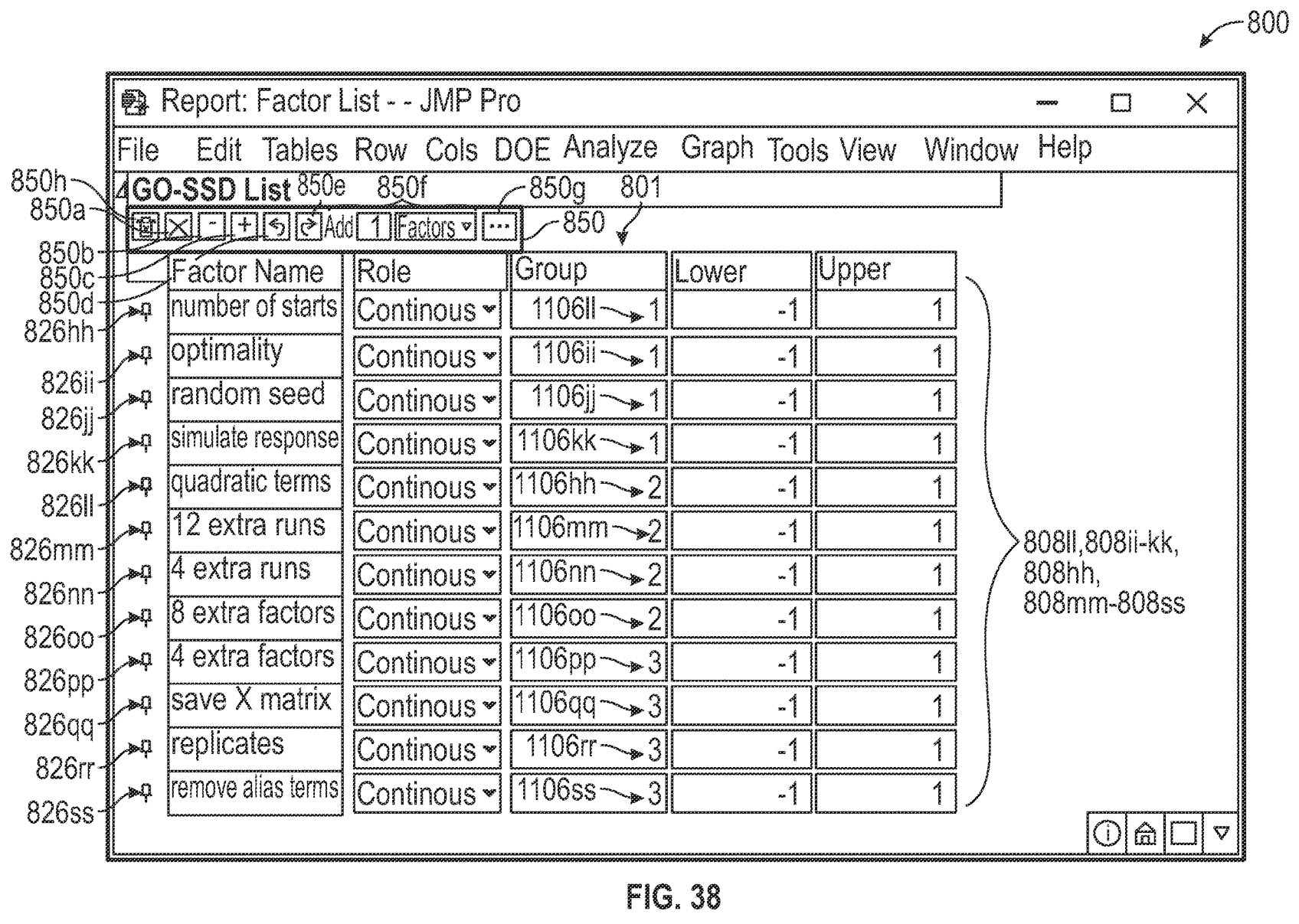

In some embodiments, the design of experiment factor group associated with a respective factor-setting composition component row may be updated during a factor rearrangement operation. For instance, as also illustrated in FIG. 36, an input 1108 selecting the factor re-ordering user interface element 826hh is detected. Further, in FIG. 37, the input 1108 moves from a position corresponding to the factor re-ordering user interface elements 826hh to a position corresponding to the factor re-ordering user interface elements 826ll. Thus, as a result, as illustrated in FIG. 38, the factor-setting composition component rows 826ll and 826hh swap positions within the design of experiments factor specification user interface 800. Additionally, as result of the input 1108, the design of experiment group associated with the factor-setting composition component rows 826ll is updated from being associated group two (2) to being associated with group one (1) (e.g., as indicated by the design of experiments group user interface element 1106ll), and the design of experiment group associated with the factor-setting composition component rows 826hh is updated from being associated group one (1) to being associated with group two (2) (e.g., as indicated by the design of experiments group user interface element 1106hh).

FIG. 39 illustrates one embodiment of a method 3900 for performing factor type conversion(s) and model transformation(s) in a design of experiments. It should be appreciated that other examples contemplated within the scope of the present disclosure may involve more operations, fewer operations, different operations, or a different order of operations than as shown in FIG. 39.

As will be described in more detail herein, the embodiments of the method 3900 may result in numerous technical advantages and technical improvements-a subset of which will now be described. Firstly, in some embodiments, when converting a target design of experiment factor from a previous factor type to a new factor type, the processes 3910-3928 may enable experimental values required by the new factor type to be automatically defined (e.g., without user input) based on experimental values previously associated with the target design of experiments factor when such factor was of the previous factor type. Secondly, the processes 3928-3940 may enable a design of experiments model to flexibly adapt (e.g., without user input) as factors are added, removed, or as attributes of the factors change.

Overall, these technical advantages and improvements may reduce user error when configuring a design of experiments, thereby creating a more efficient and accurate design of experiments. It shall be appreciated that the processes 3910-3940 may be particularly beneficial for users with limited experience in configuring a design of experiments and for users that may not fully understand the ramifications of converting a design of experiment factor to a new factor type, including the changes required to a design of experiment model underlying the design of experiments.

In some embodiments, the method 3900 may include a process 3910 that functions to receive factor specification data that specifies a plurality of factors and one or more factor parameters of the plurality of factors for configuring a design of experiments. As will be described in more detail herein, in some embodiments, the plurality of factors specified in the factor specification data may relate to independent variables that may be manipulated during the design of experiments to measure their respective effect on one or more dependent variables (e.g., response variables). Additionally, in some embodiments, as will also be described in more detail herein, the factor parameters defined within the factor specification data may relate to specific values (e.g., levels) or settings that the plurality of factors may take during the design of experiments. Thus, in some embodiments, the combination of the factor parameters defined for each of the plurality of factors may represent the experimental space of the design of experiments.

In some embodiments, the process 3910 may function to receive the factor specification data via the design of experiments factor specification user interface 800 illustrated and described in FIGS. 8-38. As previously mentioned above, the factor specification user interface 800, in some embodiments, may enable a user to add one or more factors to the design of experiments, remove one or more factors from the design of experiments, and/or update one or more factors in the design of experiments.

An example of factor specification data received by the design of experiments factor specification user interface 800 is illustrated in FIG. 8. Specifically, in FIG. 8, the design of experiments factor specification user interface 800 is receiving, via user input, factor specification data 801 that includes eight (8) design of experiment factors—as indicated by the eight (8) factor-setting component composition rows 808a-808h. It shall be noted that the above example is not intended to be limiting and that the factor specification data 801 may specify additional, different, or fewer design of experiment factors than illustrated without departing from the scope of the disclosure. Various non-limiting factor parameters that may be specified in the factor specification data 801 will now be described.

In some embodiments, the factor specification data 801 may specify a name of each factor in the factor specification data 801 (e.g., a factor name parameter). For instance, in the example of FIG. 8, the factor specification data 801 is specifying that the eight (8) design of experiment factors are named "Wing Length," "Paper Type," "Drop Height," "Paper Clip," "Extra fold at bottom," "X," "X2," and "X3," respectively (as indicated by the factor-setting user interface control elements 802a-802h). It shall be noted that the name of a respective factor may be modified in ways previously described in the method 700.

Additionally, or alternatively, in some embodiments, the factor specification data 801 may specify a type of each factor in the factor specification data 801 (e.g., a factor type parameter). For instance, as also shown in the example of FIG. 8, the factor specification data 801 is specifying that the design of experiment factors named "Wing Length," "Paper Type," "Drop Height," "Paper Clip," "Extra fold at bottom," "X," "X2," and "X3" correspond to a discrete numeric factor type, a categorical factor type, a continuous factor type, a categorical factor type, a categorical factor type, a categorical factor type, a categorical factor type, and a categorical factor type, respectively (as indicated by the plurality of factor type user interface control elements 810a-810h). It shall be noted that, in some embodiments, the type of a respective factor may be changed in ways previously described in the method 700.

Additionally, or alternatively, in some embodiments, the factor specification data 801 may specify a change difficulty level of each factor in the factor specification data 801 (e.g., a factor change parameter). For instance, in the example of FIG. 8, the factor specification data 801 is specifying that the design of experiment factors named "Wing Length," "Paper Type," "Drop Height," "Paper Clip," "Extra fold at bottom," "X," "X2," and "X3" have a change difficulty of "Easy" (as indicated by the plurality of design of experiments platform configuration user interface control elements 812*a*-812*h*). It shall be noted that, in some embodiments, the change difficultly level of a respective factor may be modified in ways previously described in the method 700.

In some embodiments, the factor specification data 801 may specify the values (e.g., levels) that each factor in the factor specification data 801 may take during an execution of the design of experiments. For instance, in the example of FIG. 8, the factor specification data 801 is specifying that the design of experiment factor named "Wing Length" is associated with the discrete numeric levels two (2) and six (6)—as indicated by the dynamic row 814*a*. The factor specification data 801 is also specifying that the design of experiment factor named "Paper Type" is associated with the categorical levels "Cardstock" and "Regular" (as indicated by the dynamic row 814*b*). The factor specification data 801 is also specifying that the design of experiment factor named "Drop Height" has a continuous range between one (1) and twenty (20) (as indicated by the dynamic row 814*c*). The factor specification data 801 is also specifying that the design of experiment factor named "Paper Clip" is associated with categorical levels "Small" and "Big" (as indicated by the dynamic row 814*d*). The factor specification data 801 is also specifying that the design of experiment factors named "Extra fold at bottom," "X," "X2," and "X3" are associated with categorical levels "Yes" and "No" (as indicated by the dynamic rows 814*e*-814*h*). It shall be noted that the values (e.g., levels) of a respective factor may be modified in ways previously described in the method 700.

In some embodiments, the factor specification data 801 may specify a unit of measurement (UoM) associated each factor in the factor specification data 801 (e.g., a factor change parameter). For instance, in the example of FIG. 8, the factor specification data 801 is specifying that the design of experiment factors named "Wing Length," "Paper Type," "Drop Height," "Paper Clip," "Extra fold at bottom," "X," "X2," and "X3" are not currently associated with a unit of measurement (as indicated by the "empty" plurality of factor unit user interface control elements 816*a*-816*h*). It shall be noted that the UoM of a respective factor may be modified in ways previously described in the method 700.

Referring to FIG. 39, in some embodiments, the method 3900 may include a process 3920 that functions to execute a factor type conversion for a target factor of the plurality of factors based on the factor specification data indicating a selection of a successor factor type selected from a plurality of factor types. As will be described in more detail herein, executing a factor type conversion may cause the target to be converted from a current factor type (e.g., a first factor type) to a successor factor type (e.g., a second factor type). Examples of factor type conversions performed by the process 3920 may include, but should not be limited to, converting a continuous factor to a categorical factor, converting a categorical factor to a discrete numeric factor, converting a discrete numeric factor to a continuous factor, and/or the like. Additional non-limiting examples will be further described herein.

Figure 40:
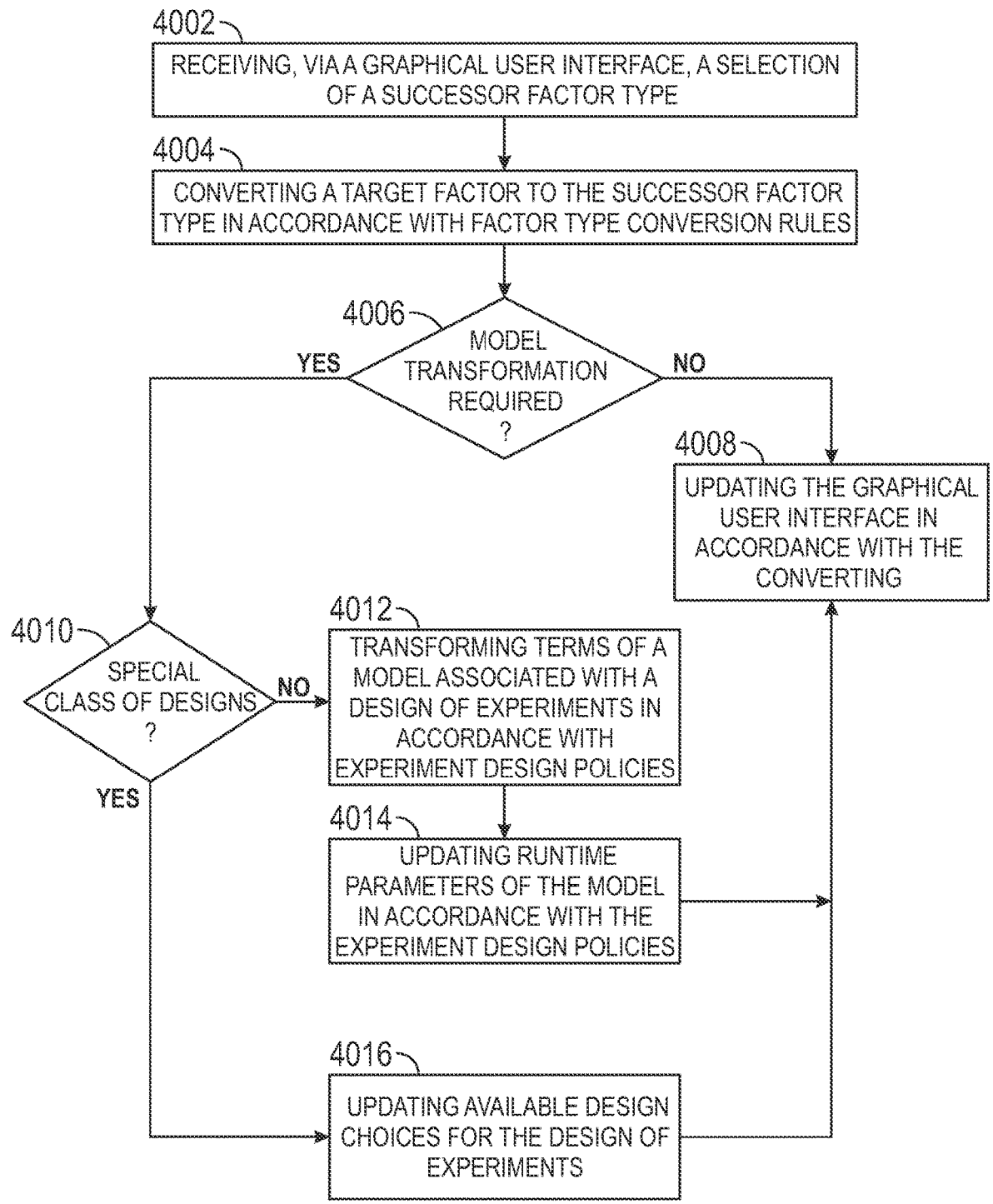
FIG. 40 illustrates an example schematic for performing factor type conversions and model transformations in a design of experiments according to at least one embodiment of the present technology.

In some embodiments, as indicated by step 4002 in FIG. 40, the process 3920 may function to receive the selection of the successor factor type via a graphical user interface (e.g., the design of experiments factor specification user interface 800 illustrated in FIGS. 8-38). An example of the process 3920 receiving the selection of a successor factor type via a graphical user interface is illustrated in FIGS. 11-13. Specifically, in FIGS. 11-13, for reasons previously described, the selection input 824 illustrated in FIG. 12 causes "Factor 1" to change from a categorical factor type as indicated by the user interface control element 810*f* in FIG. 11 (e.g., a current factor type, an incumbent factor type, etc.) to a continuous factor type as indicated by the user interface control element 810*f* in FIG. 13 (e.g., a successor factor type). It shall be noted that the above example is not intended to be limiting and that the successor factor type of "Factor 1" may be different than as illustrated when the input 824 selects a different one of the plurality of factor type user interface control element 822*a*-822*h*.

Additionally, as indicated by the step 4004 in FIG. 40, in response to receiving the selection of a successor factor type, the process 3920 may function to convert the target factor to the successor factor type in accordance with pre-defined factor type conversion rules. The pre-defined factor type conversion rules, in some embodiments, may relate to rules for dynamically updating values (e.g., attributes, parameters, levels, etc.) associated with the target factor as the target factor changes from a current factor type to a succeeding factor type and/or may relate to rules for updating the design of experiment factor specification user interface 800 as the target factor changes from a current factor type to a succeeding factor type. Examples of such pre-defined factor type conversion rules will be described in more detail with respect processes 3920 and 3924.

Referring to FIG. 39, in some embodiments, executing the factor type conversion may include a process 3924 that functions to replace, at a graphical user interface, a set of factor specification user interface elements that correspond to an incumbent factor type previously selected for the target factor with a second set of factor specification user interface elements that correspond to the successor factor type. Various examples of factor type conversions that may be performed by such processes will now be described.

In some embodiments, the factor type conversion executed by the processes 3920 and 3924 may cause a target factor to be converted from a continuous factor type to a categorical factor type. An example of the processes 3920 and 3924 converting a target factor from the continuous factor type to the categorical factor type will now be described with reference to FIGS. 41 and 42.

FIG. 41 illustrates an example design of experiment factor 4100.

Specifically, in FIG. 41, the factor-setting user interface control element 802*hh* is indicating that the design of experiment factor 4100 is named "X1." The factor type user interface control element 810*hh* is indicating that the design of experiment factor 4100 is currently a continuous factor type. The design of experiments platform configuration user interface control element 812*hh* is indicating that the design of experiment factor 4100 has an "Easy" change difficulty setting. The dynamic row 814*hh* is displaying a plurality of number edit boxes 4102 and 4104 that are specifying the minimum continuous range and the maximum continuous range of the design of experiment factor 4100 (e.g., one (1) and two (2)), respectively.

In some embodiments, converting the design of experiment factor 4100 from a continuous factor type to a categorical factor type may include updating the row 814*hh* illustrated in FIG. 41 to include one or more user interface elements that are configured to receive input for defining one or more categorical levels for the design of experiments factor 4100. For instance, as shown in FIG. 42, when converting the design of experiment factor 4100 from the continuous factor type (indicated by 810hh in FIG. 41) to the categorical factor type (indicated by 810hh in FIG. 42), the process 4324 replaces the number input fields 4102 and 4104 illustrated in FIG. 41 with user interface elements 4202-4208. It shall be noted that the user interface elements 4202-4208 may have similar characteristics as elements 836a-836d, 838a-838d, and 840g-840j illustrated in FIG. 13.

Additionally, or alternatively, in some embodiments, converting the design of experiment factor 4100 from the continuous factor type to the categorical factor type may include defining a first categorical level for the design of experiment factor 4100 based on a character representation of the minimum continuous value currently associated with the design of experiment factor 4100. For instance, in the example of FIGS. 41 and 42, when converting the design of experiment factor 4100 from the continuous factor type to the categorical factor type, the process 4320 converts the minimum continuous value indicated by the number edit field 4102 to a character representation (e.g., 1→"L1") and, in turn, defines a first categorical level for the design of experiment factor 4100 with a value corresponding to the character representation of the minimum continuous value—as indicated by element 4206.

Additionally, or alternatively, in some embodiments, converting the design of experiment factor 4100 from the continuous factor type to the categorical factor type may include defining a second categorical level for the design of experiment factor 4100 based on a character representation of the maximum continuous value currently associated with the design of experiment factor 4100. For instance, in the example of FIGS. 41 and 42, when converting the design of experiment factor 4100 from the continuous factor type to the categorical factor type, the process 4320 converts the maximum continuous value indicated by the number edit field 4104 to a character representation (e.g., 2→"L2") and, in turn, defines a second categorical level for the design of experiment factor 4100 with a value corresponding to the character representation of the maximum continuous value—as indicated by element 4208.

In some embodiments, the factor type conversion executed by the processes 3920 and 3924 may cause a target factor to be converted from a continuous factor type to a discrete numeric factor type. Various examples of such processes converting the design of experiment factor 4100 from the continuous factor type to the discrete numeric factor type will now be described with reference to FIGS. 41 and 43.

In some embodiments, converting the design of experiments factor 4100 from the continuous factor type to the discrete numeric factor type may include updating the row 814hh illustrated in FIG. 41 to include one or more user interface elements that are configured to receive input for defining one or more discrete numeric levels of the design of experiment factor 4100. For instance, as shown in FIG. 43, when converting the design of experiment factor 4100 from the continuous factor type (as indicated by 810hh in FIG. 41) to the discrete numeric factor type (as indicated by 810hh in FIG. 43), the process 4324 replaces the number input fields 4102 and 4104 illustrated in FIG. 41 with user interface elements 4302-4308. It shall be noted that the user interface elements 4302-4308 may have similar characters as the user interface elements 830a-830d illustrated in FIG. 13.

Additionally, or alternatively, in some embodiments, converting the design of experiment factor 4100 from the continuous factor type to the discrete numeric factor type may include defining a discrete numeric level for the design of experiment factor 4100 based on a minimum value of a continuous range currently associated with the design of experiment factor 4100. For instance, as also shown in FIG. 43, when converting the design of experiment factor 4100 from the continuous factor type to the discrete numeric factor type, the process 3920 defines a first discrete numeric level with a value that corresponds to minimum continuous value associated with the design of experiment factor 4100 in FIG. 41 (as indicated by user interface element 4306).

Additionally, or alternatively, in some embodiments, converting the design of experiment factor 4100 from the continuous factor type to the discrete numeric factor type may include defining a discrete numeric level for the design of experiment factor 4100 based on a maximum value of a continuous range currently associated with the design of experiment factor 4100. For instance, as also shown in FIG. 43, when converting the design of experiment factor 4100 from the continuous factor type to the discrete numeric factor type, the process 3920 defines a second discrete numeric level with a value that corresponds to the maximum continuous value associated with the design of experiment factor 4100 in FIG. 41 (as indicated by user interface element 4308).

In some embodiments, the factor type conversion executed by the processes 3920 and 3924 may cause a target factor to be converted from a continuous factor type to a mixture factor type. Various examples of such processes converting the design of experiment factor 4100 from the continuous factor type to the mixture factor type will now be described with reference to FIGS. 41 and 44.

In some embodiments, converting the design of experiments factor 4100 from the continuous factor type to the mixture factor type may include updating the row 814hh illustrated in FIG. 41 to include one or more user interface elements that are configured to receive input for defining mixture parameters (e.g., values) of the design of experiment factor 4100. For instance, in the example of FIGS. 41 and 44, when converting the design of experiment factor 4100 from the continuous factor type (as illustrated by 810hh in FIG. 41) to the mixture factor type (as illustrated by 810hh in FIG. 44), the process 4324 replaces the number input fields 4102 and 4104 illustrated in FIG. 41 with the number input fields 4402 and 4404. It shall be noted that, in some embodiments, the number input fields 4402 and 4404 may be configured to receive user input for setting a minimum mixture value and a maximum mixture value of design of experiment factor 4100.

Additionally, or alternatively, in some embodiments, converting the design of experiments factor 4100 from the continuous factor type to the mixture factor type may include defining a minimum mixture value for the design of experiment factor 4100 based on a minimum value of a continuous range currently associated with the design of experiment factor 4100. For instance, as also shown in FIG. 44, when converting the design of experiment factor 4100 from the continuous factor to the mixture factor, the process 3924 sets a minimum mixture value of the design of experiment factor 4100 to correspond to the minimum continuous value specified by number input field 4102 in FIG. 41 (as indicated by the user interface control element 4402).

It shall be noted that, in some embodiments, the minimum mixture value may be different from the minimum continuous value. For instance, in some embodiments, the process 4320 may set the minimum mixture value to zero (0) when the minimum continuous value indicated by number input field 4102 is less than zero (0) and/or when the maximum value indicated by number input field 4104 is less than zero (0).

Additionally, or alternatively, in some embodiments, converting the design of experiments factor 4100 from the continuous factor type to the mixture factor type may include defining a maximum mixture value for the design of experiment factor 4100 based on a maximum value of a continuous range currently associated with the design of experiment factor 4100. For instance, as also shown in FIG. 44, when converting the design of experiment factor 4100 from the continuous factor type to the mixture factor type, the process 3924 sets a maximum mixture value of the design of experiment factor 4100 to correspond to the maximum continuous value specified by the number input field 4104 in FIG. 41 (as indicated by the user interface control element 4404).

It shall be noted that, in some embodiments, the maximum mixture value may be different from the maximum continuous value. For instance, in some embodiments, the process 4320 may set the maximum mixture value to one (1) when the maximum continuous value indicated by number input field 4104 is less than zero (0).

In some embodiments, the factor type conversion executed by the processes 3920 and 3924 may cause a target factor to be converted from a continuous factor type to a blocking factor type. Various non-limiting example of such processes converting the design of experiment factor 4100 illustrated in FIG. 41 from the continuous factor type to the blocking factor type will now be described with reference to FIGS. 41 and 45.

Figure 45:
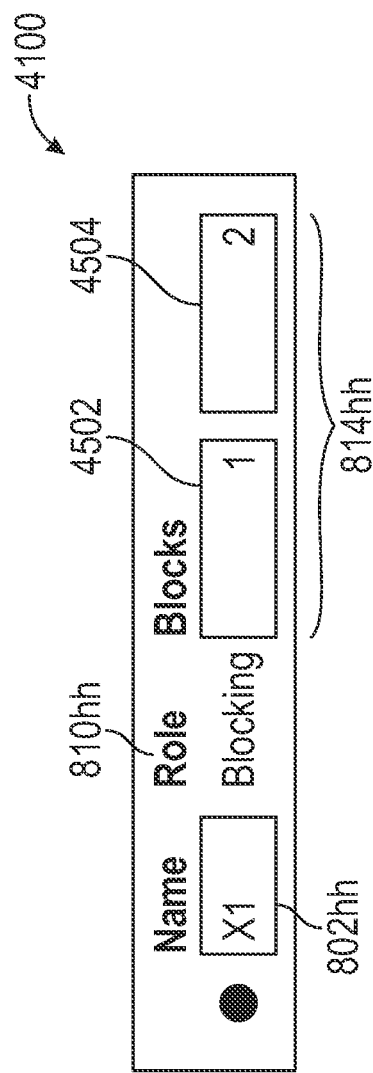

In some embodiments, converting the design of experiments factor 4100 from the continuous factor type to the blocking factor type may include updating the row 814*hh* illustrated in FIG. 41 to include one or more user interface elements that are configured to receive input for defining one or more blocking levels of the design of experiments factor 4100. For instance, as shown in FIG. 45, when converting the design of experiment factor 4100 from the continuous factor type (as illustrated by 810*hh* in FIG. 41) to the blocking factor type (as indicated by 810*hh* in FIG. 45), the number input fields 4102 and 4104 illustrated in FIG. 41 are replaced with user interface elements 4502-4504 for defining block levels of the design of experiment factor 4100.

Additionally, or alternatively, in some embodiments, converting the design of experiment factor 4100 from the continuous factor type to the blocking factor type may include defining a block level based on the minimum continuous value currently associated with the design of experiment factor 4100. For instance, as also illustrated in FIG. 45, when converting design of experiment factor 4100 from the continuous factor type to the blocking factor type, the process 3920 defines a first block level with a value that corresponds to the minimum continuous value specified by the number input field 4102 illustrated in FIG. 41 (as indicated by the user interface element 4502).

Additionally, or alternatively, in some embodiments, converting the design of experiment factor 4100 from the continuous factor type to the blocking factor type may include defining a block level based on the maximum continuous value currently associated with the design of experiment factor 4100. For instance, as also illustrated in FIG. 45, when converting design of experiment factor 4100 from the continuous factor type to the blocking factor type, the process 3920 defines a first block level with a value that corresponds to the maximum continuous value specified by the number input field 4104 illustrated in FIG. 41 (as indicated by the user interface element 4504).

In some embodiments, the factor type conversion executed by the processes 3920 and 3924 may cause a target factor to be converted from a continuous factor type to a covariate factor type. Various non-limiting example of such processes converting the design of experiment factor 4100 illustrated in FIG. 41 from the continuous factor type to the covariate factor type will now be described with reference to FIGS. 41 and 46.

Figure 46:
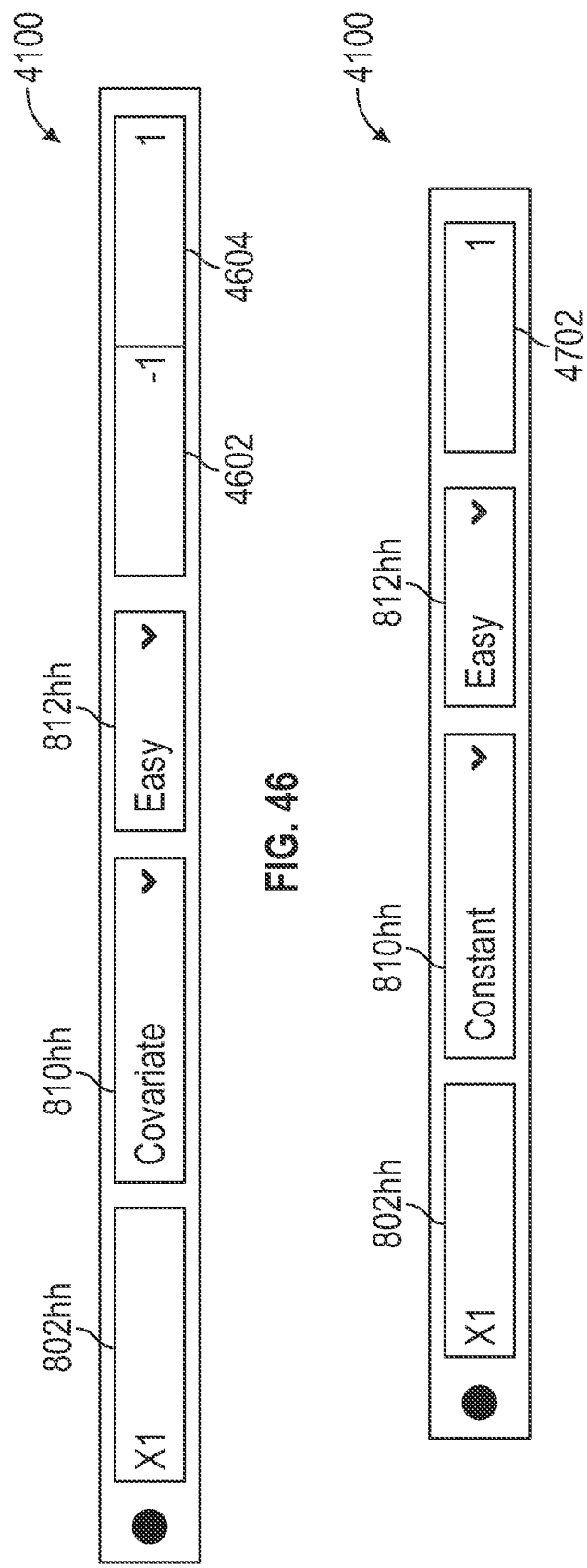

In some embodiments, converting the design of experiments factor 4100 from the continuous factor type to the covariate factor type may include updating the row 814*hh* illustrated in FIG. 41 to include one or more user interface elements that are configured to receive input for defining (or specifying) one or more covariate levels of the design of experiment factor 4100. For instance, as shown in FIG. 46, when converting the design of experiment factor 4100 from the continuous factor type (as illustrated by 810*hh* in FIG. 41) to the covariate factor type (as illustrated by 810*hh* in FIG. 46), the process 3920 replaces the number input fields 4102 and 4104 illustrated in FIG. 41 with user interface elements 4602-4604 for defining covariate levels of the design of experiment factor 4100. It shall be noted that, in some embodiments, the covariate levels may be specified via user interaction with a design of experiments covariate dialog column or the like.

In some embodiments, the factor type conversion executed by the processes 3920 and 3924 may cause a target factor to be converted from a continuous factor type to a constant factor type. Various examples of such processes converting the design of experiment factor 4100 illustrated in FIG. 41 from the continuous factor type to the constant factor type will now be described with reference to FIGS. 41 and 47.

Figure 47:
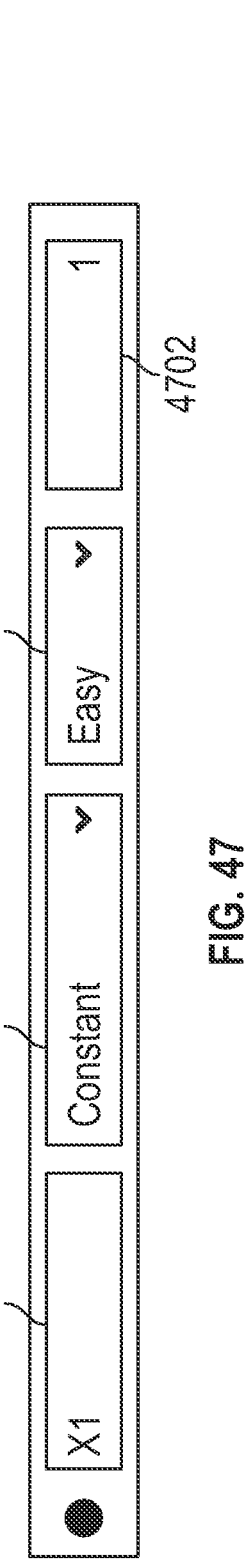

In some embodiments, converting the design of experiments factor 4100 from the continuous factor type to the constant factor type may include updating the row 814*hh* illustrated in FIG. 41 to include one or more user interface elements that are configured to receive input for defining a constant value of the design of experiment factor 4100. For instance, as shown in FIG. 47, when converting the design of experiment factor 4100 from the continuous factor type (as illustrated by 810*hh* in FIG. 41) to the constant factor type (as indicated by 810*hh* in FIG. 47), the process 3920 replaces the number input fields 4102 and 4104 illustrated in FIG. 41 with number edit box 4702 for defining a constant value of the design of experiment factor 4100.

Additionally, or alternatively, in some embodiments, converting the design of experiment factor 4100 from the continuous factor type to the constant factor type may include defining a constant value for the design of experiment factor 4100 based on the minimum continuous value currently associated with the design of experiment factor 4100. For instance, as also shown in FIG. 47, when converting the design of experiment factor 4100 from the continuous factor type to the constant factor type, the process 3920 defines a constant value for the design of experiment factor 4100 that corresponds to the minimum continuous value indicated by number input field 4102 illustrated in FIG. 41 (as indicated by the number edit box 4702).

In some embodiments, the factor type conversion executed by the processes 3920 and 3924 may cause a target factor to be converted from a categorical factor type to a continuous factor type. An example of the processes 3920 and 3924 converting a target factor from the categorical factor type to the continuous factor type will now be described with reference to FIGS. 48 and 49.

FIG. 48 illustrates an example design of experiment factor 4800. Specifically, in the example of FIG. 48, the factor-setting user interface control element 802ii is indicating that the design of experiment factor 4800 is named "X3." The factor type user interface control element 810ii is indicating that the design of experiment factor 4800 is currently a categorical factor type. The design of experiments platform configuration user interface control element 812ii is indicating that the design of experiment factor 4800 has an "Easy" change difficulty setting. The dynamic row 814ii is displaying a plurality of button control elements 4802-4804 and a plurality of text edit boxes 4806-4812. It shall be noted that elements 4802-4812 may operate in a similar manner as button control elements 836a-838d and text edit boxes 840a-840j illustrated in FIG. 13.

In some embodiments, converting the design of experiment factor 4800 from the categorical factor type to the continuous factor type may include updating the row 814ii illustrated in FIG. 48 to include one or more user interface elements that are configured to receive input for defining a continuous range of the design of experiment factor 4800. For instance, as shown in FIG. 49, when converting the design of experiment factor 4800 from the categorical factor type (as indicated by 810ii in FIG. 48) to the continuous factor type (as indicated by 810ii in FIG. 49), the process 4324 replaces the user interface elements 4802-4812 illustrated in FIG. 48 with the number edit boxes 4902-4904 for defining a continuous range of the design of experiment factor 4800.

Additionally, or alternatively, in some embodiments, converting the design of experiment factor 4800 from the categorical factor type to the continuous factor type may include defining a minimum continuous value and a maximum continuous value for the design of experiment factor 4800 based on the categorical levels currently associated with the design of experiment factor 4800. The minimum continuous value and the maximum continuous value, in such embodiments, may be defined based on a first and a second categorical level identified, by the process 4320, as including a numerical string (e.g., a string that includes one or more numbers). For instance, in the example illustrated in FIG. 48, the process 4320 may identify that the categorial levels "L1" and "L2" corresponding to the text input boxes 4806 and 4808 relate to numerical strings.

In some embodiments, based on the process 4320 identifying a set of categorical levels that each include a numerical string, the process 4320 may function to extract the numbers included in such numerical strings and, in turn, use the extracted numbers to define the minimum continuous value and the maximum continuous value for the design of experiment factor 4800. For instance, in the example illustrated in FIGS. 48 and 49, when converting the design of experiment factor 4800 from the categorical factor type to the continuous factor type, the process 4320 extracts the numbers included in the categorical levels specified by the text edit boxes 4806 and 4808 (e.g., extracting one (1) from "L1" and two (2) from "L2") and, in turn, uses the extracted numbers as the minimum continuous value and maximum continuous value for the design of experiment factor 4800 (as indicated by the number input boxes 4902 and 4904), respectively. It shall be noted that, in some embodiments, if the process 4320 determines the design of experiment factor 4800 does not include at two categorial levels that comprise a numerical string, the process 4320 may function to set default values for the minimum and maximum continuous values (e.g., such as negative one (−1) and positive one (+1), or the like).

In some embodiments, the factor type conversion executed by the process 3920 may cause a target factor to be converted from the categorical factor type to the discrete numeric factor type. Various examples of such processes converting the design of experiment factor 4800 illustrated in FIG. 48 from the categorical factor type to the discrete numeric factor type will now be described with reference to FIGS. 48 and 50.

In some embodiments, converting the design of experiment factor 4800 from the categorical factor type to the discrete numeric factor type may include updating the row 814ii illustrated in FIG. 48 to include one or more user interface elements that are configured to receive input for defining one or more discrete numeric levels of the design of experiment factor 4800. For instance, as shown in FIG. 50, when converting the design of experiment factor 4800 from the categorical factor type (as indicated by 810ii in FIG. 48) to the discrete numeric factor type (as indicated by 810ii in FIG. 50), the process 4324 replaces the user interface control elements 4802-4812 with the button control elements 5002-5004 and the number edit boxes 5006-5012. It shall be noted that the button control elements 5002-5004 and the number edit boxes 5006-5012 may operate in a similar to the button control elements 830c-830d and the number edit boxes 830a-830b illustrated in FIG. 13.

Additionally, or alternatively, in some embodiments, converting the design of experiment factor 4800 from the categorical factor type to the discrete numeric factor type may include defining a plurality of discrete numeric levels based on the categorical levels currently associated with the design of experiments factor 4800. Defining the plurality of discrete numeric levels, in some embodiments, may include converting each of the plurality of categorical values associated with the design of experiment factor 4800 to a numerical value. For instance, in the example of FIG. 48, the process 4320 may function to convert the categorical levels "L1," "L2," "L3," and "L4" (indicated by the text edit boxes 4806-4812 in FIG. 48) to corresponding numerical values one (1), two (2), three (3), and four (4), respectively.

In turn, in some embodiments, the process 4320 may use the numerical values extracted by the process 4320 to define a plurality discrete numeric levels for the design of experiments factor 4800. For instance, as also shown in FIG. 50, based on the extracting, the process 4320 creates a plurality of discrete numeric levels for the design of experiment factor 4800 (as indicated by the number edit boxes 5006-5012). Specifically, in FIG. 50, the process 4320 uses the number extracted from the categorical value "L1" (e.g., one (1)) to define the discrete numeric level corresponding to number edit box 5006. The process 4320 uses the number extracted from the categorical value "L2" (e.g., two (2)) to define the discrete numeric level corresponding to number edit box 5008. The process 4320 uses the number extracted from the categorical value "L3" (e.g., three (3)) to define the discrete numeric level corresponding to number edit box 5010. The process 4320 uses the number extracted from the categorical value "L4" (e.g., four (4)) to define the discrete numeric level corresponding to number edit box 5012.

It shall be noted that, in some embodiments, the discrete numeric levels indicated by the plurality of number edit boxes 5006-5012 may correspond to default values (and, optionally, not the numerical values extracted by the process 4320). For instance, when the process 4320 determines that the plurality of categorical levels do not include numerical strings, the process 4320 may instead function to map each of the plurality of categorical levels to a pre-determined value (e.g., a default value). In turn, based on the mapping, the process 4320 may function to define a plurality of discrete numeric levels for the design of experiments factor 4800 that each correspond to one of the pre-determined values.

In some embodiments, the factor type conversion executed by the processes 3920 and 3924 may cause a target factor to be converted from the categorical factor type to the mixture factor type. Various examples of such processes converting the design of experiment factor 4800 illustrated in FIG. 48 from the categorical factor type to the mixture factor type will now be described with reference to FIGS. 48 and 51.

In some embodiments, converting the design of experiments factor 4800 from the categorical factor type to the mixture factor type may include updating the row 814ii illustrated in FIG. 48 to include one or more user interface elements that are configured to receive input for defining mixture parameters (e.g., values) of the design of experiment factor 4800. For instance, in the example of FIGS. 48 and 51, when converting the design of experiment factor 4800 from the categorical factor type (as illustrated by 810ii in FIG. 48) to the mixture factor type (as illustrated by 810ii in FIG. 51), the process 4324 replaces the user interface control elements 4802-4812 illustrated in FIG. 41 with the number input fields 5102 and 5104. It shall be noted that, in some embodiments, the number input fields 5102 and 5104 may be configured to receive input for setting a minimum mixture value and a maximum mixture value of the design of experiment factor 4800.

Additionally, or alternatively, in some embodiments, converting the design of experiment factor 4800 from the categorical factor type to the mixture factor type may include defining a minimum mixture value and a maximum mixture value for the design of experiment factor 4800 based on the categorical levels currently associated with the design of experiments factor 4800. The minimum mixture value and the maximum mixture value, in some examples, may be defined based on a first and a second categorical level identified, by the process 4320, as including a numerical string (e.g., a string that includes one or more numbers). For instance, in the example illustrated in FIG. 48, the process 4320 may identify that the categorial levels "L1" and "L2" corresponding to the text input boxes 4806 and 4808 relate to numerical strings.

In some embodiments, based on the process 4320 identifying a set of categorical levels that each include a numerical string, the process 4320 may function to extract the numbers included in such numerical strings and, in turn, use the extracted numbers to define the minimum mixture value and the maximum mixture value. For instance, in the example illustrated in FIGS. 48 and 51, when converting the design of experiment factor 4800 from the categorical factor type to the mixture factor type, the process 4320 extracts the numbers included in the categorical levels specified by text input boxes 4806 and 4808 (e.g., extracts the number one (1) from "L1" and the number two (2) from "L2"), sets the minimum mixture value to correspond the number extracted from the categorical level "L1" (as indicated by the number input box 5102), and sets the maximum mixture value to correspond the number extracted from the categorical level "L2" (as indicated by the number input box 5104).

It shall be noted that, in some embodiments, if the process 4320 determines the design of experiment factor 4800 does not include at two categorial levels that comprise a numerical string, the process 4320 may function to set default values for the minimum and maximum mixture values (e.g., such as zero (0) and positive one (+1), or the like). Similarly, it shall also be noted that, in some embodiments, the minimum mixture value and the maximum mixture value set for the design of experiments factor 4100 may be different from the number extracted from a categorical level. For instance, in some embodiments, the process 4320 may set the minimum mixture value to zero (0) when the number extracted from the categorical level "L1" is less than zero (0) and the set the maximum mixture value to one (1) when the number extracted from the categorical level "L2" is less than zero (0).

In some embodiments, the factor type conversion executed by the processes 3920 and 3924 may cause a target factor to be converted from a categorical factor type to a blocking factor type. Various non-limiting example of such processes converting the design of experiment factor 4800 illustrated in FIG. 48 from the categorical factor type to the blocking factor type will now be described with reference to FIGS. 48 and 52.

Figure 52:
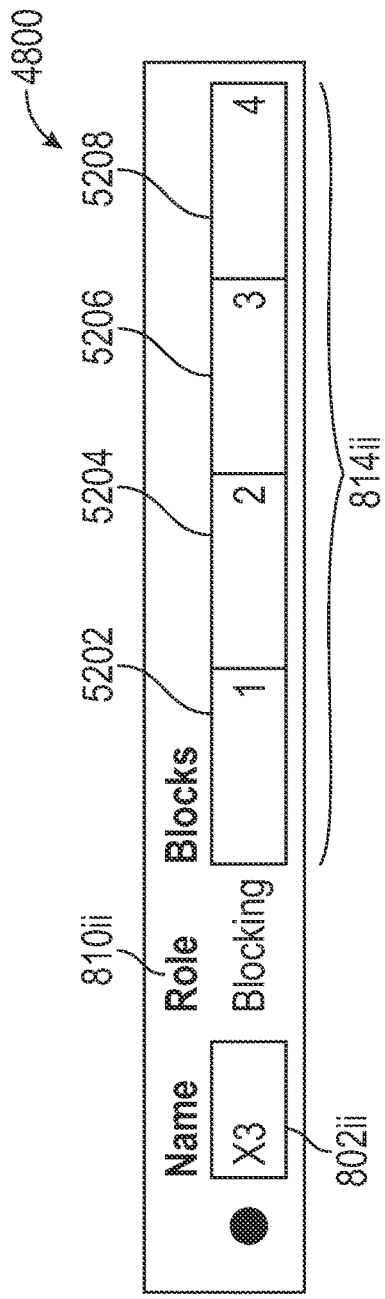

In some embodiments, converting the design of experiments factor 4800 from the categorical factor type to the blocking factor type may include updating the row 814ii illustrated in FIG. 48 to include one or more user interface elements that are configured to receive input for defining one or more blocking levels of the design of experiments factor 4800. For instance, as shown in FIG. 52, when converting the design of experiment factor 4800 from the continuous factor type (as illustrated by 810ii in FIG. 48) to the blocking factor type (as illustrated by 810ii in FIG. 52), the process 3920 replaces the user interface elements 4802-4812 illustrated in FIG. 48 with user interface elements 5202-5208 for defining block levels of the design of experiment factor 4100.

Additionally, or alternatively, in some embodiments, converting the design of experiment factor 4800 from the categorical factor type to the blocking factor type may include defining a plurality of blocking levels for the design of experiment factor 4800 based on the categorical levels currently associated with the design of experiment factor 4800. Defining the plurality of blocking levels, in some embodiments, may include converting each of the plurality of categorical values associated with the design of experiments factor 4800 to a numerical value. For instance, in the example of FIG. 48, the process 4320 may function to convert the categorical levels "L1," "L2," "L3," and "L4" (indicated by the text edit boxes 4806-4812 in FIG. 48) to corresponding numerical values one (1), two (2), three (3), and four (4), respectively.

In turn, in some embodiments, the process 4320 may use the extracted numerical values to define a plurality blocking levels for the design of experiment factor 4800. For instance, as also shown in FIG. 52, based on the extracting, the process 4320 creates a plurality of blocking levels for the design of experiment factor 4800 (as indicated by the number edit boxes 5202-5208). Specifically, in FIG. 52, the process 4320 uses the number extracted from the categorical value "L1" (e.g., one (1)) to define the blocking level corresponding to number edit box 5202. The process 4320 uses the number extracted from the categorical value "L2" (e.g., two (2)) to define the blocking level corresponding to number edit box 5204. The process 4320 uses the number extracted from the categorical value "L3" (e.g., three (3)) to define the blocking level corresponding to number edit box 5206. The process 4320 uses the number extracted from the categorical value "L4" (e.g., four (4)) to define the blocking level corresponding to number edit box 5208.

In some embodiments, the factor type conversion executed by the processes 3920 and 3924 may cause a target factor to be converted from a categorical factor type to a covariate factor type. Various non-limiting examples of such processes converting the design of experiment factor 4800 illustrated in FIG. 48 from the categorical factor type to the covariate factor type will now be described with reference to FIGS. 48 and 53.

Figure 53:
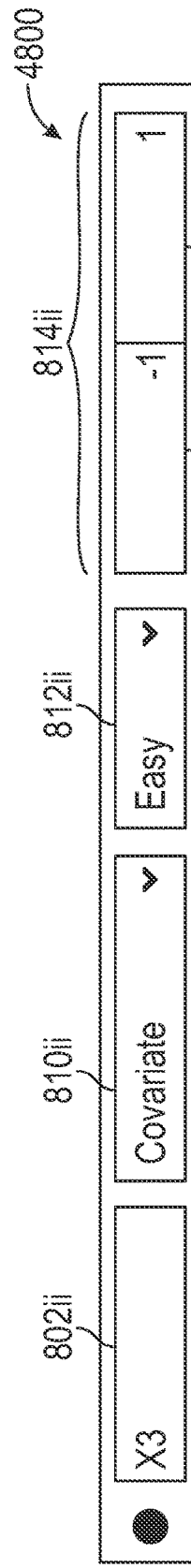

In some embodiments, converting the design of experiment factor 4800 from the categorical factor type to the covariate factor type may include updating the row 814ii illustrated in FIG. 48 to include one or more user interface elements that are configured to receive input for defining (or specifying) one or more covariate levels of the design of experiment factor 4800. For instance, as shown in FIG. 53, when converting the design of experiment factor 4800 from the categorical factor type (as illustrated by 810ii in FIG. 48) to the covariate factor type (as illustrated by 810ii in FIG. 53), the process 3920 replaces user interface elements 4802-4812 illustrated in FIG. 48 with user interface elements 5304-5306 for defining covariate levels of the design of experiment factor 4800. It shall be noted that, in some embodiments, the covariate levels may be specified via user interaction with a design of experiments covariate dialog column or the like.

In some embodiments, the factor type conversion executed by the processes 3920 and 3924 may cause a target factor to be converted from a categorical factor type to a constant factor type. Various non-limiting examples of such processes converting the design of experiment factor 4800 illustrated in FIG. 48 from the categorical factor type to the constant factor type will now be described with reference to FIGS. 48 and 54.

Figure 54:
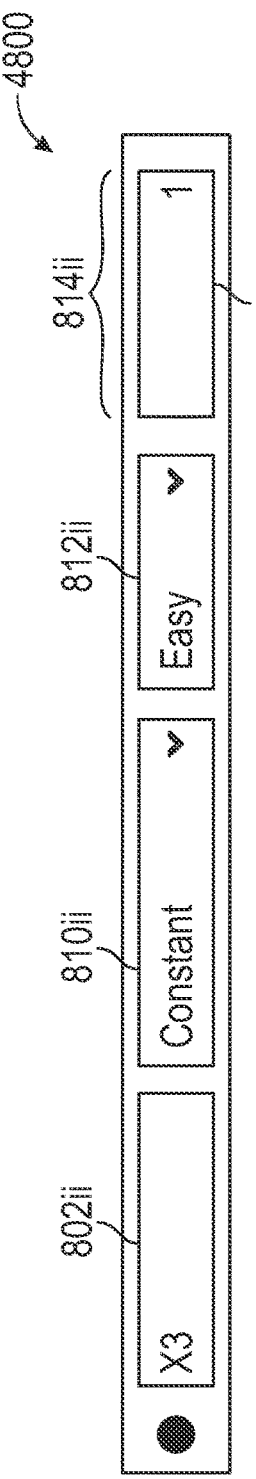

In some embodiments, converting the design of experiments factor 4800 from the categorical factor type to the constant factor type may include updating the row 814ii illustrated in FIG. 48 to include one or more user interface elements that are configured to receive input for defining (or specifying) a constant value of the design of experiment factor 4800. For instance, as shown in FIG. 54, when converting the design of experiment factor 4800 from the categorical factor type (as illustrated by 810ii in FIG. 48) to the constant factor type (as indicated by 810ii in FIG. 54), the process 3920 replaces the user interface elements 4802-4812 illustrated in FIG. 48 with number edit box 5402 for defining a constant value of the design of experiment factor 4800.

Additionally, or alternatively, in some embodiments, converting the design of experiment factor 4800 to the constant factor type may include defining a constant value for the design of experiment factor 4100 based on a respective categorical level associated with the design of experiment factor 4800. Defining the constant value, in such embodiments, may include converting the respective categorical level to a numerical value (e.g., by extracting the number included from the respective categorical level). For instance, in the example of FIG. 48, the process 4320 may function to convert the categorical level "L1" to the numerical value one (1).

In turn, in some embodiments, the process 4320 may use the extracted numerical value to define a constant value for the design of experiments factor 4800. For instance, as shown in FIG. 54, when converting the design of experiment factor 4800 from the categorical factor type to the constant factor type, the process 4320 uses the constant value extracted from the categorical level "L1" (e.g., one (1)) as the constant value for the design of experiment factor 4800 (as indicated by element 5402).

In some embodiments, the factor type conversion executed by the processes 3920 and 3924 may cause a target factor to be converted from a discrete numeric factor type to a continuous factor type. An example of such processes converting a target factor from the discrete numeric factor type to the continuous factor type will now be described with reference to FIGS. 55 and 56.

Figure 55:
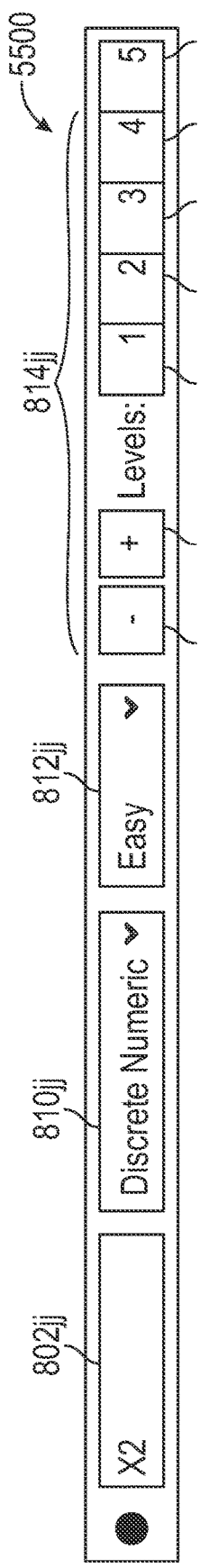

FIG. 55 illustrates an example design of experiment factor 5500.

Specifically, in the example of FIG. 55, a factor-setting user interface control element 802jj is indicating that the design of experiment factor 5500 is named "X2." The factor type user interface control element 810jj is indicating that the design of experiment factor 4800 is currently a discrete numeric factor type. The design of experiment platform configuration user interface control element 812jj is indicating that the design of experiment factor 4800 has an "Easy" change difficulty setting. The dynamic row 814jj is displaying a plurality of button control elements 5502-5504 and a plurality of number edit boxes 5508-5514. It shall be noted that, in some embodiments, the control elements 5502-5514 may have characteristics similar to the button control elements 830c-830d and the number edit boxes 830a-830b illustrated in FIG. 13.

Figure 56:
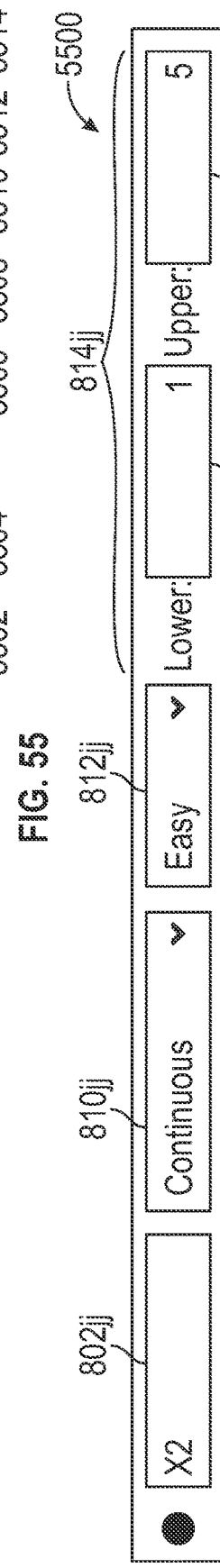

In some embodiments, converting the design of experiment factor 5500 from the discrete numeric factor type to the continuous factor type may include updating the row 814jj illustrated in FIG. 55 to include one or more user interface elements that are configured to receive input for defining a continuous range of the design of experiment factor 4800. For instance, as shown in FIG. 56, when converting the design of experiment factor 5500 from the discrete numeric factor type (as indicated by 810jj in FIG. 55) to the continuous factor type (as indicated by 810jj in FIG. 56), the process 4324 replaces the user interface control elements 5502-5514 illustrated in FIG. 55 with the number edit boxes 5602-5604 for defining a continuous range of the design of experiment factor 5500.

Additionally, or alternatively, in some embodiments, converting the design of experiments factor 5500 from the discrete numeric factor type to the continuous factor type may include defining a minimum continuous value and a maximum continuous value for the design of experiment factor 5500 based on a minimum discrete numeric level and a maximum discrete numeric level associated with the design of experiment factor 5500. For instance, in the example of FIG. 56, the process 3920 identifies (e.g., determines) that the minimum discrete numeric level and the maximum discrete numeric level associated with the design of experiment factor 5500 in FIG. 55 corresponds to one (1) and five (5), respectively. Accordingly, as also shown in FIG. 56, the process 3920 sets the minimum continuous value to correspond to the minimum discrete numeric value (indicated by number input box 5602) and sets the maximum continuous value to correspond to the maximum discrete numeric value (indicated by number input box 5604).

In some embodiments, the factor type conversion executed by the processes 3920 and 3924 may cause a target factor to be converted from the discrete numeric factor type to the categorical factor type. Various examples of such process converting the design of experiment factor 5500 illustrated in FIG. 55 from the discrete numeric factor type to the categorical factor type will now be described with reference to FIGS. 55 and 57.

In some embodiments, converting the design of experiment factor 5500 from the discrete numeric factor type to the categorical factor type may include updating the row 814*jj* illustrated in FIG. 55 to include one or more user interface elements that are configured to receive input for defining one or more categorical levels of the design of experiment factor 5500. For instance, as shown in FIG. 50, when converting the design of experiment factor 5500 from the discrete numeric factor type (as indicated by 810*jj* in FIG. 55) to the categorical factor type (as indicated by 810*jj* in FIG. 57), the process 4324 replaces the user interface control elements 5502-5514 with the button control elements 5702-5704 and the text edit boxes 5706-5714. It shall be noted that the control elements 5702-5714, in some embodiments, may be configured to define categorical levels in a similar manner as the elements 836*a*-836*d*, 838*a*-838*d*, and 840*g*-840*j* illustrated in FIG. 13.

Additionally, or alternatively, in some embodiments, converting the design of experiment factor 5500 from the discrete numeric factor type to the categorical factor type may include defining a plurality of categorical levels for the design of experiment factor 5500 based on the discrete numeric levels currently associated with the design of experiments factor 5500. Defining the plurality of categorical levels, in some embodiments, may include converting each of the plurality of discrete numeric levels associated with the design of experiments factor 5500 to a character representation. For instance, in the example of FIG. 55, the process 4320 may function to convert the discrete numeric levels one (1), two (2), three (3), four (4), and five (5) (as indicated by the number edit boxes 5506-5514 in FIG. 55) to corresponding character values "L1," "L2," "L3," "L4," and "L5", respectively.

Figure 57:
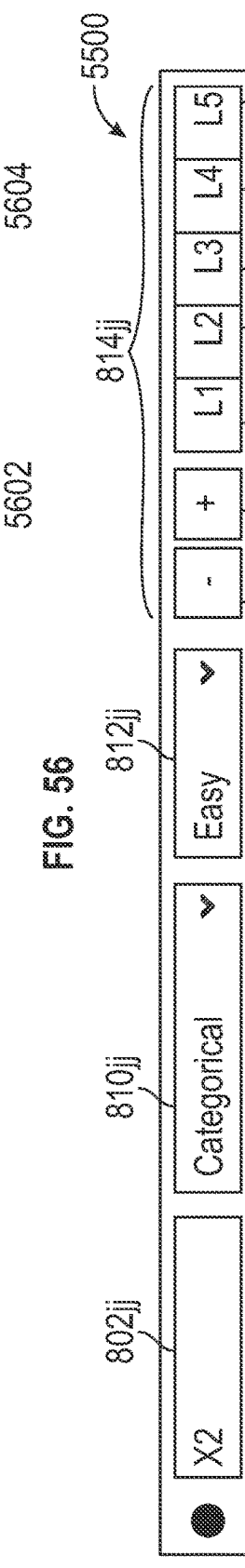

In turn, in some embodiments, the process 4320 may use the character representations to define a plurality categorical levels for the design of experiments factor 5500. For instance, as also shown in FIG. 57, based on the converting, the process 4320 creates a plurality of categorical levels that each correspond to the character representation of a respective one of the discrete numeric levels associated with the design of experiment factor 5500 (as indicated by the number edit boxes 5704-5714). Specifically, in the example of FIG. 57, the categorical level indicated by the number edit box 5706 corresponds to the character representation of the discrete numeric level associated with input text edit box 5506. The categorical level indicated by the number edit box 5708 corresponds to the character representation of the discrete numeric level associated with input text edit box 5508. The categorical level indicated by the number edit box 5710 corresponds to the character representation of the discrete numeric level associated with input text edit box 5510. The categorical level indicated by the number edit box 5712 corresponds to the character representation of the discrete numeric level associated with text edit box 5512. The categorical level indicated by the number edit box 5714 corresponds to the character representation the discrete numeric level associated input text edit box 5514.

In some embodiments, the factor type conversion executed by the processes 3920 and 3924 may cause a target factor to be converted from the discrete numeric factor type to the mixture factor type. Various examples of such processes converting the design of experiment factor 5500 illustrated in FIG. 55 from the discrete numeric factor type to the mixture factor type will now be described with reference to FIGS. 55 and 58.

In some embodiments, converting the design of experiments factor 5500 from the discrete numeric factor type to the mixture factor type may include updating the row 814*jj* illustrated in FIG. 55 to include one or more user interface elements that are configured to receive input for defining mixture parameters (e.g., values) of the design of experiment factor 5500. For instance, in the example of FIGS. 55 and 58, when converting the design of experiment factor 5500 from the discrete numeric factor type (as illustrated by 810*jj* in FIG. 55) to the mixture factor type (as illustrated by 810*jj* in FIG. 58), the process 4324 replaces the control elements 5502-5514 illustrated in FIG. 55 with the number input fields 5802 and 5804. It shall be noted that, in some embodiments, the number input fields 5802 and 5804 may be configured to receive input for setting a minimum mixture value and a maximum mixture value of design of experiment factor 5500.

Figure 58:
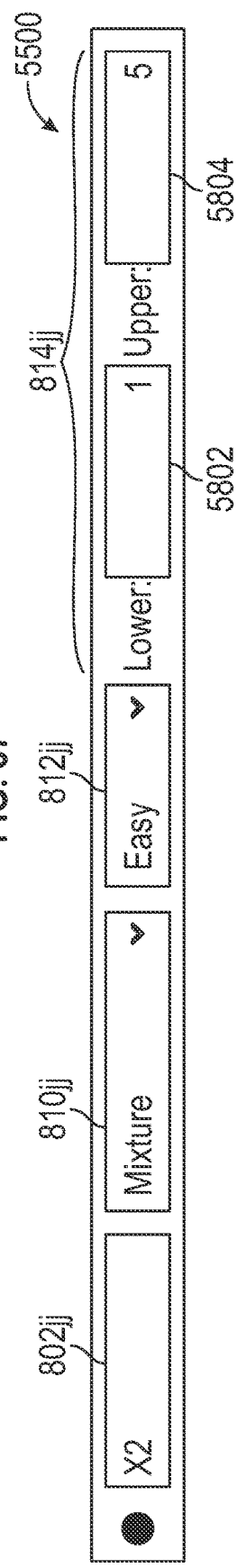

Additionally, or alternatively, in some embodiments, converting the design of experiment factor 5500 from the discrete numeric factor type to the mixture factor type may include defining a minimum mixture value and a maximum mixture value based on a minimum discrete numeric level and a maximum discrete numeric level associated with the design of experiment factor 5500. For instance, in the example of FIG. 58, when converting the design of experiment factor 5500 from the discrete numeric factor type to the mixture factor type, the process 3920 identifies (e.g., determines) that the minimum discrete numeric level and the maximum discrete numeric level associated with the design of experiment factor 5500 in FIG. 55 corresponds to one (1) and five (5), respectively. Accordingly, as also shown in FIG. 58, the process 3920 sets the minimum mixture value to correspond to the minimum discrete numeric value (indicated by number edit box 5802) and sets the maximum mixture value to correspond to the maximum discrete numeric value (indicated by number edit box 5804).

It shall be noted that, in some embodiments, the minimum mixture value set for the design of experiments factor 5500 may be different from the minimum discrete numeric value. For instance, in some embodiments, the process 4320 may set the minimum mixture value to zero (0) when the minimum discrete numeric value is less than zero (0) and/or when the maximum discrete value is less than zero (0). Similarly, it shall also be noted that, in some embodiments, the maximum mixture value set for the design of experiments factor 5500 may be different from the maximum discrete numeric value. For instance, in some embodiments, the process 4320 may set the maximum mixture value to one (1) when the maximum discrete numeric value is less than zero (0).

In some embodiments, the factor type conversion executed by the processes 3920 and 3924 may cause a target factor to be converted from a discrete numeric factor type to a blocking factor type. Various non-limiting example of such processes converting the design of experiment factor 5500 illustrated in FIG. 55 from the discrete numeric factor type to the blocking factor type will now be described with reference to FIGS. 55 and 59.

Figure 59:
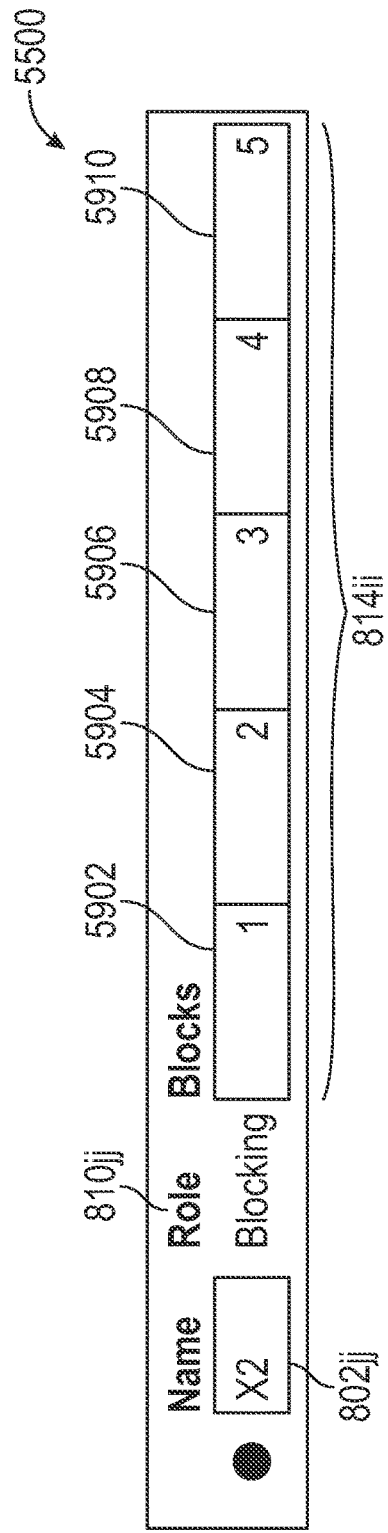

In some embodiments, converting the design of experiments factor 5500 from the discrete numeric factor type to the blocking factor type may include updating the row 814*jj* illustrated in FIG. 55 to include one or more user interface elements that are configured to receive input for defining one or more blocking levels of the design of experiments factor 5500. For instance, as shown in FIG. 59, when converting the design of experiment factor 5500 from the discrete numeric factor type (as illustrated by 810*jj* in FIG. 55) to the blocking factor type (as indicated by 810*jj*), the process 3924 replaces the user interface elements 5502-5514 illustrated in FIG. 55 with the user interface elements 5902-5910 for defining block levels of the design of experiment factor 5500.

Additionally, or alternatively, in some embodiments, converting the design of experiment factor 5500 from the discrete numeric factor type to the blocking factor type may include defining a plurality of blocking levels for the design of experiment factor 5500 based on the discrete numeric levels currently associated with the design of experiment factor 5500. The plurality of blocking levels, in some embodiments, may each correspond to one of the discrete numeric levels associated with the design of experiment factor 5500 and, optionally, may have a value based on the discrete numeric level to which it corresponds. For instance, in the example illustrated in FIG. 59, when converting the design of experiment factor 5500 from the discrete numeric factor type to the blocking factor type, the process 4320 creates a plurality of blocking levels (e.g., as indicated by the number input boxes 5902-5910). Specifically, in the example of FIG. 59, the blocking level indicated by the number edit box 5902 corresponds to the discrete numeric level associated number edit box 5506. The blocking level indicated by the number edit box 5904 corresponds to the discrete numeric level associated number input box 5508. The blocking level indicated by the number edit box 5908 corresponds to the discrete numeric level associated with number input box 5512. The blocking level indicated by the number edit box 5910 corresponds to the discrete numeric level associated with number input box 5514.

In some embodiments, the factor type conversion executed by the processes 3920 and 3924 may cause a target factor to be converted from a discrete numeric factor type to a covariate factor type. Various non-limiting examples of such processes converting the design of experiment factor 5500 illustrated in FIG. 55 from the discrete numeric factor type to the covariate factor type will now be described with reference to FIGS. 55 and 60.

Figure 60:
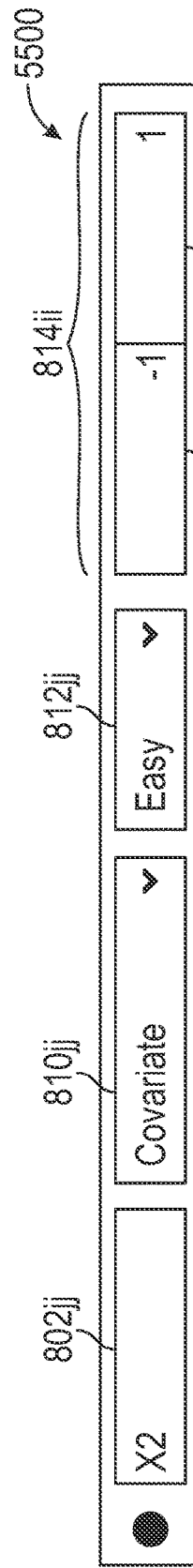

In some embodiments, converting the design of experiment factor 5500 from the discrete numeric factor type to the covariate factor type may include updating the row 814$jj$ illustrated in FIG. 55 to include one or more user interface elements that are configured to receive input for defining (e.g., specifying) one or more covariate levels of the design of experiment factor 5500. For instance, as shown in FIG. 60, when converting the design of experiment factor 5500 from the discrete numeric factor type (as illustrated by 810$jj$ in FIG. 55) to the covariate factor type (as illustrated by 801$jj$ in FIG. 60), the process 3924 replaces the control elements 5502-5514 illustrated in FIG. 55 with user interface elements 6002-6004 for defining covariate levels of the design of experiment factor 5500. It shall be noted that, in some embodiments, the covariate levels may be specified based on user interaction received at a design of experiments covariate dialog or the like.

In some embodiments, the factor type conversion executed by the processes 3920 and 3924 may cause a target factor to be converted from a discrete numeric factor type to a constant factor type. Various non-limiting examples of such processes converting the design of experiment factor 5500 illustrated in FIG. 55 from the discrete numeric factor type to the constant factor type will now be described with reference to FIGS. 55 and 61.

Figure 61:
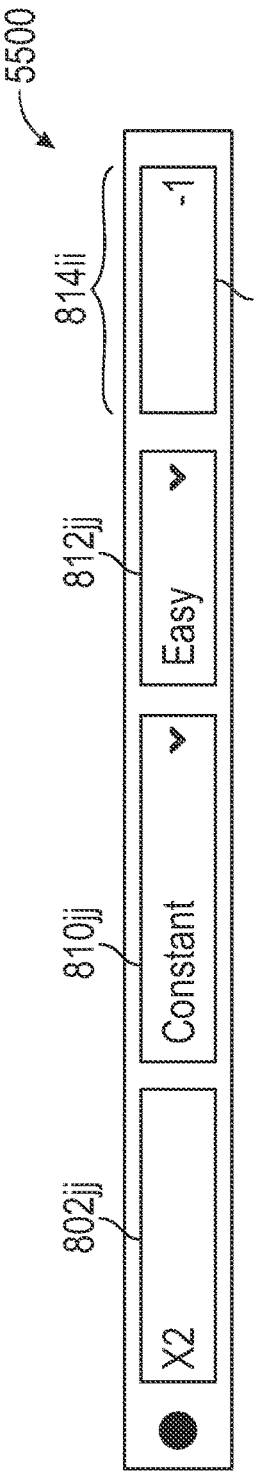

In some embodiments, converting the design of experiments factor 5500 from the discrete numeric factor type to the constant factor type may include updating the row 814$jj$ illustrated in FIG. 55 to include one or more user interface elements that are configured to receive input for defining (or specifying) a constant value of the design of experiment factor 5500. For instance, as shown in FIG. 61, when converting the design of experiment factor from the discrete numeric factor type (as illustrated by 810$jj$ in FIG. 55) to the constant factor type (as indicated by 810$jj$ in FIG. 61), the process 4324 replaces the user interface elements 5502-5514 illustrated in FIG. 55 with the number edit box 6102 for defining a constant value of the design of experiment factor 4100.

In some embodiments, the constant value of the design of experiment factor 4100 may be automatically set based on the minimum discrete value currently associated with the design of experiment factor 4100. For instance, as also shown in FIG. 61, when converting the design of experiment factor from the discrete numeric factor type (as illustrated by 810$jj$ in FIG. 55) to the constant factor type (as indicated by 810$jj$ in FIG. 61), the process 4320 sets the constant value to one (1) because the minimum discrete numeric level associated with the design of experiment factor 5500 in FIG. 55 has a value of one (1) (as indicated by number edit box 6102).

In some embodiments, the factor type conversion executed by the processes 3920 and 3924 may cause a target factor to be converted from a mixture factor type to a continuous factor type. An example of such processes converting a target factor from the mixture factor type to the continuous factor type will now be described with reference to FIGS. 62 and 63.

Figure 62:
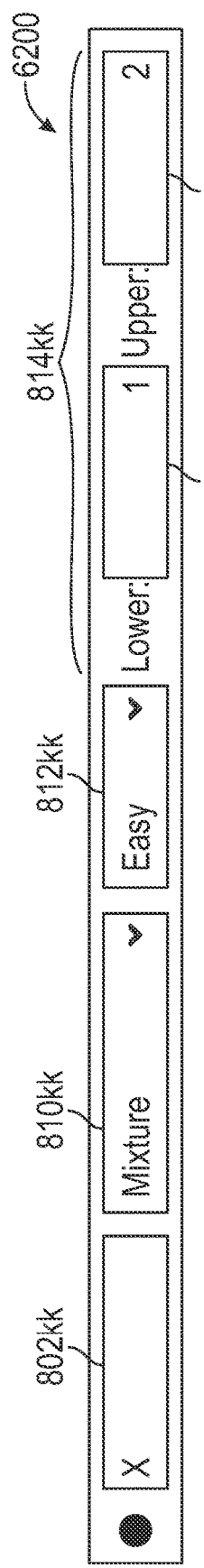

FIG. 62 illustrates an example design of experiment factor 6200.

Specifically, in FIG. 62, the factor-setting user interface control element 802$kk$ is indicating that the design of experiment factor 6200 is named "X." The factor type user interface control element 810$kk$ is indicating that the design of experiment factor 6200 is currently a mixture factor type. The design of experiments platform configuration user interface control element 812$kk$ is indicating that the design of experiment factor 6200 has an "Easy" change difficulty setting. The dynamic row 814$kk$ is displaying a plurality of number edit boxes 6202 and 6204 that are specifying the minimum mixture value and a maximum mixture value of the design of experiment factor 6200 (e.g., one (1) and two (2)), respectively.

In some embodiments, converting the design of experiment factor 6200 from the mixture factor type to the continuous factor type may include updating the row 814$kk$ illustrated in FIG. 62 to include one or more user interface elements that are configured to receive input for defining a continuous range of the design of experiment factor 6200. For instance, in the example of FIGS. 62 and 63, when converting the design of experiment factor 6200 from the mixture factor type (as illustrated by 810$kk$ in FIG. 62) to the continuous factor type (as illustrated by 810$kk$ in FIG. 63), the process 4324 replaces the number input fields 6202 and 6204 illustrated in FIG. 62 with the number input fields 6302 and 6304. It shall be noted that, in some embodiments, the number input fields 6302 and 6304 may have similar characters as number input fields 834$a$ and 834$b$ illustrated in FIG. 13.

Additionally, or alternatively, in some embodiments, converting the design of experiments factor 6200 from the mixture factor type to the continuous factor type may include defining a minimum continuous value for the design of experiment factor 4100 based on a minimum mixture currently associated with the design of experiment factor 6200. For instance, as also shown in FIG. 44, when converting the design of experiment factor 6200 from the mixture factor type to the continuous factor type, the process 4320 sets the minimum continuous value to correspond to the minimum mixture value associated with the design of experiments factor 6200 in FIG. 62 (as indicated by the number input fields 6202 and 6504 in FIGS. 62 and 65).

Figure 63:
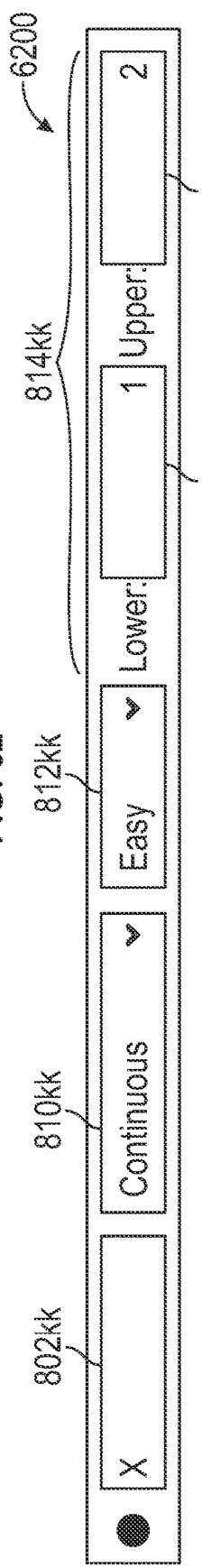

Additionally, or alternatively, in some embodiments, converting the design of experiments factor 6200 from the mixture factor type to the continuous factor type may include defining a maximum mixture value for the design of experiment factor 6200 based on a maximum value of a continuous range currently associated with the design of experiment factor 6200. For instance, as also shown in FIG. 63, when converting the design of experiment factor 6200 from the mixture factor type to the continuous factor type, the process 4320 sets the maximum mixture value of the design of experiment factor 6200 to correspond to the maximum continuous value associated with the design of experiment factor 6200 in FIG. 62 (as indicated by the number input fields 6204 and 6508 in FIGS. 62 and 65).

In some embodiments, the factor type conversion executed by the processes 3920 and 3924 may cause a target factor to be converted from a mixture factor type to a categorical factor type. Various non-limiting example of such processes converting the design of experiment factor 6200 illustrated in FIG. 62 from the mixture factor type to the categorical factor type will now be described with reference to FIGS. 62 and 64.

Figure 64:
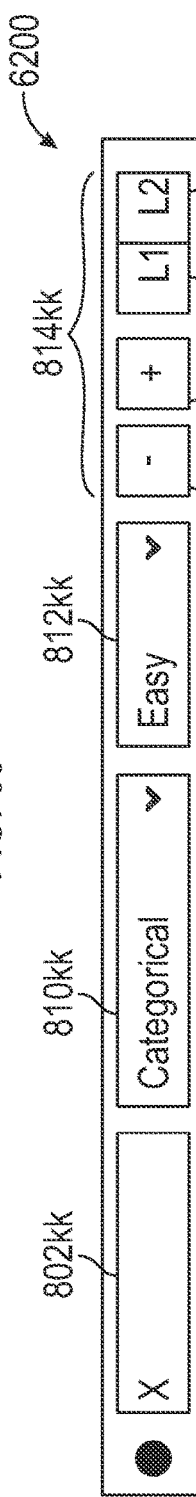

In some embodiments, converting the design of experiment factor 6200 from a mixture factor type to a categorical factor type may include updating the row 814kk illustrated in FIG. 62 to include one or more user interface elements that are configured to receive input for defining one or more categorical levels for the design of experiment factor 6200. For instance, as shown in FIG. 64, when converting the design of experiment factor 6200 from the mixture factor type (indicated by 810kk in FIG. 62) to the categorical factor type (indicated by 810kk in FIG. 64), the process 4324 replaces the number input fields 6202 and 6204 illustrated in FIG. 62 with user interface elements 6402-6408. It shall be noted that the user interface elements 6402-6408 may have similar characteristics to the elements 836a-836d, 838a-838d, and 840g-840j illustrated in FIG. 13.

Additionally, or alternatively, in some embodiments, converting the design of experiment factor 6200 from the mixture factor type to the categorical factor type may include defining a first categorical level for the design of experiment factor 6200 based on a character representation of the minimum mixture value currently associated with the design of experiment factor 6200. For instance, as also shown in FIG. 64, when converting the design of experiment factor 6200 from the mixture factor type to the categorical factor type, the process 4320 converts the minimum mixture value indicated by the number input box 6202 (e.g., one (1)) to a corresponding character representation (e.g., 1→"L1") and, in turn, defines a categorical level with a value corresponding the character representation of the minimum mixture value—as indicated by element 6406.

Additionally, or alternatively, in some embodiments, converting the design of experiment factor 6200 from the mixture factor type to the categorical factor type may include defining a second categorical level based on a character representation of the maximum mixture value currently associated with the design of experiment factor 6200. For instance, as also shown in FIG. 64, when converting the design of experiment factor 6200 from the mixture factor type to the categorical factor type, the process 4320 converts the maximum mixture value indicated by the number input box 6204 to a corresponding character representation (e.g., 2→"L2") and, in turn, defines a categorical level with a value corresponding the character representation of the maximum mixture value—as indicated by element 6408.

In some embodiments, the factor type conversion executed by the processes 3920 and 3924 may cause a target factor to be converted from a mixture factor type to a discrete numeric factor type. Various non-limiting examples of such processes converting the design of experiment factor 6200 from the mixture factor type to the discrete numeric factor type will now be described with reference to FIGS. 62 and 65.

Figure 65:
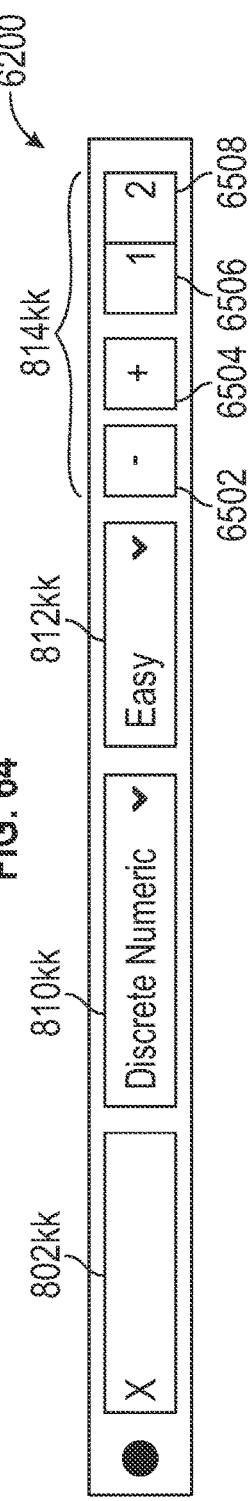

In some embodiments, converting the design of experiment factor 6200 from the mixture factor type to the discrete numeric factor type may include updating the row 814kk illustrated in FIG. 62 to include one or more user interface elements that are configured to receive input for defining one or more discrete numeric levels of the design of experiment factor 6200. For instance, as shown in FIG. 65, when converting the design of experiment factor 6200 from the mixture factor type (as indicated by 810kk in FIG. 62) to the discrete numeric factor type (as indicated by the 810kk in FIG. 65), the process 4324 replaces the number input fields 6202 and 6204 illustrated in FIG. 62 with the user interface elements 6502-6508. It shall be noted that the user interface elements 6502-6508 may have similar characteristics as elements 830a-830d illustrated in FIG. 13.

Additionally, or alternatively, in some embodiments, converting the design of experiment factor 6200 from the mixture factor type to the discrete numeric factor type may include defining a discrete numeric level for the design of experiment factor 4100 based on a minimum mixture currently associated with the design of experiment factor 6200. For instance, as also shown in FIG. 65, when converting the design of experiment factor 6200 from the mixture factor type to the discrete numeric factor type, the process 4320 defines a first discrete numeric level for the design of experiment factor 6200 (as indicated by the user interface control element 6506) with a value that corresponds to the minimum mixture value indicated by the number input box 6202 in FIG. 62.

Additionally, or alternatively, in some embodiments, converting the design of experiment factor 6200 from the mixture factor type to the discrete numeric factor type may include defining a discrete numeric level for the design of experiment factor 6200 based on a maximum mixture value currently associated with the design of experiment factor 6200. For instance, as also shown in FIG. 43, when converting the design of experiment factor 6200 from the mixture factor type to the discrete numeric factor type, the process 4320 further defines a second discrete numeric level for the design of experiment factor 6200 (as indicated by the user interface control element 6508) with a value that corresponds to the maximum mixture value indicated by the number input box 6204 in FIG. 62.

In some embodiments, the factor type conversion executed by the processes 3920 and 3924 may cause a target factor to be converted from a mixture factor type to a blocking factor type. Various non-limiting examples of such processes converting the design of experiment factor 6200 illustrated in FIG. 62 from the mixture factor type to the blocking factor type will now be described with reference to FIGS. 62 and 66.

In some embodiments, converting the design of experiment factor 6200 from the mixture factor type to the blocking factor type may include updating the row 814kk illustrated in FIG. 62 to include one or more user interface elements that are configured to receive input for defining one or more blocking levels of the design of experiments factor 6200. For instance, as shown in FIG. 66, when converting the design of experiment factor 6200 from the mixture factor type (as illustrated by 810*kk* in FIG. 62) to the blocking factor type (as indicated by 810*kk* in FIG. 66), the process 3924 replaces the number input fields 6202 and 6204 illustrated in FIG. 62 with user interface elements 6602-6604 for defining block levels of the design of experiment factor 6200.

Additionally, or alternatively, in some embodiments, converting the design of experiment factor 6200 from the mixture factor type to the blocking factor type may include defining a block level for the design of experiment factor 6200 based on the minimum mixture value currently associated with the design of experiment factor 6200. For instance, as also illustrated in FIG. 66, when converting the design of experiment factor 6200 from the mixture factor type to the blocking factor type, the process 3920 defines a first block level for the design of experiment factor 6200 (as indicated by number input box 6602) with a value that corresponds to the minimum mixture value indicated by number input field 6202 in FIG. 62.

Additionally, or alternatively, in some embodiments, converting the design of experiment factor 6200 to the blocking factor type may include defining a block level based on the maximum mixture value currently associated with the design of experiment factor 6200. For instance, as also illustrated in FIG. 66, when converting the design of experiment factor 6200 from the mixture factor type to the blocking factor type, the process 3920 also defines a second block level for the design of experiment factor 6200 (as indicated by number input box 6604) with a value that corresponds to the maximum mixture value indicated by number input field 6204 in FIG. 62.

In some embodiments, the factor type conversion executed by the processes 3920 and 3924 may cause a target factor to be converted from a mixture factor type to a covariate factor type. Various non-limiting example of such processes converting the design of experiment factor 6200 illustrated in FIG. 62 from the mixture factor type to the covariate factor type will now be described with reference to FIGS. 62 and 67.

In some embodiments, converting the design of experiments factor 6200 from the mixture factor type to the covariate factor type may include updating the row 814*kk* illustrated in FIG. 62 to include one or more user interface elements that are configured to receive input for defining (or specifying) one or more covariate levels of the design of experiment factor 6200. For instance, as shown in FIG. 67, when converting the design of experiment factor 6200 from the mixture factor type (as indicated by 810*kk* in FIG. 62) to the covariate factor type (as indicated by 810*kk* in FIG. 67), the process 3924 replaces the number input fields 6202 and 6204 illustrated in FIG. 62 with user interface elements 6702-6704 for defining covariate levels of the design of experiment factor 6200. It shall be noted that, in some embodiments, the covariate levels of the design of experiments factor 6200 may be defined based on user input received via a design of experiments covariate dialog column or the like.

In some embodiments, the factor type conversion executed by the processes 3920 and 3924 may cause a target factor to be converted from a mixture factor type to a constant factor type. Various non-limiting example of such processes converting the design of experiment factor 6200 illustrated in FIG. 62 from the mixture factor type to the constant factor type will now be described with reference to FIGS. 62 and 68.

In some embodiments, converting the design of experiments factor 4100 from the mixture factor type to the constant factor type may include updating the row 814*kk* illustrated in FIG. 62 to include one or more user interface elements that are configured to receive input for defining (or specifying) a constant value of the design of experiment factor 6200. For instance, as shown in FIG. 68, when converting the design of experiment factor 6200 from the mixture factor type (as illustrated by 810*kk* in FIG. 62) to the constant factor type (as indicated by 810*kk* in FIG. 68), the process 3924 replaces the number input fields 6202 and 6204 illustrated in FIG. 62 with number input user interface element 6802 for defining a constant value of the design of experiment factor 6200.

Additionally, or alternatively, in some embodiments, converting the design of experiment factor 6200 to the constant factor type may include defining a constant value for the design of experiment factor 6200 based on the minimum mixture value currently associated with the design of experiment factor 6200. For instance, as also illustrated in FIG. 68, when converting the design of experiment factor 6200 from the mixture factor type to the constant factor type, the process 3920 defines a constant value for the design of experiment factor 6200 (as indicated by element 6802) that is equivalent to the minimum mixture value indicated by number input field 6202 illustrated in FIG. 62.

In some embodiments, the factor type conversion executed by the processes 3920 and 3924 may cause a target factor to be converted from a blocking factor type to a continuous factor type, a categorical factor type, a discrete numeric factor type, a mixture factor type, a constant factor type, a covariate factor type, and/or the like. When converting a target factor from a blocking factor type to one of the above-mentioned factor types, the process 3920, in some embodiments, may function to perform the conversion based on default type conversion rules (e.g., such as when the blocking factor specifies 'runs per block'). It shall also be noted that, in some embodiments, the process 3920 may additionally, or alternatively, function to convert constant factors to the continuous factor type, the categorical factor type, the discrete numeric factor type, the mixture factor type, the covariate factor type, the blocking factor type, and/or the like based on similar default type conversion rules.

In some embodiments, the default type conversion rules may define the default values (e.g., levels) of a respective factor type. For instance, in a non-limiting example, the default type conversion rules for the continuous factor type may define that, by default, the minimum continuous value of a continuous factor is negative (−1), and the maximum continuous value of a continuous factor is positive one (+1). Thus, in some embodiments, when converting a target factor from a blocking factor type to a continuous factor type, the process 3920 may set the values of the target factor according to the default type conversion rules (e.g., set the minimum continuous value and the maximum continuous value to negative one (−1) and positive one (1), respectively). Other default type conversions for other factors type may be analogously defined.

Figure 69:
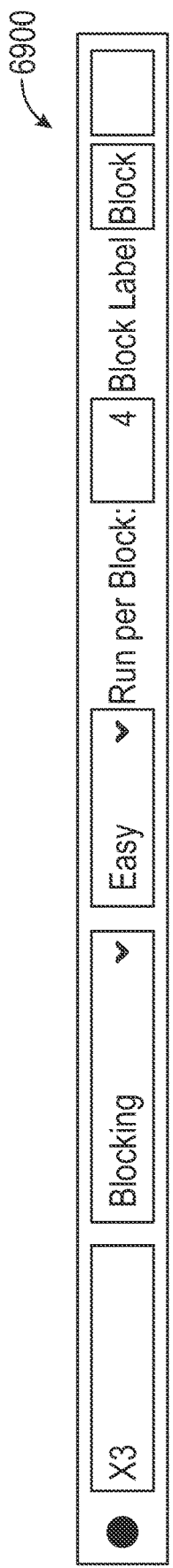
Figure 70:

An example of the process 3920 converting a blocking factor type based on default type conversion rules is illustrated in FIGS. 69 and 70. In FIGS. 69 and 70, the process 3920 is converting the design of experiment factor 6900 from a blocking factor type to the discrete numeric factor type. As illustrated, when converting the design of experiment factor 6900 from the blocking factor type to the discrete numeric factor type, the process 3920 adds, based on default settings, five (5) discrete numeric levels to the design of experiment factor 6900. Specifically, in the example of FIG. 70, the five discrete have default values of one (1), two (2), three (3), four (4), and five (5), respectively.

It shall be noted that the above example is not intended to be limiting and that, in other embodiments, the default type conversion rules may include additional, fewer, or different discrete numeric levels than illustrated. Alternatively, in some embodiments, the process 3920 may function to convert a target factor from a blocking factor type to a continuous factor type, discrete numeric factor type, mixture factor type, covariate factor type, and/or a constant factor based on the same factor type conversion rules described in FIGS. 48-54 for converting a categorical factor to a continuous factor, a discrete numeric factor, a mixture factor, a covariate factor, and/or a constant factor.

Referring to FIG. 39, in some embodiments, the process 3920 may include a process 3928 that functions to update the design of experiments with an experiment design policy for the successor factor type, wherein the experiment design policy for the successor factor type controls a transformation of an underlying model of the design of experiments. The experiment design policy, as generally referred to herein, may refer to heuristics (e.g., rules) that enable the model underlying the design of experiments to flexibly adapt as factors are added to the design of experiments, removed from the design of experiments, and/or as attributes of the factors in the design of experiments change (e.g., type, levels, etc.).

In some embodiments, when the process 3920 is converting a target factor to a continuous factor type (e.g., the successor factor type), the process 3928 may function to update the design of experiments with a continuous factor experiment design policy. The continuous factor experiment design policy, in some embodiments, may comprise a main effect model term heuristic, a model power heuristic, a degrees of freedom heuristic, a term interaction heuristic, and/or a mixture source heuristic. The main effect model term heuristic, in some embodiments, may cause the process 3930 (described later) to add a main effect model term for the target factor when one or more model transformation criteria are satisfied (e.g., if the model underlying the design of experiments does not already include such a main effect model term). The model power heuristic, in some embodiments, may cause the process 3930 to maintain (e.g., preserve) powers of one or more terms in a design of experiment model. The degrees of freedom heuristic, in some embodiments, may cause the process 3930 to set terms associated with continuous factor to one (1) degree of freedom. The term interaction heuristic, in some embodiments, may cause the process 3930 to preserve (e.g., maintain) model interaction terms currently present in the design of experiments model. The mixture source heuristic, in some embodiments, may cause the process 3930 to add an intercept term to the design of experiments model when the target factor is being converted from a mixture factor type and/or when the design of experiments model does not include other mixture factors.

In some embodiments, when the process 3920 is converting a target factor to a categorical factor type (e.g., the successor factor type), the process 3928 may function to update the design of experiments with a categorical factor experiment design policy. The categorical factor experiment design policy, in some embodiments, may comprise a main effect model term heuristic, a model power heuristic, a degrees of freedom heuristic, a term interaction heuristic, and/or a mixture source heuristic. The main effect model term heuristic, in some embodiments, may cause the process 3930 (described later) to add a main effect model term for the target factor when one or more model transformation criteria are satisfied (e.g., if the model underlying the design of experiments does not already include such main effect model term). The model power heuristic, in some embodiments, may cause the process 3930 to remove terms in the design of experiment model that include the target factor with a power greater than one. The degrees of freedom heuristic, in some embodiments, may cause the process 3930 to set term corresponding to the target factor to k−1 degrees of freedom (where k is the number of levels associated with the target factor). The term interaction heuristic, in some embodiments, may cause the process 3930 to preserve (e.g., maintain) model interaction terms currently present in the design of experiments model. The mixture source heuristic, in some embodiments, may cause the process 3930 to add a model intercept term to the design of experiments model when the target factor is being converted from a mixture factor type and/or when the design of experiments model does not include any other mixture factors.

In some embodiments, when the process 3920 is converting a target factor to a discrete numeric factor type (e.g., the successor factor type), the process 3928 may function to update the design of experiments with a discrete numeric factor experiment design policy. The discrete numeric factor experiment design policy, in some embodiments, may comprise a model power heuristic, a term interaction heuristic, and/or a mixture source heuristic. The main effect model term heuristic, in some embodiments, may cause the process 3930 (illustrated in FIG. 39) to add a main effect model term for the target factor when one or more model transformation criteria are satisfied (e.g., if the model underlying the design of experiments does not already include such a main effect model term). The model power heuristic, in some embodiments, may cause the process 3930 to set main effect terms to have a first level of estimability (e.g., "Necessary" estimability) and/or may cause terms with powers up to k−1 (where k is the number of levels associated with the target factor) to have the first level of estimability or a second level of estimability (e.g., "If possible" estimability) based on system or user preferences. The term interaction heuristic, in some embodiments, may cause the process 3930 to preserve (e.g., maintain) model interaction terms currently present in the design of experiments model. The mixture source heuristic, in some embodiments, may cause the process 3930 to add an intercept term to the design of experiments model when the target factor is being converted from a mixture factor type and when the design of experiments model does not include any other mixture factors.

In some embodiments, when the process 3920 is converting a target factor to a mixture factor type (e.g., the successor factor type), the process 3928 may function to update the design of experiments with a mixture factor experiment design policy. The mixture factor experiment design policy, in some embodiments, may comprise a model intercept heuristic and/or a mixture term interaction heuristic. The model intercept heuristic, in some embodiments, may cause the process 3930 to remove a model intercept term from the design of experiment model if such term exists in the design of experiment model. The mixture term interaction heuristic may cause, the process 3930 to remove main effect model terms associated with other variables (e.g., process variables) and/or may cause the process 3930 remove interaction model terms that comprise mixture factors from the design of experiments model.

In some embodiments, when the process 3920 is converting a target factor to a blocking factor type (e.g., the successor factor type), the process 3928 may function to update the design of experiments with a blocking factor experiment design policy. The blocking factor experiment design policy, in some embodiments, may comprise a blocking factor term interaction heuristic, a degree of freedom heuristic, and/or a mixture source heuristic. The blocking factor term interaction heuristic, in some embodiments, may cause the process 3930 to remove interactions terms from the design of experiment model that involve the target factor. The degree of freedom heuristic, in some embodiments, may cause the process 3930 to update a main effect model term associated with the target factor to have k−1 degrees of freed (where k is the number of blocking levels associated with the target factor). The mixture source heuristic, in some embodiments, may cause the process 3930 to add an intercept term to the design of experiments model when the target factor is being converted from a mixture factor type and when the design of experiments model does not include any other mixture factors (e.g., the target factor corresponds to the last mixture factor in the design of experiments).

In some embodiments, when the process 3920 is converting a target factor to a constant factor type (e.g., the successor factor type), the process 3928 may function to update the design of experiments with a constant factor experiment design policy. The constant factor experiment design policy, in some embodiments, may comprise a model term heuristic, and/or a mixture source heuristic. The model term heuristic, in some embodiments, may cause the process 3930 to remove one or more model terms from the design of experiment model that involve the target factor. The mixture source heuristic, in some embodiments, may cause the process 3930 to add an intercept term to the design of experiments model when the target factor is being converted from a mixture factor type and/or when the design of experiments model does not include any other mixture factors (e.g., the target factor corresponds to the last mixture factor in the design of experiments).

It shall be noted that, in some embodiments, when the process 3920 is converting a target factor to a covariate factor type (e.g., the successor factor type), the process 3928 may function to update the design of experiments according to the categorical experiment design policy, the continuous experiment design policy, and/or the mixture experiment design. That is, the process 3930 may convert the target factor from an incumbent factor type (e.g., source factor type) to the covariate factor type according to the heuristics defined in the categorical experiment design policy, the continuous experiment design policy, and/or the mixture experiment design policy.

In some embodiments, when the process 3920 is converting a target factor to the successor factor type, the process 3928 may function to update the design of experiments with a run size experiment design policy. The run size experiment design policy, in some embodiments, may comprise a minimum run size heuristic, a default run size heuristic, and a user specified run size heuristic. The minimum run size heuristic, in some embodiments, may cause the process 3930 to update the minimum number of runs for the design of experiment to correspond to the sum of the degrees of freedom associated with each design of experiment factor. The default run size heuristic, in some embodiments, may cause the process 3930 to update the default run size to a value corresponding to a product of the two design of experiment factors with the largest number of levels plus at least an additional four (4) degrees of freedom for error. The user specified run size heuristic, in some embodiments, may cause the process 3930 to update the user specified run size to the minimum design of experiment run size when the user specified run size is less than the minimum design of experiment run size.

In some embodiments, when the process 3920 is converting a target factor to the successor factor type, the process 3928 may function to update the design of experiments with a space filling experiment design policy. The space filling experiment design policy, in some embodiments, may comprise an available design choice heuristic that causes the process 3930 to restrict design choices when a continuous factor is converted to a categorical factor type, a discrete numeric factor type, a mixture factor type. Additionally, or alternatively, in some embodiments, the available design choice heuristic may cause the process 3930 to make a plurality of design choices available for selection when a respective design of experiment factor is converted to a continuous factor type.

In some embodiments, when the process 3920 is converting a target factor to the successor factor type, the process 3928 may function to update the design of experiments with a definitive screening design policy. The definitive screening design policy, in some embodiments, may comprise a run size heuristic that causes the process 3930 to set the run size of the design of experiments to an even number when the continuous factor is converted to a categorical factor and/or that causes the process 3930 to set the run size of the design of experiments to an odd number when design of experiments do not include a categorical factor.

In some embodiments, when the process 3920 is converting a target factor to the successor factor type, the process 3928 may function to update the design of experiments with a screening design policy. The screening design policy, in some embodiments, may comprise an available screening type heuristic that causes the process 3930 to present options for selecting fractional factorial designs or main effects screening designs when a continuous factor is converted to a two-level factor.

Referring to FIG. 39, in some embodiments and as previously mentioned above, the method 3900 may include the process 3930. The process 3930, in some embodiments, may function to execute a model transformation of the underlying model of the design of experiments based on the experiment design policy for the successor factor type, wherein executing the model transformation includes modifying one or more operational parameters of the underlying model to satisfy the experimental design policy for the successor factor type.

As will be described in more detail herein, in some embodiments, modifying operational parameters of the underlying model to satisfy the experimental design policy may include, but should be limited to, adding one or more model terms to the design of experiments model to satisfy the heuristics (e.g., rules) associated with the experiment design policy, removing one or more model terms from the design of experiments model to satisfy the heuristics associated with the experiment design policy, updating attributes of one or more model terms in the design of experiments model to satisfy the heuristics associated with the experiment design policy, updating a run size of the design of experiment, and/or the like.

It shall be noted that, in some embodiments, as illustrated in FIG. 40, the process 3930 may perform a determination

4006 to determine if transformation of the underlying design of experiments model is required. If the process 3930 determines that the factor conversion executed by the step 4004 (e.g., process 3920) does not require transformation of the underlying design of experiments model, the method 3900 may forgo performing steps 4010-4016 and perform step 4008 which functions to update the graphical user interface based on the converting of the target factor at step 4004 (e.g., update the design of experiment factor specification user interface 800 illustrated in FIGS. 8-38).

Conversely, as also shown in FIG. 40, if the process 3930 determines that the factor conversion executed by the process 3920 requires transformation of the underlying design of experiments model, the process 3930 may function to perform a determination 4010 to determine if the underlying model of the design of experiments relates to a special class of designs (e.g., space filling design platform, screening design platform, and/or the like). If the process 3930 determines that the underlying model does not relate to a special class of design, the process 3930 may perform step 4012 and/or 4014. Various non-limiting examples of the process 3930 transforming terms of a design of experiment model (4012) and updating runtime parameters of the design of experiment model (4014) will now be described.

Figure 71:
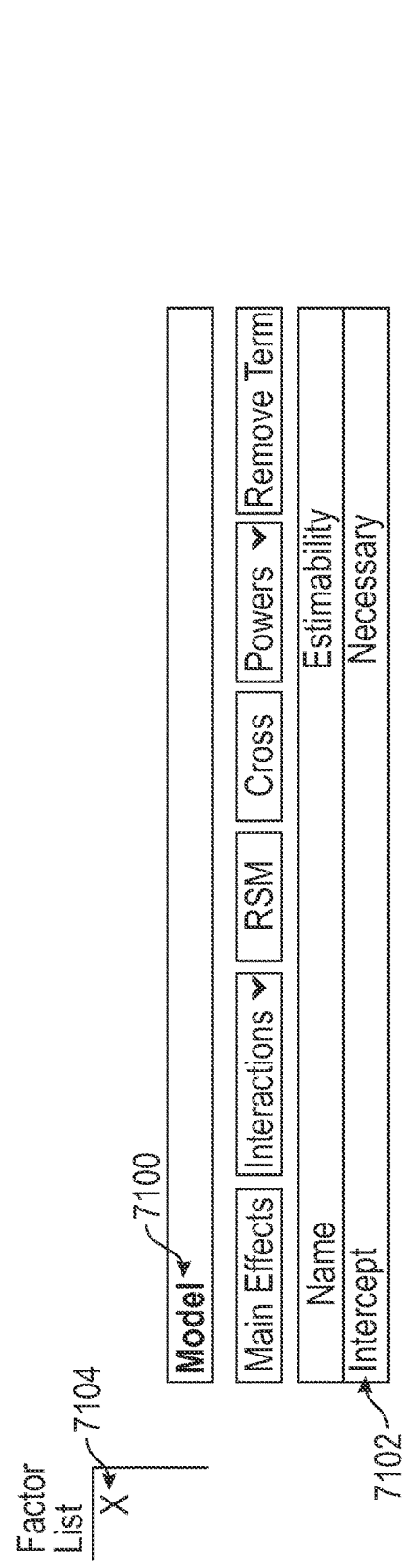
Figure 72:
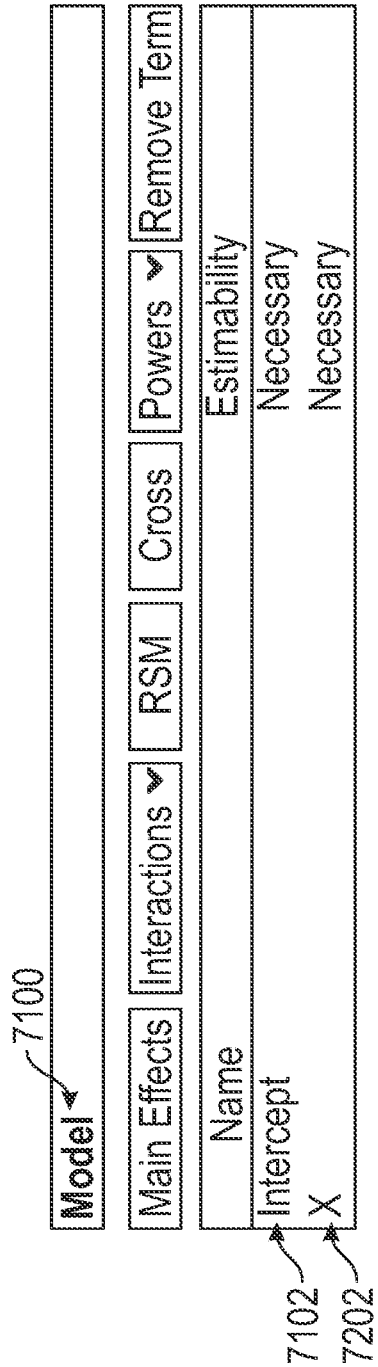

An example of the process 3930 transforming a design of experiment model to satisfy the continuous factor experiment design policy (described in the process 3928) is illustrated in FIGS. 71 and 72. In the example of FIGS. 71 and 72, the process 3930 is updating a design of experiment model 7100 based on (e.g., in response to) the process 3920 converting a design of experiment factor 7104 from a constant factor type to a continuous factor type. In particular, as illustrated in FIG. 71, the design of experiments model 7100 includes a model intercept term 7102. In FIG. 72, the process 3930 determines that the design of experiment model 7100 illustrated in FIG. 71 does not currently include a main effect term corresponding to the design of experiment factor 7104 and, in response, adds such a main effect model term 7202 to the design of experiment model 7100 for satisfying the main effect model term heuristic defined in process 3928. Additionally, in the example of FIG. 74, the process 3930 sets the main effect model term 7306 to one (1) degree of freedom to satisfy the degrees of freedom heuristic described in the process 3928.

It also be noted that if the above example included model terms with powers and/or model interaction terms, the process 3930 may have additionally functioned to preserve the powers and the model interaction terms to satisfy the model power heuristic and the term interaction heuristic described in the process 3928.

Figure 73:
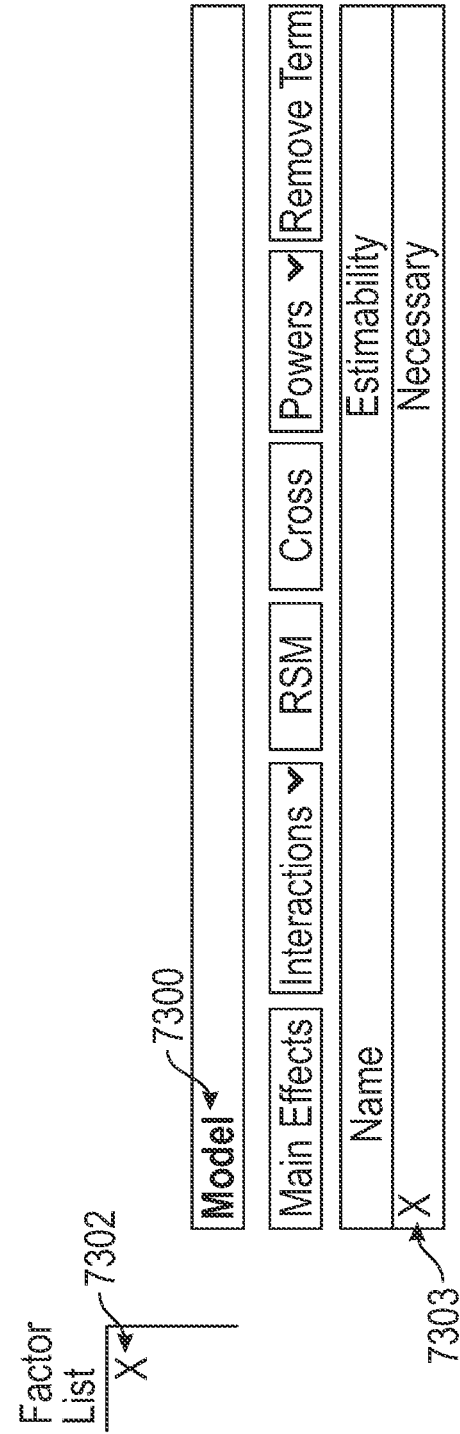
Figures 74, 75:
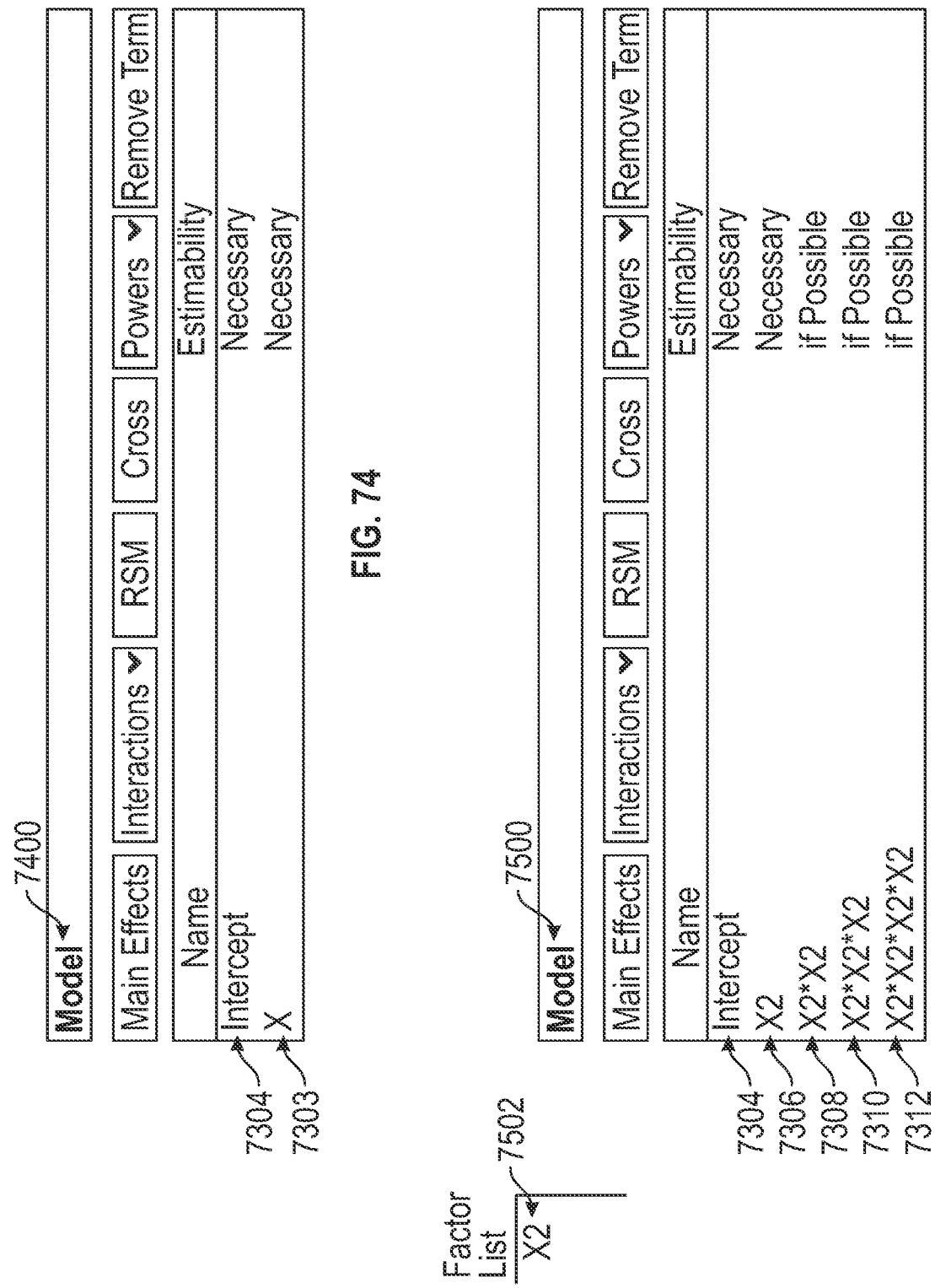

Another example of the process 3930 transforming a design of experiment model to satisfy the continuous factor experiment design policy (described in the process 3928) is illustrated in FIGS. 73 and 74. In the example of FIGS. 73 and 74, the process 3930 is updating a design of experiment model 7300 based on (e.g., in response to) the process 3920 converting a design of experiment factor 7302 from a mixture factor type to a continuous factor type. In particular, in the example of FIG. 73, the design of experiments model 7100 includes a main effects model term 7303 that corresponds to the design of experiment factor 7302. In FIG. 72, the process 3930 determines that the design of experiment factor 7302 was the last mixture factor in the design of experiments and, in response, adds a model intercept term 7304 to the design of experiment model 7300 to satisfy the mixture source heuristic described in the process 3928.

Figure 76:
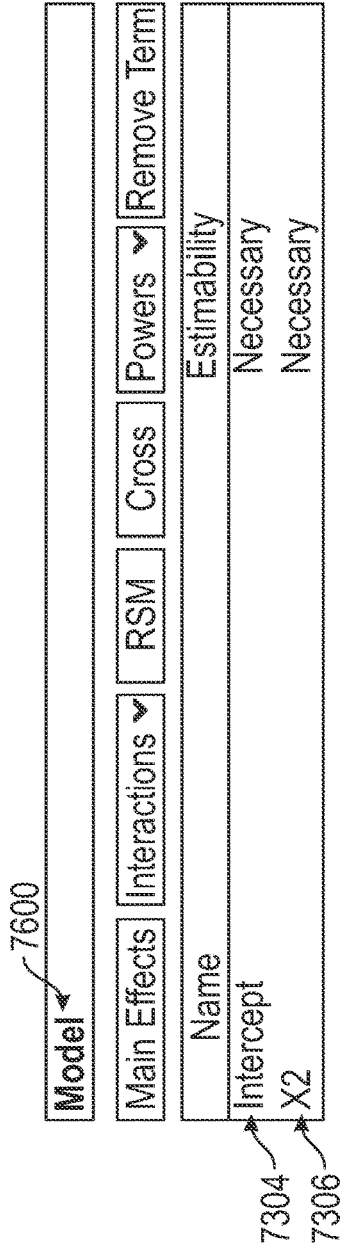

An example of the process 3930 transforming a design of experiment model to satisfy the categorical factor experiment design policy (described in the process 3928) is illustrated in FIGS. 75 and 76. In the example of FIGS. 75 and 76, the process 3930 is updating a design of experiment model 7500 based on (e.g., in response to) the process 3920 converting a design of experiment factor 7502 from a discrete factor type to a categorical factor type. In particular, in the example of FIG. 75, the design of experiments model 7100 includes a model intercept term 7304, a main effects model term 7306, and model power terms 7308-7312. In FIG. 72, the process 3930 removes the model interaction terms 7308-7312 to satisfy the model power heuristic described in the process 3298. It shall be noted that the process 3930 may perform similar transformation to satisfy the other experimental design policies described with reference to the process 3928.

Figure 77:
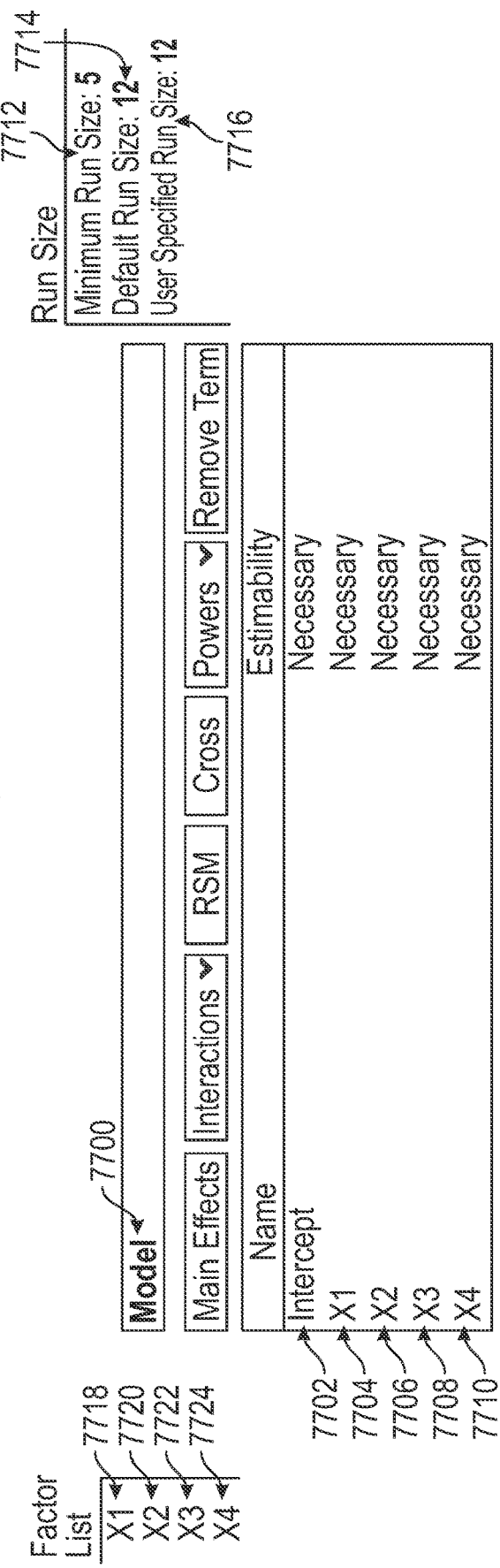
Figure 78:
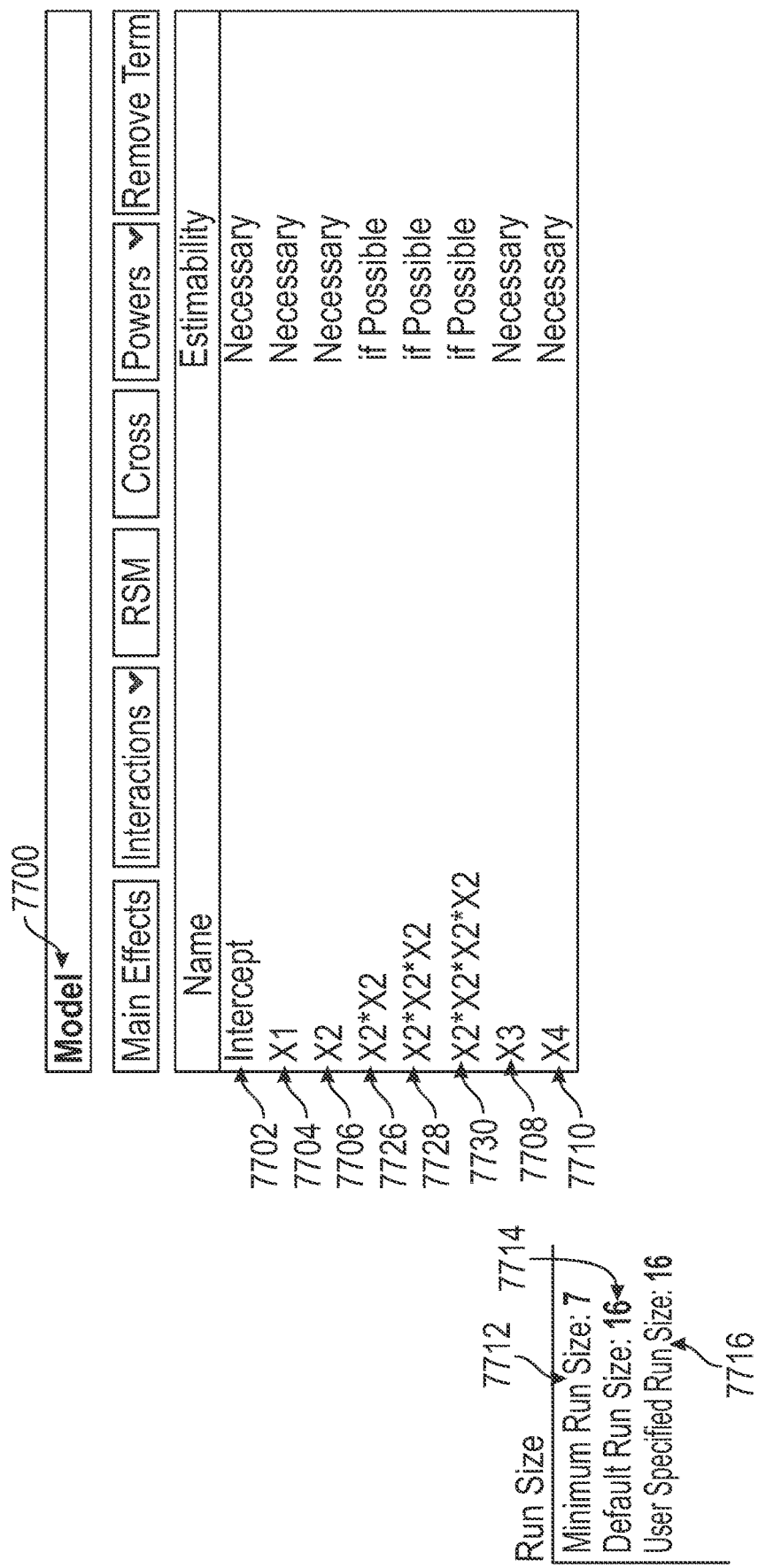

An example of the process 3930 transforming a design of experiment model to satisfy the run size experiment design policy (described in the process 3928) is illustrated in FIGS. 77 and 78. In the example of FIGS. 77 and 78, the process 3930 is updating a design of experiment model 7700 based on (e.g., in response to) the process 3930 converting the design of experiment factor 7722 from a continuous factor type to a categorical factor type with four categorical levels. Specifically, in FIG. 77, the design of experiments model 7700 includes a model intercept term 7702 and a plurality of main effect model terms 7704-7710 corresponding to the plurality of design of experiment factors 7718-7724. Additionally, as shown in FIG. 77, the design of experiment model 7700 currently has a minimum run size 7712 of five (5) runs, a default run size 7714 of twelve (12) runs, and a user specified run size of twelve (12) runs.

In FIG. 78, based on converting the design of experiment factor 7722 from a continuous factor type to a categorical factor type, the process 3930 updates the design of experiment model 7700 to include the model power terms 7726-7730. Additionally, as shown in FIG. 78, based on converting the design of experiment factor 7722 from a continuous factor type to a categorical factor type, the process 3930 updates the minimum run size 7712 to seven (7) runs to satisfy the run size experiment design policy described in the process 3928.

Conversely, as also shown in FIG. 40, in some embodiments, if the process 3930 determines via determination 4010 that the underlying model relates to a special class of designs, the process 3930 may perform step 4016. Various non-limiting examples of the process 3930 updating available design choices for the design of experiments (4016) will now be described.

Figure 80:
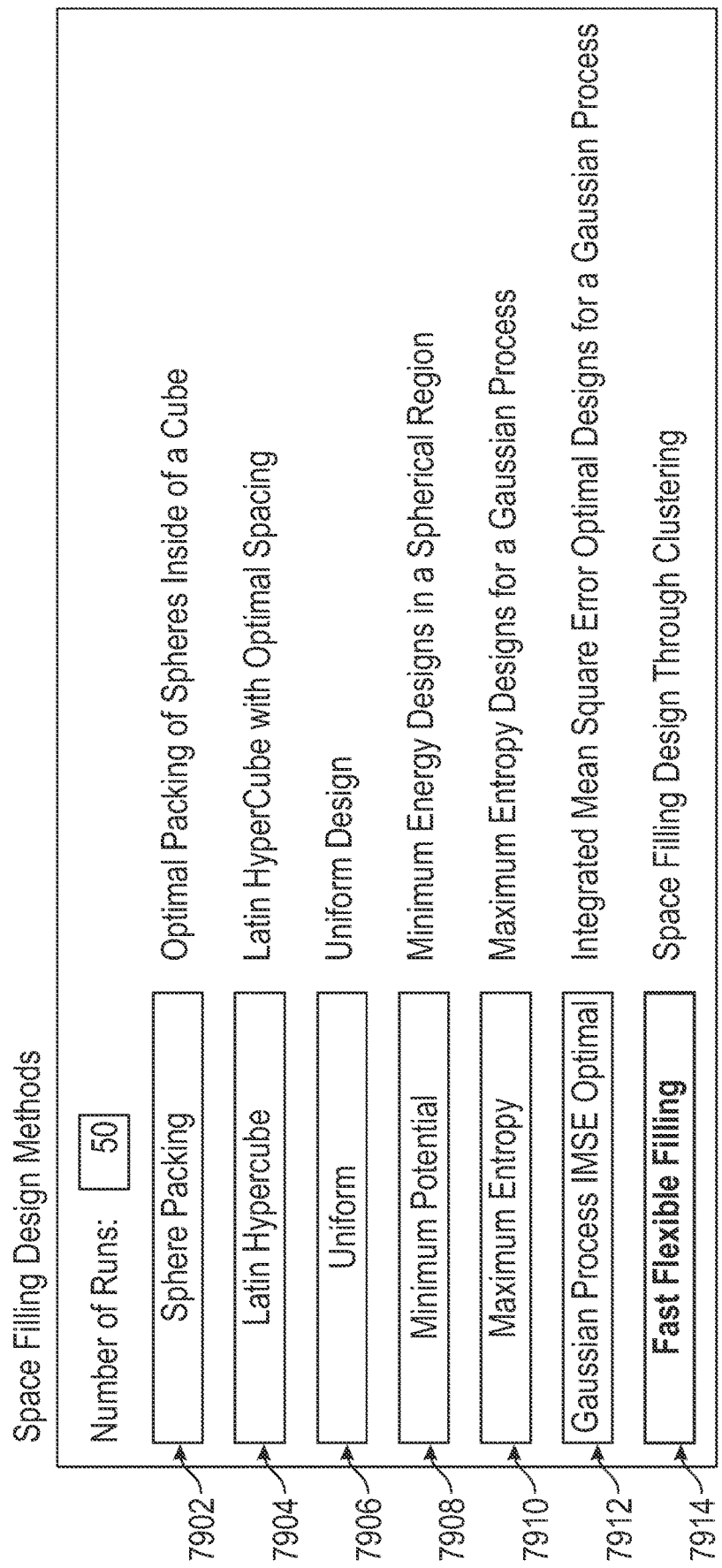

An example of the process 3930 updating available design choices to satisfy the space filling experiment design policy (described in the process 3928) is illustrated in FIGS. 79 and 80. In the example of FIGS. 79 and 80, the process 3930 is updating design choices available for selection based on (e.g., in response to) the process 3930 converting a design of experiment factor from a continuous factor type to a categorical factor type. Specifically, in FIG. 79, the space filling design choices available for selection includes a sphere packing design choice 7902, a Latin hypercube design choice 7904, a uniform design choice 7906, a minimum potential design choice 7908, a maximum entropy design choice 7910, a gaussian process IMSE Optimal design choice 7912, and a fast flexible filling design choice 7914.

In FIG. 78, based on converting the design of experiment factor from the continuous factor type to the categorical factor type, the process 3930 updates the space filing design choices available for selection to satisfy the space filling experiment design policy described in the process 3928. Specifically, in FIG. 80, the process 3930 causes the sphere packing design choice 7902, the Latin hypercube design choice 7904, the uniform design choice 7906, the minimum potential design choice 7908, the maximum entropy design choice 7910, and the gaussian process IMSE Optimal design choice 7912 to longer be available for selection.

Referring to FIG. 39, in some embodiments, the method 3900 may include a process 3940 that functions to execute the design of experiments based at least on the factor specification data, the execution of the factor type conversion, and the execution of the model transformation. In some embodiments, executing the design of experiments may include computing a plurality of design of experiment runs based on the processes 3910-3930. Each design of experiment run, in such embodiments, may refer to a single iteration of the design of experiment and/or may define specific levels or values that each factor may take during a respective design of experiment run. Furthermore, in some embodiments, once executed, the process 3940 may present the results of the design of experiment runs in a graphical user interface for enabling a user to assess the effect of the factors on the outcome of the experiment.

It shall also be noted that the system and methods of the embodiment and variations described herein can be embodied and/or implemented at least in part as a machine configured to receive a computer-readable medium storing computer-readable instructions. The instructions are preferably executed by computer-executable components preferably integrated with the system and one or more portions of the processors and/or the controllers. The computer-readable medium can be stored on any suitable computer-readable media such as RAMs, ROMs, flash memory, EEPROMs, optical devices (CD or DVD), hard drives, floppy drives, memory sticks (e.g., SD cards, USB flash drives), cloud-based services (e.g., cloud storage), magnetic storage devices, Solid-State Drives (SSDs), or any suitable device. The computer-executable component is preferably a general or application-specific processor, but any suitable dedicated hardware or hardware/firmware combination device can alternatively or additionally execute the instructions.

The systems and methods of the preferred embodiments may additionally, or alternatively, be implemented on an integrated data analytics software application and/or software architecture such as that are offered by SAS Institute Inc. or JMP Statistical Discovery LLC of Cary, N.C., USA. Merely for illustration, the systems and methods of the preferred embodiments may be implemented using or integrated with one or more software tools such as JMP®, which is developed and provided by JMP Statistical Discovery LLC.

Although omitted for conciseness, the preferred embodiments include every combination and permutation of the implementations of the systems and methods described herein.

As a person skilled in the art will recognize from the previous detailed description and from the figures and claims, modifications and changes can be made to the embodiments of the disclosure without departing from the scope of the various described embodiments.

What is claimed is:

1. A computer-program product embodied in a non-transitory machine-readable storage medium storing computer instructions that, when executed by one or more processors, perform operations that provide a graphical user interface comprising:

a plurality of factor-setting user interface (UI) control elements configured to receive an input of characters for specifying a set of design of experiment factors for creating a design of experiment (DOE);

a plurality of factor type UI control elements, each respective factor type UI control element of the plurality of factor type UI control elements being configured to receive input for specifying a factor type of a plurality of factor types displayed by the respective factor type UI control element for a corresponding DOE factor of the set of DOE factors;

a plurality of dynamic rows of editable UI control elements configured to receive inputs of experimental values for the set of DOE factors, wherein one or more dynamic rows of editable UI control elements of the plurality of dynamic rows of editable UI control elements are dynamically reconfigured from a current format of control elements to a new format of control elements based on one or more input operations to one or more of the plurality of factor type UI control elements;

a plurality of DOE platform configuration UI control elements being configured to receive input for configuring the plurality of factor type UI control elements to a DOE platform of a plurality of DOE platforms, wherein each DOE platform of the plurality DOE platforms defines a distinct number of factor types that is selectably available for a respective factor type UI control element of the plurality of factor type UI control elements; and a composite factor UI control component configured to receive inputs for generating one or more control signals that add or remove one or more DOE factors of the set of DOE factors.

2. The graphical user interface according to claim 1, further comprising:

a factor-setting grid container control, wherein the factor-setting grid container control includes:

one or more columns of the plurality of factor-setting UI control elements, a column of the plurality of factor type UI control elements, and one or more columns of the plurality of dynamic rows of editable UI control elements.

3. The graphical user interface according to claim 2, wherein:

the factor-setting grid container control includes a plurality of rows of factor-setting composition components, and each row of factor-setting composition components of the plurality of factor-setting composition components includes:

a factor-setting UI control element of the plurality of factor-setting UI control elements, a factor type UI control element of the plurality of factor type UI control elements, and a dynamic row of editable UI control elements of the plurality of dynamic rows of editable UI control elements.

4. The graphical user interface according to claim 1, wherein:

a respective DOE platform configuration UI control element of the plurality of DOE platform configuration UI control elements, when operated, changes a current DOE platform of a target factor type UI control element of the plurality of factor type UI control elements to a selected DOE platform, and the selected DOE platform increases or decreases a number of factor type UI control elements available for selection when operating the target factor type UI control element.

5. The graphical user interface according to claim 1, wherein the composite factor UI control component comprises a plurality of UI control buttons native to an operating system implementing the GUI including:
   a factor addition control button that, when operated, adds one or more DOE factors to an end of the set of DOE factors,
   a factor subtraction control button that, when operated, removes one or more DOE factors from the end of the set of DOE factors,
   a factor deletion control button that, when operated, removes one or more selected DOE factors from an arbitrary position within the set of DOE factors;
   a factor control operation undo button that, when operated, reverts the DOE or the GUI to a previous state that includes erasing a last set of one or more changes to the DOE or the GUI; and
   a factor control operation redo button that, when operated, reverses one or more most recent in time operations of the factor control operation undo button.

6. The graphical user interface according to claim 5, wherein the composite factor UI control component further includes a sub-composite factor UI control component comprising a number edit control element that, when operated, receives an input of a number identifying a number of DOE factors to append to the end of the set of DOE factors and a drop-down menu control element that, when operated, displays the plurality of factor type UI control elements that are available for selection,
   wherein in response to an input of a target number into the number edit control element and a selection of a target factor type from the plurality of factor type UI control elements that are selectably available via the drop-down menu control element, a control signal is generated that causes an automatically appending of the number of DOE factors to the end of the set of DOE of factors.

7. The graphical user interface according to claim 5, wherein the plurality of UI control buttons of the composite factor UI control component further includes a factor set reset control button that, when operated, deletes the set of DOE factors.

8. The graphical user interface according to claim 5, wherein the plurality of UI control buttons of the composite factor UI control component further includes a factor dialog control button that, when operated, displays a dialog menu element that includes:
   a first grid container control comprising a plurality of rows of factor-setting composition components, each row of factor-setting composition components of the plurality of rows of factor-setting composition components includes:
      a plurality of UI control elements for creating a distinct DOE factor of the set of DOE factors, and
      a DOE factor instantiation control button arranged in-line with the plurality of UI control elements, wherein the DOE factor instantiation control button, when operated, automatically appends one or more target DOE factors to the set of DOE factors, and
   a second grid container control comprising a further plurality of rows of factor-setting composition components, each row of factor-setting composition components of the further plurality of rows of factor-setting composition components includes a further plurality of UI control elements for creating a plurality of DOE factors of the set of DOE factors;
   a further composite factor UI control component arranged with the second grid container for controlling an addition to and a subtraction from of one or more DOE factors from a further set of DOE factors of the second grid container; and
   a further DOE factor instantiation control button arranged with the second grid container control that, when operated, automatically appends the plurality of DOE factors to the set of DOE factors.

9. The graphical user interface according to claim 1, wherein:
   the current format of control elements corresponds to an incumbent factor type UI control element of the plurality of factor type UI control elements and the new format of control elements corresponds to a succeeding factor type UI control element of the plurality of factor type UI control elements that is selected in place of the incumbent factor type UI control element.

10. The graphical user interface according to claim 1, wherein:
    the plurality of factor-setting UI control elements comprise a plurality of character edit boxes arranged in a column, and
    each of the plurality of character edit boxes is configured to receive input of one or more characters that define a target DOE factor of the set of DOE factors.

11. The graphical user interface according to claim 1, wherein:
    the plurality of factor type UI control elements comprise a plurality of drop-down menu elements arranged in a column,
    an input operation to a respective drop-down menu element of the plurality of drop-down menu elements causes the respective drop-down menu element to expand and display a set of factor type UI control elements.

12. The graphical user interface according to claim 1, wherein an order of the plurality of factor-setting UI control elements is rearranged within the GUI based on: executing a selection of a target factor-setting UI control element of the plurality of factor-setting UI control elements,
    moving the target factor-setting UI control element from a current position within the order, and
    placing the target factor-setting UI control element within a new position within the order of the plurality of factor-setting UI control elements.

13. The graphical user interface according to claim 1, wherein:
    the set of DOE factors is configured with a plurality of sequential groups of DOE factors,
    each of the plurality of sequential groups of DOE factors having a maximum group size not exceeding a specified number of DOE factors,
    an operation to rearrange a target DOE factor from a first group to a second group of the plurality of sequential groups of DOE factors automatically updates a group identification value associated with the target DOE factor and one or more group identification values of other DOE factors moved into one or more other groups of DOE factors of the plurality of sequential groups of DOE factors based on the rearrangement of the target DOE factor.

14. The graphical user interface according to claim 1, wherein when one or more DOE factors are appended to an end of the set of DOE factors causing a size of the set of DOE factors to exceed a display area of the graphical UI, the graphical UI is automatically scrolled to a section of the set of DOE factors displaying at least the one or more DOE factors.

15. A computed-implemented method comprising:
displaying a plurality of factor-setting user interface (UI) control elements configured to receive an input of characters for specifying a set of design of experiment factors for creating a design of experiment (DOE);
displaying a plurality of factor type UI control elements, each respective factor type UI control element of the plurality of factor type UI control elements being configured to receive input for specifying a factor type of a plurality of factor types displayed by the respective factor type UI control element for a corresponding DOE factor of the set of DOE factors;
displaying a plurality of dynamic rows of editable UI control elements configured to receive inputs of experimental values for the set of DOE factors, wherein one or more dynamic rows of editable UI control elements of the plurality of dynamic rows of editable UI control elements are dynamically reconfigured from a current format of control elements to a new format of control elements based on one or more input operations to one or more of the plurality of factor type UI control elements;
displaying a plurality of DOE platform configuration UI control elements being configured to receive input for configuring the plurality of factor type UI control elements to a DOE platform of a plurality of DOE platforms, wherein each DOE platform of the plurality DOE platforms defines a distinct number of factor types that is selectably available for a respective factor type UI control element of the plurality of factor type UI control elements; and
displaying a composite factor UI control component configured to receive inputs for generating one or more control signals that add or remove one or more DOE factors of the set of DOE factors.

16. The computed-implemented method according to claim 15, further comprising:
displaying a factor-setting grid container control, wherein the factor-setting grid container control includes:
one or more columns of the plurality of factor-setting UI control elements,
a column of the plurality of factor type UI control elements, and
one or more columns of the plurality of dynamic rows of editable UI control elements.

17. The computed-implemented method according to claim 16, wherein:
the factor-setting grid container control includes a plurality of rows of factor-setting composition components, and
each row of factor-setting composition components of the plurality of factor-setting composition components includes:
a factor-setting UI control element of the plurality of factor-setting UI control elements,
a factor type UI control element of the plurality of factor type UI control elements, and
a dynamic row of editable UI control elements of the plurality of dynamic rows of editable UI control elements.

18. The computed-implemented method according to claim 15, wherein:

a respective DOE platform configuration UI control element of the plurality of DOE platform configuration UI control elements, when operated, changes a current DOE platform of a target factor type UI control element of the plurality of factor type UI control elements to a selected DOE platform, and
the selected DOE platform increases or decreases a number of factor type UI control elements available for selection when operating the target factor type UI control element.

19. The computed-implemented method according to claim 15, wherein the composite factor UI control component comprises a plurality of UI control buttons native to an operating system implementing the GUI including:
a factor addition control button that, when operated, adds one or more DOE factors to an end of the set of DOE factors,
a factor subtraction control button that, when operated, removes one or more DOE factors from the end of the set of DOE factors,
a factor deletion control button that, when operated, removes one or more selected DOE factors from an arbitrary position within the set of DOE factors;
a factor control operation undo button that, when operated, reverts the DOE or the GUI to a previous state that includes erasing a last set of one or more changes to the DOE or the GUI; and
a factor control operation redo button that, when operated, reverses one or more most recent in time operations of the factor control operation undo button.

20. The computed-implemented method according to claim 19, wherein the composite factor UI control component further includes a sub-composite factor UI control component comprising a number edit control element that, when operated, receives an input of a number identifying a number of DOE factors to append to the end of the set of DOE factors and a drop-down menu control element that, when operated, displays the plurality of factor type UI control elements that are available for selection,
wherein in response to an input of a target number into the number edit control element and a selection of a target factor type from the plurality of factor type UI control elements that are selectably available via the drop-down menu control element, a control signal is generated that causes an automatically appending of the number of DOE factors to the end of the set of DOE of factors.

21. A computer-implemented system comprising:
one or more processors;
a memory;
a computer-readable medium operably coupled to the one or more processors, the computer-readable medium having computer-readable instructions stored thereon that, when executed by the one or more processors, cause a computing device to perform operations comprising:
displaying a plurality of factor-setting user interface (UI) control elements configured to receive an input of characters for specifying a set of design of experiment factors for creating a design of experiment (DOE);
displaying a plurality of factor type UI control elements, each respective factor type UI control element of the plurality of factor type UI control elements being configured to receive input for specifying a factor type of a plurality of factor types displayed by the respective factor type UI control element for a corresponding DOE factor of the set of DOE factors;

displaying a plurality of dynamic rows of editable UI control elements configured to receive inputs of experimental values for the set of DOE factors, wherein one or more dynamic rows of editable UI control elements of the plurality of dynamic rows of editable UI control elements are dynamically reconfigured from a current format of control elements to a new format of control elements based on one or more input operations to one or more of the plurality of factor type UI control elements;

displaying a plurality of DOE platform configuration UI control elements being configured to receive input for configuring the plurality of factor type UI control elements to a DOE platform of a plurality of DOE platforms, wherein each DOE platform of the plurality DOE platforms defines a distinct number of factor types that is selectably available for a respective factor type UI control element of the plurality of factor type UI control elements; and displaying a composite factor UI control component configured to receive inputs for generating one or more control signals that add or remove one or more DOE factors of the set of DOE factors.

22. The computer-implemented system according to claim 21 further comprising computer-readable instructions that, when executed, cause the computing device to perform operations comprising:

displaying a factor-setting grid container control, wherein the factor-setting grid container control includes:
one or more columns of the plurality of factor-setting UI control elements,
a column of the plurality of factor type UI control elements, and
one or more columns of the plurality of dynamic rows of editable UI control elements.

23. The computer-implemented system according to claim 22, wherein:
the factor-setting grid container control includes a plurality of rows of factor-setting composition components, and
each row of factor-setting composition components of the plurality of factor-setting composition components includes:
a factor-setting UI control element of the plurality of factor-setting UI control elements,
a factor type UI control element of the plurality of factor type UI control elements, and
a dynamic row of editable UI control elements of the plurality of dynamic rows of editable UI control elements.

24. The computer-implemented system according to claim 21, wherein:
a respective DOE platform configuration UI control element of the plurality of DOE platform configuration UI control elements, when operated, changes a current DOE platform of a target factor type UI control element of the plurality of factor type UI control elements to a selected DOE platform, and
the selected DOE platform increases or decreases a number of factor type UI control elements available for selection when operating the target factor type UI control element.

25. The computer-implemented system according to claim 21, wherein the composite factor UI control component comprises a plurality of UI control buttons native to an operating system implementing the GUI including:
a factor addition control button that, when operated, adds one or more DOE factors to an end of the set of DOE factors,
a factor subtraction control button that, when operated, removes one or more DOE factors from the end of the set of DOE factors,
a factor deletion control button that, when operated, removes one or more selected DOE factors from an arbitrary position within the set of DOE factors;
a factor control operation undo button that, when operated, reverts the DOE or the GUI to a previous state that includes erasing a last set of one or more changes to the DOE or the GUI; and
a factor control operation redo button that, when operated, reverses one or more most recent in time operations of the factor control operation undo button.

26. The computer-implemented system according to claim 21, wherein:
the current format of control elements corresponds to an incumbent factor type UI control element of the plurality of factor type UI control elements and the new format of control elements corresponds to a succeeding factor type UI control element of the plurality of factor type UI control elements that is selected in place of the incumbent factor type UI control element.

27. The computer-implemented system according to claim 21, wherein:
the plurality of factor-setting UI control elements comprise a plurality of character edit boxes arranged in a column, and
each of the plurality of character edit boxes is configured to receive input of one or more characters that define a target DOE factor of the set of DOE factors.

28. A computer-program product embodied in a non-transitory machine-readable storage medium storing computer instructions that, when executed by one or more processors, perform operations that provide a graphical user interface comprising:
a plurality of factor-setting user interface (UI) control elements configured to receive an input of characters for specifying a set of design of experiment factors for creating a design of experiment (DOE);
a plurality of factor type UI control elements, each respective factor type UI control element of the plurality of factor type UI control elements being configured to receive input for specifying a factor type of a plurality of factor types displayed by the respective factor type UI control element for a corresponding DOE factor of the set of DOE factors;
a plurality of dynamic rows of editable UI control elements configured to receive inputs of experimental values for the set of DOE factors, wherein one or more dynamic rows of editable UI control elements of the plurality of dynamic rows of editable UI control elements are dynamically reconfigured from a current format of control elements to a new format of control elements based on one or more input operations to one or more of the plurality of factor type UI control elements; and
a composite factor UI control component configured to receive inputs for generating one or more control signals that add or remove one or more DOE factors of the set of DOE factors, wherein the composite factor UI control component comprises a plurality of UI control buttons native to an operating system implementing the GUI including:
- a factor addition control button that, when operated, adds one or more DOE factors to an end of the set of DOE factors,
- a factor subtraction control button that, when operated, removes one or more DOE factors from the end of the set of DOE factors,
- a factor deletion control button that, when operated, removes one or more selected DOE factors from an arbitrary position within the set of DOE factors;
- a factor control operation undo button that, when operated, reverts the DOE or the GUI to a previous state that includes erasing a last set of one or more changes to the DOE or the GUI; and
- a factor control operation redo button that, when operated, reverses one or more most recent in time operations of the factor control operation undo button.

29. A computer-program product embodied in a non-transitory machine-readable storage medium storing computer instructions that, when executed by one or more processors, perform operations that provide a graphical user interface comprising:
- a plurality of factor-setting user interface (UI) control elements configured to receive an input of characters for specifying a set of design of experiment factors for creating a design of experiment (DOE);
- a plurality of factor type UI control elements, each respective factor type UI control element of the plurality of factor type UI control elements being configured to receive input for specifying a factor type of a plurality of factor types displayed by the respective factor type UI control element for a corresponding DOE factor of the set of DOE factors, wherein:
  - the set of DOE factors is configured with a plurality of sequential groups of DOE factors,
  - each of the plurality of sequential groups of DOE factors having a maximum group size not exceeding a specified number of DOE factors, and
  - an operation to rearrange a target DOE factor from a first group to a second group of the plurality of sequential groups of DOE factors automatically updates a group identification value associated with the target DOE factor and one or more group identification values of other DOE factors moved into one or more other groups of DOE factors of the plurality of sequential groups of DOE factors based on the rearrangement of the target DOE factor;
- a plurality of dynamic rows of editable UI control elements configured to receive inputs of experimental values for the set of DOE factors, wherein one or more dynamic rows of editable UI control elements of the plurality of dynamic rows of editable UI control elements are dynamically reconfigured from a current format of control elements to a new format of control elements based on one or more input operations to one or more of the plurality of factor type UI control elements; and
- a composite factor UI control component configured to receive inputs for generating one or more control signals that add or remove one or more DOE factors of the set of DOE factors.

* * * * *

UNITED STATES PATENT AND TRADEMARK OFFICE
CERTIFICATE OF CORRECTION

| | | |
|---|---|---|
| PATENT NO. | : 11,928,325 B1 | Page 1 of 1 |
| APPLICATION NO. | : 18/229050 | |
| DATED | : March 12, 2024 | |
| INVENTOR(S) | : Liu et al. | |

It is certified that error appears in the above-identified patent and that said Letters Patent is hereby corrected as shown below:

On the Title Page

Item (73) Assignee SAS Institute Inc. should be "JMP Statistical Discovery LLC"

Signed and Sealed this
Twenty-fifth Day of March, 2025

Coke Morgan Stewart
*Acting Director of the United States Patent and Trademark Office*